United States Patent
Yamazaki et al.

(10) Patent No.: US 12,250,819 B2
(45) Date of Patent: *Mar. 11, 2025

(54) SEMICONDUCTOR DEVICE AND METHOD FOR MANUFACTURING SEMICONDUCTOR DEVICE

(71) Applicant: SEMICONDUCTOR ENERGY LABORATORY CO., LTD., Atsugi (JP)

(72) Inventors: Shunpei Yamazaki, Tokyo (JP); Tatsuya Onuki, Kanagawa (JP); Satoru Okamoto, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 525 days.

This patent is subject to a terminal disclaimer.

(21) Appl. No.: 17/623,301

(22) PCT Filed: Jun. 23, 2020

(86) PCT No.: PCT/IB2020/055892
§ 371 (c)(1),
(2) Date: Dec. 28, 2021

(87) PCT Pub. No.: WO2021/005435
PCT Pub. Date: Jan. 14, 2021

(65) Prior Publication Data
US 2022/0367509 A1  Nov. 17, 2022

(30) Foreign Application Priority Data

Jul. 5, 2019 (JP) .................................. 2019-125710
Dec. 27, 2019 (JP) .................................. 2019-239500

(51) Int. Cl.
H10B 43/27 (2023.01)

(52) U.S. Cl.
CPC ................................ H10B 43/27 (2023.02)

(58) Field of Classification Search
None
See application file for complete search history.

(56) References Cited

U.S. PATENT DOCUMENTS 9,634,097 B2  4/2017 Rabkin et al.
10,593,693 B2  3/2020 Yamazaki et al.
(Continued)

FOREIGN PATENT DOCUMENTS

JP  2010-030064 A  2/2010
JP  2015-173230 A  10/2015
(Continued)

OTHER PUBLICATIONS

International Search Report (Application No. PCT/IB2020/055892) Dated Sep. 8, 2020.
(Continued)

Primary Examiner — Jay C Chang
(74) Attorney, Agent, or Firm — NIXON PEABODY LLP; Jeffrey L. Costellia

(57) ABSTRACT

A semiconductor device having a large storage capacity per unit area is provided. The semiconductor device includes a first insulator including a first opening; a first conductor including a second opening over the first insulator; a second insulator including a third opening over the first conductor; a third insulator provided along a first side surface of the first opening, a second side surface of the second opening, and a third side surface of the third opening; an oxide provided along the first side surface, the second side surface, and the third side surface with the third insulator therebetween; a second conductor provided at the first side surface with the third insulator and the oxide therebetween; and a third conductor provided at the third side surface with the third (Continued)

insulator and the oxide therebetween, the oxide includes a first region in the first opening, a second region in the second opening, and a third region in the third opening, and the second region has higher resistance than the first region and the third region.

16 Claims, 66 Drawing Sheets

(56) References Cited

U.S. PATENT DOCUMENTS

| | | |
|---|---|---|
| 10,600,469 B2 | 3/2020 | Kimura et al. |
| 10,665,604 B2 | 5/2020 | Kimura et al. |
| 10,839,883 B2 | 11/2020 | Kimura et al. |
| 10,886,292 B2 | 1/2021 | Kimura et al. |
| 11,011,542 B2 | 5/2021 | Yamazaki et al. |
| 11,450,371 B2 | 9/2022 | Kimura et al. |
| 2011/0065270 A1 | 3/2011 | Shim et al. |
| 2015/0263033 A1 | 9/2015 | Aoyama |
| 2016/0079268 A1* | 3/2016 | Sakuma ............... H10B 43/27 257/43 |
| 2019/0006386 A1 | 1/2019 | Yamazaki et al. |
| 2019/0027493 A1 | 1/2019 | Kimura et al. |
| 2020/0098785 A1* | 3/2020 | Kariya ............... H10B 43/10 |
| 2021/0135010 A1 | 5/2021 | Yamazaki et al. |
| 2021/0151463 A1 | 5/2021 | Kimura et al. |
| 2021/0366926 A1 | 11/2021 | Yamazaki et al. |
| 2022/0068967 A1 | 3/2022 | Yamazaki et al. |
| 2023/0005518 A1 | 1/2023 | Kimura et al. |

FOREIGN PATENT DOCUMENTS

| | | |
|---|---|---|
| JP | 2019-008862 A | 1/2019 |
| JP | 2019-012822 A | 1/2019 |
| JP | 2019-024087 A | 2/2019 |

OTHER PUBLICATIONS

Written Opinion (Application No. PCT/IB2020/055892) Dated Sep. 8, 2020.

* cited by examiner

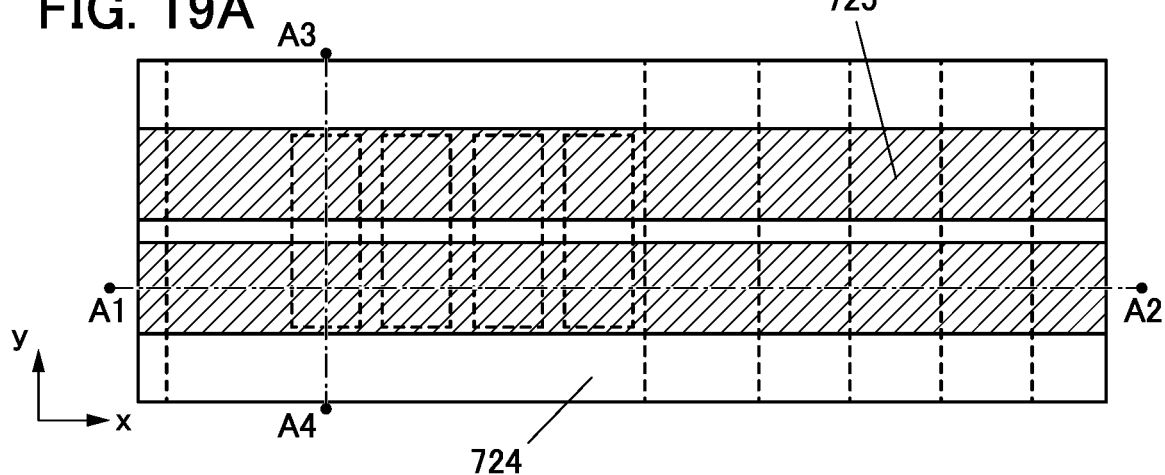
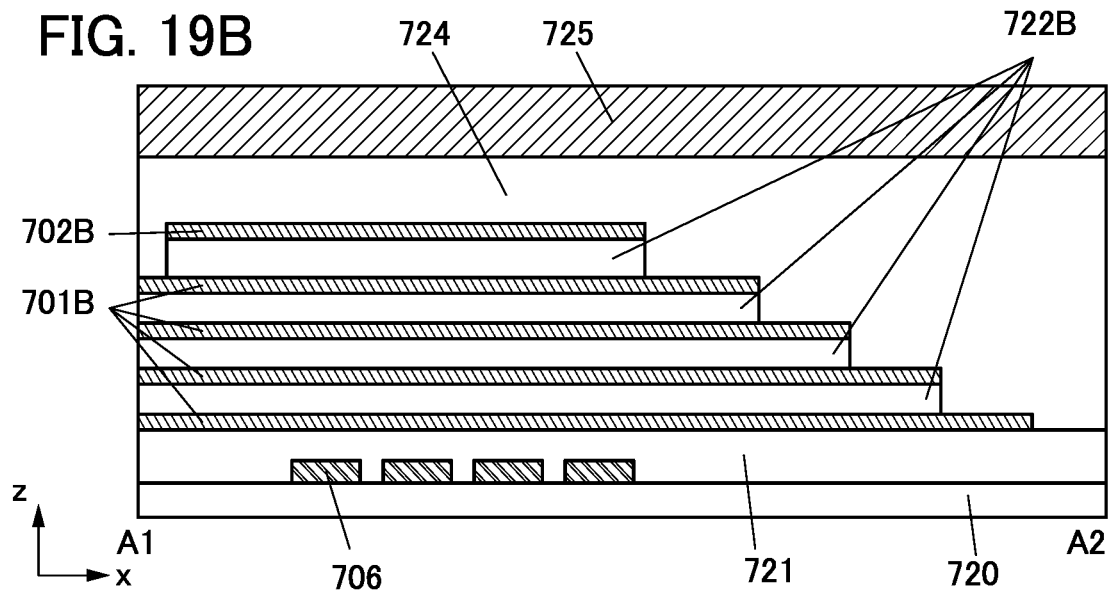
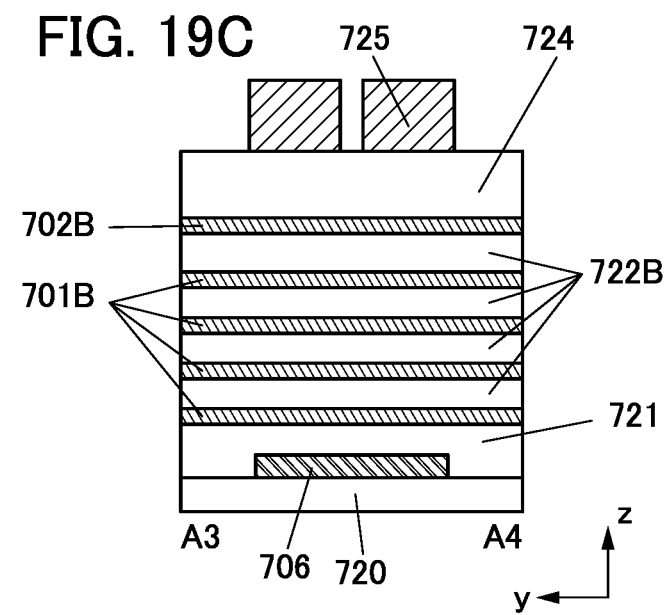

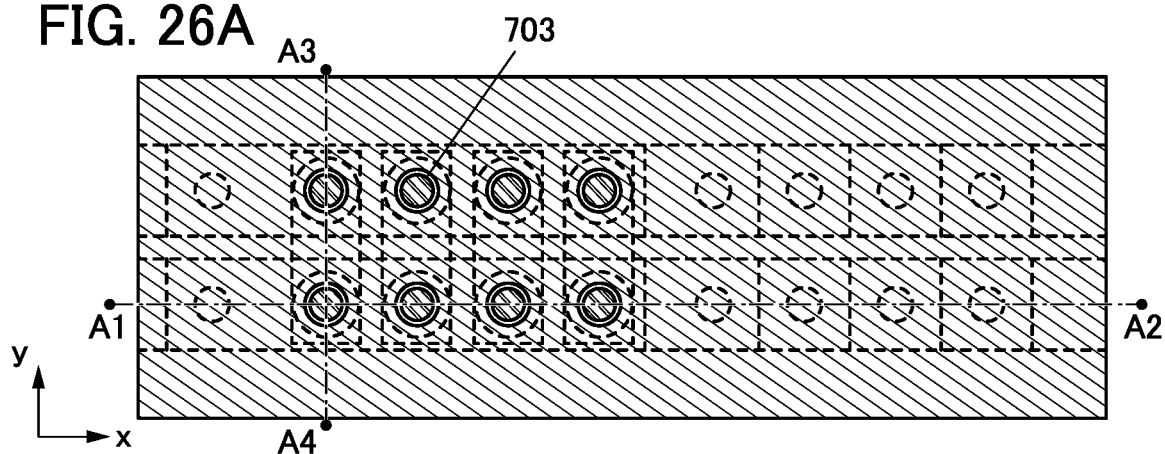
FIG. 26A
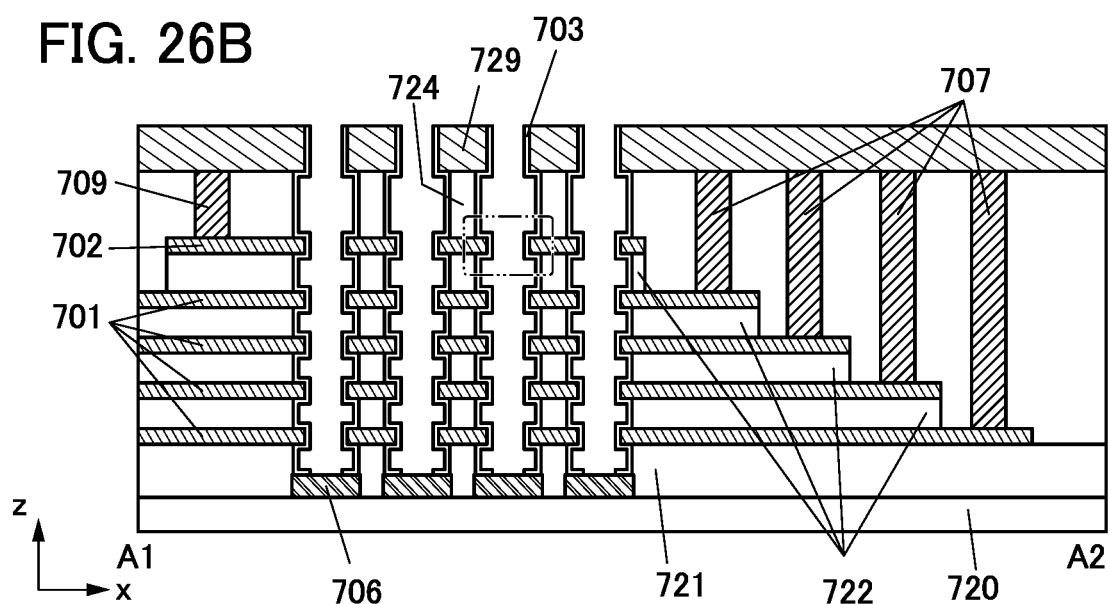
FIG. 26B
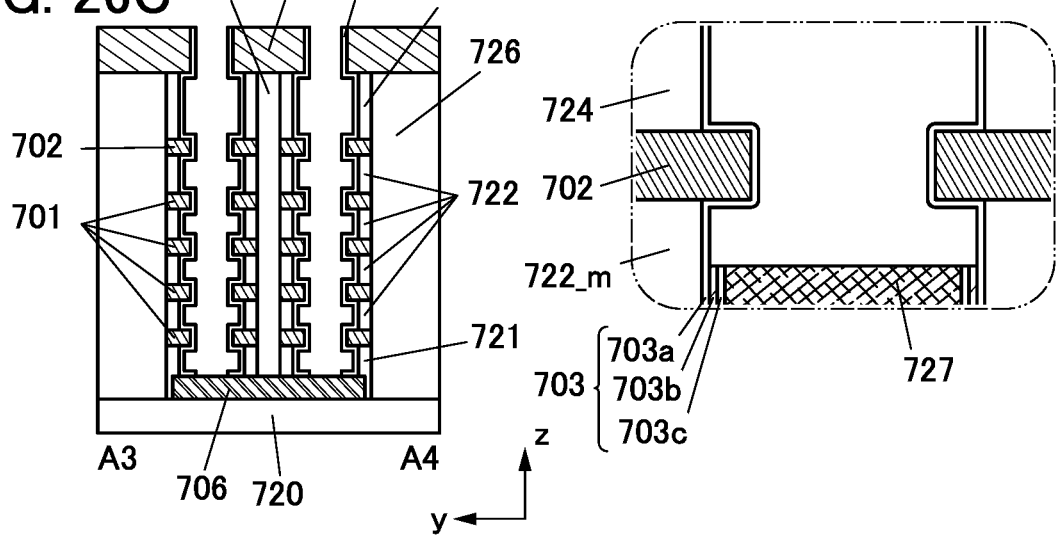
FIG. 26C
FIG. 26D

FIG. 33A
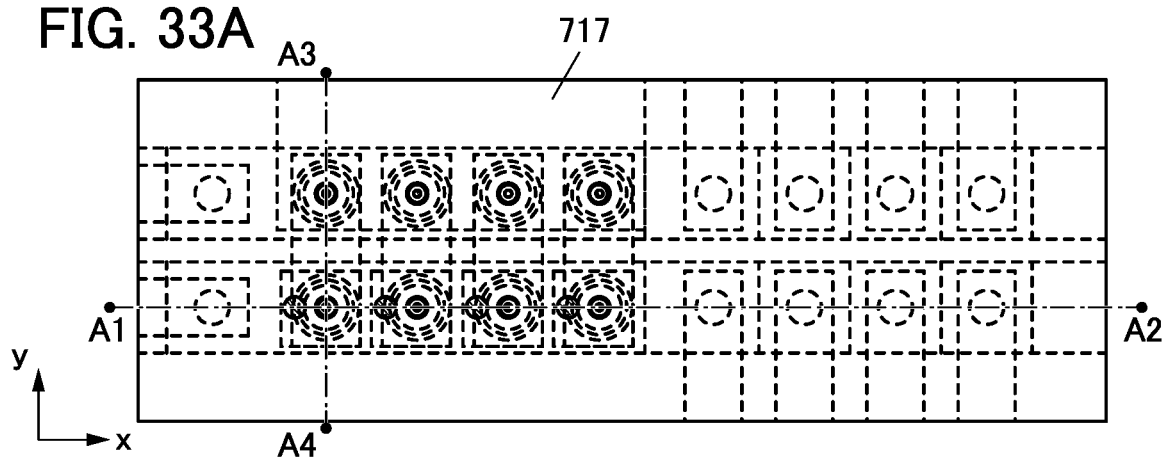
FIG. 33B
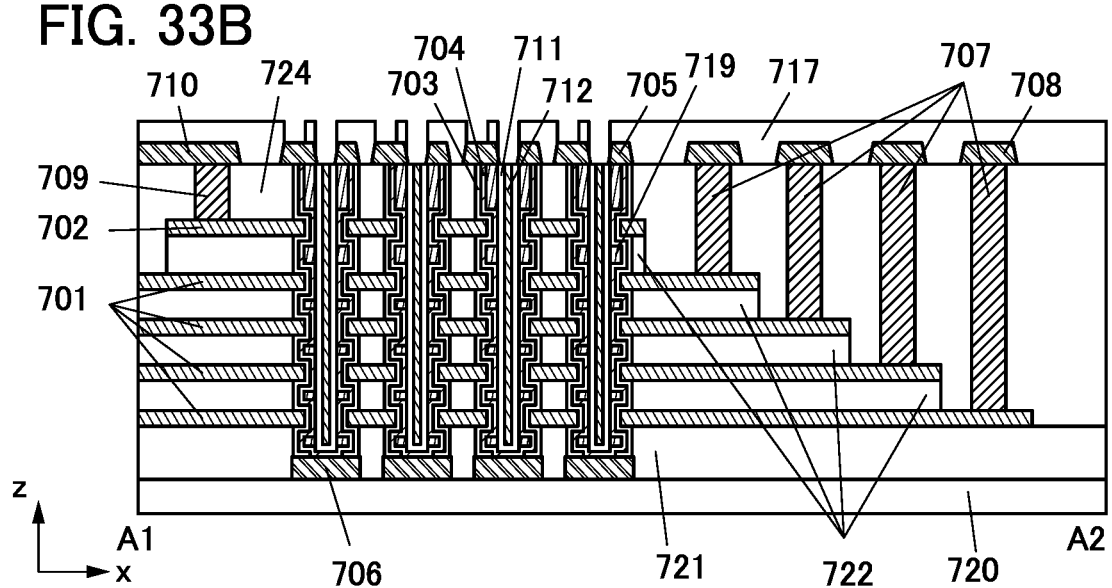
FIG. 33C

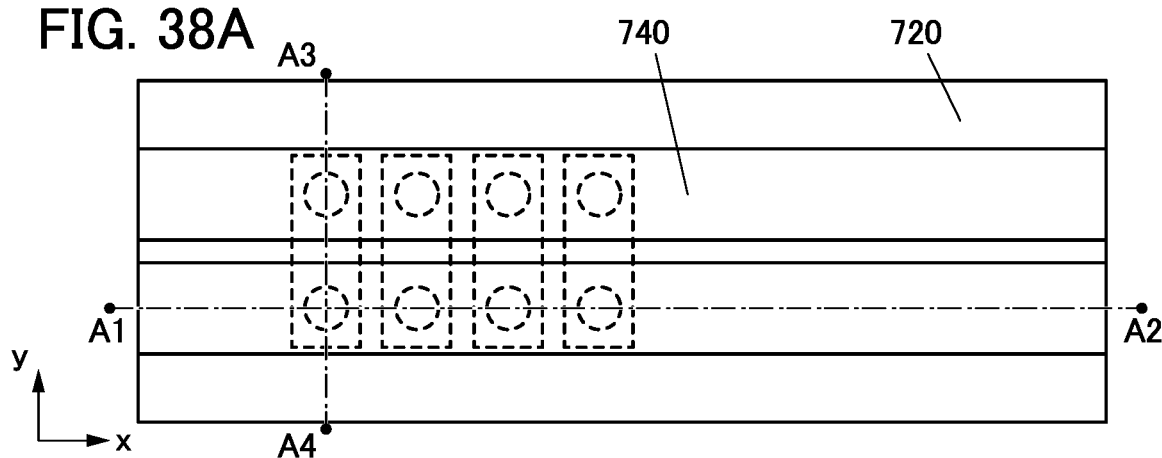
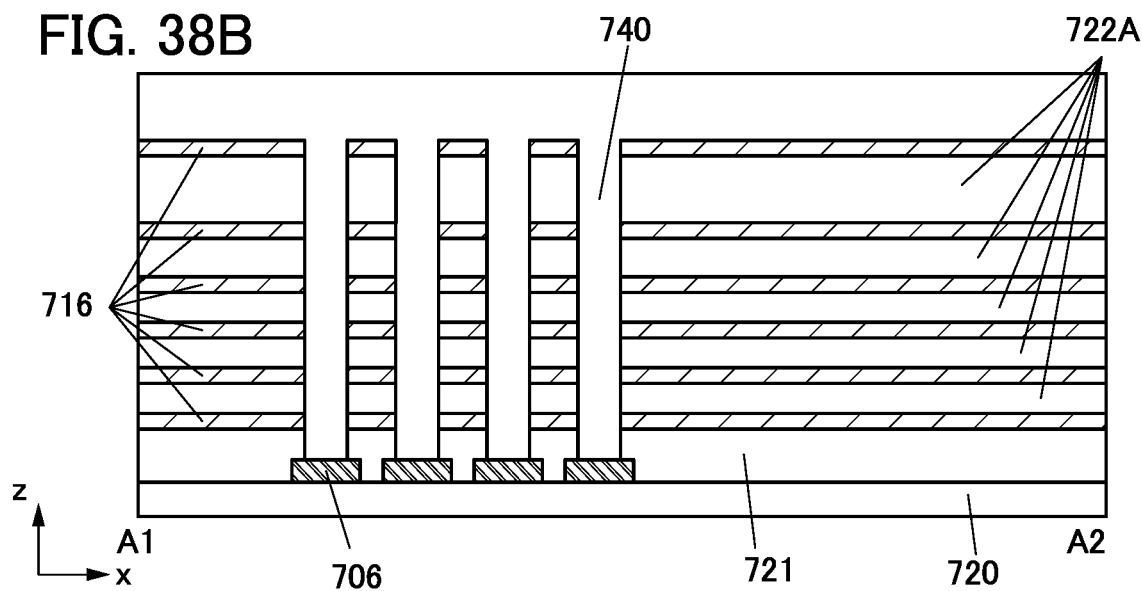
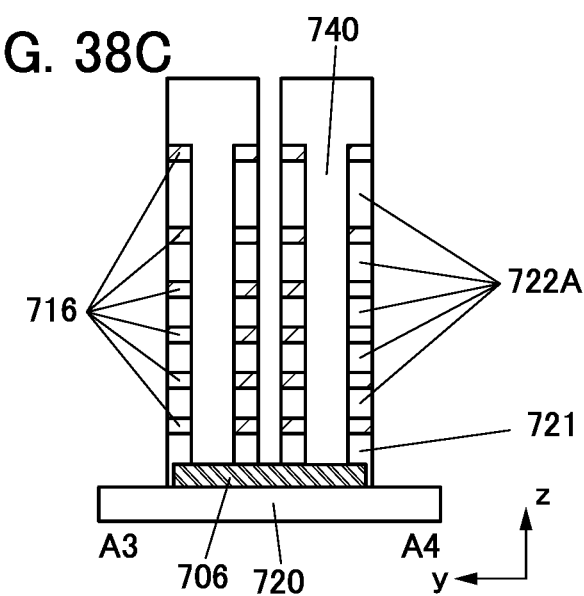

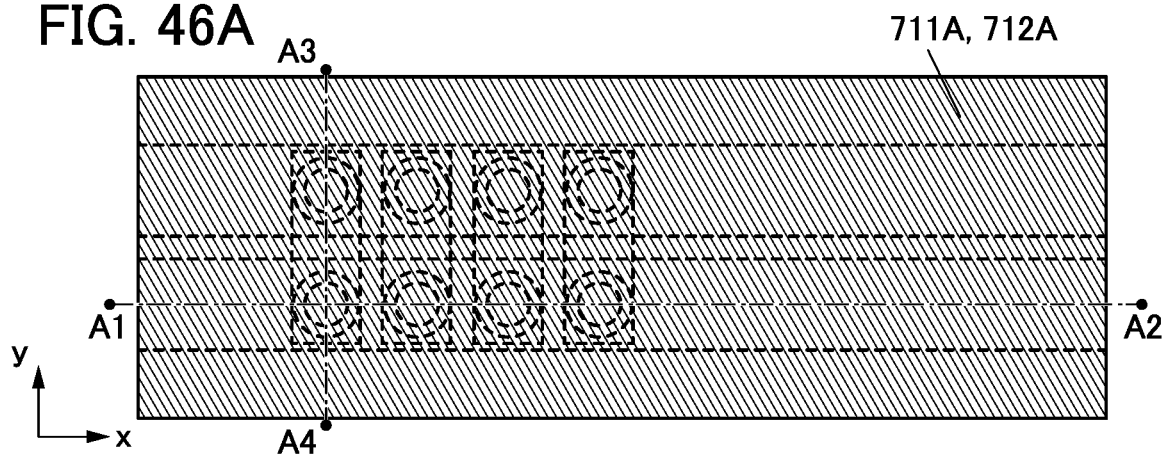
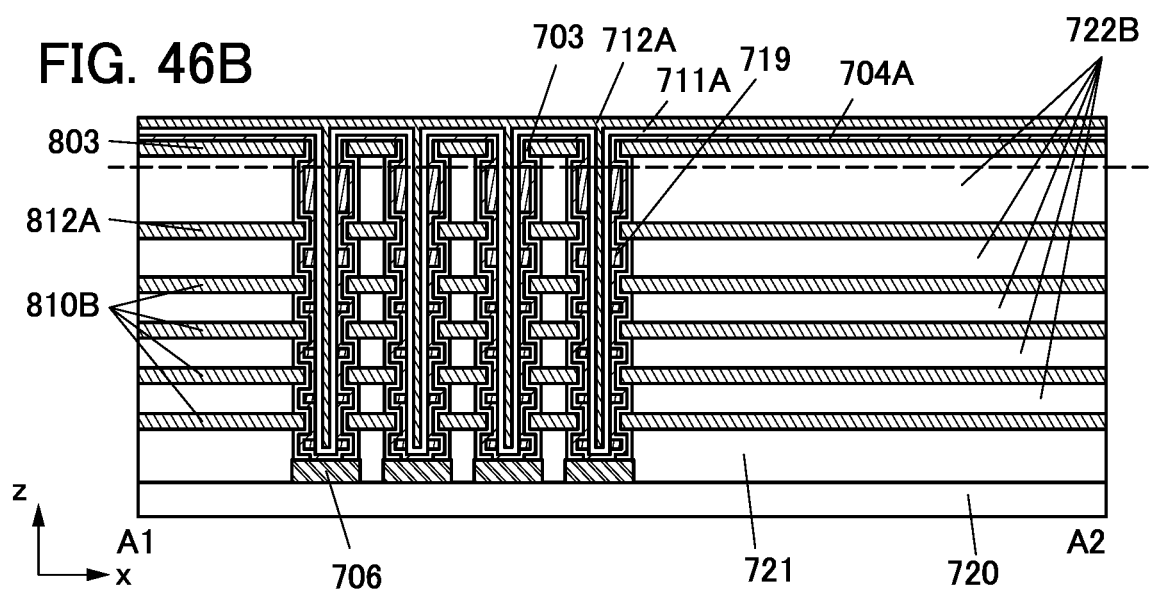
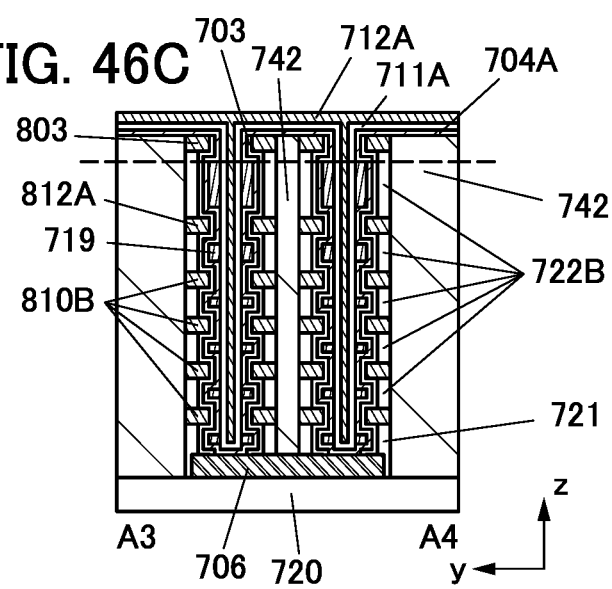

FIG. 61A
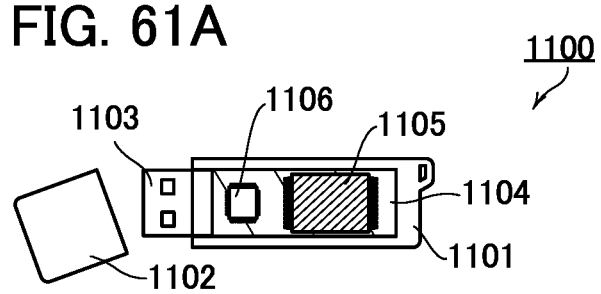
FIG. 61B  FIG. 61C
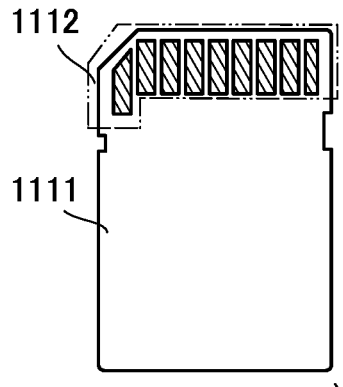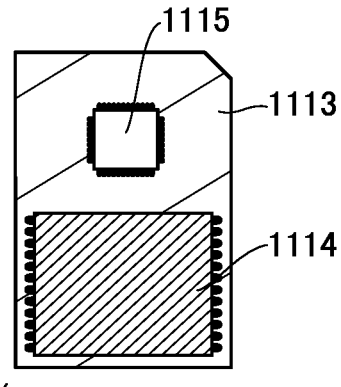
FIG. 61D  FIG. 61E
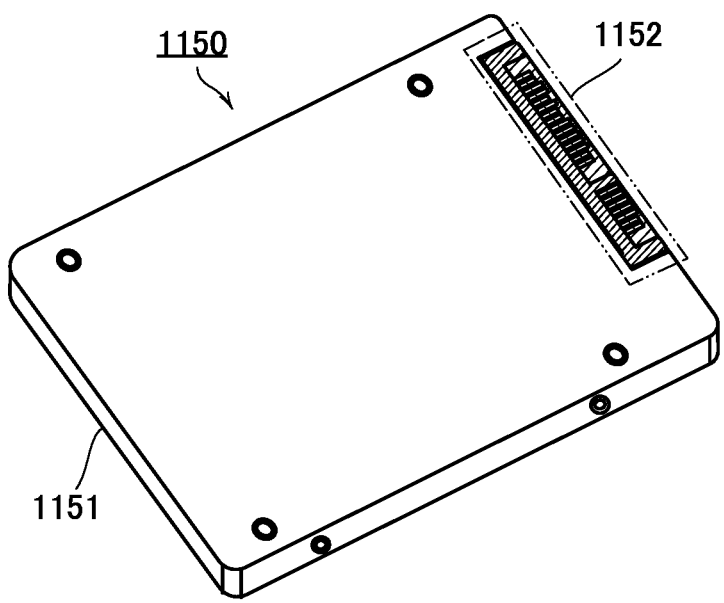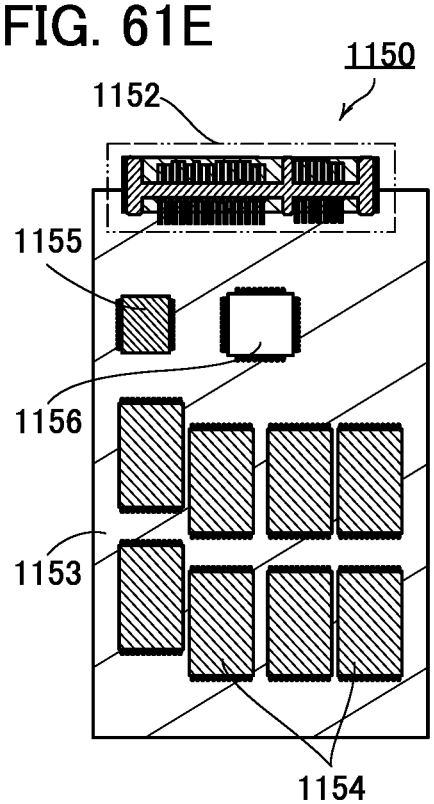

SEMICONDUCTOR DEVICE AND METHOD FOR MANUFACTURING SEMICONDUCTOR DEVICE

TECHNICAL FIELD

The present invention relates to, for example, a memory device and a semiconductor device. Alternatively, the present invention relates to, for example, manufacturing methods of the memory device and the semiconductor device. Alternatively, the present invention relates to a memory transistor included in a memory device and a manufacturing method of the memory transistor. Alternatively, the present invention relates to, for example, a processor and an electronic device. Alternatively, the present invention relates to manufacturing methods of the processor and the electronic device. Alternatively, the present invention relates to driving methods of the memory device, the processor, and the electronic device.

Note that one embodiment of the present invention is not limited to the above technical field. The technical field of one embodiment of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. A display device, a light-emitting device, a lighting device, an electro-optical device, a memory device, a semiconductor circuit, and an electronic device include a semiconductor device in some cases.

BACKGROUND ART

In recent years, with the increase in the amount of data handled, a semiconductor device having a larger storage capacity has been required. To increase storage capacity per unit area, stacking memory cells is effective (see Patent Document 1 and Patent Document 2). Stacking memory cells can increase storage capacity per unit area in accordance with the number of stacked memory cells.

REFERENCE

Patent Document

[Patent Document 1] United States Patent Application Publication No. 2011/0065270A1
[Patent Document 2] U.S. Pat. No. 9,634,097B2

SUMMARY OF THE INVENTION

Problems to be Solved by the Invention

In Patent Document 1 and Patent Document 2, a plurality of memory elements (also referred to as memory cells) are stacked and these memory elements are connected in series, so that a three-dimensional memory cell array (also referred to as a memory string) is formed. In such a three-dimensional memory cell array, as the number of stacked memory elements increases, the series resistance between the memory cells is increased, and the resistance of the memory cell array is increased. There has been a problem in that the high resistance of the memory cell array causes loss of current flowing through the memory cell array and heat generation in the memory cell array.

Furthermore, in Patent Document 1, a semiconductor pattern provided in a columnar form is in contact with an insulator including a charge accumulation layer. In Patent Document 2, a semiconductor pattern provided in a columnar form is in contact with an insulator functioning as a tunnel dielectric. When the semiconductor is in contact with the insulator, trap centers might be formed at the interface between them. The trap centers formed at the interface between the semiconductor and the insulator trap electrons and change the threshold voltage of the transistor in the positive direction and thus might adversely affect the current driving power in the on state of the transistor, that is, the on-state current, the field-effect mobility, and the reliability.

In view of the above problems, an object of one embodiment of the present invention is to provide a semiconductor device which has favorable electrical characteristics and in which the formation of trap centers is inhibited.

An object is to provide a semiconductor device having a large storage capacity per unit area. Another object is to provide a semiconductor device having a novel structure where memory cells are stacked. Another object is to provide a semiconductor device with high productivity.

Another object is to provide a module including the semiconductor device. Another object is to provide an electronic device including the above semiconductor device or the module. Another object is to provide a novel semiconductor device. Another object is to provide a novel module. Another object is to provide a novel electronic device.

Another object is to provide a semiconductor device with reduced power consumption in a circuit operation. Another object is to provide a module including the semiconductor device with reduced power consumption in a circuit operation. Another object is to provide an electronic device including a semiconductor device or a module with reduced power consumption in a circuit operation.

Note that the description of these objects does not preclude the existence of other objects. One embodiment of the present invention does not have to achieve all of these objects. Other objects are apparent from the description of the specification, the drawings, the claims, and the like, and other objects can be derived from the description of the specification, the drawings, the claims, and the like.

Means for Solving the Problems

One embodiment of the present invention is a semiconductor device which includes a first insulator including a first opening; a first conductor including a second opening over the first insulator; a second insulator including a third opening over the first conductor; a third insulator provided along a first side surface of the first opening, a second side surface of the second opening, and a third side surface of the third opening; an oxide provided along the first side surface, the second side surface, and the third side surface with the third insulator therebetween; a second conductor provided at the first side surface with the third insulator and the oxide therebetween; and a third conductor provided at the third side surface with the third insulator and the oxide therebetween, and in which the oxide includes a first region in the first opening, a second region in the second opening, and a third region in the third opening, and the second region has higher resistance than the first region and the third region.

One embodiment of the present invention is a semiconductor device which includes a first insulator including a first opening; a first conductor including a second opening over the first insulator; a second insulator including a third opening over the first conductor; a third insulator provided along a first side surface of the first opening, a second side surface of the second opening, and a third side surface of the third opening; an oxide provided along the first side surface, the second side surface, and the third side surface with the third insulator therebetween; a second conductor provided at the first side surface with the third insulator and the oxide therebetween; a third conductor provided at the third side surface with the third insulator and the oxide therebetween; a fourth insulator in contact with the oxide, the second conductor, and the third conductor; and a fourth conductor in contact with the fourth insulator, and in which the oxide is provided between the first conductor and the fourth insulator, the fourth insulator is provided between the oxide and the fourth conductor, the oxide includes a first region in the first opening, a second region in the second opening, and a third region in the third opening, and the second region has higher resistance than the first region and the third region.

In the above, it is preferable that the first conductor serve as a first gate and the fourth conductor serve as a second gate.

In the above, it is preferable that the oxide contain indium, an element M (M is one or more selected from aluminum, gallium, yttrium, and tin), and zinc.

In the above, it is preferable that the oxide include a first layer; a second layer provided in contact with an inner side of the first layer; and a third layer provided in contact with an inner side of the second layer, an energy gap of the second layer be narrower than an energy gap of the first layer, and the energy gap of the second layer be narrower than an energy gap of the third layer.

In the above, it is preferable that the second conductor and the third conductor each have a function of blocking a microwave.

In the above, it is preferable that the second region contain more oxygen than the first region and the third region.

In the above, it is preferable that the second region contain less hydrogen than the first region and the third region.

In the above, it is preferable that the second region have a lower carrier concentration than the first region and the third region.

In the above, it is preferable that the third insulator include a gate insulating layer, a charge accumulation layer, and a tunnel insulating layer.

In the above, it is preferable that a diameter of the first opening and a diameter of the third opening be larger than a diameter of the second opening.

One embodiment of the present invention is a manufacturing method of a semiconductor device, including the steps of: forming a first insulating film; forming a first conductive film over the first insulating film; forming a second insulating film over the first conductive film; processing the second insulating film, the first conductive film, and the first insulating film to form a first insulator including a first opening, a first conductor including a second opening over the first insulator, and a second insulator including a third opening over the first conductor; processing the first insulator and the second insulator to make a diameter of the first opening and a diameter of the third opening larger than a diameter of the second opening; forming a third insulator in contact with the first insulator, the first conductor, and the second insulator in the first opening, the second opening, and the third opening; forming an oxide in contact with the third insulator; forming a second conductor and a third conductor in contact with the oxide in the first opening and the third opening, respectively; and irradiating the oxide with a microwave with the second conductor and the third conductor as masks.

In the above, it is preferable that heat treatment be performed after the second conductor and the third conductor are formed.

Effect of the Invention

According to one embodiment of the present invention, a semiconductor device which has favorable electrical characteristics and in which the formation of trap centers is inhibited can be provided.

A semiconductor device having a large storage capacity per unit area can be provided. A semiconductor device having a novel structure where memory cells (also referred to as memory transistors) are stacked can be provided. A semiconductor device with high productivity can be provided.

A module including the semiconductor device can be provided. An electronic device including the above semiconductor device or the module can be provided. A novel semiconductor device can be provided. A novel module can be provided. A novel electronic device can be provided.

A semiconductor device with reduced power consumption in a circuit operation can be provided. A module including the semiconductor device with reduced power consumption in a circuit operation can be provided. An electronic device including a semiconductor device or a module with reduced power consumption in a circuit operation can be provided.

Note that the description of the effects does not preclude the existence of other effects. One embodiment of the present invention does not have to have all of these effects. Note that effects other than these are apparent from the description of the specification, the drawings, the claims, and the like and effects other than these can be derived from the description of the specification, the drawings, the claims, and the like.

BRIEF DESCRIPTION OF THE DRAWINGS

FIG. 19A is a top view illustrating a manufacturing process of a semiconductor device of one embodiment of the present invention. FIG. 19B and FIG. 19C are cross-sectional views illustrating the manufacturing process of the semiconductor device of one embodiment of the present invention.

FIG. 26A is a top view illustrating a manufacturing process of a semiconductor device of one embodiment of the present invention. FIG. 26B to FIG. 26D are cross-sectional views illustrating the manufacturing process of the semiconductor device of one embodiment of the present invention.

FIG. 33A is a top view illustrating a manufacturing process of a semiconductor device of one embodiment of the present invention. FIG. 33B and FIG. 33C are cross-sectional views illustrating the manufacturing process of the semiconductor device of one embodiment of the present invention.

FIG. 38A is a top view illustrating a manufacturing process of a semiconductor device of one embodiment of the present invention. FIG. 38B and FIG. 38C are cross-sectional views illustrating the manufacturing process of the semiconductor device of one embodiment of the present invention.

FIG. 46A is a top view illustrating a manufacturing process of a semiconductor device of one embodiment of the present invention. FIG. 46B and FIG. 46C are cross-sectional views illustrating the manufacturing process of the semiconductor device of one embodiment of the present invention.

FIG. 61A to FIG. 61E are schematic views of memory devices of embodiments of the present invention.

MODE FOR CARRYING OUT THE INVENTION

Figure 1:
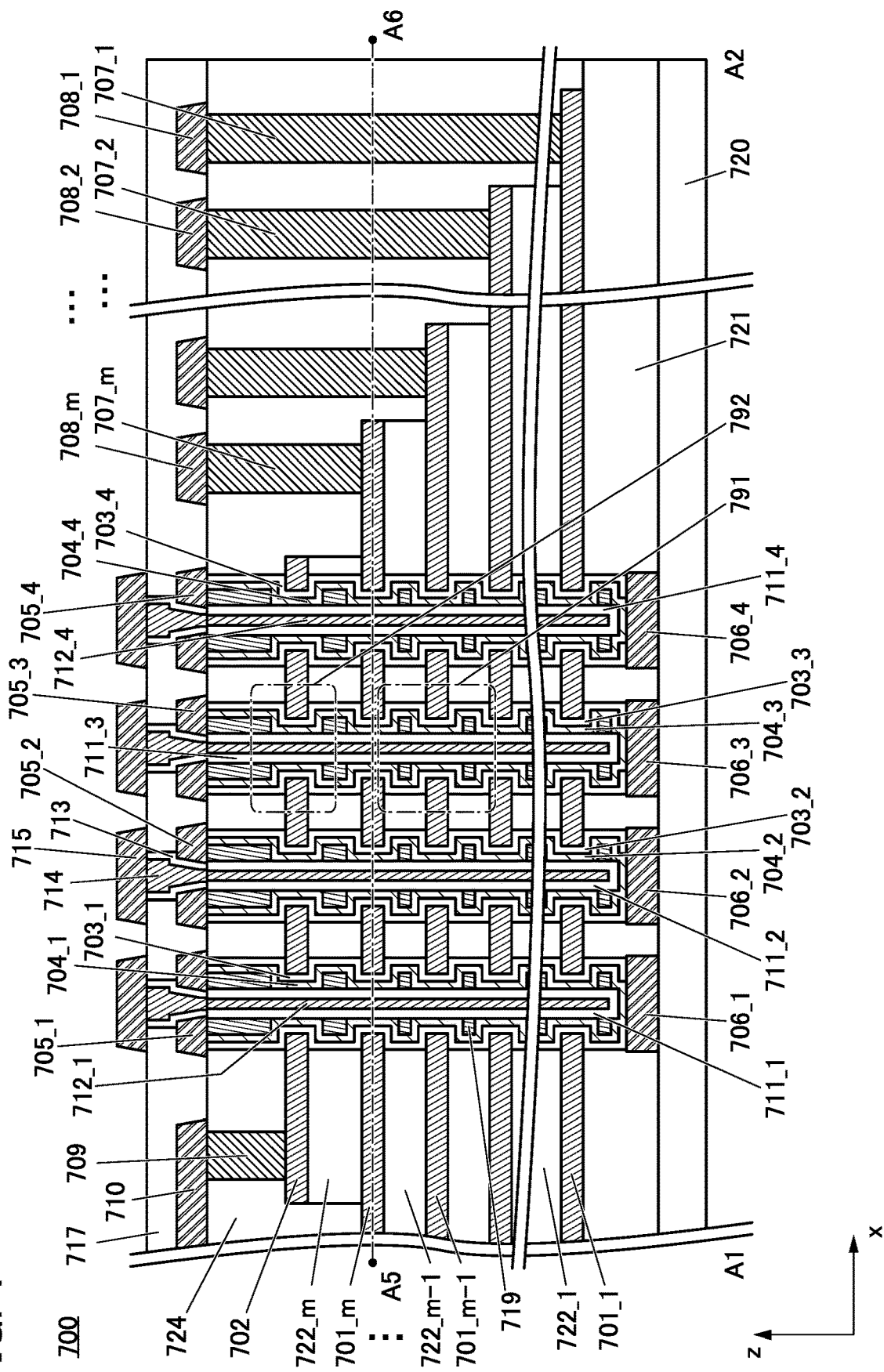
FIG. 1 is a cross-sectional view illustrating a semiconductor device of one embodiment of the present invention.

Hereinafter, embodiments are described with reference to the drawings. Note that the embodiments can be implemented with many different modes, and it is readily appreciated by those skilled in the art that modes and details can be changed in various ways without departing from the spirit and scope of the present invention. Thus, the present invention should not be construed as being limited to the following description of the embodiments.

In the drawings, the size, the layer thickness, or the region is exaggerated for clarity in some cases. Therefore, the size, the layer thickness, or the region is not necessarily limited to the illustrated scale. The drawings are schematic views showing ideal examples, and embodiments of the present invention are not limited to shapes or values shown in the drawings. In the drawings, the same portions or portions having similar functions are denoted by the same reference numerals in different drawings, and explanation thereof is not repeated. Furthermore, the same hatch pattern is used for the portions having similar functions, and the portions are not especially denoted by reference numerals in some cases.

Note that the ordinal numbers such as "first," "second," and the like in this specification and the like are used for convenience and do not denote the order of steps or the stacking order of layers. Therefore, for example, description can be made even when "first" is replaced with "second", "third", or the like as appropriate. In addition, the ordinal numbers in this specification and the like do not sometimes correspond to the ordinal numbers that are used to specify one embodiment of the present invention.

In this specification, terms for describing arrangement, such as "over" and "under", are used for convenience in describing a positional relationship between components with reference to drawings. The positional relation between components is changed as appropriate in accordance with a direction in which the components are described. Thus, terms for the description are not limited to those used in this specification, and the description can be rephrased appropriately depending on the situation.

In this specification and the like, "electrically connected" includes the case where connection is made through an "object having any electric function". Here, there is no particular limitation on the "object having any electric function" as long as electric signals can be transmitted and received between components that are connected through the object. Examples of the "object having any electric action" include a switching element such as a transistor, a resistor, an inductor, a capacitor, and other elements with a variety of functions as well as an electrode and a wiring.

Note that in this specification and the like, a nitride oxide refers to a compound that contains more nitrogen than oxygen. An oxynitride refers to a compound that contains more oxygen than nitrogen. The content of each element can be measured by Rutherford backscattering spectrometry (RBS), for example.

Moreover, in this specification and the like, the term "film" and the term "layer" can be interchanged with each other. For example, the term "conductive layer" can be changed into the term "conductive film" in some cases. As another example, the term "insulating film" can be changed into the term "insulating layer" in some cases.

In this specification and the like, "parallel" indicates a state where two straight lines are placed at an angle of greater than or equal to $-10°$ and less than or equal to $10°$. Thus, the case where the angle is greater than or equal to $-5°$ and less than or equal to $5°$ is also included. In addition, "substantially parallel" indicates a state where two straight lines are placed at an angle of greater than or equal to $-30°$ and less than or equal to $30°$. Moreover, "perpendicular" indicates a state where two straight lines are placed at an angle of greater than or equal to $80°$ and less than or equal to $100°$. Thus, the case where the angle is greater than or equal to $85°$ and less than or equal to $95°$ is also included. Furthermore, "substantially perpendicular" indicates a state where two straight lines are placed at an angle of greater than or equal to $60°$ and less than or equal to $120°$.

Furthermore, in this specification, in the case where a crystal is a trigonal crystal or a rhombohedral crystal, the crystal is regarded as a hexagonal crystal system.

Note that in this specification, a barrier film refers to a film having a function of inhibiting transmission of oxygen and impurities such as hydrogen; in the case where the barrier film has conductivity, the film is referred to as a conductive barrier film in some cases.

In this specification and the like, a metal oxide is an oxide of a metal in a broad sense. Metal oxides are classified into an oxide insulator, an oxide conductor (including a transparent oxide conductor), an oxide semiconductor (also simply referred to as an OS), and the like. For example, in the case where a metal oxide is used in an active layer of a transistor, the metal oxide is referred to as an oxide semiconductor in some cases. That is, an OS FET can also be called a transistor including a metal oxide or an oxide semiconductor.

In this specification and the like, In:Ga:Zn=4:2:3 or a neighborhood thereof refers to an atomic ratio where, when In is 4 with respect to the total number of atoms, Ga is greater than or equal to 1 and less than or equal to 3 ($1 \leq Ga \leq 3$) and Zn is greater than or equal to 2 and less than or equal to 4.1 ($2 \leq Zn \leq 4.1$). Furthermore, In:Ga:Zn=5:1:6 or a neighborhood thereof refers to an atomic ratio where, when In is 5 with respect to the total number of atoms, Ga is greater than 0.1 and less than or equal to 2 ($0.1 < Ga \leq 2$) and Zn is greater than or equal to 5 and less than or equal to 7 ($5 \leq Zn \leq 7$). Furthermore, In:Ga:Zn=1:1:1 or a neighborhood thereof refers to an atomic ratio where, when In is 1 with respect to the total number of atoms, Ga is greater than 0.1 and less than or equal to 2 ($0.1 < Ga \leq 2$) and Zn is greater than 0.1 and less than or equal to 2 ($0.1 < Zn \leq 2$).

Embodiment 1

In this embodiment, a structure, a manufacturing method, a circuit configuration, and an operation of a semiconductor device of one embodiment of the disclosed invention are described with reference to FIG. 1 to FIG. 60C.

Memory Transistor MT and Memory Cell Array
700

Figure 2A:
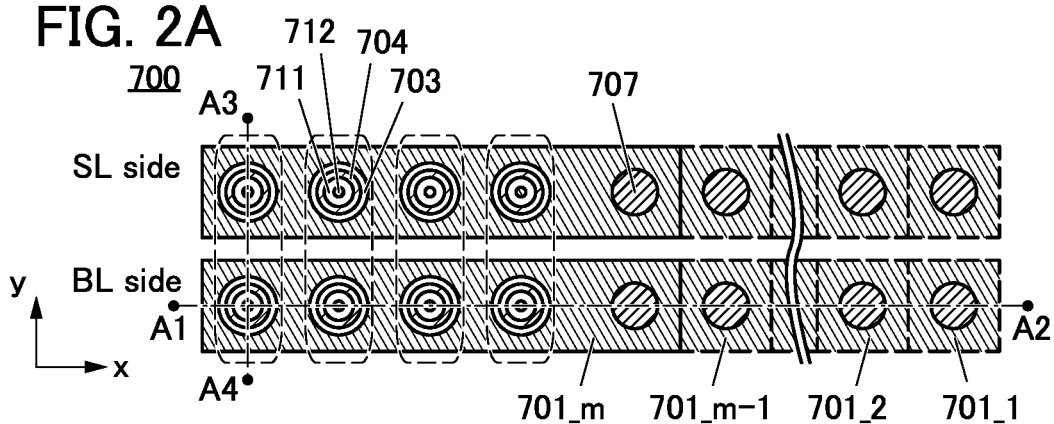
FIG. 2A is a top view illustrating a semiconductor device of one embodiment of the present invention.
Figure 2B:
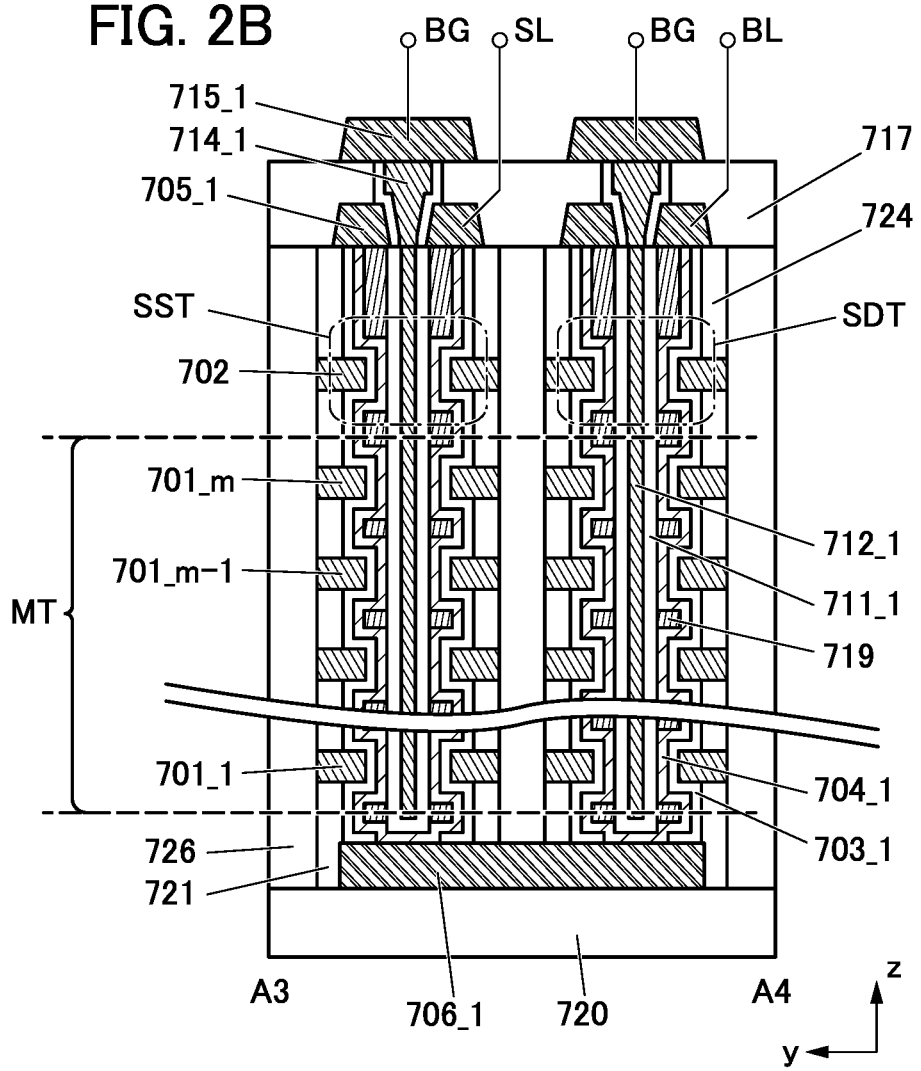
FIG. 2B is a cross-sectional view illustrating the semiconductor device of one embodiment of the present invention.
Figure 3A:
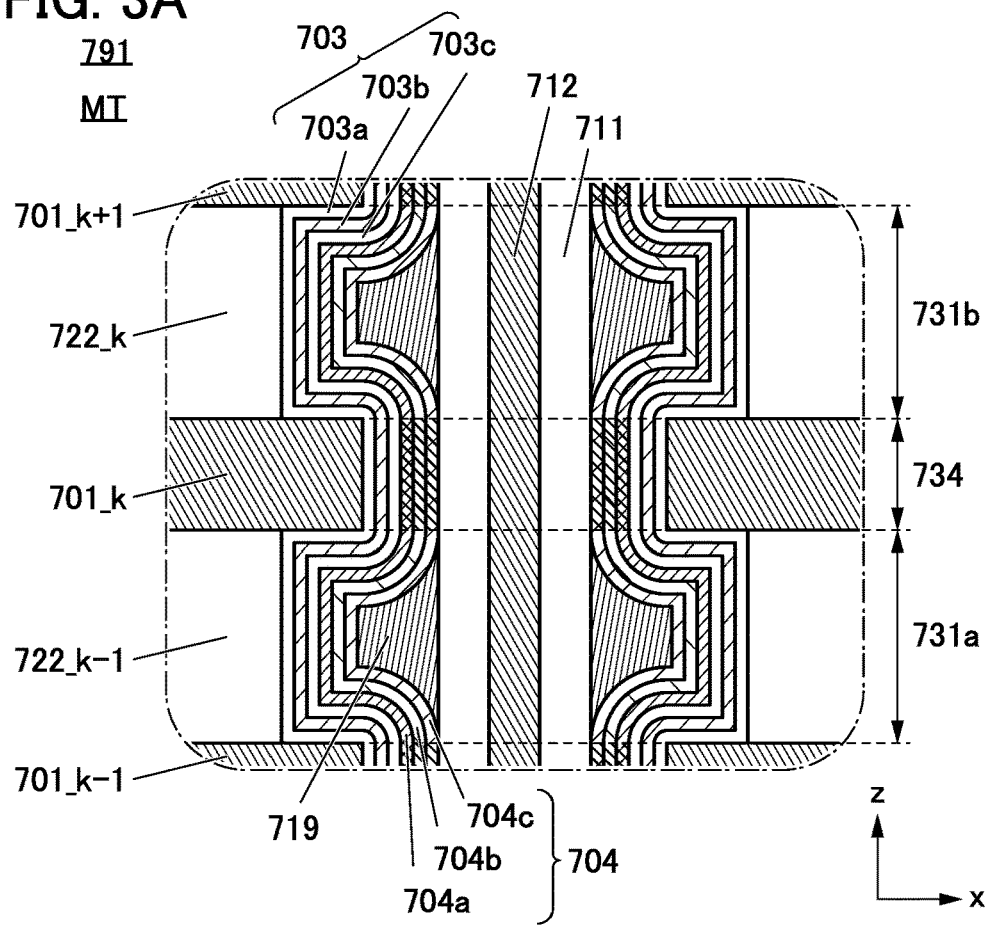
FIG. 3A and FIG. 3B are cross-sectional views illustrating a semiconductor device of one embodiment of the present invention.
Figure 3B:
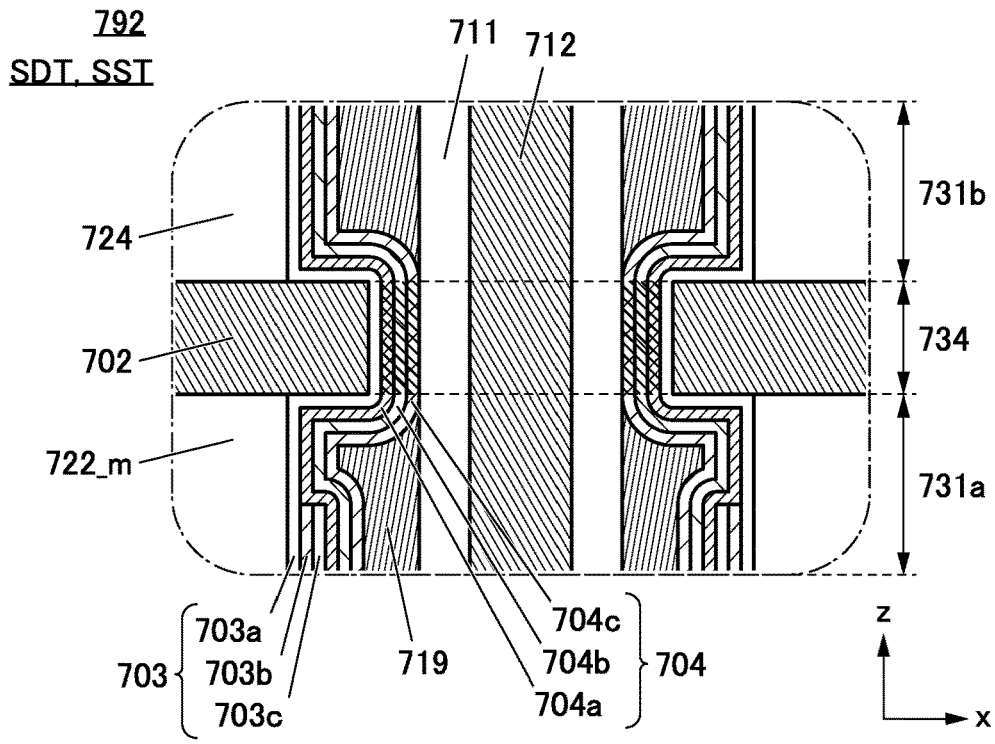

First, the structures of a memory transistor MT of a semiconductor device and a memory cell array 700 are described with reference to FIG. 1 to FIG. 3B. FIG. 1 is a cross-sectional view of the memory cell array 700. FIG. 2A is a top view of the memory cell array 700. Note that FIG. 2A is a top view of a plane indicated by the dashed-dotted line A5-A6 in FIG. 1 and some components are not shown. FIG. 1 is a cross-sectional view of a portion indicated by the dashed-dotted line A1-A2 in FIG. 2A. FIG. 2B is a cross-sectional view of a portion indicated by the dashed-dotted line A3-A4 in FIG. 2A and is a cross-sectional view illustrating an example of a memory string. FIG. 3A is an enlarged cross-sectional view of a portion surrounded by a dashed-dotted line 791 in FIG. 1 and is a diagram illustrating an example of the memory transistor MT serving as a memory cell. FIG. 3B is an enlarged cross-sectional view of a portion surrounded by a dashed-dotted line 792 in FIG. 1 and is a diagram illustrating an example of a transistor serving as a selection transistor. Note that in the following description, a rectangular coordinate system using an x-axis, a y-axis, and a z-axis is set as shown in FIG. 1 and FIG. 2 for the sake of convenience. Here, the x-axis and the y-axis are parallel to a top surface of a base 720 provided with the memory cell array 700 and the z-axis is perpendicular to the top surface of the base 720.

The memory cell array 700 includes conductors 706 (a conductor 706_1 to a conductor 706_4) and an insulator 721 over the base 720 and includes a stack in which conductors 701 (a conductor 701_1 to a conductor 701_$m$; m is a natural number of greater than or equal to 2) and insulators 722 (an insulator 722_1 to an insulator 722_$m$) are alternately stacked over the insulator 721. The memory cell array 700 includes a conductor 702 over the stack and includes an insulator 724 over the conductor 702 and the stack.

The memory cell array 700 includes a plurality of opening portions that are formed to penetrate the insulator 724, the conductor 702, the stack, and the insulator 721. In FIG. 1, four opening portions are shown. The opening portions are provided in positions that overlap with the conductors 706. The memory cell array 700 includes insulators 703 (an insulator 703_1 to an insulator 703_4) inside the opening portions, oxides 704 (an oxide 704_1 to an oxide 704_4) located inward from the insulators 703, and insulators 711 (an insulator 711_1 to an insulator 711_4) located inward from the oxides 704. The memory cell array 700 includes conductors 719 between the oxides 704 and the insulators 711. As described later, the conductors 719 have a function of blocking a microwave. The memory cell array 700 includes conductors 712 (a conductor 712_1 to a conductor 712_4) located inward from the insulators 711.

The memory cell array 700 includes conductors 705 (a conductor 705_1 to a conductor 705_4) over the insulator 724. In FIG. 1, the conductor 705_1 to the conductor 705_4 are electrically connected to the oxide 704_1 to the oxide 704_4, respectively. The conductor 706_1 to the conductor 706_4 are electrically connected to the oxide 704_1 to the oxide 704_4, respectively.

The memory cell array 700 includes a conductor 710 and conductors 708 (a conductor 708_1 to a conductor 708_$m$) over the insulator 724. The conductor 710 is electrically connected to the conductor 702 through a conductor 709. The memory cell array 700 further includes an insulator 717 over the insulator 724, the conductors 705, the conductors 708, and the conductor 710. In regions overlapping with the conductors 712 and in the vicinities thereof, a plurality of insulators 713 and a plurality of conductors 714 are provided to be embedded in the insulator 717. In the x-axis direction, the conductor 714 includes a region that overlaps with the insulator 717 with the insulator 713 positioned therebetween.

The memory cell array 700 includes a plurality of conductors 715 over the insulator 717. The conductors 715 are electrically connected to the conductors 712 through the conductors 714.

In the memory cell array 700 shown in FIG. 1, conductors 707 (a conductor 707_1 to a conductor 707_$m$) are provided to be embedded in the insulator 724. The conductor 708_1 to the conductor 708_$m$ are electrically connected to the conductor 701_1 to the conductor 701_$m$ through the conductor 707_1 to the conductor 707_$m$, respectively. Note that in FIG. 1 and FIG. 2, four or more stages of the conductors 701 are illustrated to show a plurality of the conductors 701; however, this embodiment is not limited to FIG. 1 and at least two stages of the conductors 701 are provided.

Here, as shown in FIG. 1 and FIG. 2A, the conductor 701 is provided to extend in the x-axis direction. As shown in FIG. 1 and FIG. 2B, the insulator 703 and the oxide 704 are provided to extend in the z-axis direction along a side surface of the opening that is formed to penetrate the insulator 724, the conductor 702, the stack, and the insulator 721. That is, it is preferable that the conductor 701 be provided to perpendicularly intersect with the insulator 703 and the oxide 704. Furthermore, as shown in FIG. 1, the conductor 707 is provided to extend in the z-axis direction. The conductor 708 may be provided to extend in the y-axis direction. In addition, a conductor serving as a bit line BL connected to the conductor 705 may be provided to extend in the y-axis direction. Part of the conductor 705 may serve as the bit line BL and the conductor 705 may be provided to extend in the y-axis direction.

The conductor 712 is formed in a columnar shape and provided to extend in the z-axis direction. In addition, the insulator 711 is provided to surround the conductor 712, the oxide 704 is provided to surround the insulator 711, and the insulator 711 and the oxide 704 are provided to extend in the z-axis direction. In other words, the conductor 712 as a core is provided inward from the columnar oxide 704 that is provided to extend in the z-axis direction, and the insulator 711 is provided between the oxide 704 and the conductor 712. Furthermore, the insulator 703 is provided to surround a periphery of the side of the columnar oxide 704. The conductor 707 is formed in a columnar shape and provided to extend in the z-axis direction.

The diameter of the opening formed in the insulator 721, the insulators 722, and the insulator 724 is larger than the diameter of the opening formed in the conductors 701 and the conductor 702, and it can be said that the insulators have recessions with respect to side surfaces of the conductors. The conductors 719 are provided at the side surfaces of the insulator 721, the insulators 722, and the insulator 724 with the insulator 703 and the oxide 704 provided therebetween. That is, the insulator 703 and the oxide 704 are provided at the side surfaces of the insulator 721, the conductors 701, the insulators 722, the conductor 702, and the insulator 724 along the recessions, and the conductors 719 are provided inside the recessions with the insulator 703 and the oxide 704 provided between the conductors 719 and the insulators. The conductors 719 are in contact with regions of the oxide 704, thereby reducing the resistance of the regions and forming low-resistance regions. The low-resistance regions are sometimes referred to as N-type regions. The conductors 719 preferably have an effect of inhibiting passage of a microwave. When the oxide 704 is irradiated with a microwave, the carrier concentration of the oxide 704 is reduced and a high-resistance region, i.e., an I-type region, can be formed in the oxide 704. The carrier concentration of the I-type region irradiated with a microwave is preferably lower than $1\times10^{18}/cm^3$, further preferably lower than or equal to $1\times10^{17}/cm^3$, still further preferably lower than or equal to $1\times10^{16}/cm^3$. Owing to the conductors 719 serving as blocking bodies during microwave irradiation, the N-type regions can maintain their low resistance. Accordingly, in the oxide 704, the N-type regions and the I-type regions are alternately provided in the z-axis direction. Such a structure is sometimes referred to as an N-I-N junction. Owing to the low-resistance regions of the oxide 704, in the memory string or memory cell array where the memory cells are stacked, the series resistance between the memory cells can be reduced.

When the oxide 704 is irradiated with a microwave under an atmosphere containing oxygen and argon, the hydrogen concentration of the oxide 704 is reduced and the carrier concentration is reduced. This is probably because hydrogen in the oxide 704 is bonded to oxygen to be a water molecule or a hydroxide ion and be released from the oxide 704. Oxygen in the atmosphere is probably supplied to oxygen vacancies that have been generated in the oxide 704 by the release of a water molecule or a hydroxide ion, whereby the oxide 704 has increased resistance to be the high-resistance region, i.e., the I-type region.

During the microwave treatment, thermal energy might be directly transferred to the oxide 704 owing to electromagnetic interaction between the microwave and the molecules in the oxide 704. This thermal energy heats the oxide 704 in some cases. Such heat treatment is sometimes referred to as microwave annealing. When microwave treatment is performed in an atmosphere containing oxygen, an effect equivalent to that of oxygen annealing might be obtained. In the case where the oxide 704 contains hydrogen, the thermal energy might be transferred to hydrogen in the oxide 704, in which case the resultantly activated hydrogen is released from the oxide 704.

By contrast, in the oxide 704 covered with the conductors 719, which block the microwave, the hydrogen concentration and carrier concentration are not reduced and the N-type regions can maintain their low resistance value. Here, the carrier concentration of the N-type regions is preferably higher than or equal to $1\times10^{18}/cm^3$, further preferably higher than or equal to $1\times10^{19}/cm^3$, still further preferably higher than or equal to $1\times10^{20}/cm^3$.

The columnar oxide 704 is, in the z-axis direction, electrically connected to the conductor 706 at the lower end and electrically connected to the conductor 705 at the upper end. As shown in FIG. 2B, the conductor 706 is electrically connected to the lower ends of two adjacent columnar oxides 704, and the upper ends of the two columnar oxides 704 are electrically connected to the respective conductors 705 that are electrically separated from each other. In this embodiment, the U-shaped memory string in which the two columnar oxides 704 are electrically connected to each other through the conductor 706 is described; however, the present invention is not limited thereto. For example, the conductor 706 may serve as one of the bit line BL and a source line SL and the conductor 705 may serve as the other of the bit line BL and the source line SL. In this case, the conductor 706 may be electrically connected to a plurality of the columnar oxides 704 or one columnar oxide 704. Furthermore, the conductor 705 may be electrically connected to the plurality of columnar oxides 704 or one columnar oxide 704.

In the case where the lower end of the columnar oxide 704 is electrically connected to one of the bit line BL and the source line SL and the upper end thereof is electrically connected to the other, selection transistors are preferably provided at around the lower end and upper end of the columnar oxide 704. For example, in the case where the conductor 706 serves as part of the bit line BL and the conductor 705 serves as part of the source line SL, a selection transistor SST is provided between the conductor 706 and the memory transistor MT and a selection transistor SDT is provided between the conductor 705 and the memory transistor MT.

Here, a region where the conductor 701 crosses the insulator 703 and the oxide 704 and the vicinity of the region serve as the memory transistor MT. A region where the conductor 702 crosses the insulator 703 and the oxide 704 and the vicinity of the region serve as the selection transistor. The channel length directions of the memory transistor MT and the selection transistor are parallel to the z-axis. The memory transistor MT and the selection transistor are electrically connected in series to form the memory string.

FIG. 3A is an enlarged cross-sectional view of a portion surrounded by the dashed-dotted line 791 in FIG. 1 and is a diagram showing a cross section of the memory transistor MT in the k-th stage (k is an integer of greater than or equal to 2 and less than or equal to m−1). The memory transistor MT includes the conductor 701_k, the insulator 703 (an insulator 703a, an insulator 703b, and an insulator 703c), and the oxide 704 (an oxide 704a, an oxide 704b, and an oxide 704c). In addition, the memory transistor MT may include the conductor 712 and the insulator 711.

The conductor 701_k serves as a gate of the memory transistor MT, the insulator 703a serves as a gate insulating layer, the insulator 703b serves as a charge accumulation layer, and the insulator 703c serves as a tunnel insulating layer.

Although the details are described later, the oxide 704 includes the oxide 704a, the oxide 704b, and the oxide 704c, and the oxide 704a has an energy gap relatively wider than that of the oxide 704b, and the oxide 704c has an energy gap relatively wider than that of the oxide 704b. In other words, the oxide 704b has an energy gap relatively narrower than those of the oxide 704a and the oxide 704c.

In the oxide 704, a region 734 that overlaps with the conductor 701_k in the x-axis direction serves as a channel formation region. Furthermore, in the oxide 704, regions 731 (a region 731a and a region 731b) which overlap with the conductors 719 in the x-axis direction serve as the low-resistance regions. In the oxide 704, a region positioned between the region 734 and the region 731 serves as a junction region. The resistance of this region is preferably lower than that of the region 734. Furthermore, the resistance value of the region may be substantially equal to or higher than that of the region 731. The region may serve as a channel formation region like the region 734 or serve as a low-resistance region like the region 731.

The memory transistor MT in the k-th stage shares the low-resistance region with the memory transistor MT in the k−1-th stage or the memory transistor MT in the k+1-th stage. The oxide 704 has a structure where the channel formation regions and the low-resistance regions are alternately formed. Owing to the low-resistance regions of the oxide 704, in the memory string or memory cell array where the memory cells are stacked, the series resistance between the memory cells can be reduced.

In the case where the conductor 712 is provided, the conductor 701_k serves as a first gate and the conductor 712 serves as a second gate. Note that the first gate is referred to as simply a gate or a control gate, and the second gate is referred to as a back gate in some cases. The insulator 711 is provided between the oxide 704 and the conductor 712 and serves as a second gate insulating layer. At this time, the insulator 703*a* serves as a first gate insulating layer. Power consumption of the memory transistor MT can be reduced by control of the potential of the conductor 712 that serves as the second gate in the circuit operation of the memory transistor MT.

FIG. 3B is an enlarged cross-sectional view of a portion surrounded by the dashed-dotted line 792 in FIG. 1 and is a diagram showing a cross section of the selection transistor (the bit-line-side transistor SDT and the source-line-side transistor SST). The selection transistor includes the conductor 702, the insulator 703 (the insulator 703*a*, the insulator 703*b*, and the insulator 703*c*), and the oxide 704 (the oxide 704*a*, the oxide 704*b*, and the oxide 704*c*). In addition, the selection transistor may include the conductor 712 and the insulator 711.

The conductor 702 serves as a gate of the selection transistor and the insulator 703*a* serves as a gate insulating layer. As the gate insulating layer, at least the insulator 703*a* is provided, and the insulator 703*b* and the insulator 703*c* are not necessarily provided. Alternatively, after the insulator 703*a*, the insulator 703*b*, and the insulator 703*c* are provided, the insulator 703*b* and the insulator 703*c* may be partly removed.

The oxide 704 includes the oxide 704*a*, the oxide 704*b*, and the oxide 704*c*, and the oxide 704*a* has an energy gap relatively wider than that of the oxide 704*b*, and the oxide 704*c* has an energy gap relatively wider than that of the oxide 704*b*. In other words, the oxide 704*b* has an energy gap relatively narrower than those of the oxide 704*a* and the oxide 704*c*.

In the oxide 704, the region 734 that is positioned in the same layer as the conductor 702 serves as a channel formation region. Furthermore, in the oxide 704, the regions 731 (the region 731*a* and the region 731*b*) covered with the conductors 719 serve as low-resistance regions.

In the case where the conductor 712 is provided, the conductor 702 serves as a first gate and the conductor 712 serves as a second gate. Note that the first gate is referred to as simply a gate or a top gate, and the second gate is referred to as a back gate in some cases. The insulator 711 is provided between the oxide 704 and the conductor 712 and serves as a second gate insulating layer. At this time, the insulator 703*a* serves as a first gate insulating layer. With the conductor 712 that serves as the second gate, the threshold voltage of the selection transistor can be controlled.

Note that the structure of the semiconductor device in this embodiment is an example, and the present invention is not limited to the number, the position, and the like of the circuit element, the wiring, and the like shown in the drawings and the like according to this embodiment. The number, the position, and the like of the circuit element, the wiring, and the like included in the semiconductor device in this embodiment can be set as appropriate in accordance with the circuit configuration and the driving method.

The base 720 provided with the memory cell array 700 preferably has an insulating surface. As a substrate having an insulating surface, a semiconductor substrate provided with an insulator on its surface, an insulator substrate, a conductor substrate provided with an insulator on its surface, or the like is used. For the semiconductor substrate, a semiconductor substrate containing silicon, germanium, or the like or a semiconductor substrate containing silicon carbide, silicon germanium, gallium arsenide, indium phosphide, zinc oxide, gallium oxide, or the like may be used, for example. As the insulator substrate, a glass substrate, a quartz substrate, a sapphire substrate, a stabilized zirconia substrate (e.g., an yttria-stabilized zirconia substrate), or a resin substrate may be used, for example. In addition, a substrate in which an insulator region is included in the above semiconductor substrate, for example, an SOI (Silicon On Insulator) substrate or the like may be used. As the conductor substrate, a graphite substrate, a metal substrate, an alloy substrate, a conductive resin substrate, or the like may be used.

The conductor 701 serves as the gate of the memory transistor MT and is electrically connected to a word line. That is, the conductor 701, the conductor 707, and the conductor 708 also serve as part of the word line. Here, the conductors 701 are preferably provided in a step-like shape where the conductor 701 in a lower layer extends to be closer to the A2 side than the conductor 701 in an upper layer is, as shown in FIG. 1. In the case where the conductors 701 are provided in this manner, the conductor 701 in an upper layer does not overlap with a region of part of a top surface of the conductor 701 in a lower layer and thus, the region of the conductor 701 in each layer can be connected to the conductor 707.

For the conductor 701, a conductive material such as silicon to which an impurity is added or a metal can be used. When silicon is used for the conductor 701, amorphous silicon or polysilicon can be used. Furthermore, a p-type impurity or an n-type impurity may be added to impart conductivity to silicon. As a conductive material containing silicon, silicide containing titanium, cobalt, or nickel can be used for the conductor 701. When a metal material is used for the conductor 701, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

The conductor 702 is provided over the conductor 701. The conductor 702 serves as the gate of the selection transistor (the bit-line-side selection transistor SDT and the source-line-side selection transistor SST) and is electrically connected to a wiring DGL or a wiring SGL. That is, the conductor 702, the conductor 709, and the conductor 710 also serve as part of the wiring DGL or the wiring SGL. For the conductor 702, a material similar to that for the conductor 701 can be used. As the conductor 702, a material that is the same as or different from that of the conductor 701 may be used. The materials for the conductor 701 and the conductor 702 are determined in accordance with the usage, with their work functions and the like taken into consideration.

As the insulator 721, the insulator 722, the insulator 724, and other insulators provided in the upper layer and the lower layer of the conductor 701 and the conductor 702, an oxide, a nitride, an oxynitride, a nitride oxide, a metal oxide, a metal oxynitride, a metal nitride oxide, or the like which has an insulating property can be used. Silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, or a resin has a low relative permittivity and thus is preferably used for the insulators.

By contrast, although usable as the insulators, aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, and the like have a high relative permittivity and parasitic capacitance might thus be generated between the conductors 701 or between the conductor 701 and the conductor 702. The material used for the insulators can be determined in accordance with the design or the usage of the device.

The insulator 703 includes the insulator 703a, the insulator 703b, and the insulator 703c. The insulator 703a is provided on the conductor 701 side, the insulator 703c is provided on the oxide 704 side, and the insulator 703b is provided between the insulator 703a and the insulator 703c. The insulator 703a serves as a gate insulating layer, the insulator 703b serves as a charge accumulation layer, and the insulator 703c serves as a tunnel insulating layer.

Note that the selection transistor may have the same structure as the memory transistor MT. By contrast, the charge accumulation layer and the tunnel insulating layer are not necessarily provided in the selection transistor as shown in FIG. 3B. The bit-line-side transistor SDT and the source-line-side transistor SST may have a structure in which the insulator 703b and the insulator 703c are removed and only the insulator 703a is provided as the insulator 703. The conductor 712 may be provided as the second gate electrode. In this case, the conductor 702 serves as the first gate electrode, the insulator 703a serves as the first gate insulating film, and the insulator 711 serves as the second gate insulating film. With the conductor 712, the threshold voltage of the selection transistor can be controlled.

For the insulator 703a, silicon oxide or silicon oxynitride is preferably used. Aluminum oxide, hafnium oxide, or an oxide containing aluminum and hafnium may be used. Alternatively, a stack of these materials may be used for the insulator 703a.

For the insulator 703b, a material serving as a charge accumulation layer is preferably used, and silicon nitride or silicon nitride oxide is preferably used. Aluminum oxide, hafnium oxide, or an oxide containing aluminum and hafnium may be used.

For the insulator 703c, silicon oxide or silicon oxynitride is preferably used. Aluminum oxide, hafnium oxide, or an oxide containing aluminum and hafnium may be used. Alternatively, a stack of these materials may be used for the insulator 703c. Furthermore, the insulator 703c is preferably thinner than the insulator 703a. Although details are described later, in writing or erasing data to/from the memory transistor MT, charge is transferred between the oxide 704 and the insulator 703b through the insulator 703c. That is, the insulator 703c serves as a tunnel insulating layer.

Specifically, in the case where the insulator 703 is formed in the opening provided in the stack including the conductor 701, the conductor 702, and the insulating films, the insulator 703 formed at the bottom portion of the opening needs to be removed by anisotropic etching using dry etching or the like. In anisotropic etching, a side surface of the insulator 703c is also exposed to plasma, a radical, a gas, a chemical solution, or the like. When they damage the side surface of the insulator 703c, trap centers might be generated in the insulator 703c and might affect the electrical characteristics of the transistor. To inhibit the generation of the trap centers, the side surface of the insulator 703c is required to be highly resistant to damage from etching. In this case, for the insulator 703c, aluminum oxide, a stack of silicon oxide and aluminum oxide, or a stack of silicon oxynitride and aluminum oxide is preferably used.

The insulator 703a, the insulator 703b, and the insulator 703c can be formed by an ALD (Atomic Layer Deposition) method or a CVD (Chemical Vapor Deposition) method. To prevent contamination of the interfaces between the insulator 703a, the insulator 703b, and the insulator 703c, these insulators are preferably deposited in succession in the same chamber or with a multi-chamber deposition apparatus including a plurality of chambers without exposure to an air atmosphere.

As the oxide 704, a metal oxide serving as an oxide semiconductor (hereinafter also referred to as an oxide semiconductor) is preferably used. An oxide semiconductor is preferable because favorable on-state characteristics and high mobility of a transistor can be obtained as compared to a semiconductor made of silicon or the like.

As the oxide 704, for example, a metal oxide such as an In-M-Zn oxide including indium, an element M, and zinc (the element M is one or more kinds selected from aluminum, gallium, yttrium, tin, copper, vanadium, beryllium, boron, titanium, iron, nickel, germanium, zirconium, molybdenum, lanthanum, cerium, neodymium, hafnium, tantalum, tungsten, magnesium, and the like) is preferably used. In—Ga oxide, In—Zn oxide, or indium oxide may be used as the oxide 704. For example, an oxide containing indium, gallium, and zinc (sometimes referred to as In—Ga—Zn oxide), In—Ga—Zn oxide containing tin, or the like can be used as the oxide 704.

A semiconductor device including the above metal oxide, particularly In—Ga—Zn oxide, has an operation temperature of higher than or equal to −40° C. and lower than or equal to 190° C., which means extremely high heat resistance. The use of such a metal oxide in a memory device makes it possible to obtain a highly reliable memory device that has favorable characteristics in a wide temperature range. In other words, a memory device with favorable heat resistance can be obtained. This heat resistance is higher than the heat resistance of a phase change memory (PCM) (higher than or equal to −40° C. and lower than or equal to 150° C.), the heat resistance of a resistance random access memory (ReRAM) (higher than or equal to −40° C. and lower than or equal to 125° C.), the heat resistance of a magnetoresistive random access memory (MRAM) (higher than or equal to −40° C. and lower than or equal to 105° C.), or the like.

The oxide 704 preferably includes the oxide 704a provided on the insulator 703c side, the oxide 704b provided inward from the oxide 704a, and the oxide 704c provided inward from the oxide 704b. At this time, as the oxide 704a, an oxide having an energy gap relatively wider than that of the oxide 704b is preferably used. Furthermore, as the oxide 704c, an oxide having an energy gap relatively wider than that of the oxide 704b is preferably used. Here, in some cases, an oxide having a wide energy gap is referred to as an oxide that is a wide gap, and an oxide having a narrow energy gap is referred to as an oxide that is a narrow gap.

In FIG. 3A and FIG. 3B, the oxide 704 has a three-layer structure of the oxide 704a, the oxide 704b, and the oxide 704c; however, the present invention is not limited thereto. The oxide 704 may have a single-layer structure of any one of the oxide 704a, the oxide 704b, and the oxide 704c, a two-layer structure of the oxide 704a and the oxide 704b, or a stacked-layer structure of four or more layers.

In the case where the oxide 704a and the oxide 704c are wide gaps and the oxide 704b is a narrow gap, an energy at the conduction band minimum of each of the oxide 704a and the oxide 704c is preferably higher than an energy at the conduction band minimum of the oxide 704b. In other words, the electron affinity of each of the oxide 704a and the oxide 704c is preferably lower than the electron affinity of the oxide 704b.

The oxide 704a, the oxide 704b, and the oxide 704c are preferably combined to have different atomic ratios of metal atoms. Specifically, the atomic ratio of the element M to the constituent elements in the metal oxide used for each of the oxide 704a and the oxide 704c is preferably higher than the atomic ratio of the element M to the constituent elements in the metal oxide used for the oxide 704b. The atomic ratio of the element M to In in the metal oxide used as each of the oxide 704a and the oxide 704c is preferably higher than the atomic ratio of the element M to In in the metal oxide used as the oxide 704b. The atomic ratio of In to the element M in the metal oxide used as the oxide 704b is preferably higher than the atomic ratio of In to the element M in the metal oxide used as each of the oxide 704a and the oxide 704c.

As the oxide 704a and the oxide 704c, for example, a metal oxide having a composition In:Ga:Zn=1:3:4, In:Ga:Zn=1:3:2, or In:Ga:Zn=1:1:1, or a composition which is in the neighborhood thereof can be used. As the oxide 704b, for example, a metal oxide having a composition In:Ga:Zn=4:2:3 to 4:2:4.1, In:Ga:Zn=1:1:1, or In:Ga:Zn=5:1:6, or a composition which is in the neighborhood thereof can be used. The oxide 704a, the oxide 704b, and the oxide 704c are preferably combined to satisfy the above relation of the atomic ratios. For example, it is preferable that the oxide 704a and the oxide 704c be a metal oxide having a composition In:Ga:Zn=1:3:4 or a composition which is in the neighborhood thereof and the oxide 704b be a metal oxide having a composition In:Ga:Zn=4:2:3 to 4:2:4.1 or a composition which is in the neighborhood thereof. Note that the above composition represents the atomic ratio of an oxide formed over a base or the atomic ratio of a sputtering target.

It is also preferable that a CAAC-OS described later be used as the oxide 704a and the oxide 704c and a CAC-OS be used as the oxide 704b. In the case where the CAAC-OS is used as the oxide 704a and the oxide 704c, the c-axes are preferably aligned parallel to the x-y plane shown in FIG. 1, FIG. 2, and the like, that is, perpendicular to the z-axis, and preferably aligned from the side surface of the opening to the central portion.

Here, in a junction portion of the oxide 704a and the oxide 704b and a junction portion of the oxide 704c and the oxide 704b, the conduction band minimum is gradually varied. In other words, the conduction band minimum in the junction portion of the oxide 704a and the oxide 704b and the junction portion of the oxide 704c and the oxide 704b is continuously varied or continuously connected. To obtain this, the density of defect states in a mixed layer formed at the interface between the oxide 704a and the oxide 704b and the interface between the oxide 704c and the oxide 704b is preferably made low.

Specifically, when the oxide 704a, the oxide 704b, and the oxide 704c contain the same element (as a main component) in addition to oxygen, a mixed layer with a low density of defect states can be formed. For example, in the case where the oxide 704b is In—Ga—Zn oxide, In—Ga—Zn oxide, Ga—Zn oxide, gallium oxide, or the like is preferably used for the oxide 704a and the oxide 704c. Accordingly, the density of defect states at the interface between the oxide 704a and the oxide 704b and the interface between the oxide 704c and the oxide 704b can be made low. Thus, the influence of interface scattering on carrier conduction is small, and the memory transistor MT can have a high on-state current.

Note that the details of the metal oxide that can be used as the oxide 704 are described later.

FIG. 3A is an enlarged view of the memory transistor MT surrounded by the dashed-dotted line 791 in FIG. 1. As shown in FIG. 3A, the oxide 704b is provided to be sandwiched between the oxide 704a and the oxide 704c. In such a structure, carriers mainly flow in the component having a narrow gap when the carriers flow in the oxide 704 from the conductor 705 toward the conductor 706 or from the conductor 706 toward the conductor 705. Thus, with the above structure, the oxide 704b that is a narrow gap is sandwiched between the oxide 704a and the oxide 704c that are wide gaps, whereby carriers flowing through the oxide 704 can be confined in the oxide 704b. This enables high current drive capability in the on state of the transistor, i.e., a high on-state current and high field-effect mobility.

The oxide 704a is provided between the oxide 704b and the insulator 703c, whereby the oxide 704b serving as a carrier path and the insulator 703c are not in direct contact with each other, so that the formation of trap centers can be inhibited. The trap centers formed at the interface between the semiconductor (oxide semiconductor) and the insulator trap electrons and cause the threshold voltage of the transistor to shift in the positive direction, which might adversely affect the reliability and the on-off characteristics of the transistor. Thus, the electrical characteristics of a transistor including the oxide are not affected by the trap centers, so that higher current drive capability in the on state, i.e., a higher on-state current and higher field-effect mobility can be obtained. Furthermore, the transistor and a semiconductor device including the transistor can have high reliability.

To provide the low-resistance regions in the oxide 704, the conductors 719 are preferably provided to be in contact with part of the oxide 704. The conductors 719 are provided at the side surfaces of the insulator 721, the insulators 722, and the insulator 724 with the insulator 703 and the oxide 704 provided therebetween. Although the details are described later, the diameter of the opening formed in the insulator 721, the insulators 722, and the insulator 724 is larger than the diameter of the opening formed in the conductors 701 and the conductor 702, and the conductors 719 exist only in the same layers as the insulator 721, the insulators 722, and the insulator 724. Accordingly, the oxide 704 partly has regions in contact with the conductors 719.

The conductors 719 preferably have at least one of a function of supplying hydrogen to the oxide 704, a function of supplying nitrogen to the oxide 704, and a function of extracting oxygen from the oxide 704. The conductors 719 having such a function are in contact with the oxide 704, whereby carriers are generated in the oxide 704.

Specifically, oxygen is extracted from the oxide 704, whereby oxygen vacancies are generated in the oxide 704. When hydrogen is trapped by these oxygen vacancies, carriers are generated. Alternatively, in the case where nitrogen is trapped by the generated oxygen vacancies, nitrogen is substituted for oxygen bonded to two indium atoms. When nitrogen is bonded to these two indium atoms, it is probable that nitrogen has an unpaired electron and serves as a carrier.

As the conductors 719 having a function of extracting oxygen from the oxide 704, a material containing one or more of tantalum, tungsten, titanium, and aluminum can be used. Alternatively, a nitride or an oxide containing one or more of tantalum, tungsten, titanium, and aluminum can be used. Specifically, tantalum nitride, tungsten nitride, titanium nitride, aluminum nitride, a nitride containing aluminum and tantalum, a nitride containing aluminum and titanium, aluminum oxide, tantalum oxide, or the like can be used. The use of a metal nitride as the conductors 719 enables extraction of oxygen from the oxide 704 and supply of nitrogen to the oxide 704.

Hydrogen contained in the insulator 703, the insulator 721, the insulator 722, and the insulator 724 may be supplied to the oxide 704. Alternatively, a material formed using a gas containing hydrogen when the material is formed can be used for the conductors 719. For example, silicon, silicon oxide, silicon oxynitride, silicon nitride, silicon nitride oxide, or the like formed using monosilane, disilane, ammonia, or the like can be used. Such a material preferably has a function of blocking a microwave.

After the oxide 704 is provided in contact with the conductors 719, heat treatment is preferably performed. Performing the heat treatment promotes extraction of oxygen, supply of hydrogen, or supply of nitrogen and can reduce the resistance of part of the oxide 704 efficiently. As described above, owing to the low-resistance regions provided for the oxide 704, in the memory string or memory cell array where the memory cells are stacked, the series resistance between the memory cells can be reduced.

Heat treatment is preferably performed under an atmosphere containing nitrogen in a state where the region 731 is in contact with a metal film, a nitride film containing a metal element, or an oxide film containing a metal element. By the heat treatment, the metal element is diffused from the metal film, the nitride film containing the metal element, or the oxide film containing the metal element into the region 731 of the oxide 704; thus, the metal element can be added to the region 731. Note that at this time, the region 731 of the oxide 704 may be alloyed with the metal element. When the region 731 of the oxide 704 is alloyed with the metal element, the metal element added to the oxide semiconductor is brought into a relatively stable state; therefore, a highly reliable semiconductor device can be provided.

To provide the oxide 704 with the I-type region, the conductors 719 preferably block a microwave and serve as masks for the oxide 704.

When treatment for increasing resistance is performed on the oxide 704 that is not covered with the conductors 719, the region 734 serving as the high-resistance region is formed in the oxide 704. For the treatment for increasing resistance, a method by which oxygen is supplied to the oxide 704 or a method by which hydrogen is extracted from the oxide 704 is employed, for example.

When microwave treatment is performed on the oxide 704 under an atmosphere containing at least oxygen, the carrier concentration of the oxide 704 is reduced and the high-resistance region can be formed. The atmosphere under which the microwave treatment is performed may be an atmosphere containing oxygen and argon. It is preferable that the microwave treatment make the carrier concentration of the oxide 704 lower than $1\times10^{18}/cm^3$, further preferably lower than or equal to $1\times10^{17}/cm^3$, still further preferably lower than or equal to $1\times10^{16}/cm^3$.

By the microwave treatment, hydrogen in the oxide 704 is bonded to oxygen to be a water molecule or a hydroxide ion and be released from the oxide 704. Oxygen in the atmosphere is probably supplied to oxygen vacancies that have been generated in the oxide 704 by the release of a water molecule or a hydroxide ion, whereby the oxide 704 has increased resistance and the region 734 becomes the high-resistance region, i.e., the I-type region.

During the microwave treatment, thermal energy might be directly transferred to the oxide 704 owing to electromagnetic interaction between the microwave and the molecules in the oxide 704. This thermal energy heats the oxide 704 in some cases. Such heat treatment is sometimes referred to as microwave annealing. When microwave treatment is performed in an atmosphere containing oxygen, an effect equivalent to that of oxygen annealing might be obtained. In the case where the oxide 704 contains hydrogen, the thermal energy might be transferred to hydrogen in the oxide 704, in which case the resultantly activated hydrogen is released from the oxide 704.

Here, a memory transistor or a selection transistor including an oxide semiconductor is likely to have its electrical characteristics changed by impurities and oxygen vacancies in a region of the oxide semiconductor where a channel is formed; accordingly, the reliability is decreased in some cases. Moreover, if the region of the oxide semiconductor where a channel is formed contains oxygen vacancies, the transistor tends to have normally-on characteristics. Thus, oxygen vacancies in the region 734 where a channel is formed are preferably reduced as much as possible. Since oxygen can be supplied to the oxide 704 by the microwave treatment, the oxygen vacancies in the region 734 can be repaired, which is preferable.

By contrast, in the regions 731 covered with the conductors 719, which block the microwave, the hydrogen concentration and carrier concentration are not reduced and the low-resistance regions, i.e., the N-type regions, can be maintained. Here, the carrier concentration of the regions 731 is preferably higher than or equal to $1\times10^{18}/cm^3$, further preferably higher than or equal to $1\times10^{19}/cm^3$, still further preferably higher than or equal to $1\times10^{20}/cm^3$.

In the case where hydrogen in the oxide 704 is diffused into the region 731 and enters oxygen vacancies in the region 731, the hydrogen is brought into a relatively stable state. Hydrogen in oxygen vacancies in the region 734 is released from the oxygen vacancies by heat treatment at higher than or equal to 250° C., is diffused into the region 731, enters oxygen vacancies in the region 731, and is brought into a relatively stable state. Thus, by the heat treatment, the resistance of the region 731 is further reduced, and the region 734 is highly purified (a reduction in impurities such as water or hydrogen) and the resistance is further increased.

In the case where the conductor 712 is provided, a material similar to that for the conductor 701 can be used for the conductor 712. Since the conductor 712 needs to be formed in the opening having a high aspect ratio (in other words, the recession of the oxide 704 and the insulator 711), the conductor 712 is preferably formed by a CVD method, an ALD method, or a plating method. At this time, for the insulator 711, a material similar to that for the insulator 703 can be used.

In the case where the insulator 711 is provided inward from the oxide 704c, the insulator 711 is preferably a material that can supply oxygen to the oxide 704 or a material that can supply impurities, such as hydrogen and nitrogen. When an oxide that contains hydrogen and nitrogen as little as possible is used for the insulator 711, oxygen can be supplied to the oxide 704 in some cases. By supplying oxygen to the oxide 704, impurities such as hydrogen and water contained in the oxide 704 can be removed and the oxide 704 is highly purified. When an oxide in which impurities are reduced as much as possible is used as the oxide 704, the memory transistor MT and the semiconductor device including the memory transistor MT can have high reliability.

When an oxide containing hydrogen and nitrogen is used for the insulator 711, hydrogen and nitrogen can be supplied to the oxide 704 in some cases. When hydrogen and nitrogen are supplied to the oxide 704, the resistance value of the oxide 704 is decreased in some cases. The resistance value of the oxide 704 decreased to the extent that it does not hinder the circuit operation enables the memory transistor MT to operate with a lower driving voltage. Furthermore, high current drive capability in the on state of the memory transistor MT, i.e., a high on-state current and high field-effect mobility can be obtained.

The top view shape of the opening formed in the stack provided with the memory transistor MT is, but not limited to, circular as illustrated in FIG. 2A and the like; the top view shape may be, for example, elliptic or polygonal, e.g., a triangle or a quadrangle. In the case where a polygonal shape is employed, corners thereof may be rounded. The top-view shapes of the insulator 703 and the oxide 704 may change depending on the top-view shape of the opening. The opening may have a shape where a lower cross sectional area of the opening (on the conductor 706 side) is narrower than an upper cross sectional area of the opening (on the conductor 705 side).

The memory transistor MT is formed of the oxide 704, the insulator 703, and the conductor 701 (any one of the conductor 701_1 to the conductor 701_m). FIG. 1 and FIG. 2 show an example in which m stages of memory transistors MT (m is a natural number of greater than or equal to 2) are stacked. Note that in FIG. 1 and FIG. 2, four or more stages of the conductors 701 are illustrated to show the plurality of conductors 701; however, this embodiment is not limited to FIG. 1 and at least two stages of the conductors 701 are provided.

The conductor 705 is electrically connected to the oxide 704 and serves as part of the source line SL or part of the bit line BL. As the conductor 705, a conductive material containing a metal element is preferably used. Alternatively, a conductive material among materials that can be used for the conductors 719 can be used for the conductor 705. In that case, the resistance of part of the oxide 704 is reduced as described above. A metal compound layer containing the metal element contained in the conductor 705 and the component of the oxide 704 is preferably formed at the interface between the conductor 705 and the oxide 704. The metal compound layer is preferably formed, in which case the contact resistance between the conductor 705 and the oxide 704 is reduced. Alternatively, oxygen contained in the oxide 704 is absorbed by the conductor 705 and the resistance of the vicinity of the interface between the conductor 705 and the oxide 704 is reduced, whereby the contact resistance between the conductor 705 and the oxide 704 can be reduced.

A conductive material containing one or more metal elements selected from aluminum, ruthenium, titanium, tantalum, chromium, tungsten, and copper is preferably used as the conductor 705.

As shown in FIG. 2B, the conductor 706 electrically connects the oxide 704 electrically connected to the conductor 705 that serves as part of the bit line BL to the oxide 704 electrically connected to the conductor 705 that serves as part of the source line SL, so that a memory string is formed. Regions surrounded by dotted lines in FIG. 2A represent memory strings. In other words, FIG. 2A shows the memory cell array 700 including four memory strings.

For the conductor 706, a material similar to that for the conductor 705 can be used. Alternatively, a conductive material among materials that can be used for the conductors 719 can be used for the conductor 706. In that case, the resistance of part of the oxide 704 is reduced as described above. The conductor 706 and the conductor 705 may be formed using the same material or different materials.

A metal compound layer containing the metal element contained in the conductor 706 and the component of the oxide 704 is preferably formed at the interface between the conductor 706 and the oxide 704. The metal compound layer is preferably formed, in which case the contact resistance between the conductor 706 and the oxide 704 is reduced. Alternatively, oxygen contained in the oxide 704 is absorbed by the conductor 706 and the resistance of the oxide 704 in the vicinity of the interface between the conductor 706 and the oxide 704 is reduced, whereby the contact resistance between the conductor 706 and the oxide 704 can be reduced.

The conductor 707, the conductor 708, the conductor 709, the conductor 710, the conductor 714, and the conductor 715 can be formed using a material that can be used for the conductor 701, the conductor 702, or the conductor 712. The conductors may be formed using the same material or different materials.

(Memory Cell Array 700A)

Figure 4:
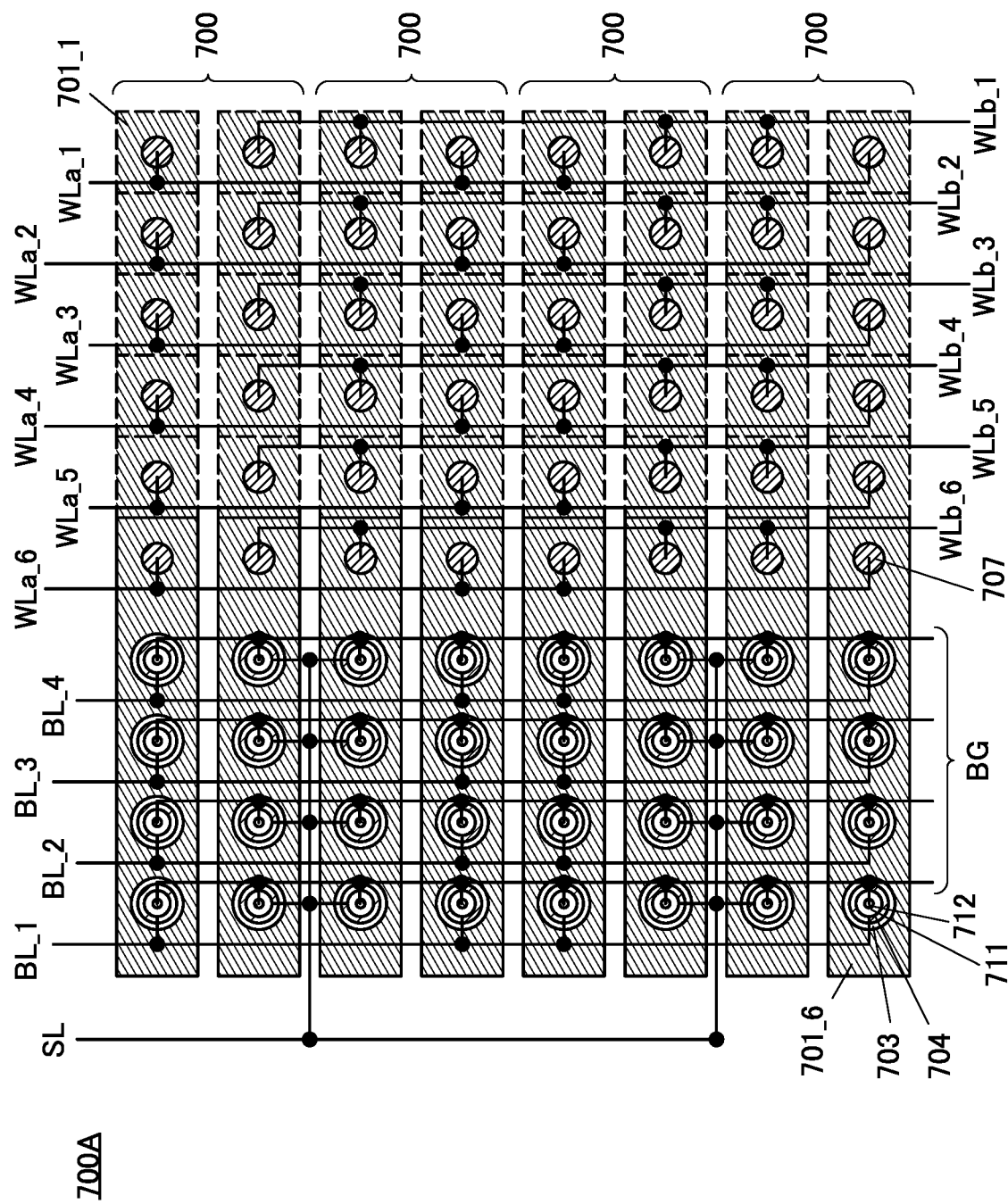
FIG. 4 is a top view illustrating a semiconductor device of one embodiment of the present invention.

FIG. 4 is a top view illustrating a memory cell array 700A in which a plurality of the memory cell arrays 700 including six stages of memory transistors MT are combined. Note that in FIG. 4, some components are omitted for simple description. For example, the selection transistors (the bit-line-side transistor SDT and the source-line-side transistor SST) provided over the conductors 701 and the conductors 702 which are the components of the selection transistors are omitted. In addition, the conductors 705 serving as part of the bit line BL and part of the source line SL, the conductor 708 serving as part of a word line WL, and the conductor 715 serving as part of a wiring BG electrically connected to the conductor 712 serving as the second gate are shown by solid lines.

In the memory cell array 700A, each memory cell array 700 includes four memory strings including six stages of memory transistors MT.

The ends of the memory strings on the bit line side are electrically connected to the respective bit lines BL (a bit line BL_1 to a bit line BL_4). The ends of the memory strings on the source line side are electrically connected to the source line SL and are supplied with a common potential. The source line SL may be grounded or may be supplied with a constant potential. Alternatively, the potential may be changed depending on the circuit operation.

The conductor 701_1 to the conductor 701_6 are electrically connected to the respective word lines WL. The conductor 701_1 to the conductor 701_6 on the bit line side are electrically connected to a word line WLa_1 to a word line WLa_6, respectively, and the conductor 701_1 to the conductor 701_6 on the source line side are electrically connected to a word line WLb_1 to a word line WLb_6, respectively.

The conductors 712 are electrically connected to the wirings BG. Although FIG. 4 shows an example where the conductors 712 aligned in the column direction are electrically connected to the common wiring BG, the present invention is not limited to this example. The conductors 712 aligned in the row direction may be electrically connected to the common wiring BG. Furthermore, different potentials may be applied to the wirings BG, or the same potential may be applied to a plurality of the wirings BG. In the case where the same potential is applied to a plurality of the wirings BG, the plurality of wirings BG are preferably electrically connected to each other. The plurality of wirings BG may refer to all the wirings BG included in the memory cell array 700A.

In order that a given potential is applied to the wiring BG, the wiring BG is preferably electrically connected to a circuit that controls the potential of the wiring BG (which is referred to as a BG driver or a BG driver circuit, for example, in some cases or simply referred to as a driver or a driver circuit in other cases). The BG driver circuit may be provided for each of the wirings BG or the plurality of wirings BG may be electrically connected to one BG driver circuit. For example, the memory cell array 700A may include one BG driver circuit and all the wirings BG included in the memory cell array 700A may be electrically connected to the BG driver circuit.

By selecting any of the bit lines BL (the bit line BL_1 to the bit line BL_4) and any of the word lines WL (the word line WLa_1 to the word line WLa_6 and the word line WLb_1 to the word line WLb_6) as appropriate, a given memory transistor MT in the memory cell array 700 can be selected. In addition, writing, reading, erasing, and the like can be performed on the selected memory transistor MT.

Since the selection transistor (not shown) is provided in each memory string, the given memory cell array 700 in the memory cell array 700A can be selected, and writing, reading, erasing, and the like can be performed on the given memory transistor MT in the selected memory cell array 700.

Structure Example of Memory Device 750

Figure 5:
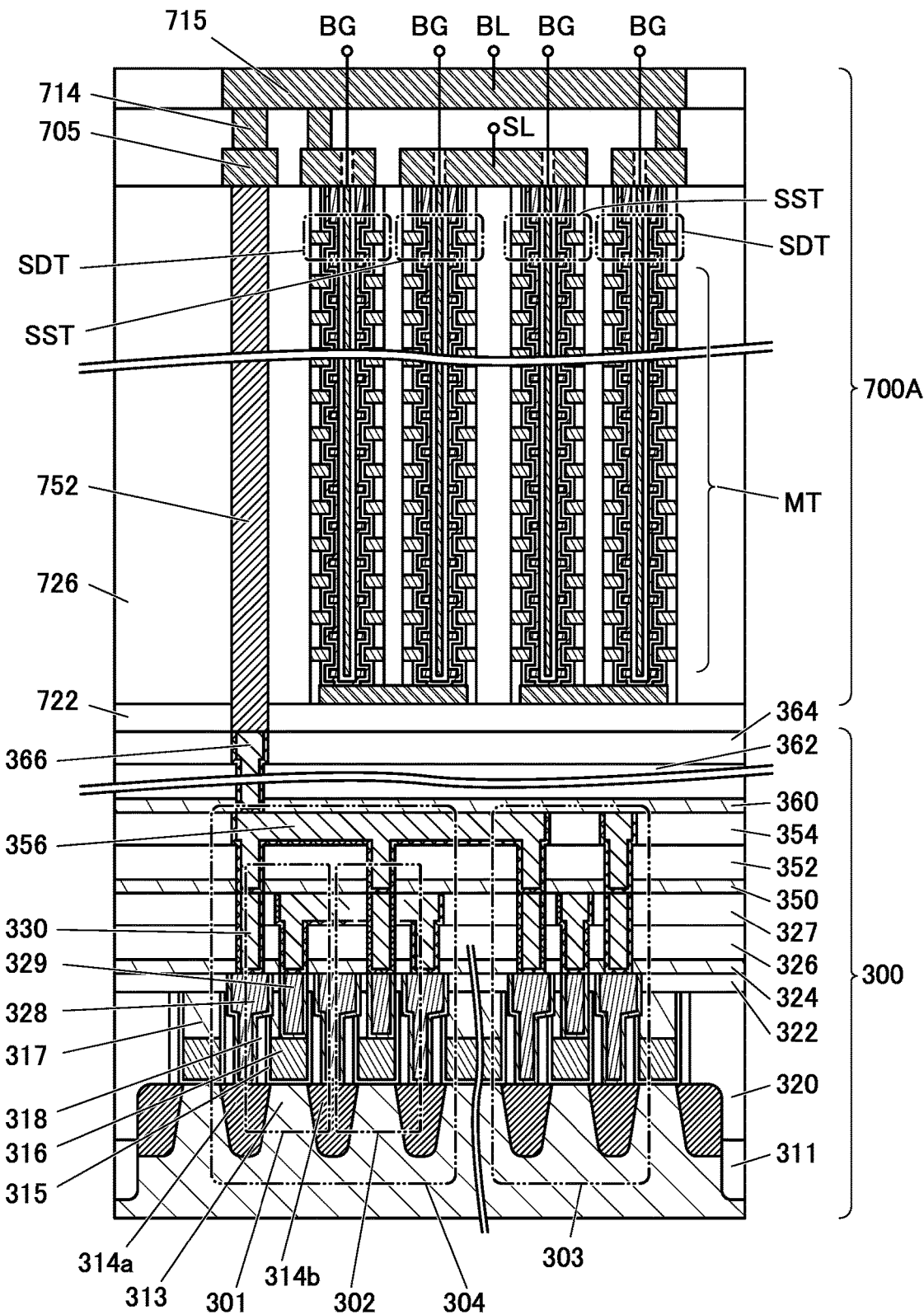
FIG. 5 is a cross-sectional view illustrating a semiconductor device of one embodiment of the present invention.

FIG. 5 shows a structure example of a memory device 750 in which the memory cell array 700A is stacked over a circuit 300. As shown in FIG. 5, the memory cell array 700A is stacked over a region where the circuit 300 including a transistor 301, a transistor 302, and a transistor 303 is formed. The transistor 301 and the transistor 302 are included in a sense amplifier 304 and the transistor 303 serves as a column selection switch. Specifically, the bit line BL of the memory cell array 700A is electrically connected to one of a source and a drain of the transistor 301, a gate of the transistor 301 is electrically connected to one of a source and a drain of the transistor 302, and a gate of the transistor 302 is electrically connected to the other of the source and the drain of the transistor 301. The one of the source and the drain of the transistor 301 and the other of the source and the drain of the transistor 302 are electrically connected to one of a source and a drain of the transistor 303 which serves as the column selection switch. Accordingly, the layout area of the memory device 750 can be reduced. Note that FIG. 5 shows an example where 10 stages of memory transistors MT are provided and one memory string includes 20 memory transistors MT. However, the number of stages of stacked memory transistors MT is not limited thereto. For example, 32 stages of memory transistors, 64 stages of memory transistors, 128 stages of memory transistors, or 200 or more stages of memory transistors may be stacked.

The bit line BL of the memory cell array 700A is electrically connected to the sense amplifier 304 and the transistor 303 serving as the column selection switch through a conductor 752 formed to be embedded in an insulator 726, the insulator 722, and the like. Note that circuits and transistors included in the circuit 300 are examples, and one embodiment of the present invention is not limited to the circuit configurations and the transistor structures. In addition to the above, a transistor or a circuit such as a control circuit, a row decoder, a row driver, a source line driver, or an input-output circuit can be provided as appropriate in accordance with the configuration or driving method of the memory device 750.

The transistor 301, the transistor 302, and the transistor 303 are provided on a substrate 311 and each include a conductor 316, an insulator 315, a semiconductor region 313 that is part of the substrate 311, and a low-resistance region 314a and a low-resistance region 314b serving as a source region and a drain region. Note that as shown in FIG. 5, one low-resistance region may be used in common for a source region or a drain region of one of the transistor 301 and the transistor 302 and a source region or a drain region of the other of the transistor 301 and the transistor 302.

In each of the transistor 301, the transistor 302, and the transistor 303, the semiconductor region 313 (part of the substrate 311) in which a channel is formed has a convex shape. In addition, the conductor 316 is provided to cover a side surface and a top surface of the semiconductor region 313 with the insulator 315 therebetween. Note that a material adjusting the work function may be used for the conductor 316. The transistor 301, the transistor 302, and the transistor 303 that are described above are also referred to as FIN-type transistors because they utilize convex portions of a semiconductor substrate. Note that an insulator serving as a mask for forming the convex portion may be included in contact with an upper portion of the convex portion. Furthermore, although the case where the convex portion is formed by processing part of the semiconductor substrate is described here, a semiconductor film having a convex shape may be formed by processing an SOI substrate.

Although each of the transistor 301, the transistor 302, and the transistor 303 may be either a p-channel transistor or an n-channel transistor, the transistor 301 and the transistor 302 are preferably transistors having different polarities.

It is preferable that a region of the semiconductor region 313 where the channel is formed, a region in the vicinity thereof, the low-resistance region 314a and the low-resistance region 314b serving as the source region and the drain region, and the like contain a semiconductor such as a silicon-based semiconductor, further preferably single crystal silicon. Alternatively, these regions may be formed using a material containing Ge (germanium), SiGe (silicon germanium), GaAs (gallium arsenide), GaAlAs (gallium aluminum arsenide), or the like. A structure may be employed in which silicon whose effective mass is controlled by applying stress to the crystal lattice and changing the lattice spacing is used. Alternatively, the transistor 301, the transistor 302, and the transistor 303 may be an HEMT (High Electron Mobility Transistor) with the use of GaAs and GaAlAs, or the like.

The low-resistance region 314a and the low-resistance region 314b contain an element which imparts n-type conductivity, such as arsenic or phosphorus, or an element which imparts p-type conductivity, such as boron, in addition to the semiconductor material used for the semiconductor region 313.

The insulator 315 serves as a gate insulating film of each of the transistor 301, the transistor 302, and the transistor 303.

The conductor 316 serving as a gate electrode can be formed using a semiconductor material such as silicon containing an element that imparts n-type conductivity, such as arsenic or phosphorus, or an element that imparts p-type conductivity, such as boron, or using a conductive material such as a metal material, an alloy material, or a metal oxide material.

Note that the work function depends on a material of the conductor; thus, the threshold voltage can be adjusted by changing the material of the conductor. Specifically, it is preferable to use a material such as titanium nitride or tantalum nitride for the conductor. Moreover, in order to ensure both conductivity and embeddability, it is preferable to use stacked layers of metal materials such as tungsten and aluminum for the conductor, and it is particularly preferable to use tungsten in terms of heat resistance.

An insulator 317 serving as an etching stopper is preferably provided above the conductor 316. In addition, an insulator 318 serving as a spacer is preferably provided on a side surface of the insulator 315. When the insulator 317 and the insulator 318 are provided, regions where the low-resistance region 314a and the low-resistance region 314b and a conductor 328 are electrically connected to each other can be defined in a self-aligned manner. Thus, even when misalignment occurs in forming the openings for exposing part of the low-resistance region 314a and the low-resistance region 314b, the openings for exposing the intended regions can be formed. The conductor 328 provided in the openings formed in this manner can provide a favorable contact with reduced contact resistance between the low-resistance region 314a and the low-resistance region 314b and the conductor 328. The contact between the low-resistance region 314a and the low-resistance region 314b and the conductor 328 which is formed in this manner may be referred to as a self-aligned contact. Furthermore, a conductor 329 electrically connected to the conductor 316 may be provided so as to be embedded in the insulator 317 and an insulator 322.

An insulator 320, the insulator 322, an insulator 324, an insulator 326, and an insulator 327 are stacked in this order to cover the transistor 301, the transistor 302, and the transistor 303.

The insulator 320, the insulator 322, the insulator 324, the insulator 326, and the insulator 327 can be formed using, for example, silicon oxide, silicon oxynitride, silicon nitride oxide, silicon nitride, aluminum oxide, aluminum oxynitride, aluminum nitride oxide, or aluminum nitride.

The insulator 322 may have a function of a planarization film for planarizing a level difference caused by the transistor 301 or the like provided below the insulator 322. For example, a top surface of the insulator 322 may be planarized by planarization treatment using a chemical mechanical polishing (CMP) method or the like to improve planarity.

The insulator 324 is preferably formed using a film having a barrier property that prevents diffusion of hydrogen or impurities from the substrate 311, the transistor 301, or the like into the region where the memory cell array 700A is provided.

For the film having a barrier property against hydrogen, silicon nitride formed by a CVD method can be used, for example. Here, diffusion of hydrogen into a semiconductor element including an oxide semiconductor, such as the memory transistor MT, degrades the characteristics of the semiconductor element in some cases. Therefore, a film that inhibits hydrogen diffusion is preferably used between the memory transistor MT and the transistor 301 and the like. The film that inhibits hydrogen diffusion is specifically a film from which a small amount of hydrogen is released.

The amount of released hydrogen can be analyzed by thermal desorption spectroscopy (TDS), for example. The amount of hydrogen released from the insulator 324 that is converted into hydrogen atoms per area of the insulator 324 is less than or equal to $10\times10^{15}$ atoms/cm$^2$, preferably less than or equal to $5\times10^{15}$ atoms/cm$^2$, in the TDS analysis in a film-surface temperature range of 50° C. to 500° C., for example.

Note that the permittivity of each of the insulator 326 and the insulator 327 is preferably lower than that of the insulator 324. For example, the relative permittivity of each of the insulator 326 and the insulator 327 is preferably lower than 4, further preferably lower than 3. The relative permittivity of each of the insulator 326 and the insulator 327 is, for example, preferably 0.7 times or less, further preferably 0.6 times or less the relative permittivity of the insulator 324. When a material with a low permittivity is used for the interlayer film, the parasitic capacitance generated between wirings can be reduced.

The conductor 328, the conductor 329, a conductor 330, and the like that are electrically connected to the memory cell array 700A are embedded in the insulator 320, the insulator 322, the insulator 324, the insulator 326, and the insulator 327. Note that the conductor 328, the conductor 329, and the conductor 330 have functions of plugs or wirings. A plurality of conductors serving as plugs or wirings are collectively denoted by the same reference numeral in some cases. Furthermore, in this specification and the like, a wiring and a plug electrically connected to the wiring may be a single component. That is, there are cases where part of a conductor serves as a wiring and another part of the conductor serves as a plug.

As a material for each of the plugs and wirings (the conductor 328, the conductor 329, the conductor 330, and the like), a single layer or a stacked layer of a conductive material such as a metal material, an alloy material, a metal nitride material, or a metal oxide material can be used. It is preferable to use a high-melting-point material that has both heat resistance and conductivity, such as tungsten or molybdenum, and it is particularly preferable to use tungsten. Alternatively, each of the plugs and wirings is preferably formed using a low-resistance conductive material such as aluminum or copper. The use of a low-resistance conductive material can reduce wiring resistance.

A wiring layer may be provided over the insulator 327 and the conductor 330. For example, in FIG. 5, an insulator 350, an insulator 352, and an insulator 354 are stacked in this order. Furthermore, a conductor 356 is formed in the insulator 350, the insulator 352, and the insulator 354. The conductor 356 has a function of a plug or a wiring. Note that the conductor 356 can be provided using a material similar to those for the conductor 328, the conductor 329, and the conductor 330.

For example, like the insulator 324, the insulator 350 is preferably formed using an insulator having a barrier property against hydrogen. The conductor 356 preferably contains a conductor having a barrier property against hydrogen. That is, the conductor 356 having a barrier property against hydrogen is preferably formed in an opening portion of the insulator 350 having a barrier property against hydrogen. With this structure, the transistor 301 and the like and the memory transistor MT can be separated by the barrier layer, so that diffusion of hydrogen from the transistor 301 and the like into the memory transistor MT can be inhibited.

As the conductor having a barrier property against hydrogen, tantalum nitride is preferably used, for example. In addition, the use of a stack including tantalum nitride and tungsten, which has high conductivity, can inhibit diffusion of hydrogen from the transistor 301 and the like while the conductivity of a wiring is maintained. In that case, a structure is preferable in which a tantalum nitride layer having a barrier property against hydrogen is in contact with the insulator 350 having a barrier property against hydrogen.

A wiring layer may be provided over the insulator 354 and the conductor 356. For example, in FIG. 5, an insulator 360, an insulator 362, and an insulator 364 are stacked in this order. Furthermore, a conductor 366 is formed in the insulator 360, the insulator 362, and the insulator 364. The conductor 366 has a function of a plug or a wiring. Note that the conductor 366 can be provided using a material similar to those for the conductor 328, the conductor 329, and the conductor 330.

For example, like the insulator 324, the insulator 360 is preferably formed using an insulator having a barrier property against hydrogen. Furthermore, the conductor 366 preferably contains a conductor having a barrier property against hydrogen. That is, the conductor 366 having a barrier property against hydrogen is preferably formed in an opening portion of the insulator 360 having a barrier property against hydrogen. With this structure, the transistor 301 and the like and the memory transistor MT can be separated by the barrier layer, so that diffusion of hydrogen from the transistor 301 and the like into the memory transistor MT can be inhibited.

The insulator 722 is provided over the insulator 364 and the conductor 366, and the memory cell array 700A is provided above the insulator 722. A barrier film formed using a material similar to that for the insulator 324 may be provided between the insulator 364 and the insulator 722.

Figure 6:
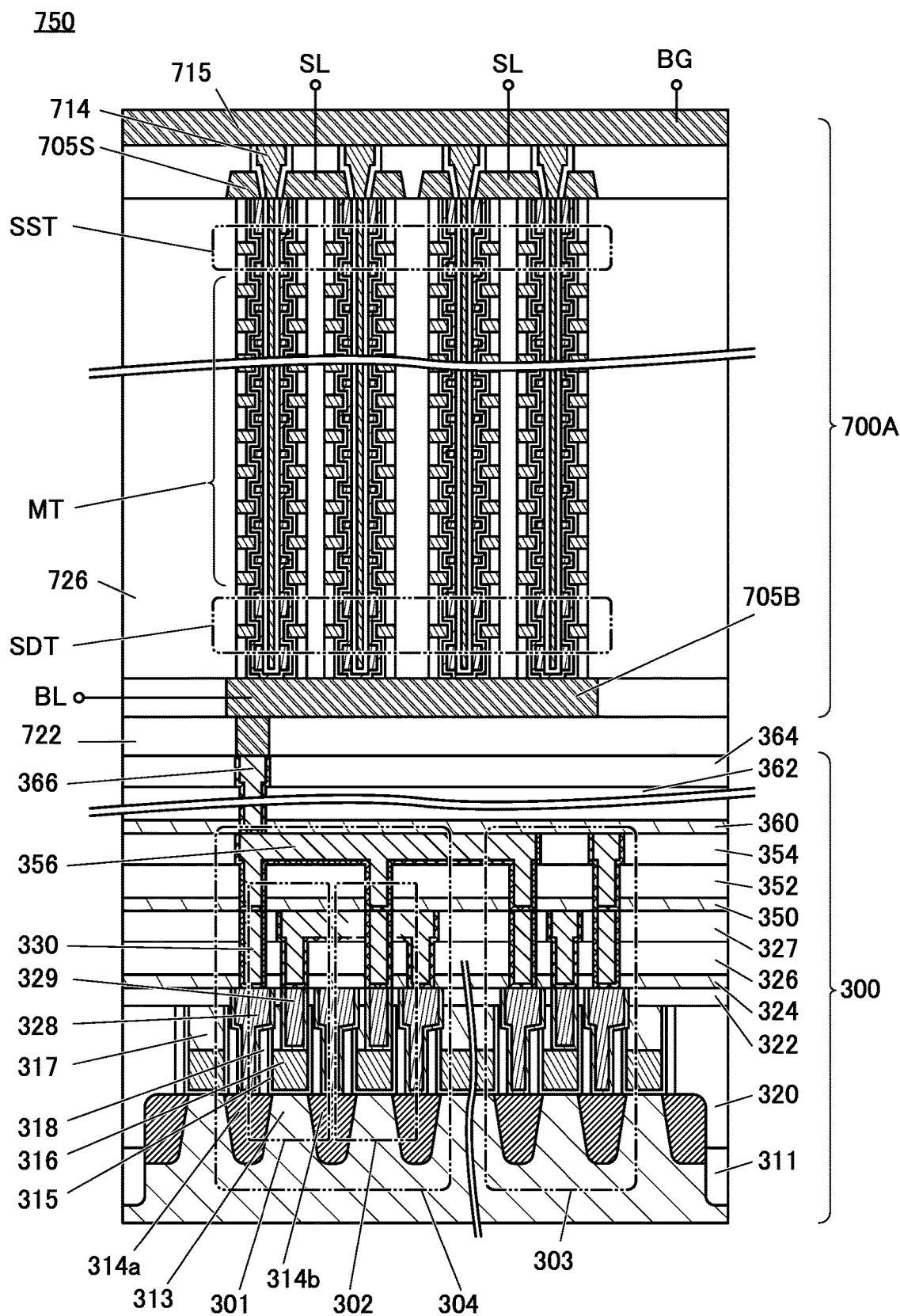
FIG. 6 is a cross-sectional view illustrating a semiconductor device of one embodiment of the present invention.

FIG. 5 shows an example of the memory cell array 700A including the U-shaped memory string in which the two columnar oxides 704 are electrically connected to each other through the conductor 706; however, the present invention is not limited to this example. In FIG. 6, in the columnar oxide 704 including 8 stages of memory transistors MT and the two selection transistors (SDT and SST), the lower end of one columnar oxide 704 is electrically connected to a conductor 705B serving as the bit line BL and the upper end thereof is electrically connected to a conductor 705S serving as the source line SL. That is, one memory string is formed using one columnar oxide 704. Although the conductor 705B is electrically connected to the lower ends of four columnar oxides in FIG. 6, the present invention is not limited thereto. One conductor 705B may be electrically connected to one columnar oxide 704, or one conductor 705B may be electrically connected to two or more columnar oxides 704. The conductor 705S is electrically connected to upper ends of two columnar oxides; however, the present invention is not limited thereto. One conductor 705S may be electrically connected to one columnar oxide 704, or one conductor 705S may be electrically connected to two or more columnar oxides 704.

The selection transistor SDT is provided between the conductor 705B and the memory transistor MT and the selection transistor SST is provided between the conductor 705S and the memory transistor MT. The structure in which the conductor 705B serving as the bit line BL is electrically connected to the circuit 300 provided below the conductor 705B is preferable because the number of wirings (lead wirings) and plugs for electrically connecting the memory cell array 700A to the circuit 300 can be reduced and the layout area of the memory device 750 can be further reduced. Note that in FIG. 6, 8 stages of the memory transistors MT are stacked; however, the present invention is not limited thereto. The number of stages of the memory transistors MT may be greater than or equal to 2 and less than or equal to 7, or may be greater than or equal to 9. For example, 32 stages of memory transistors, 64 stages of memory transistors, 128 stages of memory transistors, or 200 or more stages of memory transistors may be stacked.

Metal Oxide

A metal oxide that can be used for the oxide 704 of the present invention is described below.

The metal oxide preferably contains at least indium or zinc. In particular, indium and zinc are preferably contained. In addition to these, one or more selected from aluminum, gallium, yttrium, and tin are preferably contained. Furthermore, one or more kinds selected from boron, titanium, iron, nickel, germanium, zirconium, molybdenum, lanthanum, cerium, neodymium, hafnium, tantalum, tungsten, magnesium, and the like may be contained.

For example, the metal oxide preferably contains indium, gallium, and zinc. Alternatively, the metal oxide preferably contains indium and gallium. Alternatively, the metal oxide preferably contains indium and zinc. Alternatively, the metal oxide preferably contains indium. Alternatively, the metal oxide preferably contains indium, gallium, zinc, and tin.

Here, the case where the metal oxide is an In-M-Zn oxide containing indium, the element M, and zinc, is considered. Note that the element M represents one or more elements selected from aluminum, gallium, yttrium, and tin. Other elements that can be used as the element M include boron, titanium, iron, nickel, germanium, zirconium, molybdenum, lanthanum, cerium, neodymium, hafnium, tantalum, tungsten, and magnesium. Note that a plurality of the above elements may be used in combination as the element M in some cases.

Note that in this specification and the like, a metal oxide containing nitrogen is also collectively referred to as a metal oxide in some cases. A metal oxide containing nitrogen may be referred to as a metal oxynitride.

Composition of Metal Oxide

The composition of a CAC (Cloud-Aligned Composite)-OS that can be used in a transistor disclosed in one embodiment of the present invention is described below.

Note that in this specification and the like, CAAC (c-axis aligned crystal) and CAC (Cloud-Aligned Composite) are sometimes stated. Note that CAAC refers to an example of a crystal structure, and CAC refers to an example of a function or a material composition.

A CAC-OS or a CAC-metal oxide has a conducting function in part of the material and has an insulating function in another part of the material; as a whole, the CAC-OS or the CAC-metal oxide has a function of a semiconductor. Note that in the case where the CAC-OS or the CAC-metal oxide is used in an active layer of a transistor, the conducting function is a function that allows electrons (or holes) serving as carriers to flow, and the insulating function is a function that does not allow electrons serving as carriers to flow. By the complementary action of the conducting function and the insulating function, a switching function (On/Off function) can be given to the CAC-OS or the CAC-metal oxide. In the CAC-OS or the CAC-metal oxide, separation of the functions can maximize each function.

In addition, the CAC-OS or the CAC-metal oxide includes conductive regions and insulating regions. The conductive regions have the above-described conducting function, and the insulating regions have the above-described insulating function. Furthermore, in some cases, the conductive regions and the insulating regions in the material are separated at the nanoparticle level. Furthermore, in some cases, the conductive regions and the insulating regions are unevenly distributed in the material. Furthermore, in some cases, the conductive regions are observed to be coupled in a cloud-like manner with their boundaries blurred.

In the CAC-OS or the CAC-metal oxide, the conductive regions and the insulating regions each have a size of greater than or equal to 0.5 nm and less than or equal to 10 nm, preferably greater than or equal to 0.5 nm and less than or equal to 3 nm and are dispersed in the material in some cases.

The CAC-OS or the CAC-metal oxide includes components having different bandgaps. For example, the CAC-OS or the CAC-metal oxide includes a component having a wide gap due to the insulating region and a component having a narrow gap due to the conductive region. In the case of the structure, when carriers flow, carriers mainly flow in the component having a narrow gap. Furthermore, the component having a narrow gap complements the component having a wide gap, and carriers also flow in the component having a wide gap in conjunction with the component having a narrow gap. Therefore, in the case where the above-described CAC-OS or CAC-metal oxide is used for a channel formation region of a transistor, the transistor in the on state can achieve high current driving capability, that is, a high on-state current and high field-effect mobility.

In other words, the CAC-OS or the CAC-metal oxide can also be referred to as a matrix composite or a metal matrix composite.

Structure of Metal Oxide

An oxide semiconductor (metal oxide) is classified into a single crystal oxide semiconductor and a non-single-crystal oxide semiconductor. Examples of the non-single-crystal oxide semiconductors include a CAAC-OS (c-axis aligned crystalline oxide semiconductor), a polycrystalline oxide semiconductor, an nc-OS (nanocrystalline oxide semiconductor), an amorphous-like oxide semiconductor (a-like OS), and an amorphous oxide semiconductor.

The CAAC-OS has c-axis alignment, a plurality of nanocrystals are connected in the a-b plane direction, and its crystal structure has distortion. Note that the distortion refers to a portion where the direction of a lattice arrangement changes between a region with a regular lattice arrangement and another region with a regular lattice arrangement in a region where the plurality of nanocrystals are connected.

The nanocrystal is basically a hexagon but is not always a regular hexagon and is a non-regular hexagon in some cases. Furthermore, a pentagonal or heptagonal lattice arrangement, for example, is included in the distortion in some cases. Note that it is difficult to observe a clear crystal grain boundary (also referred to as grain boundary) even in the vicinity of distortion in the CAAC-OS. That is, formation of a crystal grain boundary is found to be inhibited by the distortion of a lattice arrangement. This is because the CAAC-OS can tolerate distortion owing to a low density of arrangement of oxygen atoms in the a-b plane direction, an interatomic bond length changed by substitution of a metal element, and the like.

The CAAC-OS tends to have a layered crystal structure (also referred to as a layered structure) in which a layer containing indium and oxygen (hereinafter, an In layer) and a layer containing the element M, zinc, and oxygen (hereinafter, an (M,Zn) layer) are stacked. Note that indium and the element M can be replaced with each other, and when the element M in the (M,Zn) layer is replaced with indium, the layer can also be referred to as an (In,M,Zn) layer. Furthermore, when indium in the In layer is replaced with the element M, the layer can be referred to as an (In,M) layer.

The CAAC-OS is a metal oxide with high crystallinity. On the other hand, a clear crystal grain boundary cannot be observed in the CAAC-OS; thus, it can be said that a reduction in electron mobility due to the crystal grain boundary is less likely to occur. Furthermore, entry of impurities, formation of defects, or the like might decrease the crystallinity of a metal oxide, which means that the CAAC-OS is a metal oxide having small amounts of impurities and defects (e.g., oxygen vacancies (Vo)). Thus, a metal oxide including a CAAC-OS is physically stable. Therefore, the metal oxide including a CAAC-OS is resistant to heat and has high reliability.

In the nc-OS, a microscopic region (e.g., a region with a size of greater than or equal to 1 nm and less than or equal to 10 nm, in particular, a region with a size of greater than or equal to 1 nm and less than or equal to 3 nm) has a periodic atomic arrangement. Furthermore, there is no regularity of crystal orientation between different nanocrystals in the nc-OS. Thus, the orientation in the whole film is not observed. Accordingly, the nc-OS cannot be distinguished from an a-like OS or an amorphous oxide semiconductor by some analysis methods.

An a-like OS is a metal oxide having a structure between those of the nc-OS and an amorphous oxide semiconductor. The a-like OS includes a void or a low-density region. That is, the a-like OS has low crystallinity compared with the nc-OS and the CAAC-OS.

An oxide semiconductor (metal oxide) can have various structures which show different properties. Two or more kinds of the amorphous oxide semiconductor, the polycrystalline oxide semiconductor, the a-like OS, the nc-OS, and the CAAC-OS may be included in an oxide semiconductor of one embodiment of the present invention.

Transistor Including Metal Oxide

Next, the case where the above metal oxide is used in a channel formation region of a transistor is described.

Note that when the above metal oxide is used in a channel formation region of a transistor, a transistor having high field-effect mobility can be achieved. In addition, a transistor having high reliability can be achieved.

Here, an example of the hypothesis about electric conduction of a metal oxide is described.

Electric conduction in a solid is inhibited by a scattering source called a scattering center. For example, it is known that in the case of single crystal silicon, lattice scattering and ionized impurity scattering are main scattering centers. In other words, in the elemental state with few lattice defects and impurities, the carrier mobility is high because there is no factor that inhibits the electric conduction in the solid.

The above presumably applies to a metal oxide. For example, it is probable that a metal oxide containing less oxygen than oxygen in the stoichiometric composition has many oxygen vacancies Vo. Atoms around the oxygen vacancies are located in places shifted from those in the elemental state. This distortion due to the oxygen vacancies might become a scattering center.

Furthermore, a metal compound containing more oxygen than oxygen in the stoichiometric composition contains excess oxygen, for example. Excess oxygen existing in a liberated state in the metal compound becomes $O^-$ or $O^{2-}$ by receiving an electron. Excess oxygen that has become $O^-$ or $O^{2-}$ might be a scattering center.

According to the above, it is probable that in the case where the metal oxide has an elemental state containing oxygen in the stoichiometric composition, the carrier mobility is high.

Since crystals of an indium-gallium-zinc oxide (hereinafter, IGZO) that is a kind of metal oxide containing indium, gallium, and zinc tend not to grow particularly in the air and thus, a stable structure is obtained in some cases when IGZO is formed of smaller crystals (e.g., the above-described nanocrystals) rather than larger crystals (here, crystals with a size of several millimeters or several centimeters). This is probably because connection of small crystals, rather than formation of large crystals, leads to a reduction in distortion energy.

Note that in a region where small crystals are connected to each other, defects are formed in some cases to reduce the distortion energy of the region. Thus, when the distortion energy is reduced without formation of a defect in the region, the carrier mobility can be increased.

A metal oxide with a low carrier density is preferably used for the transistor. In order to reduce the carrier density of the metal oxide film, the concentration of impurities in the metal oxide film is reduced so that the density of defect states can be reduced. In this specification and the like, a state with a low impurity concentration and a low density of defect states is referred to as a highly purified intrinsic or substantially highly purified intrinsic state. For example, the metal oxide has a carrier density of lower than $8\times10^{11}/cm^3$, preferably lower than $1\times10^{11}/cm^3$, and further preferably lower than $1\times10^{10}/cm^3$, and higher than or equal to $1\times10^{-9}/cm^3$.

Moreover, a highly purified intrinsic or substantially highly purified intrinsic metal oxide film has a low density of defect states and accordingly may have a low density of trap states.

Charges trapped by the trap states in the metal oxide take a long time to disappear and may behave like fixed charges. Thus, a transistor whose channel formation region includes a metal oxide having a high density of trap states has unstable electrical characteristics in some cases.

Accordingly, in order to obtain stable electrical characteristics of the transistor, it is effective to reduce the impurity concentration of the metal oxide. In addition, in order to reduce the impurity concentration of the metal oxide, the impurity concentration of an adjacent film is also preferably reduced. Examples of impurities include hydrogen, nitrogen, an alkali metal, an alkaline earth metal, iron, nickel, and silicon.

Impurities

Here, the influence of each impurity in the metal oxide is described.

When silicon or carbon that is a Group 14 element is contained in the metal oxide, defect states are formed in the metal oxide. Thus, the concentration of silicon or carbon in the metal oxide and the concentration of silicon or carbon near an interface with the metal oxide (the concentration measured by secondary ion mass spectrometry (SIMS)) are set to lower than or equal to $2\times10^{18}$ atoms/cm$^3$, preferably lower than or equal to $2\times10^{17}$ atoms/cm$^3$.

When the metal oxide contains an alkali metal or an alkaline earth metal, defect states are formed and carriers are generated in some cases. Thus, a transistor including a metal oxide that contains an alkali metal or an alkaline earth metal in its channel formation region is likely to have normally-on characteristics. Therefore, it is preferable to reduce the concentration of an alkali metal or an alkaline earth metal in the metal oxide. Specifically, the concentration of an alkali metal or an alkaline earth metal in the metal oxide obtained by SIMS is set lower than or equal to $1\times10^{18}$ atoms/cm$^3$, preferably lower than or equal to $2\times10^{16}$ atoms/cm$^3$.

Furthermore, when containing nitrogen, the metal oxide easily becomes n-type by generation of electrons serving as carriers and an increase in carrier density. As a result, a transistor including a metal oxide containing nitrogen in its channel formation region is likely to have normally-on characteristics. Thus, nitrogen in the channel formation region of the metal oxide is preferably reduced as much as possible. For example, the nitrogen concentration of the metal oxide is set lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$ in SIMS.

Hydrogen contained in a metal oxide reacts with oxygen bonded to a metal atom to be water, and thus forms an oxygen vacancy in some cases. Entry of hydrogen into the oxygen vacancy generates an electron serving as a carrier in some cases. Furthermore, bonding of part of hydrogen to oxygen bonded to a metal atom causes generation of an electron serving as a carrier in some cases. Thus, a transistor including a metal oxide containing hydrogen is likely to have normally-on characteristics. Accordingly, hydrogen in the metal oxide is preferably reduced as much as possible. Specifically, the hydrogen concentration of the metal oxide obtained by SIMS is set lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When a metal oxide whose impurities are sufficiently reduced is used in a channel formation region of a transistor, the off-state current of the transistor can be reduced and stable electrical characteristics can be provided.

Manufacturing Method 1 of Memory Cell

Next, one embodiment of a formation method of the memory transistor MT that serves as a memory cell of the present invention is described with reference to FIG. 7A to FIG. 12B. Note that FIG. 7A to FIG. 12B are cross-sectional views showing a manufacturing process of the memory transistor MT.

Figure 7A:
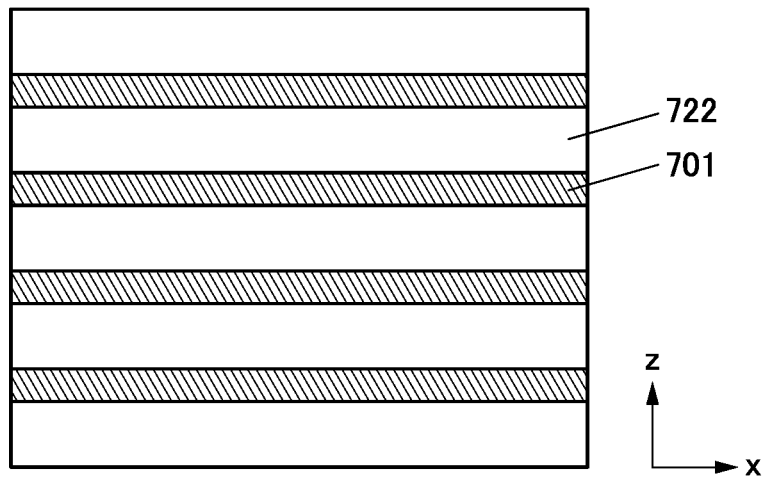
FIG. 7A to FIG. 7C are cross-sectional views illustrating a manufacturing process of a semiconductor device of one embodiment of the present invention.

First, as shown in FIG. 7A, the conductors 701 and the insulators 722 are alternately stacked in the z-axis direction.

Figure 7B:
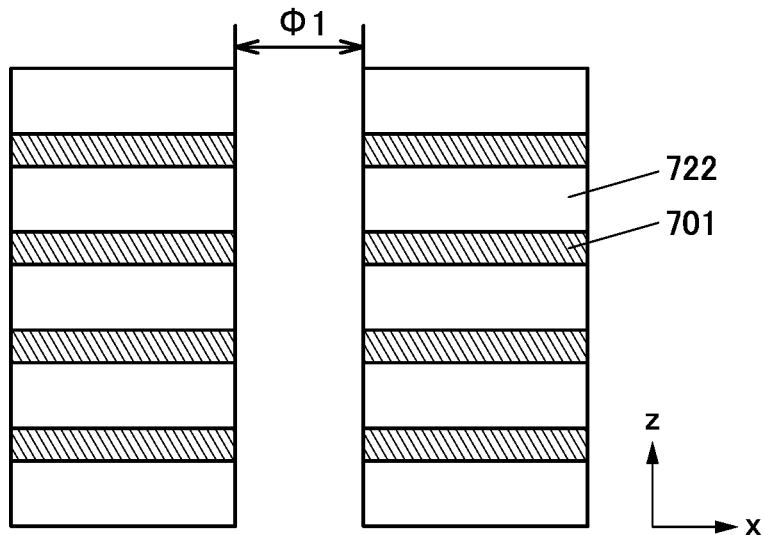

Then, as shown in FIG. 7B, the conductors 701 and the insulators 722 are processed to form an opening with a diameter of φ1 in the conductors 701 and the insulators 722.

Figure 7C:
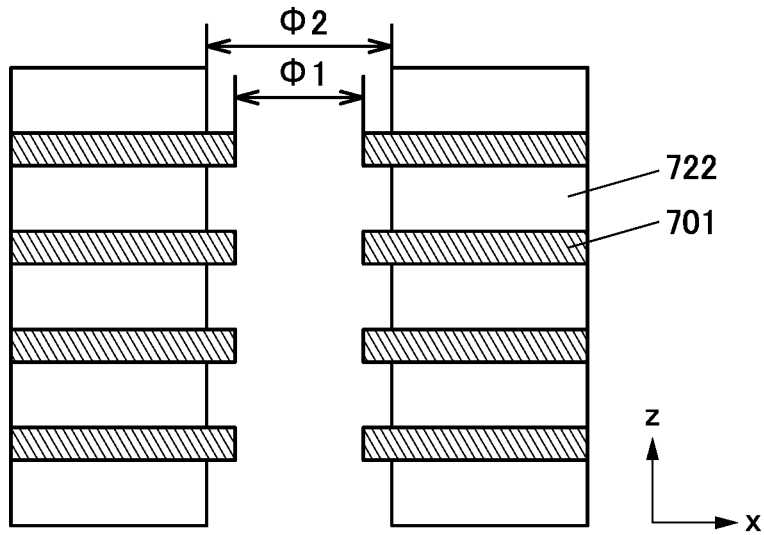

Then, isotropic etching is performed under treatment conditions such that the conductors 701 are not etched but the insulators 722 are etched or treatment conditions such that the etching rate of the insulators 722 is sufficiently higher than that of the conductors 701. Accordingly, as shown in FIG. 7C, the side surfaces of the insulators 722 recede in a direction which is perpendicular to the z-axis direction and/or a direction which is substantially perpendicular to the z-axis direction, so that projections and recessions are formed at a side surface of the opening. When the opening diameter obtained by this etching is φ2, φ1 and φ2 satisfy the relation φ1<φ2.

Figure 8A:
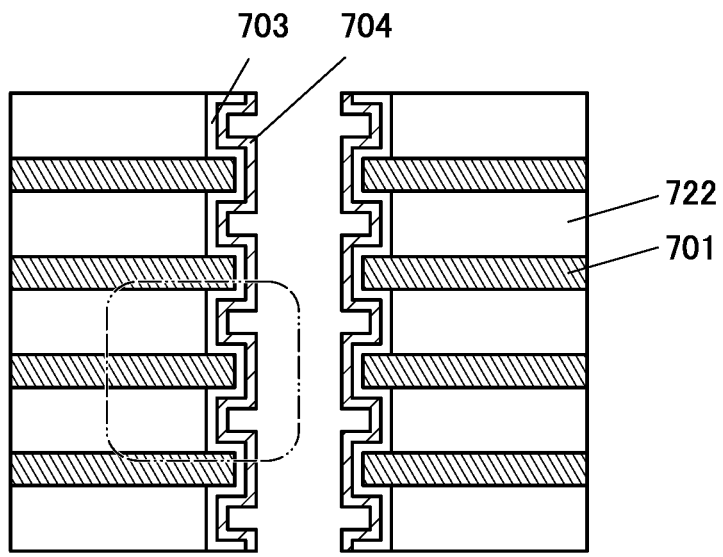
FIG. 8A and FIG. 8B are cross-sectional views illustrating a manufacturing process of a semiconductor device of one embodiment of the present invention.
Figure 8B:
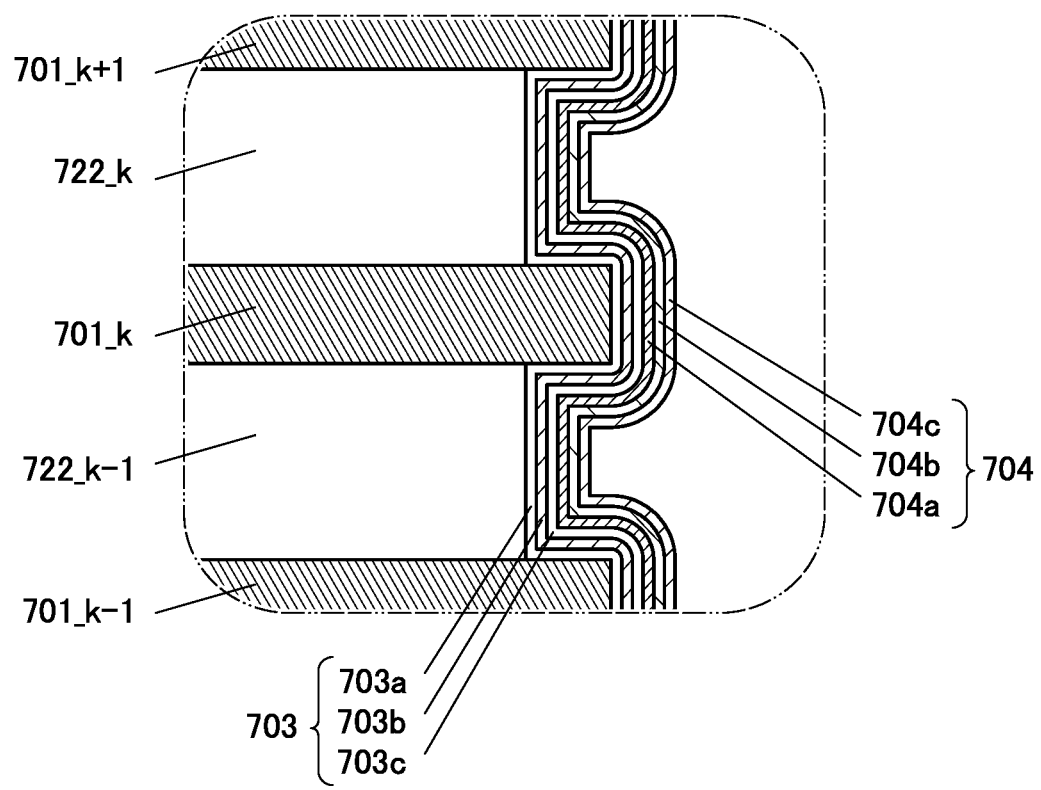

Next, as shown in FIG. 8A and FIG. 8B, the insulator 703 and the oxide 704 are formed in the opening. FIG. 8B is an enlarged view of a region surrounded by the dashed-dotted line in FIG. 8A, and shows a cross section of the conductor 701_k−1 and the insulator 722_k−1 in the k−1-th stage, the conductor 701_k and the insulator 722_k in the k-th stage, and the conductor 701_k+1 in the k+1-th stage (k is an integer of greater than or equal to 2 and less than or equal to m−1). The insulator 703 is formed by stacking the insulator 703a, the insulator 703b, and the insulator 703c in this order. The oxide 704 is formed by stacking the oxide 704a, the oxide 704b, and the oxide 704c in this order. Note that although not shown, the insulator 703 at the bottom portion of the opening is preferably removed before the oxide 704 is formed. The insulator 703 and the oxide 704 are formed with good coverage even on the recessions of the insulators 722, and the insulator 703a is formed in contact with the side surfaces of the insulators 722 and the side surfaces, part of the top surfaces, and part of bottom surfaces of the conductors 701.

Figure 9A:
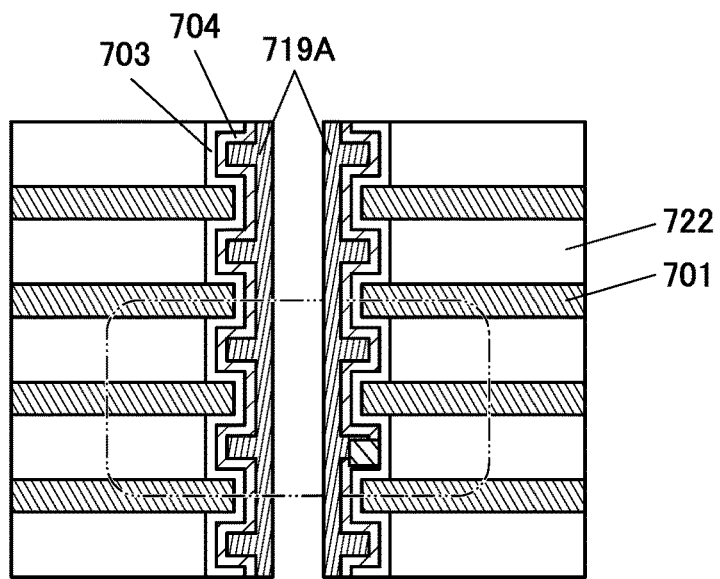
FIG. 9A to FIG. 9C are cross-sectional views illustrating a manufacturing process of a semiconductor device of one embodiment of the present invention.
Figure 9B:
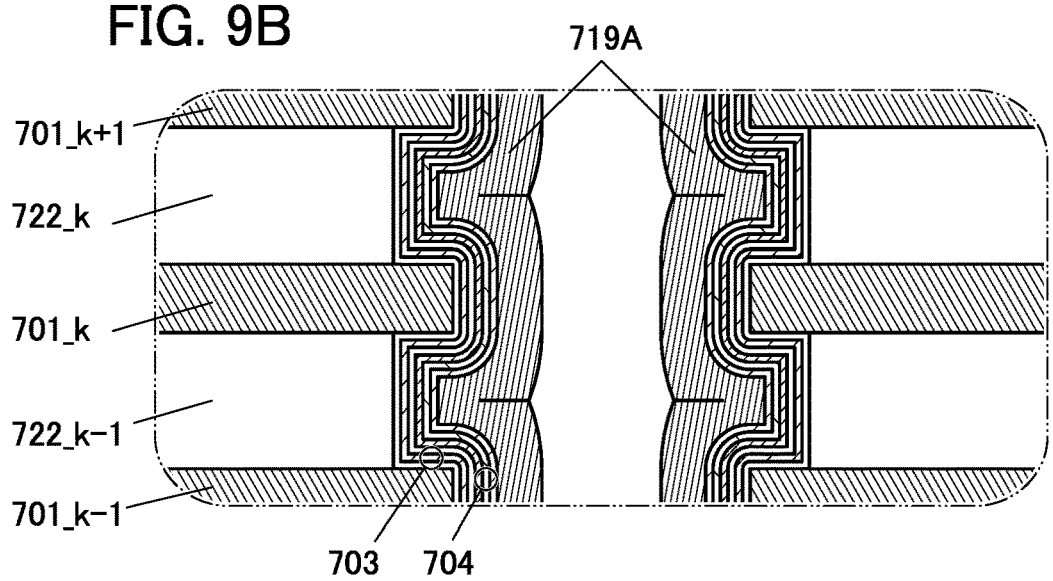
Figure 9C:
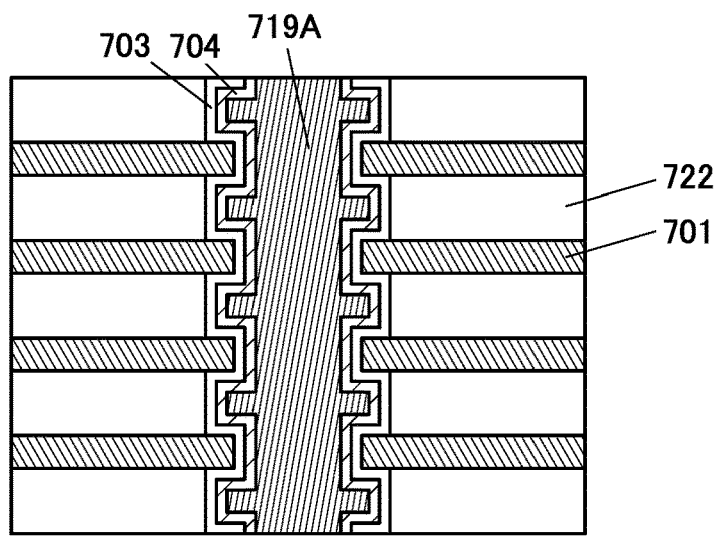

Next, as shown in FIG. 9A, a conductive film 719A is formed in the opening. FIG. 9B is an enlarged view of a portion surrounded by the dashed-dotted line in FIG. 9A. As shown in FIG. 9B, the conductive film 719A is formed to fill the inner sides of the recessions with the insulator 703 and the oxide 704 provided between the conductive film 719A and the side surface of the opening. However, the present invention is not limited thereto. As shown in FIG. 9C, the conductive film 719A may be formed to fill not only the recessions but also the whole opening.

Figure 10A:
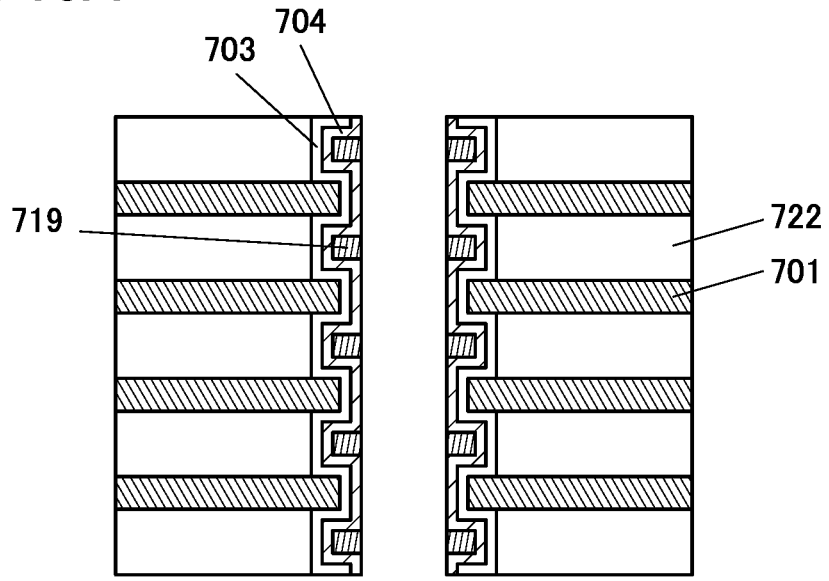
FIG. 10A and FIG. 10B are cross-sectional views illustrating a manufacturing process of a semiconductor device of one embodiment of the present invention.

Then, the conductive film 719A is processed to form the conductors 719 (see FIG. 10A). The conductive film 719A can be processed by isotropic etching or anisotropic etching. In the case where the formed conductive film 719A fills the recessions but does not completely fill the opening as shown in FIG. 9A, the conductive film 719A is preferably processed by isotropic etching. By contrast, in the case where the conductive film 719A is formed to fill the recessions and the opening as shown in FIG. 9C, it is preferable to use anisotropic etching. By such processing, the conductors 719 can be formed in the recessions.

After the formation of the conductors 719, heat treatment may be performed to reduce the resistance of the oxide 704 in regions in contact with the conductors 719. The timing of performing the heat treatment is not limited to this step. The heat treatment may be performed after later-described microwave treatment, after formation of the insulator 711, or after formation of the conductor 712.

Figure 10B:
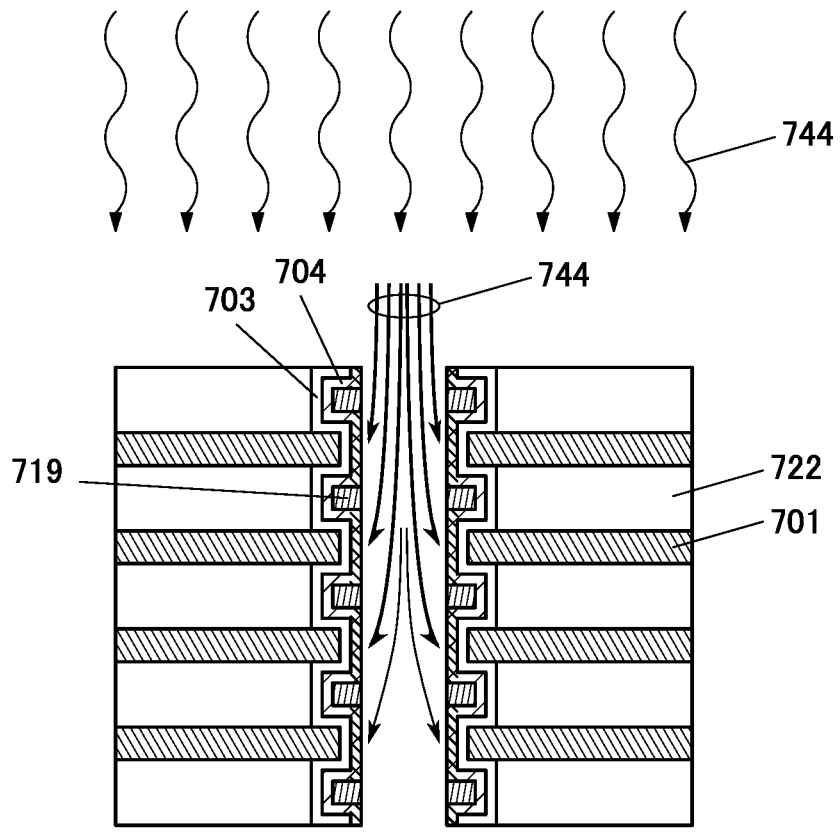
Figure 11:
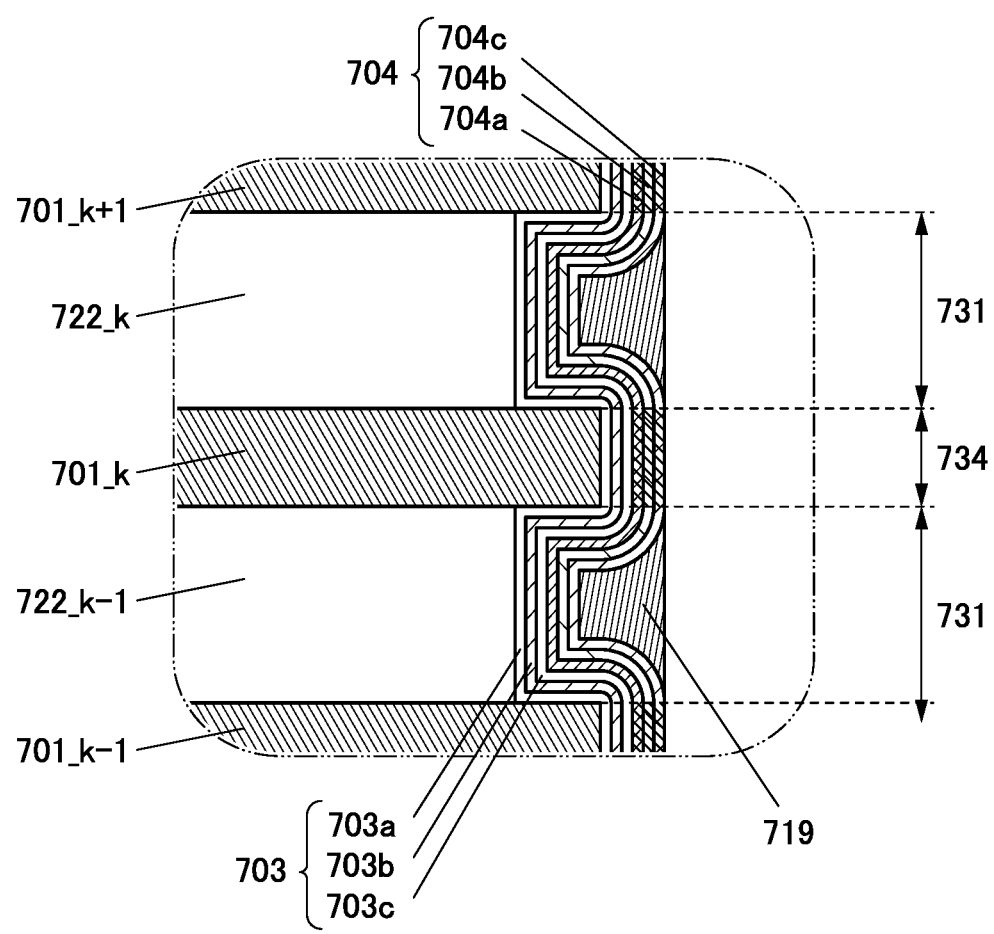
FIG. 11 is a cross-sectional view illustrating a manufacturing process of a semiconductor device of one embodiment of the present invention.

Then, microwave treatment is performed on the oxide 704 as shown in FIG. 10B. The microwave treatment is preferably performed in an atmosphere containing oxygen, particularly preferably in an atmosphere containing oxygen and argon. In the opening, the regions 734 of the oxide 704 and the conductors 719 are irradiated with a microwave 744 from above a substrate (also referred to as a wafer) over which the conductors 701, the insulators 722, the insulator 703, the oxide 704, and the conductors 719 are formed. Here, since the conductors 719 have a function of blocking the microwave 744, the regions 731 of the oxide 704 which are covered with the conductors 719 are not irradiated with the microwave 744.

The irradiation with the microwave 744 reduces the hydrogen concentration of the regions 734. In the regions 734, hydrogen is probably bonded to oxygen to form a water molecule or a hydroxide ion and be released out of the regions 734. Moreover, oxygen in the atmosphere is supplied to oxygen vacancies formed by the release of water molecules or hydroxide ions. This probably causes a decrease in the carrier concentration of the regions 734 and an increase in the resistance of the regions 734. As a result, the regions 734 can be the high-resistance regions, i.e., the I-type regions (see FIG. 11). Here, it is preferable that the microwave treatment make the carrier concentration of the oxide 704 lower than $1 \times 10^{18}/cm^3$, further preferably lower than or equal to $1 \times 10^{17}/cm^3$, still further preferably lower than or equal to $1 \times 10^{16}/cm^3$. The regions 731, which are not irradiated with the microwave 744, maintain their low resistance. Here, the carrier concentration of the regions 731 is preferably higher than or equal to $1 \times 10^{18}/cm^3$, further preferably higher than or equal to $1 \times 10^{19}/cm^3$, still further preferably higher than or equal to $1 \times 10^{20}/cm^3$.

During the microwave treatment, thermal energy might be directly transferred to the oxide 704 owing to electromagnetic interaction between the microwave and the molecules in the oxide 704. This thermal energy heats the oxide 704 in some cases. Such heat treatment is sometimes referred to as microwave annealing. When microwave treatment is performed in an atmosphere containing oxygen, an effect equivalent to that of oxygen annealing might be obtained. In the case where the oxide 704 contains hydrogen, the thermal energy might be transferred to hydrogen in the oxide 704, in which case the resultantly activated hydrogen is released from the oxide 704.

Figure 12A:
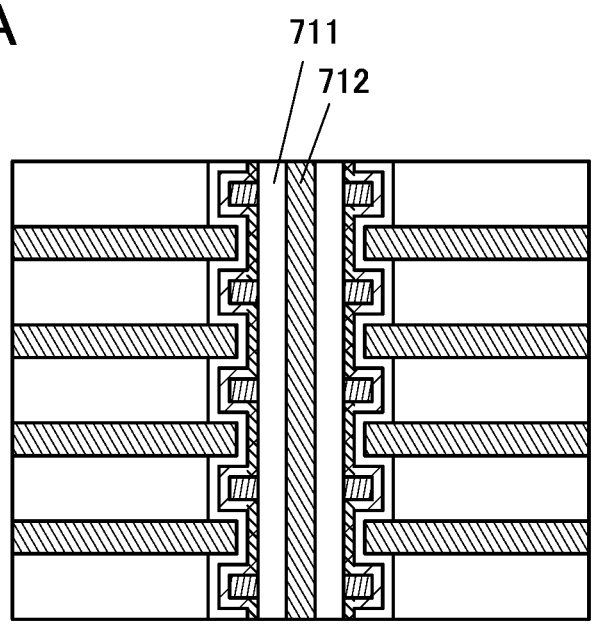
FIG. 12A and FIG. 12B are cross-sectional views illustrating a manufacturing process of a semiconductor device of one embodiment of the present invention.
Figure 12B:
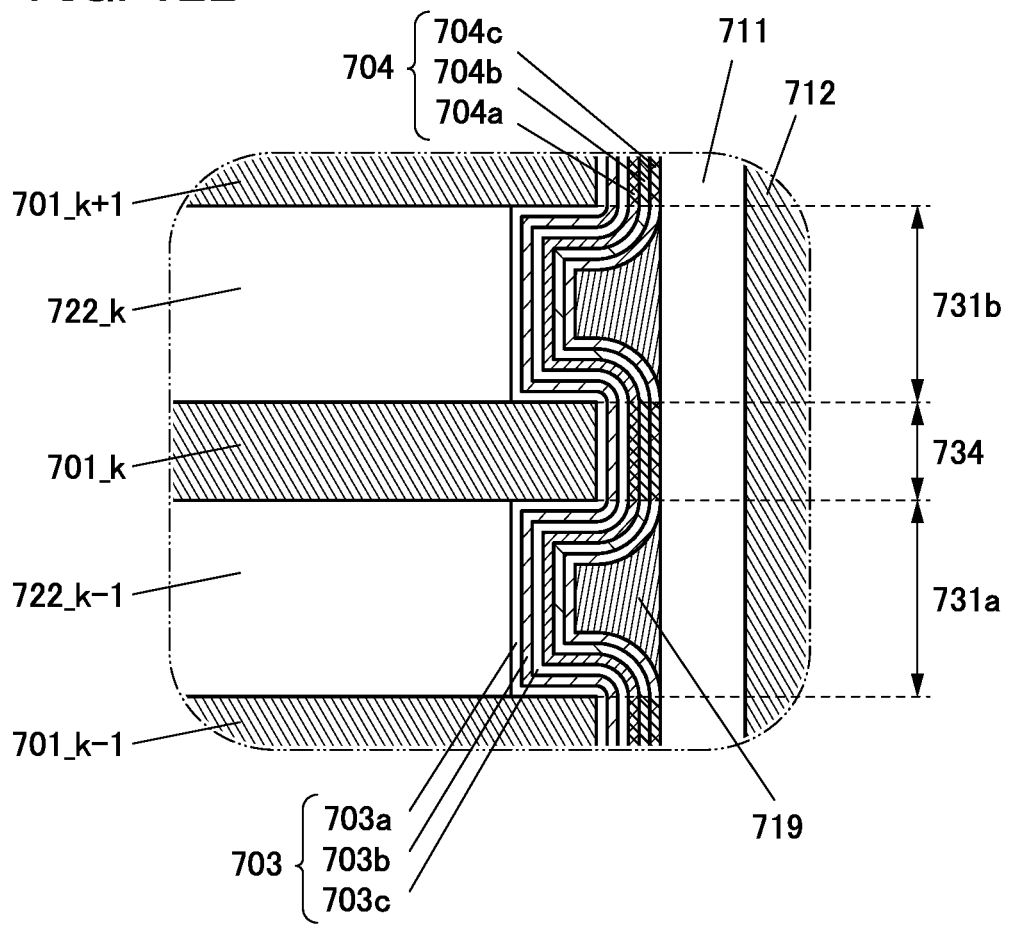

Next, the insulator 711 is formed inward from the oxide 704 and the conductors 719, and the conductor 712 is formed inward from the insulator 711 (see FIG. 12A). Note that the conductor 712 is not necessarily provided, and the inner sides of the oxide 704 and the conductors 719 may be filled with the insulator 711.

Here, heat treatment may be performed to reduce the resistance of the oxide 704 in contact with the conductors 719. The regions 731 (the region 731a and the region 731b) of the oxide 704 are in contact with the conductors 719, and thus have reduced resistance to become the low-resistance regions. By contrast, the regions 734, which are not in contact with the conductors 719, maintain their high resistance (see FIG. 12B). Incidentally, the above-described microwave treatment, i.e., the microwave annealing, may double as this heat treatment. In the case where the microwave annealing sufficiently heats the oxide 704 and the like, the heat treatment is not necessarily performed.

The region 734 of the oxide 704 serves as the channel formation region of the memory transistor MT. The region 731a serves as one of a source and a drain of the memory transistor MT and the region 731b serves as the other of the source and the drain. The conductor 701_k serves as the first gate of the memory transistor MT, the conductor 712 serves as the second gate, the insulator 703a serves as the first gate insulating layer, the insulator 703b serves as the charge accumulation layer, the insulator 703c serves as the tunnel insulating layer, and the insulator 711 serves as the second gate insulating layer. Note that the source or the drain of the memory transistor MT in which the conductor 701_k serves as the gate may serve as a drain or a source in the transistor positioned over or under the memory transistor MT. For example, when the region 731b serves as a source of a transistor in which the conductor 701_k serves as a gate, the region 731b may serve as a drain of a transistor in which the conductor 701_k+1 serves as a gate.

Through the above steps, the memory transistor MT serving as a memory cell can be formed. By the above method, the memory transistors MT in a plurality of layers can be manufactured at a time without performing patterning for manufacturing the memory transistors MT for each layer. Furthermore, in the case where a memory cell array is manufactured by the above method, even when the number of layers of the memory transistors MT is increased, the number of steps of patterning and etching of the memory transistors MT is not increased. In this manner, the process of manufacturing the memory cell array can be shortened; thus, a semiconductor device with high productivity can be provided.

Manufacturing Method 2 of Memory Cell

Next, a manufacturing method of a memory cell which is different from the above method is described with reference to FIG. 13A to FIG. 15C. Here, a manufacturing method of a memory cell which involves a different formation method of the conductor 701 is described. Note that components similar to the components described in Manufacturing method 1 of memory cell are denoted by the same reference numerals, and the components and the manufacturing methods of the components are sometimes not described.

Figure 13A:
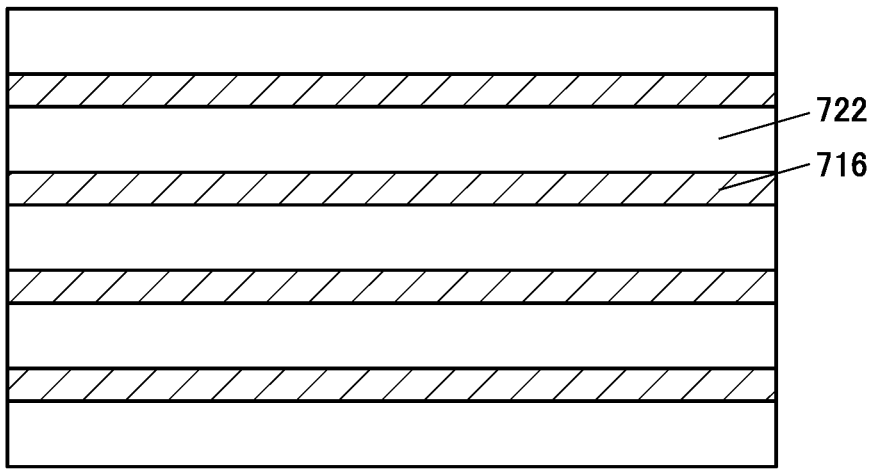
FIG. 13A to FIG. 13C are cross-sectional views illustrating a manufacturing process of a semiconductor device of one embodiment of the present invention.

First, the insulators 722 and layers 716 that can be selectively etched against the insulators 722 are alternately stacked as shown in FIG. 13A. The layers 716 are used as sacrifice layers and removed in a later step; thus, an insulator, a conductor, a semiconductor, or the like can be used as their material. For example, silicon nitride can be used for the layers 716.

Figure 13B:
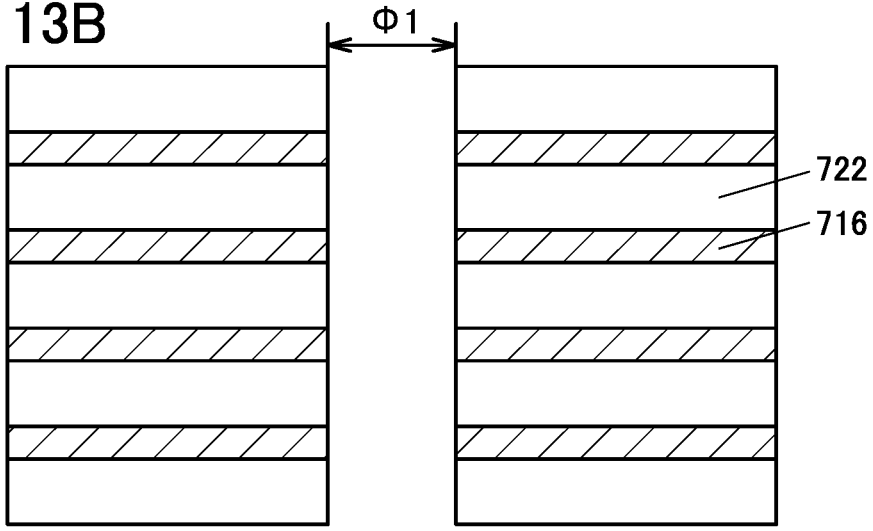

Then, as shown in FIG. 13B, the layers 716 and the insulators 722 are processed to form a first opening with a diameter of $\varphi 1$ in the layers 716 and the insulators 722.

Figure 13C:
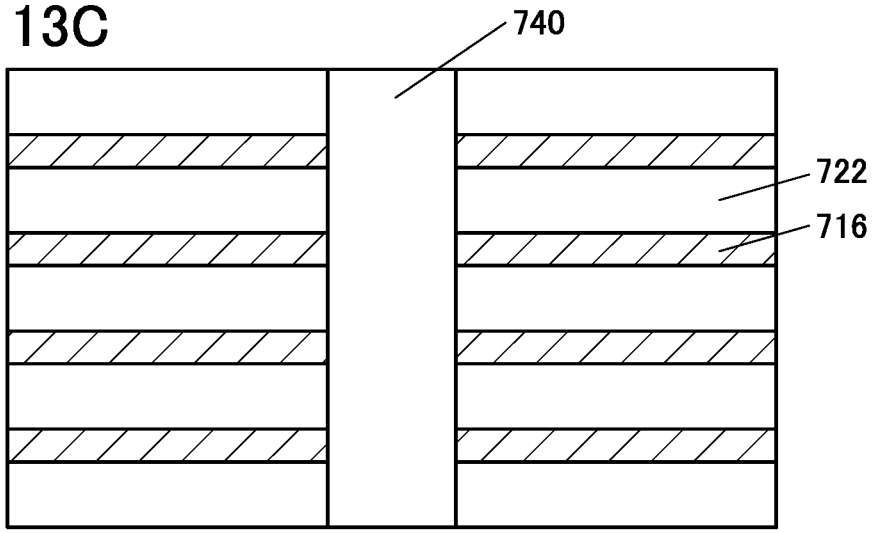

Then, a layer 740 is formed in the first opening as shown in FIG. 13C. The layer 740 is preferably formed to fill the inner side of the first opening. For the formation of the layer 740, one or both of a CVD method and an ALD method can be used. The layer 740 is preferably able to be selectively etched against the conductor 701 which is formed in a later step. The layer 740 is used as a sacrifice layer and removed in a later step; thus, an insulator, a conductor, a semiconductor, or the like can be used as its material. A material similar to that for the insulators 722 can be used for the layer 740.

Figure 14A:
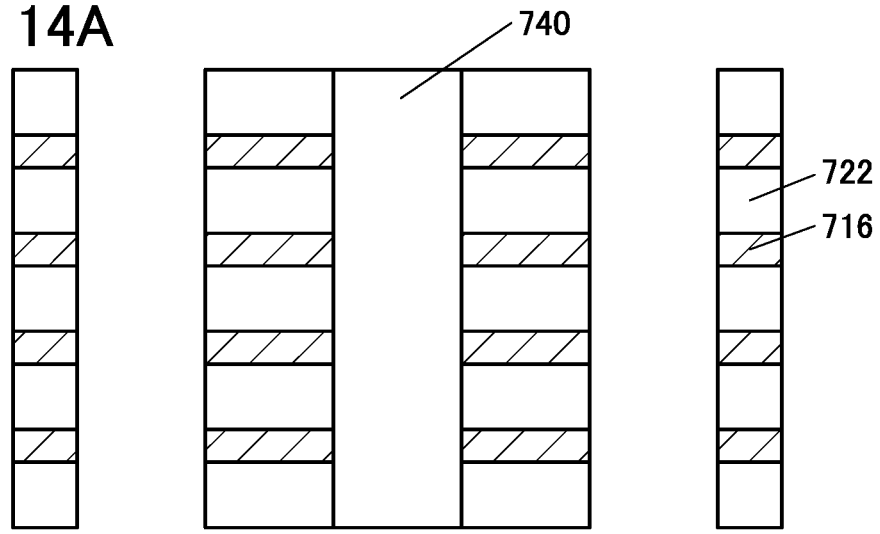
FIG. 14A to FIG. 14C are cross-sectional views illustrating a manufacturing process of a semiconductor device of one embodiment of the present invention.

Subsequently, the layers 716 and the insulators 722 are processed to form second openings in the layers 716 and the insulators 722 as shown in FIG. 14A. A plurality of the second openings, each of which has a slit shape, are formed to sandwich the first opening. The second openings are provided such that their major axes are parallel to each other.

Figure 14B:
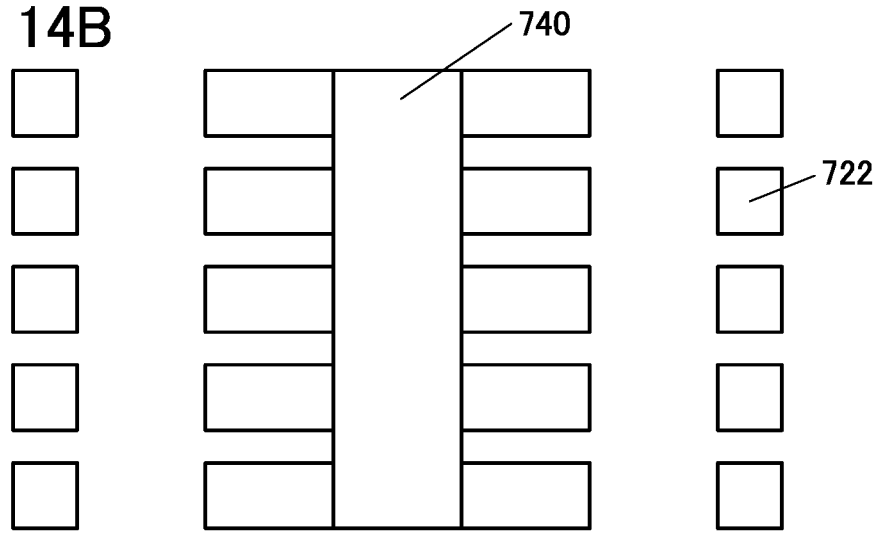

Subsequently, the layers 716 are etched to be removed as shown in FIG. 14B. For the etching of the layers 716, isotropic etching such as wet etching, plasma etching, or gas etching is preferably used. An etchant is introduced via the second openings to remove the layers 716.

Figure 14C:
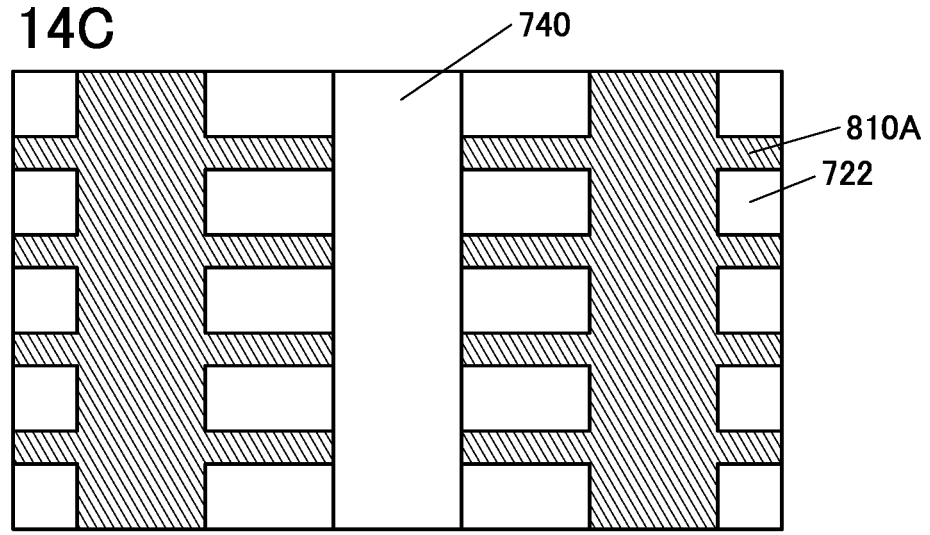

Then, a conductor 810A is formed to fill the inner sides of the second openings and the regions from which the layers 716 have been removed as shown in FIG. 14C. The conductor 810A can be formed by an ALD method or a CVD method. For the conductor 810A, a material similar to that for the conductor 701 can be used.

Figure 15A:
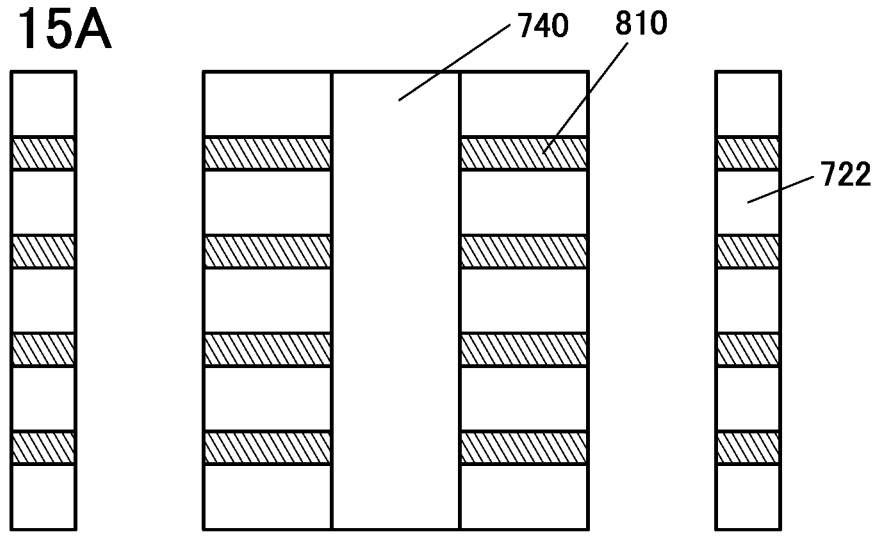
FIG. 15A to FIG. 15C are cross-sectional views illustrating a manufacturing process of a semiconductor device of one embodiment of the present invention.

Subsequently, as shown in FIG. 15A, the conductor 810A is processed to be partly removed, whereby conductors 810 are formed. By this processing, at least the conductor 810A in the second openings is removed. Anisotropic etching is preferably employed to remove the conductor 810A; for example, the conductor 810A is preferably processed in a self-aligned manner with the use of the uppermost insulator 722 as a mask. By this processing, the second openings are formed again.

Figure 15B:
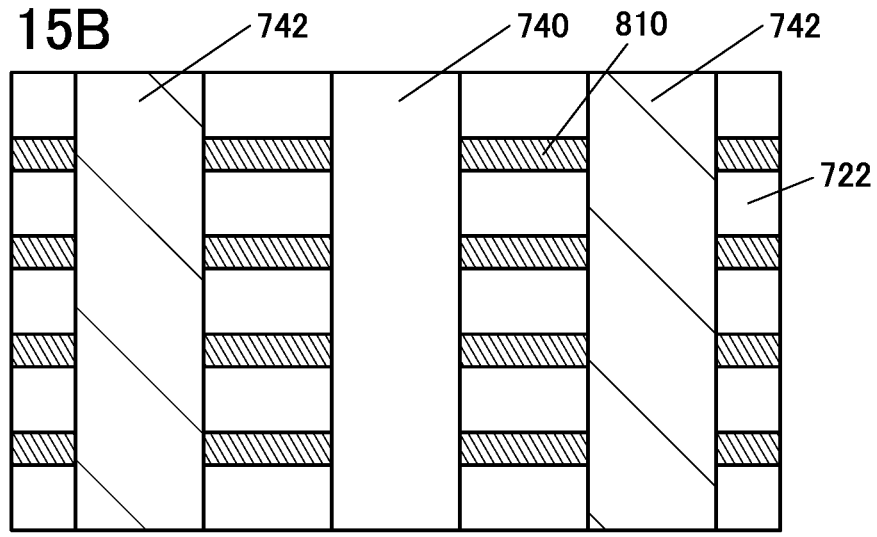

Then, an insulator 742 is formed to fill the second openings as shown in FIG. 15B. The insulator 742 can be formed by an ALD method or a CVD method. It is preferable that the insulator 742 be able to be selectively etched against the layer 740 in a later step. For the insulator 742, for example, silicon nitride, silicon nitride oxide, silicon oxynitride, or silicon oxide can be used.

Figure 15C:
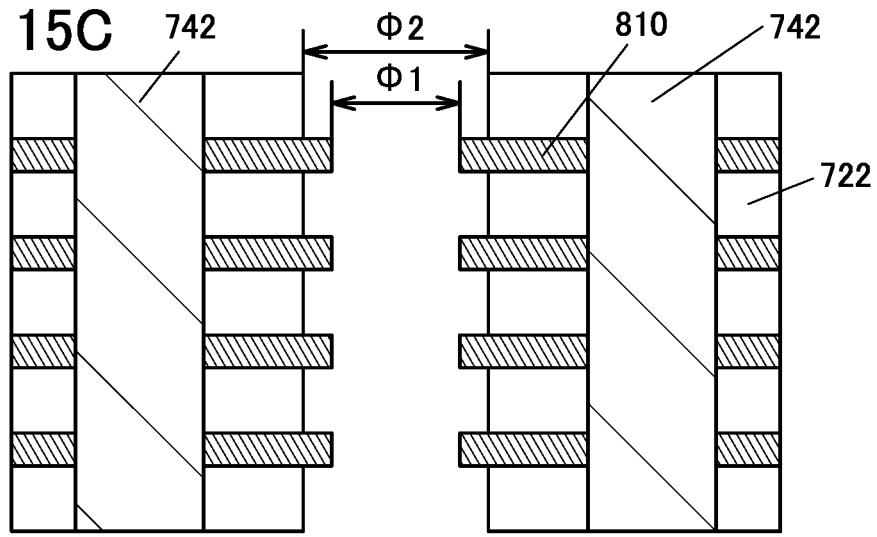

Subsequently, the layer 740 is processed to form the first opening again as shown in FIG. 15C. Anisotropic etching is preferably used to process the layer 740. In addition, isotropic etching is performed on the insulators 722 to increase the opening diameter of the insulators 722. The diameter of the opening at this time is $\varphi 2$ ($\varphi 2 > \varphi 1$). Here, it can be said that the insulators 722 each have a recession with respect to side surfaces of the conductors 810 between which the insulator 722 is vertically sandwiched. The processing of the insulators 722 may be performed in the same step as the anisotropic etching of the layer 740. For example, the processing of the insulators 722 may be performed during overetching by the anisotropic etching of the layer 740. Alternatively, the processing of the insulators 722 may be performed by isotropic etching after removal of the layer 740.

Then, although not shown, the insulator 703 and the oxide 704 are formed, the conductors 719 are formed, microwave treatment is performed, the insulator 711 is formed, and the conductor 712 is formed inward from the insulator 711, whereby a memory cell can be formed. These steps can be performed as in the method described in Manufacturing method 1 of memory cell.

(Manufacturing Method 1 of Memory Cell Array)

Next, one embodiment of a manufacturing method of a memory cell array of the present invention is described with reference to FIG. 16A to FIG. 34C. In each diagram of FIG. 16A to FIG. 34C, A is a top view seen from the z-axis direction, and B is a cross-sectional view of a portion indicated by the dashed-dotted line A1-A2 in A. Furthermore, C is a cross-sectional view of a portion indicated by the dashed-dotted line A3-A4 in A. FIG. 26D and FIG. 29D are enlarged cross-sectional views of portions surrounded by the dashed-dotted lines in FIG. 26B and FIG. 29B, respectively. In addition, components similar to the components described in Manufacturing method 1 of memory cell are denoted by the same reference numerals, and the components and the manufacturing methods of the components are sometimes not described.

Figure 16A:
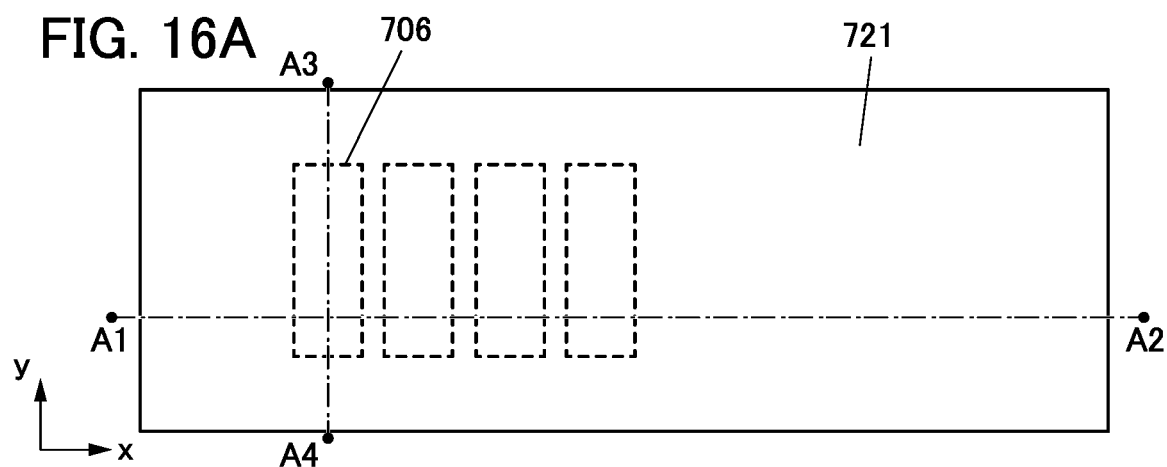
FIG. 16A is a top view illustrating a manufacturing process of a semiconductor device of one embodiment of the present invention.
Figure 16B:
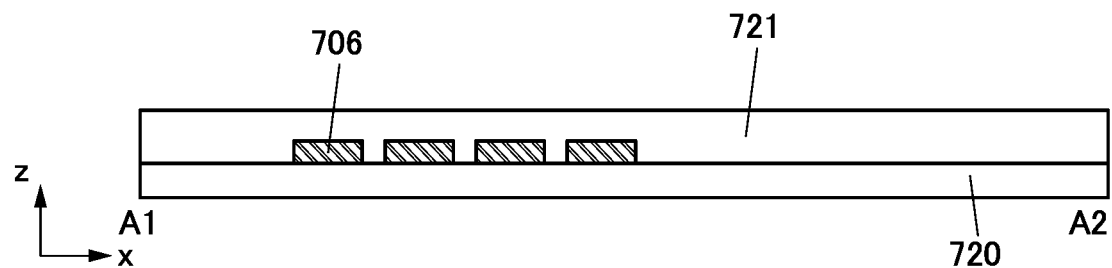
FIG. 16B and FIG. 16C are cross-sectional views illustrating the manufacturing process of the semiconductor device of one embodiment of the present invention.
Figure 16C:
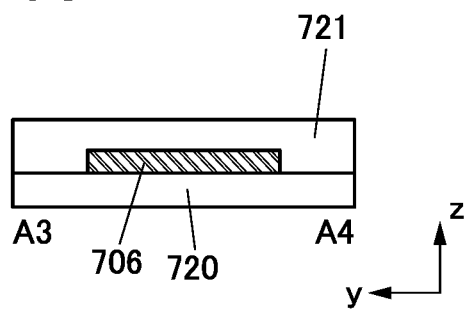
Figure 17A:
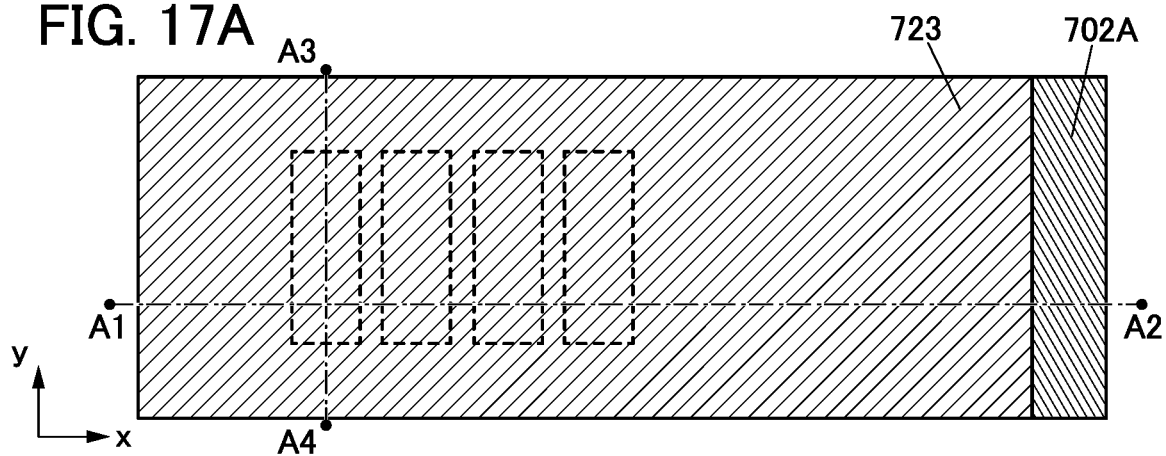
FIG. 17A is a top view illustrating a manufacturing process of a semiconductor device of one embodiment of the present invention.
Figure 17B:
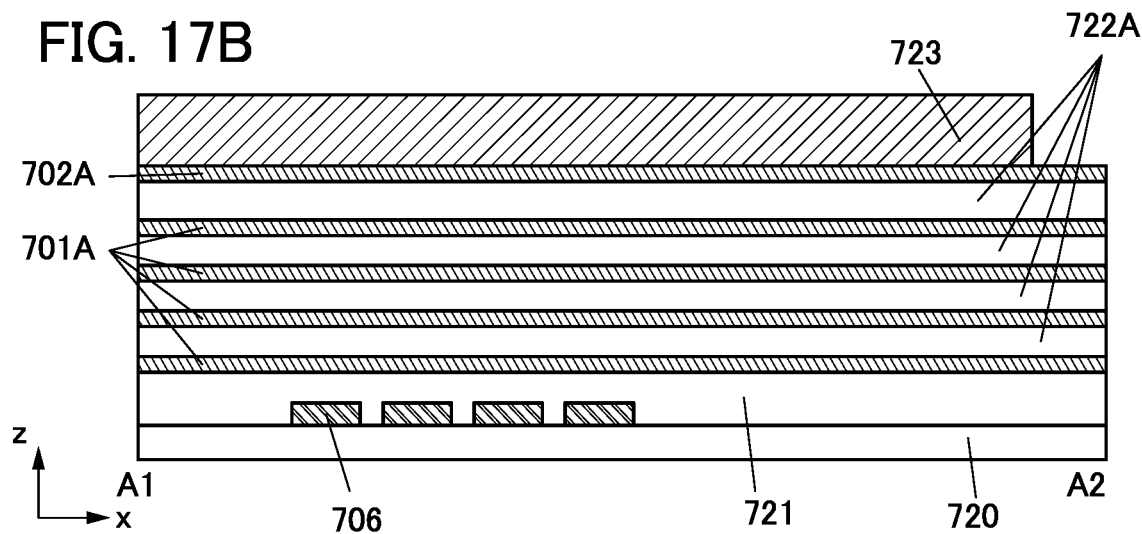
FIG. 17B and FIG. 17C are cross-sectional views illustrating the manufacturing process of the semiconductor device of one embodiment of the present invention.
Figure 17C:
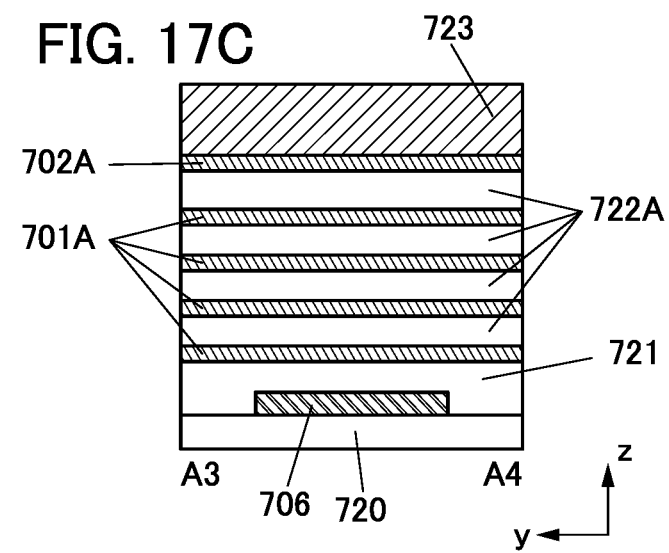

First, the conductors 706 are formed over the base 720 having an insulating surface, and the insulator 721 is formed to cover the conductors 706 (see FIG. 16A to FIG. 16C).

First, a conductive film is formed and processed by a lithography method, whereby the conductors 706 are formed. Note that the method for forming the conductors 706 and the insulator 721 is not limited thereto and they may be formed in the following manner: the insulator 721 is formed over the base 720, unnecessary portions of the insulator 721 are removed to form grooves or openings, and the conductors 706 are embedded in the grooves or the opening portions. Such a formation method of conductors is referred to as a damascene method (a single damascene method or a dual damascene method) in some cases. When an insulating film is further formed over the conductors 706 formed by the damascene method and the insulator 721, the structure shown in FIG. 16A to FIG. 16C can be obtained.

The conductors 706 and the insulator 721 can be formed by a sputtering method, a CVD method, a molecular beam epitaxy (MBE) method, a pulsed laser deposition (PLD) method, an ALD method, or the like.

Note that the CVD method can be classified into a plasma CVD (PECVD: Plasma Enhanced CVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas to be used.

By a plasma CVD method, a high-quality film can be obtained at a relatively low temperature. Furthermore, a thermal CVD method is a deposition method that does not use plasma and thus enables less plasma damage to an object to be processed. For example, a wiring, an electrode, an element (a transistor, a capacitor, or the like), or the like included in a semiconductor device might be charged up by receiving electric charge from plasma. In that case, accumulated electric charge might break the wiring, the electrode, the element, or the like included in the semiconductor device. By contrast, such plasma damage does not occur in the case of a thermal CVD method, which does not use plasma, and thus the yield of the semiconductor device can be increased. In addition, a thermal CVD method does not cause plasma damage during deposition, so that a film with few defects can be obtained.

An ALD method is also a deposition method that enables less plasma damage to an object. An ALD method also does not cause plasma damage during deposition, so that a film with few defects can be obtained.

Unlike a deposition method in which particles ejected from a target or the like are deposited, a CVD method and an ALD method are deposition methods in which a film is formed by reaction at a surface of an object to be processed. Thus, a CVD method and an ALD method are deposition methods that enable favorable step coverage almost regardless of the shape of an object to be processed. In particular, an ALD method has excellent step coverage and excellent thickness uniformity and thus is suitable for covering a surface of an opening portion with a high aspect ratio, for example. On the other hand, an ALD method has a relatively low deposition rate, and thus is preferably used in combination with another deposition method with a high deposition rate, such as a CVD method, in some cases.

A CVD method and an ALD method enable control of the composition of a film to be obtained with the flow rate ratio of the source gases. For example, by a CVD method and an ALD method, a film with a certain composition can be deposited depending on the flow rate ratio of the source gases. Moreover, for example, by a CVD method or an ALD method, by changing the flow rate ratio of the source gases during the deposition, a film whose composition is continuously changed can be deposited. In the case of performing deposition while changing the flow rate ratio of the source gases, as compared with the case of performing deposition with use of a plurality of deposition chambers, the time taken for the deposition can be shortened because the time taken for transfer and pressure adjustment is omitted. Thus, the productivity of the semiconductor device can be increased in some cases.

Note that in the lithography method, first, a resist is exposed to light through a photomask. Next, a region exposed to light is removed or left using a developer, so that a resist mask is formed. Then, etching treatment through the resist mask is conducted, whereby a conductor, a semiconductor, an insulator, or the like can be processed into a desired shape. The resist mask is formed by, for example, exposure of the resist to KrF excimer laser light, ArF excimer laser light, EUV (Extreme Ultraviolet) light, or the like. Alternatively, a liquid immersion technique may be employed in which a gap between a substrate and a projection lens is filled with liquid (e.g., water) in light exposure. Alternatively, an electron beam or an ion beam may be used instead of the light. Note that a photomask is unnecessary in the case of using an electron beam or an ion beam. Note that the resist mask can be removed by dry etching treatment such as ashing, wet etching treatment, wet etching treatment after dry etching treatment, or dry etching treatment after wet etching treatment.

In addition, a hard mask formed of an insulator or a conductor may be used instead of the resist mask. In the case where a hard mask is used, a hard mask with a desired shape can be formed by forming an insulating film or a conductive film to be the hard mask material over the conductive film, forming a resist mask thereover, and then etching the hard mask material.

For the processing, a dry etching method or a wet etching method can be employed. Processing by a dry etching method is suitable for microfabrication.

As a dry etching apparatus, a capacitively coupled plasma (CCP) etching apparatus including parallel plate electrodes can be used. The capacitively coupled plasma etching apparatus including the parallel plate electrodes may have a structure in which a high-frequency power is applied to one of the parallel plate electrodes. Alternatively, a structure may be employed in which different high-frequency powers are applied to one of the parallel plate electrodes. Alternatively, a structure may be employed in which high-frequency powers with the same frequency are applied to the parallel plate electrodes. Alternatively, a structure may be employed in which high-frequency powers with different frequencies are applied to the parallel plate electrodes. Alternatively, a dry etching apparatus including a high-density plasma source can be used. As the dry etching apparatus including a high-density plasma source, an inductively coupled plasma (ICP) etching apparatus or the like can be used, for example.

In the case where a hard mask is used for etching of the conductive film, the etching treatment may be performed after the resist mask used for formation of the hard mask is removed or with the resist mask left. In the latter case, the resist mask sometimes disappears during the etching. The hard mask may be removed by etching after the etching of the conductive film. Meanwhile, the hard mask is not necessarily removed when the hard mask material does not affect later steps or can be utilized in later steps.

As the conductive film to be the conductors 706, a conductive film containing a metal element is preferably formed by a sputtering method. The conductive film can also be formed by a CVD method.

A surface of the insulator 721 is preferably subjected to planarization treatment as needed. A chemical mechanical polishing (CMP) method or a reflow method can be used for the planarization treatment.

Conductive films 701A and insulating films 722A are alternately stacked over the conductors 706 and the insulator 721. This embodiment shows an example in which the conductive film 701A is formed over the insulator 721 and the insulating film 722A is formed over the conductive film 701A; however, the order of the formation is not limited thereto. The insulating film 722A may be formed over the insulator 721, and the conductive film 701A may be formed over the insulating film 722A. A CVD method can be used for the formation of the conductive films 701A and the insulating films 722A. Alternatively, a sputtering method may be used.

For the conductors 706 and the conductive films 701A, a conductive material such as silicon to which an impurity is added or a metal can be used. The conductors 706 and the conductive films 701A may be formed using the same material or different materials. In the case of using silicon for the conductors 706 or the conductive films 701A, amorphous silicon or polysilicon can be used. Furthermore, a p-type impurity or an n-type impurity may be added to impart conductivity to silicon. As a conductive material containing silicon, silicide containing titanium, cobalt, or nickel can be used for the conductors 706 or the conductive films 701A. When a metal material is used for the conductors 706 or the conductive films 701A, a material containing one or more kinds of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used.

For the insulator 721 and the insulating films 722A, an oxide, a nitride, an oxynitride, a nitride oxide, a metal oxide, a metal oxynitride, a metal nitride oxide, or the like which has an insulating property can be used. It is possible to use silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, aluminum oxide, gallium oxide, hafnium oxide, zirconium oxide, an oxide containing aluminum and hafnium, an oxynitride containing aluminum and hafnium, an oxide containing silicon and hafnium, an oxynitride containing silicon and hafnium, a nitride containing silicon and hafnium, or the like.

Although an example in which four layers of the conductive films 701A and four layers of the insulating films 722A are formed is described in this embodiment, the number of stacked layers is not limited thereto. Five or more layers of the conductive films 701A and five of more layers of the insulating films 722A may be formed depending on the required performance of the semiconductor device. For example, 32 layers, 64 layers, 128 layers, or 200 or more layers of the conductive films 701A and the insulating films 722A may be formed.

A conductive film 702A is formed over the uppermost conductive film 722A. A mask 723 is formed over the conductive film 702A (see FIG. 17A to FIG. 17C). The conductive film 702A can be formed using a method and a material similar to those of the conductive films 701A. Note that the conductive film 702A may be formed by the same method as or a method different from that of the conductive films 701A. As the conductive film 702A, a material that is the same as or different from that of the conductive films 701A may be used.

Figure 18A:
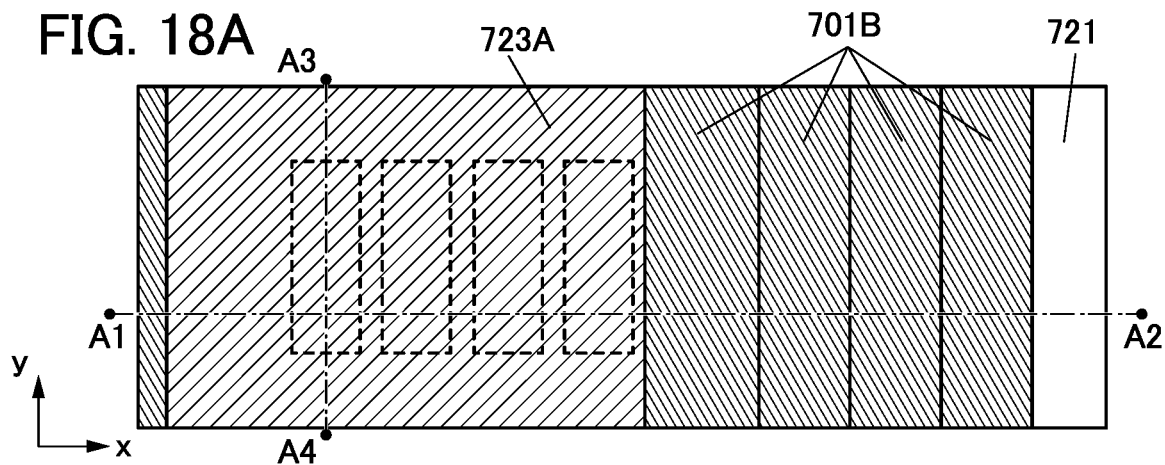
FIG. 18A is a top view illustrating a manufacturing process of a semiconductor device of one embodiment of the present invention.
Figure 18B:
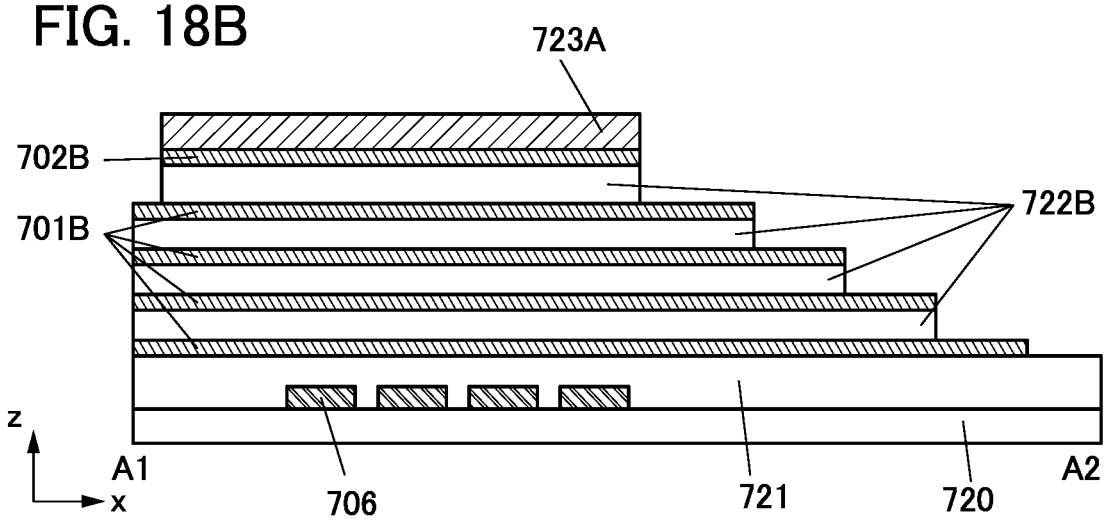
FIG. 18B and FIG. 18C are cross-sectional views illustrating the manufacturing process of the semiconductor device of one embodiment of the present invention.
Figure 18C:
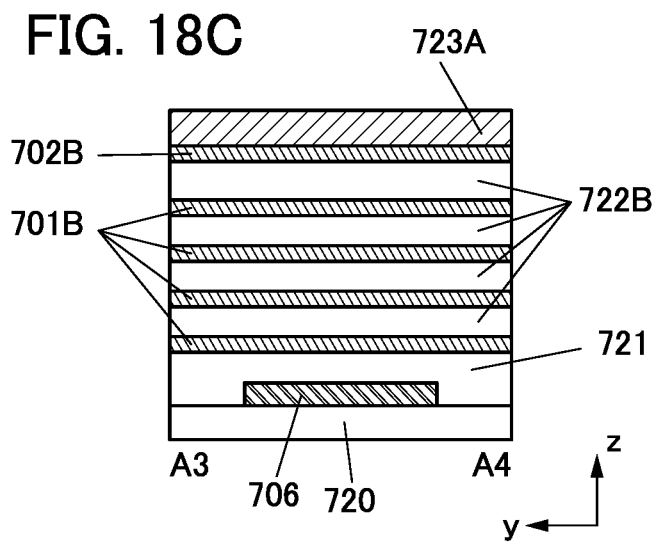
Figure 20A:
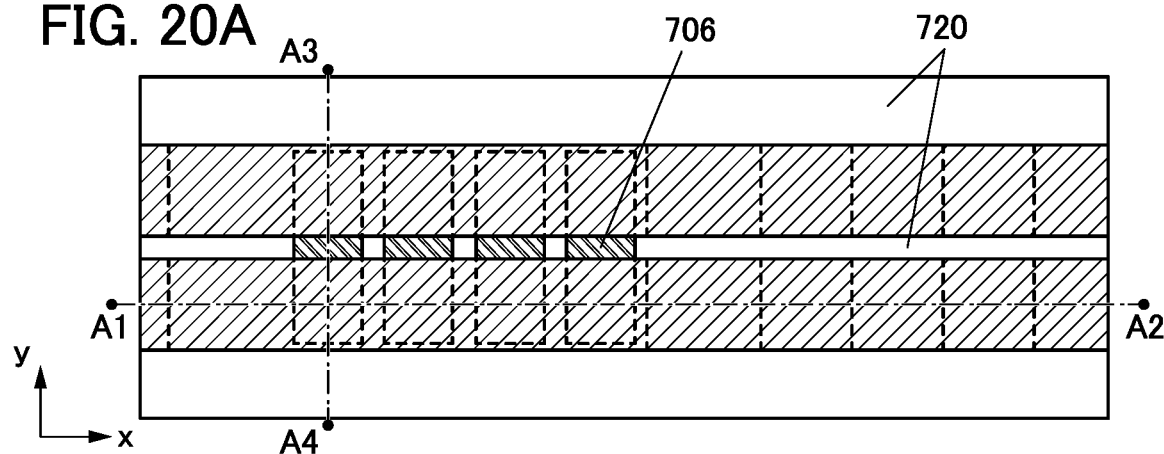
FIG. 20A is a top view illustrating a manufacturing process of a semiconductor device of one embodiment of the present invention.
Figure 20B:
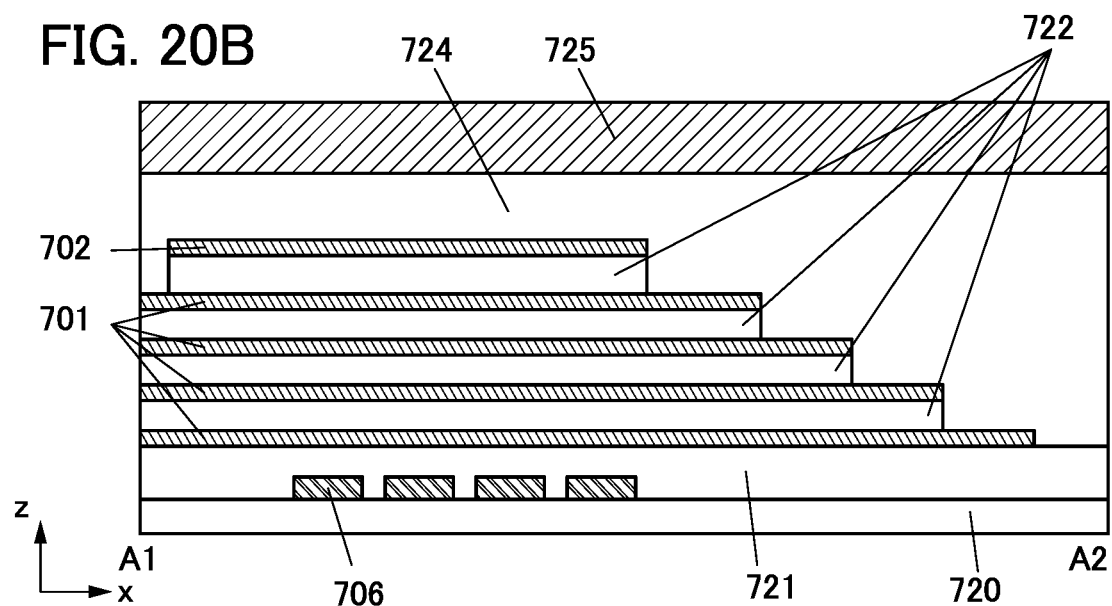
FIG. 20B and FIG. 20C are cross-sectional views illustrating the manufacturing process of the semiconductor device of one embodiment of the present invention.
Figure 20C:
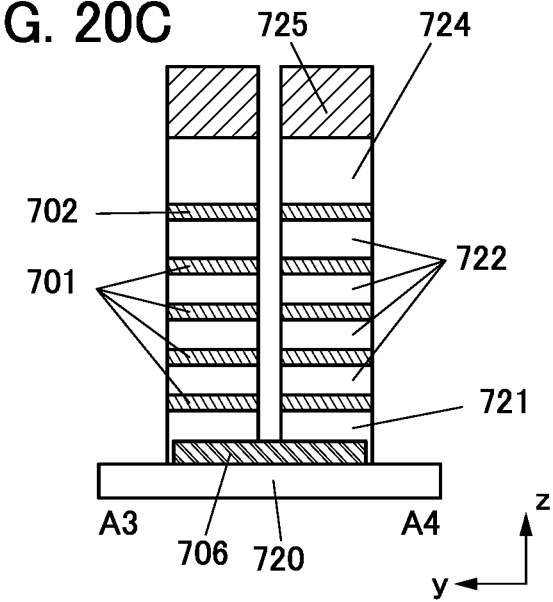
Figure 21A:
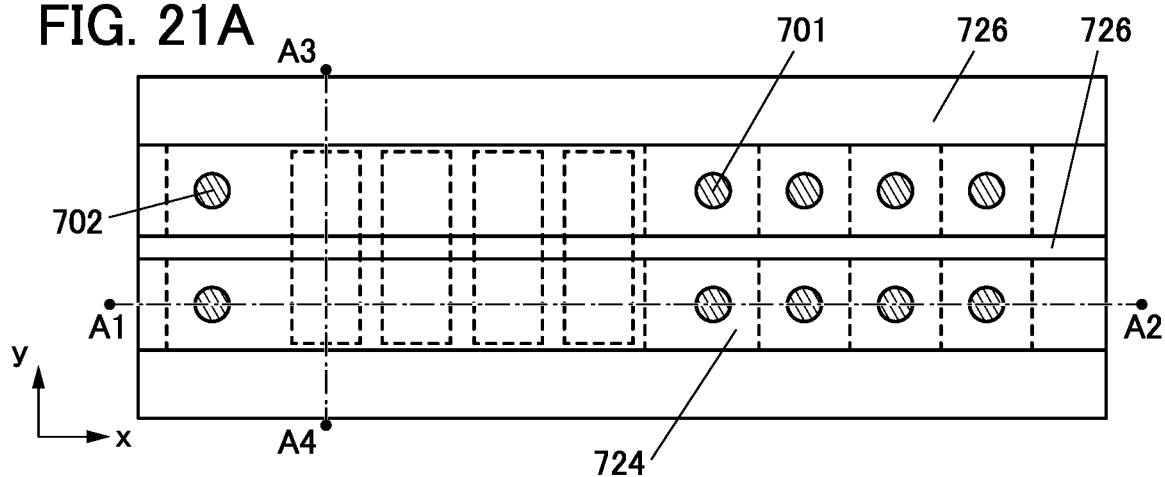
FIG. 21A is a top view illustrating a manufacturing process of a semiconductor device of one embodiment of the present invention.
Figure 21B:
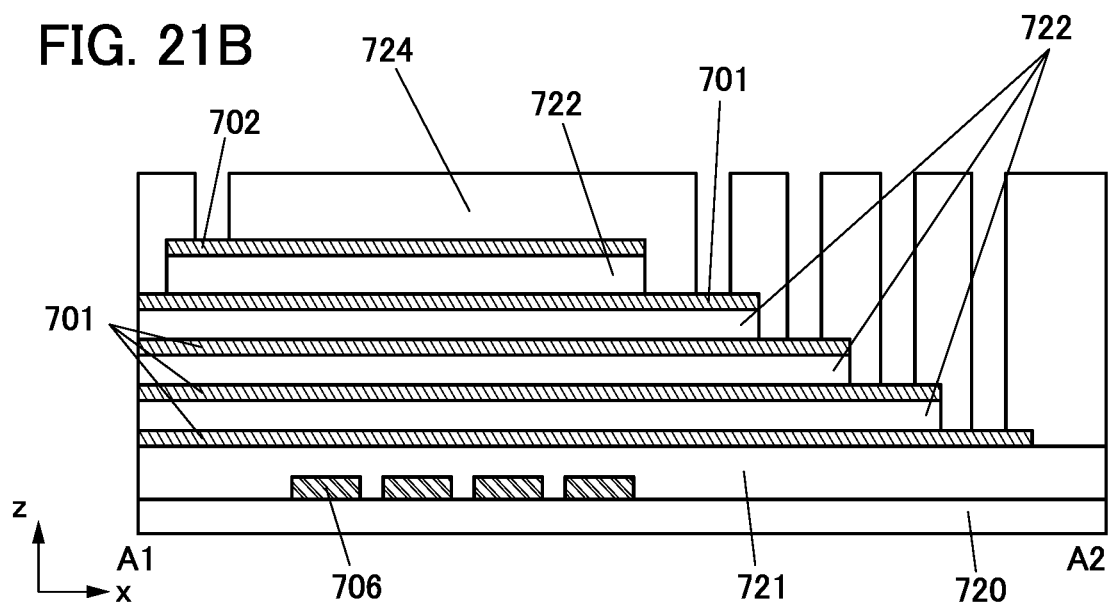
FIG. 21B and FIG. 21C are cross-sectional views illustrating the manufacturing process of the semiconductor device of one embodiment of the present invention.
Figure 21C:
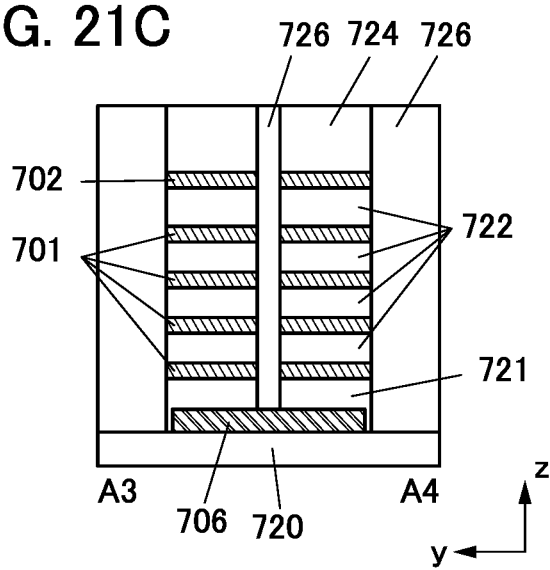

Next, the conductive film 702A, the conductive films 701A, and the insulating films 722A are processed to form conductors 701B, a conductor 702B, and insulators 722B which have a step-like shape as shown in FIG. 18B. In the processing of the conductive film 702A, the conductive films 701A, and the insulating films 722A, etching of the conductive film 702A, the conductive films 701A, and the insulating films 722A and slimming of the mask 723 are alternately performed, whereby the conductors 701B, the conductor 702B, and the insulators 722B which have a step-like shape can be formed. By the processing of the conductive film 702A, the conductive films 701A, and the insulating films 722A, the mask 723 is reduced in width and thickness to be a mask 723A (see FIG. 18A to FIG. 18C).

Then, the mask 723A is removed, and the insulator 724 is formed. The insulator 724 can be formed by a CVD method. The insulator 724 is preferably subjected to planarization treatment by a CMP method or a reflow method. Masks 725 are formed over the insulator 724. The masks 725 are formed over the planarized insulator 724, whereby the accuracy of lithography is improved (see FIG. 19A to FIG. 19C).

Then, the insulator 724, the conductor 702B, the conductors 701B, the insulators 722B, and the insulator 721 are processed with the use of the masks 725. By the processing, the conductors 701 which serve as the gates of the memory transistors MT and are electrically connected to the word lines, and the conductor 702 which serves as the gate of the selection transistor are formed. In addition, by the processing, the insulators 722B become the insulators 722 (see FIG. 20A to FIG. 20C).

Then, the masks 725 are removed. After that, the insulator 726 is formed to be embedded in the portions from which the insulator 724, the conductor 702B, the conductors 701B, the insulators 722B, and the insulator 721 have been removed by the above processing. The insulator 726 can be formed by a CVD method or an ALD method. It is particularly preferable to employ an ALD method, in which case a film with a uniform thickness can be formed even in a groove or an opening portion having a high aspect ratio. Alternatively, the insulator 726 may be formed by a combination of an ALD method and a CVD method. The insulator 726 is preferably subjected to planarization treatment by a CMP method or a reflow method. In the case where the planarization treatment is performed by a CMP method, the insulator 726 may be polished until a surface of the insulator 724 is exposed. Alternatively, the insulator 724 and the insulator 726 may be polished together. In this case, the thickness of the insulator 724 becomes small.

Next, the insulator 724 is processed by a lithography method to form first openings so that the conductors 701 and the conductor 702 are exposed. The first opening is formed for each of the conductors 701 formed in a step-like shape (see FIG. 21A to FIG. 21C).

Figure 22A:
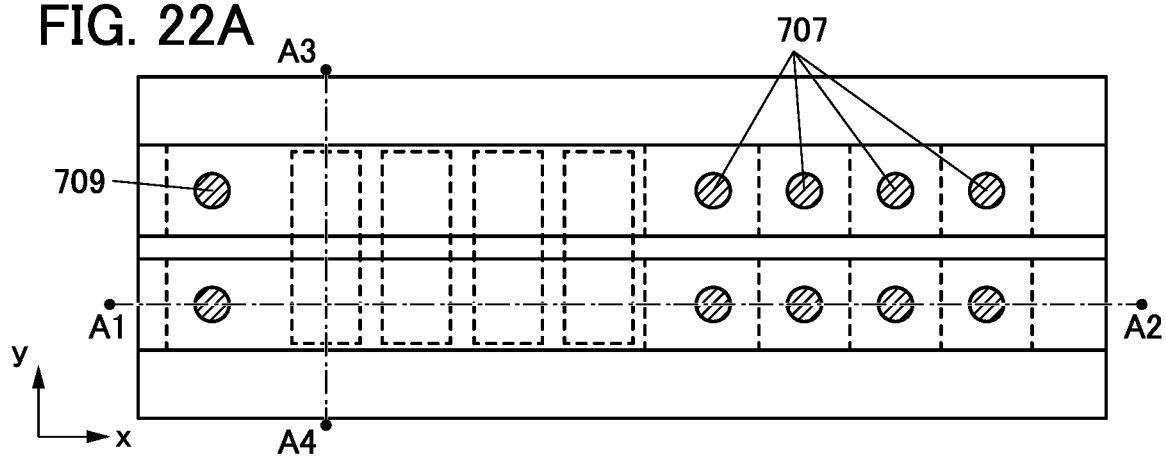
FIG. 22A is a top view illustrating a manufacturing process of a semiconductor device of one embodiment of the present invention.
Figure 22B:
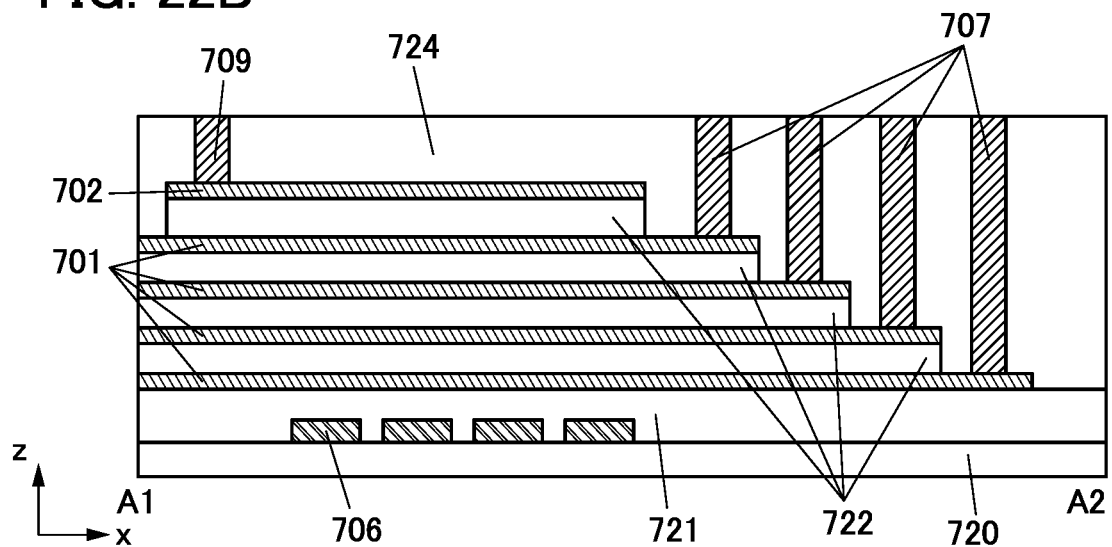
FIG. 22B and FIG. 22C are cross-sectional views illustrating the manufacturing process of the semiconductor device of one embodiment of the present invention.
Figure 22C:
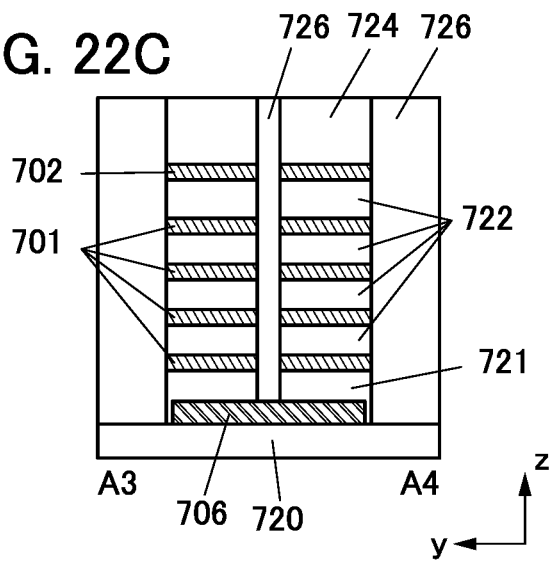

Next, the conductors 707 electrically connected to the conductors 701 and the conductor 709 electrically connected to the conductor 702 are formed to fill the first openings (see FIG. 22A to FIG. 22C). The conductors 707 and the conductor 709 can be formed by a CVD method or an ALD method. It is particularly preferable to employ an ALD method, in which case a film with a uniform thickness can be formed even in a groove or an opening portion having a high aspect ratio. Alternatively, the conductors 707 and the conductor 709 may be formed by a combination of an ALD method and a CVD method. The conductors 707 and the conductor 709 may have a stacked-layer structure composed of a plurality of layers. The conductors 707 and the conductor 709 can be formed in such a manner that a conductive film to be the conductors 707 and the conductor 709 is formed over the insulator 724 and in the first openings and an unnecessary conductive film is removed by CMP or the like.

Figure 23A:
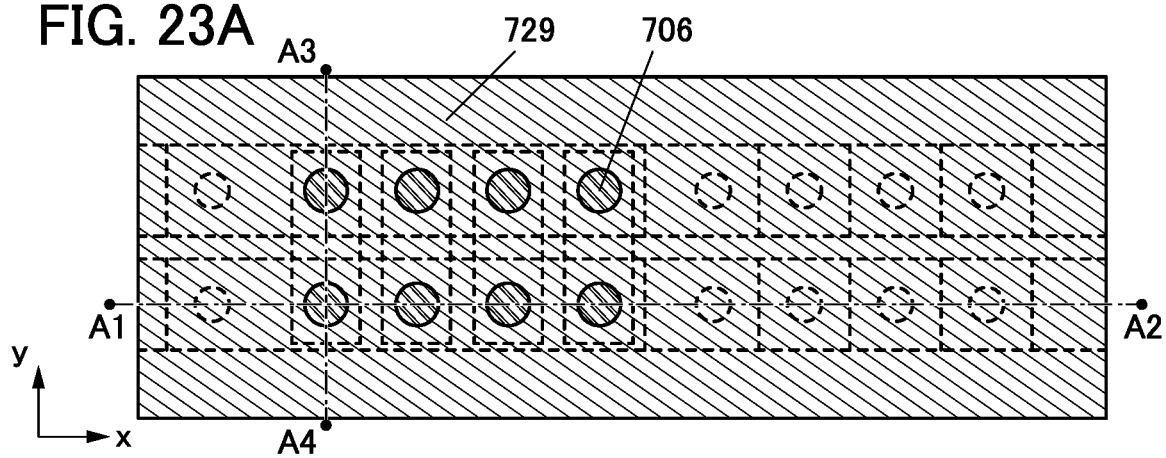
FIG. 23A is a top view illustrating a manufacturing process of a semiconductor device of one embodiment of the present invention.
Figure 23B:
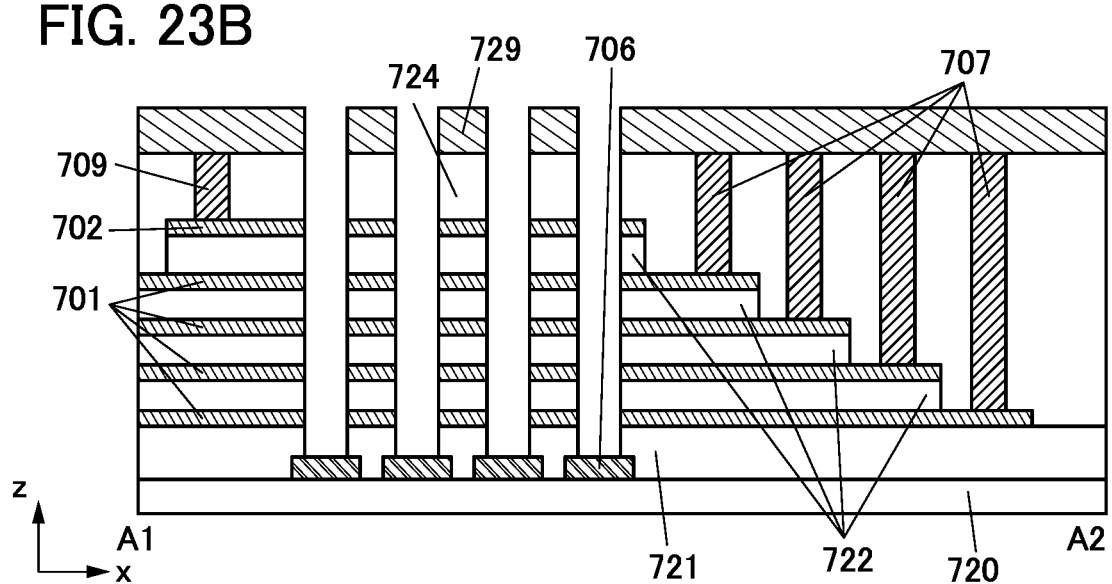
FIG. 23B and FIG. 23C are cross-sectional views illustrating the manufacturing process of the semiconductor device of one embodiment of the present invention.
Figure 23C:
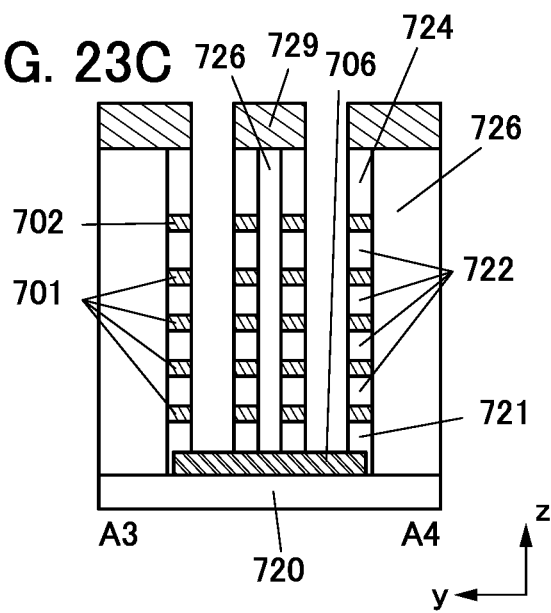

Next, a mask 729 is formed over the insulator 724 and the insulator 726, and the insulator 724, the conductor 702, the conductors 701, the insulators 722, and the insulator 721 are processed by a lithography method to form second openings exposing the conductors 706 (see FIG. 23A to FIG. 23C).

Figure 24A:
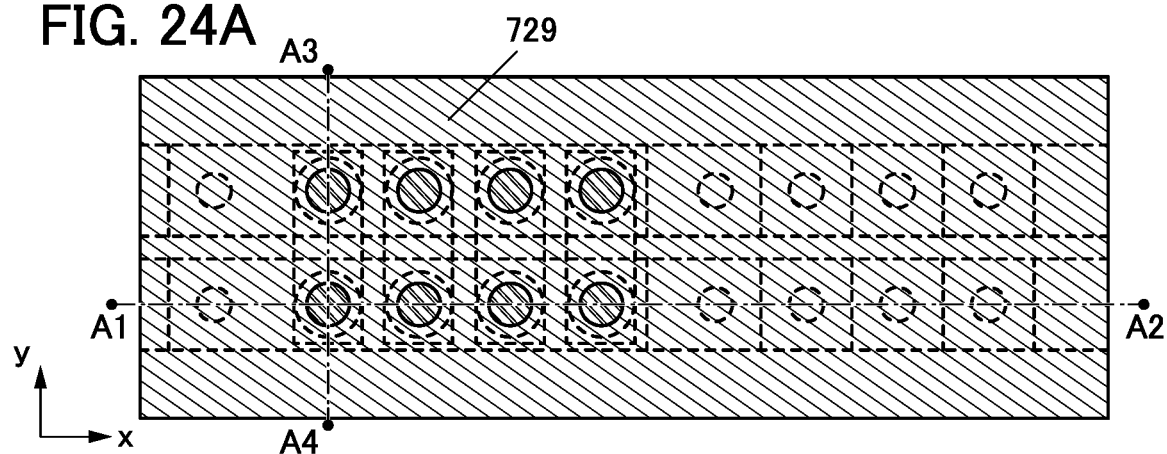
FIG. 24A is a top view illustrating a manufacturing process of a semiconductor device of one embodiment of the present invention.
Figure 24B:
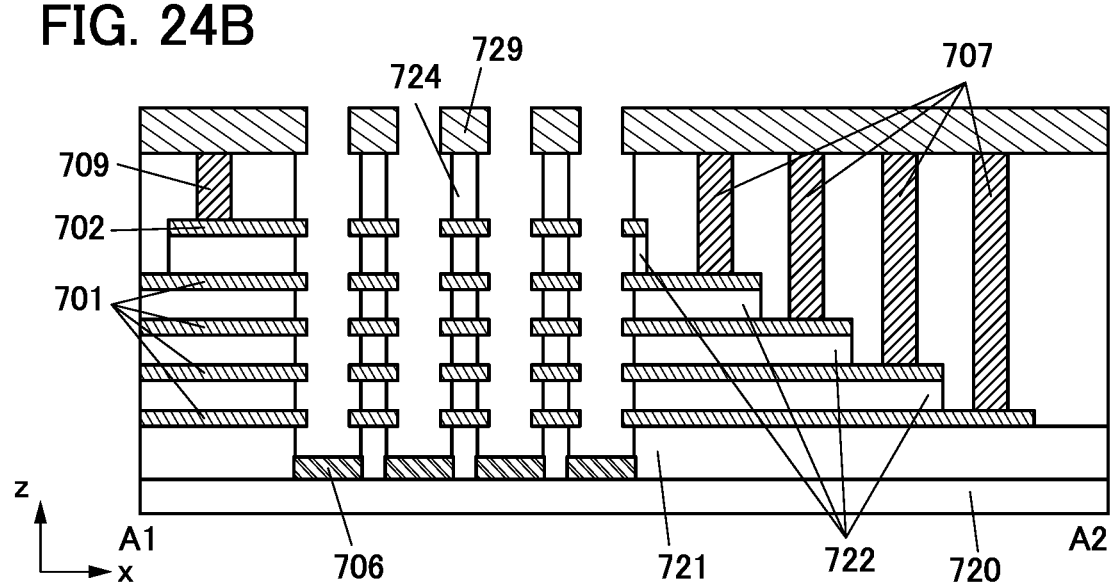
FIG. 24B and FIG. 24C are cross-sectional views illustrating the manufacturing process of the semiconductor device of one embodiment of the present invention.
Figure 24C:
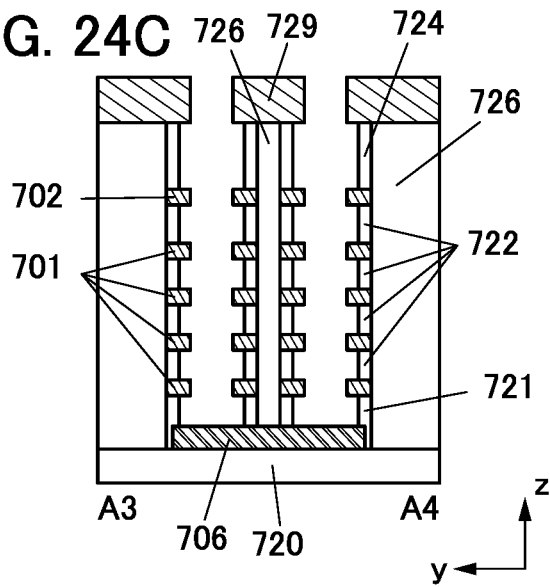

Then, the insulator 721, the insulators 722, and the insulator 724 are subjected to isotropic etching to increase the diameter of the openings in the insulator 721, the insulators 722, and the insulator 724 (see FIG. 24A to FIG. 24C). By this treatment, the diameter of the openings in the insulators becomes larger than that of the openings in the conductors 701 and the conductor 702. It can be said that the insulators each have a recession with respect to the side surface of the conductor (the conductor 701 or the conductor 702) positioned over or under the insulator. Such processing can be performed by isotropic etching using dry etching with a gas, a radical, plasma, or the like, or by isotropic etching using wet etching with a liquid. A liquid used for wet etching may be referred to as an etchant. In the case where isotropic etching is performed using dry etching, a gas, a radical, plasma, or the like containing at least one of chlorine, bromine, and fluorine can be used. The isotropic etching is preferably performed without removal of the mask 729.

Figure 25A:
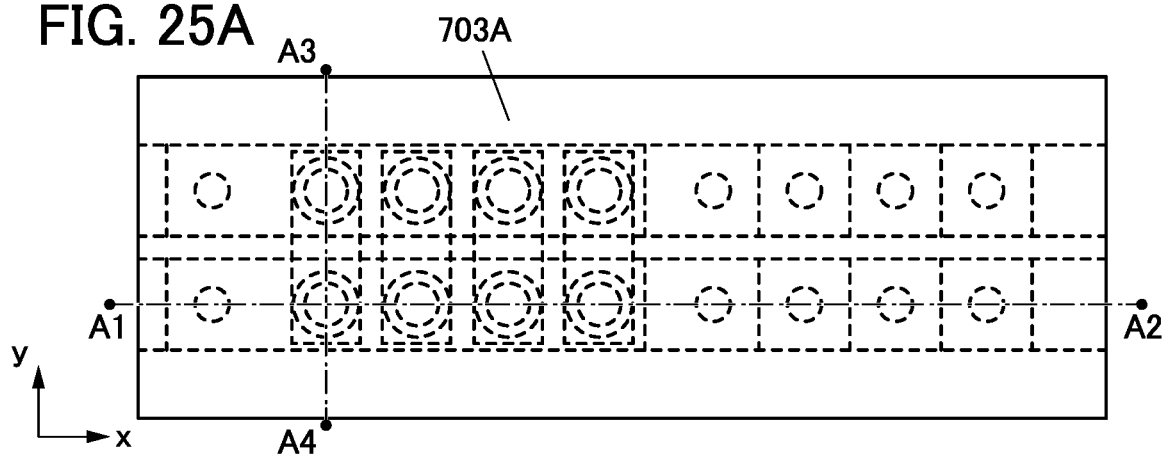
FIG. 25A is a top view illustrating a manufacturing process of a semiconductor device of one embodiment of the present invention.
Figure 25B:
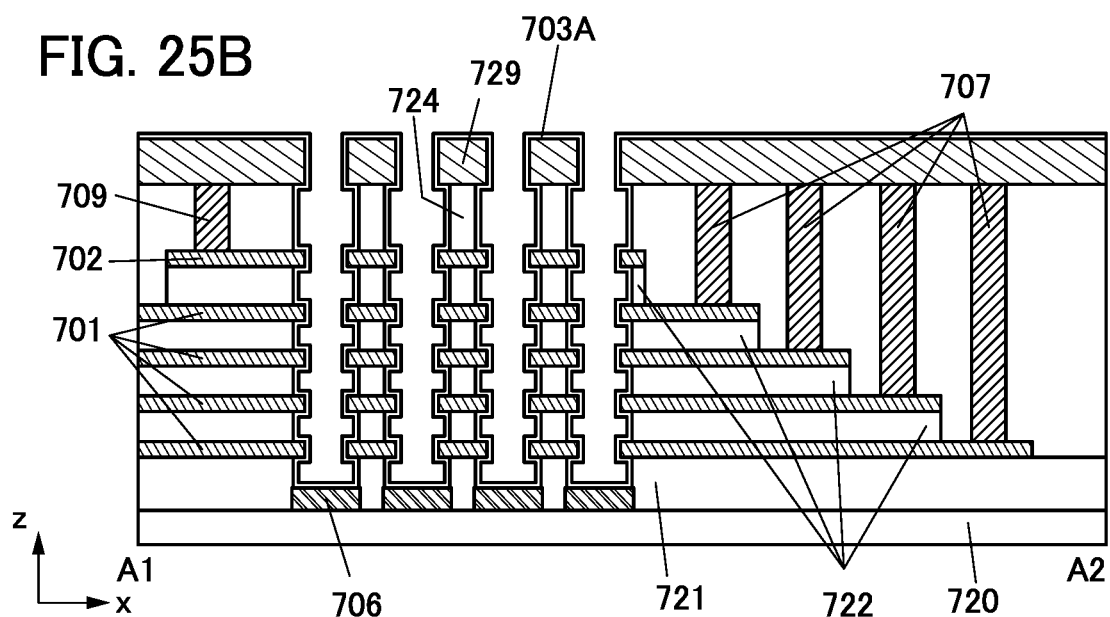
FIG. 25B and FIG. 25C are cross-sectional views illustrating the manufacturing process of the semiconductor device of one embodiment of the present invention.
Figure 25C:
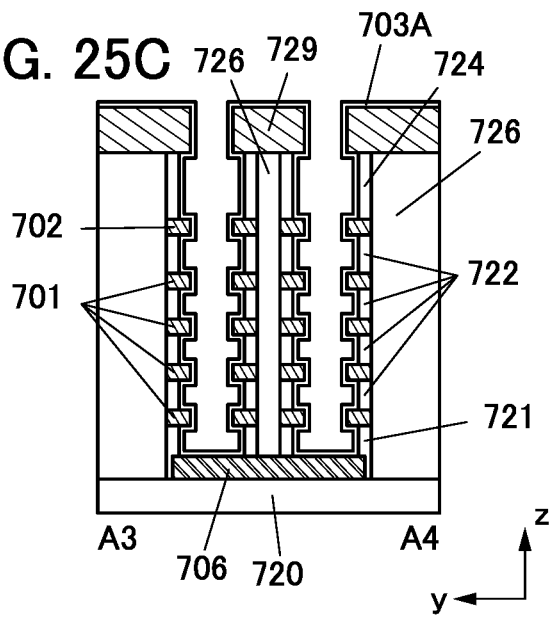

Next, an insulating film 703A to be the insulators 703 is formed over the insulator 724, the conductors 707, the conductor 709, and the mask 729 and in the second openings (see FIG. 25A to FIG. 25C). Although not shown, the insulating film 703A is formed by stacking an insulating film to be the insulator 703*a*, an insulating film to be the insulator 703*b*, and an insulating film to be the insulator 703*c* in this order. The insulating film 703A can be formed by a CVD method or an ALD method. It is particularly preferable to employ an ALD method, in which case a film with a uniform thickness can be formed even in a groove or an opening portion having a high aspect ratio. Alternatively, the insulating film 703A may be formed by a combination of an ALD method and a CVD method. The insulating film to be the insulator 703*a*, the insulating film to be the insulator 703*b*, and the insulating film to be the insulator 703*c* may be formed using the same deposition apparatus or different deposition apparatuses. The insulating film to be the insulator 703*c* is preferably formed to be thinner than the insulating film to be the insulator 703*a* so that the insulator 703*c* is thinner than the insulator 703*a*.

The insulating film 703A formed by the above method can have high coverage and can be formed in the recessions of the insulator 721, the insulators 722, and the insulator 724. That is, the insulating film 703A can be formed in contact with not only the side surfaces of the insulator 721, the insulators 722, and the insulator 724 and the side surfaces of the conductors 701 and the conductor 702, but also part of the top surfaces and part of the bottom surfaces of the conductors 701 and the conductor 702.

Then, the insulating film 703A formed at the bottom portions of the second openings is removed, so that the insulators 703 are obtained. Anisotropic etching is preferably used to remove the insulating film 703A. Here, the insulating film 703A over the mask 729 is also removed; thus, the insulators 703 are provided only on the side walls of the second openings (see FIG. 26A to FIG. 26D). The conductors 706 are exposed again by removing the insulating film 703A at the bottom portions of the second openings.

Here, as shown in FIG. 26D, the insulator 703*b* and the insulator 703*c* of the insulator 703 that are positioned in the upper portion of the second opening may be removed. FIG. 26D is an enlarged view of a portion surrounded by the dashed-dotted line in FIG. 26B. First, a material 727 (also referred to as a sacrifice layer) that can be easily removed in a later step is formed to be embedded in the second opening and is removed by etching or the like to a desired depth in the second opening. The insulator 703*c* and the insulator 703*b* exposed by the etching are removed in this order, whereby only the insulator 703*a* can be used as the insulator 703 positioned in the horizontal direction (x-y direction) of the conductor 702. In this case, the gate insulating film of each of the selection transistors SST and SDT is formed of the insulator 703*a*. After the insulator 703*c* and the insulator 703*b* are removed, the material 727 is removed.

Next, an oxide film 704A to be the oxides 704 is formed in the second openings. The oxide film 704A can be formed in such a manner that an oxide film to be the oxide 704*a*, an oxide film to be the oxide 704*b*, and an oxide film to be the oxide 704*c* are deposited sequentially over the insulator 724, the conductors 707, the conductor 709, the insulators 703, and the mask 729 and in the second openings. The oxide 704 is formed to be partly in contact with the conductors 706.

The oxide film to be the oxide 704*a*, the oxide film to be the oxide 704*b*, and the oxide film to be the oxide 704*c* can be formed by a CVD method or an ALD method. It is particularly preferable to employ an ALD method, in which case a film with a uniform thickness can be formed even in a groove or an opening portion having a high aspect ratio. Alternatively, the oxide films may be formed by a combination of an ALD method and a CVD method. Alternatively, the oxide films may be formed using different deposition methods or different deposition apparatuses.

Figure 27A:
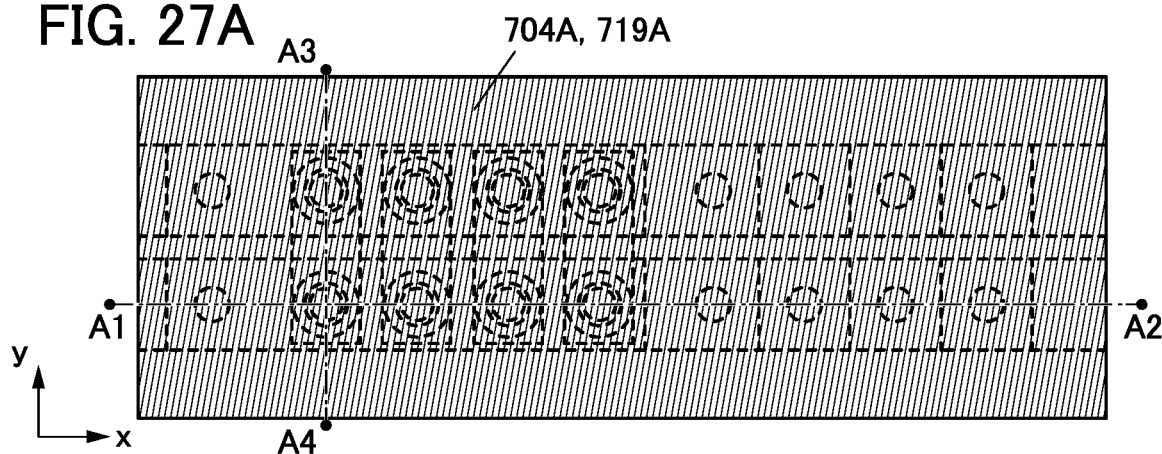
FIG. 27A is a top view illustrating a manufacturing process of a semiconductor device of one embodiment of the present invention.
Figure 27B:
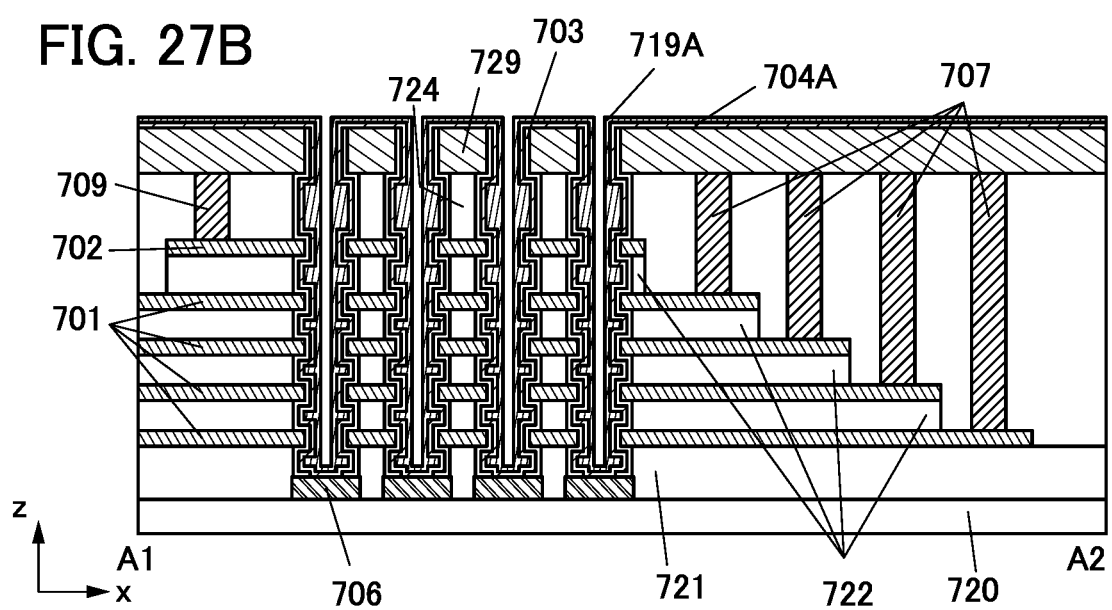
FIG. 27B and FIG. 27C are cross-sectional views illustrating the manufacturing process of the semiconductor device of one embodiment of the present invention.
Figure 27C:
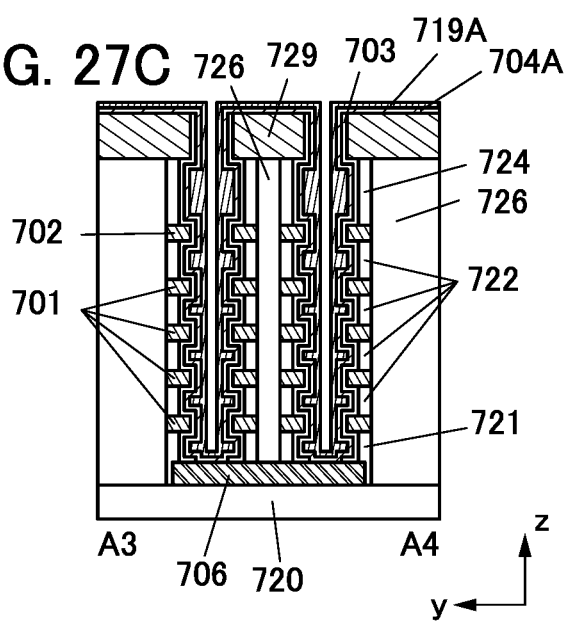

Subsequently, the conductive film 719A is formed in the second openings (see FIG. 27A to FIG. 27C). The conductive film 719A is formed to fill at least the recessions of the insulator 721, the insulators 722, and the insulator 724 with the insulator 703 and the oxide film 704A provided between the conductive film 719A and a side surface of the second opening, and does not need to fill the second opening entirely. The conductive film 719A can be formed by a CVD method or an ALD method. It is particularly preferable to employ an ALD method, in which case a film with a uniform thickness can be formed even in a groove or an opening portion having a high aspect ratio. Alternatively, the conductive film 719A may be formed by a combination of an ALD method and a CVD method.

Figure 28A:
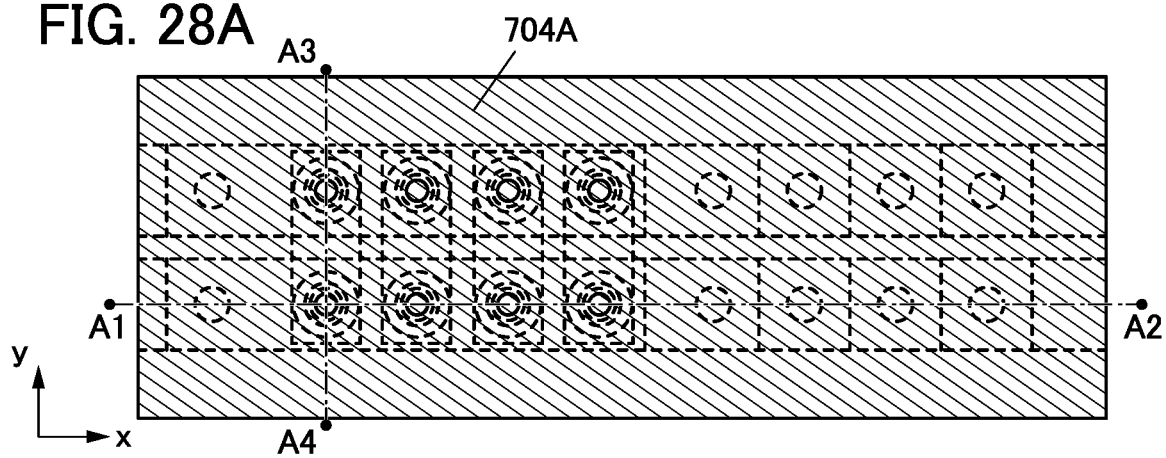
FIG. 28A is a top view illustrating a manufacturing process of a semiconductor device of one embodiment of the present invention.
Figure 28B:
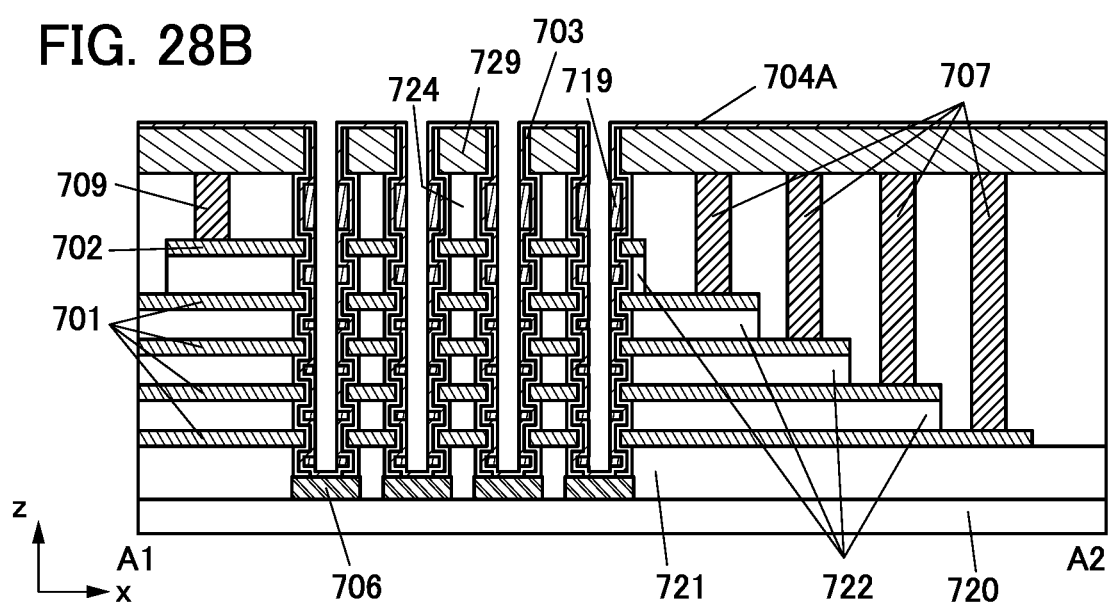
FIG. 28B and FIG. 28C are cross-sectional views illustrating the manufacturing process of the semiconductor device of one embodiment of the present invention.
Figure 28C:
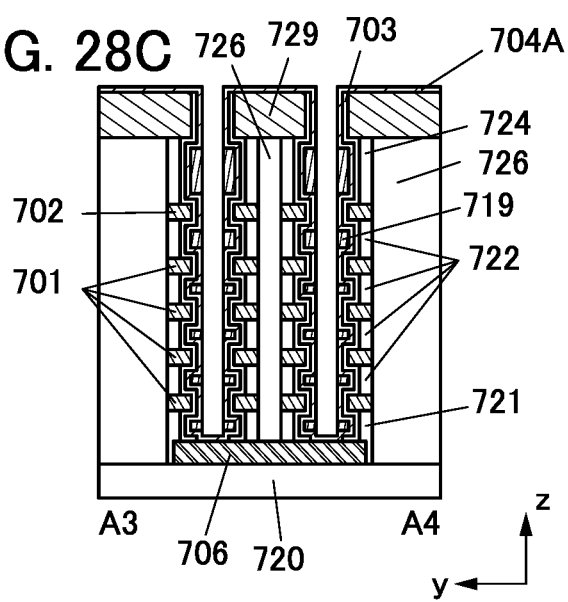
Figure 29A:
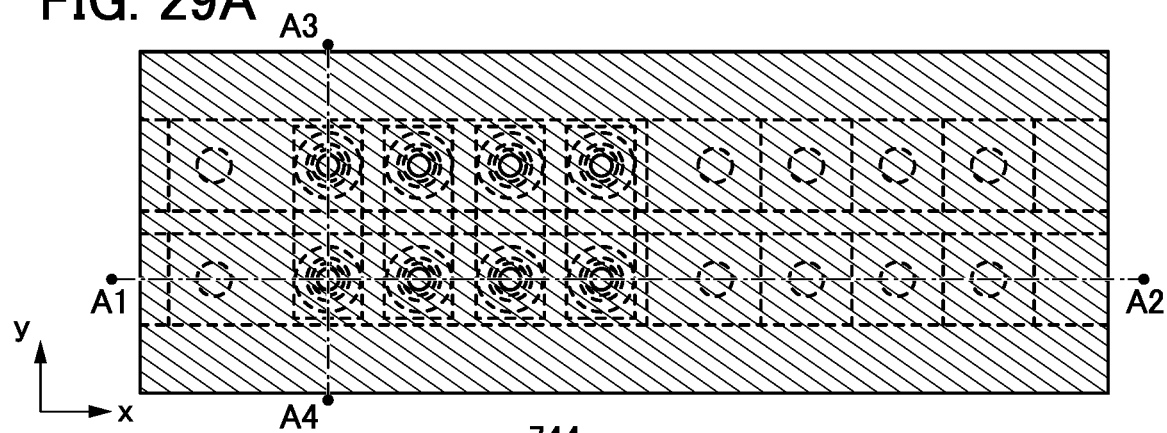
FIG. 29A is a top view illustrating a manufacturing process of a semiconductor device of one embodiment of the present invention.
Figure 29B:
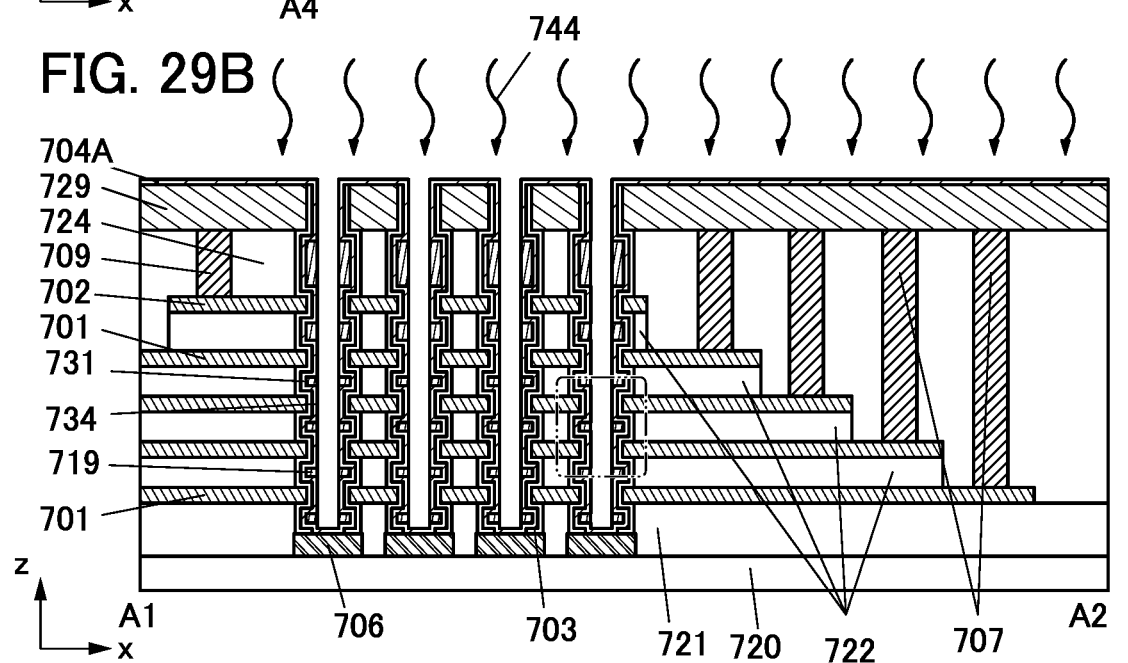
FIG. 29B to FIG. 29D are cross-sectional views illustrating the manufacturing process of the semiconductor device of one embodiment of the present invention.
Figure 29C:
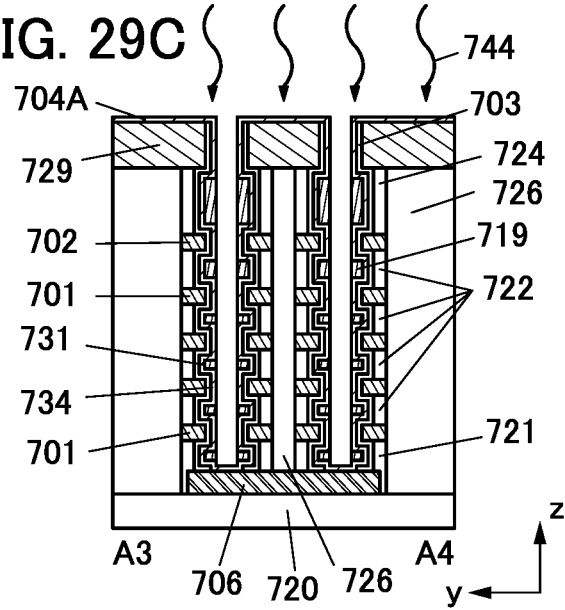
Figure 29D:
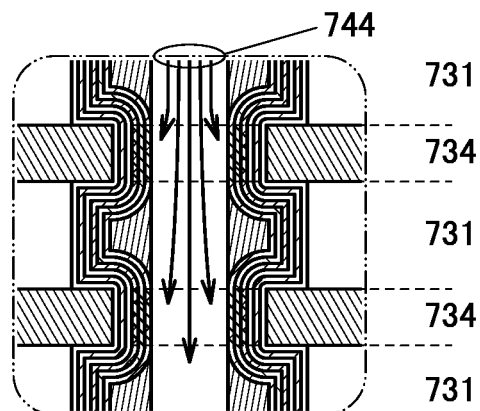

Next, the conductive film 719A is processed to form the conductors 719 (see FIG. 28A to FIG. 28C). The conductive film 719A can be processed by isotropic etching or anisotropic etching. In the case where the formed conductive film 719A fills the recessions but does not completely fill the openings as shown in FIG. 27A to FIG. 27C, the conductive film 719A is preferably processed by isotropic etching. By contrast, in the case where the conductive film 719A is formed to fill the recessions and the openings, it is preferable to use anisotropic etching. By such processing, the conductors 719 can be formed in the recessions.

Then, the resistance of part of the oxide film 704A is increased with the use of the conductors 719 as masks to form the high-resistance regions (I-type regions). In a formation method of the high-resistance regions, irradiation of the oxide film 704A with the microwave 744 is performed to remove hydrogen contained in the oxide 704. The irradiation with the microwave 744 is preferably performed in an atmosphere containing oxygen, in which case oxygen is supplied to the oxide film 704A. In this embodiment, the resistance of the regions 734 of the oxide film 704A is increased under an atmosphere containing oxygen and argon (see FIG. 29A to FIG. 29D).

Here, heat treatment may be performed. The heat treatment is preferably performed in an atmosphere containing nitrogen at higher than or equal to 200° C. and lower than or equal to 500° C., further preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere. Incidentally, the above-described microwave treatment, i.e., the microwave annealing, may double as this heat treatment. In the case where the microwave annealing sufficiently heats the oxide 704 and the like, the heat treatment is not necessarily performed.

The heat treatment reduces the resistance of the oxide film 704A in contact with the conductors 719, so that the low-resistance regions (N-type regions) can be formed in the regions 731. The heat treatment performed in the state where the oxide film 704A and the conductors 719 are in contact with each other sometimes forms metal compound layers containing a metal element contained in the conductors 719 and the component of the oxide film 704A at the interfaces between the conductors 719 and the oxide film 704A. Formation of the metal compound layers is preferable because the resistance of the oxide film 704A is reduced in the regions in contact with the conductors 719. In addition, oxygen contained in the oxide film 704A is absorbed by the conductors 719 in some cases. When the heat treatment is performed in the state where the oxide film 704A and the conductors 719 are in contact with each other, the resistance of the oxide film 704A is further reduced. The heat treatment may be performed before the microwave treatment. Since the regions 731 whose resistance is reduced by the heat treatment are covered with the conductors 719, the regions 731 are not affected by the microwave 744 and can maintain the low resistance value even after the microwave treatment.

When the heat treatment is performed in the state where the oxide film 704A and the conductors 706 are in contact with each other, the resistance of the oxide film 704A is reduced in some cases. The heat treatment performed in the state where the oxide film 704A and the conductors 706 are in contact with each other sometimes forms metal compound layers containing a metal element contained in the conductors 706 and the component of the oxide film 704A at the interfaces between the conductors 706 and the oxide film 704A. Formation of the metal compound layers is preferable because the contact resistance between the conductors 706 and the oxide film 704A can be reduced. Oxygen contained in the oxide film 704A is absorbed by the conductors 706 in some cases. This is preferable because at this time, the resistance of the oxide film 704A in the vicinity of the interfaces between the conductors 706 and the oxide film 704A is reduced, so that the contact resistance between the conductors 706 and the oxide film 704A can be reduced. When the heat treatment is performed in the state where the oxide film 704A and the conductors 706 are in contact with each other, the oxide film 704A has lower resistance and the contact resistance between the conductors 706 and the oxide film 704A is further reduced.

It is preferable that the carrier concentration of the regions 734 after the above microwave treatment and heat treatment be lower than $1\times10^{18}/cm^3$, further preferably lower than or equal to $1\times10^{17}/cm^3$, still further preferably lower than or equal to $1\times10^{16}/cm^3$. The carrier concentration of the regions 731 is preferably higher than or equal to $1\times10^{18}/cm^3$, further preferably higher than or equal to $1\times10^{19}/cm^3$, still further preferably higher than or equal to $1\times10^{20}/cm^3$.

Then, an insulating film 711A is formed inward from the oxide film 704A and the conductors 719, and a conductive film 712A is formed inward from the insulating film 711A. The insulating film 711A and the conductive film 712A can be formed by a CVD method or an ALD method. It is particularly preferable to employ an ALD method, in which case a film with a uniform thickness can be formed even in a groove or an opening portion having a high aspect ratio. Alternatively, the insulating film 711A and the conductive film 712A may be formed by a combination of an ALD method and a CVD method (see FIG. 30A to FIG. 30C).

For the insulators 711, a material that supplies oxygen to the oxide 704 or a material that supplies hydrogen can be used in accordance with the characteristics needed for the memory transistors MT and the semiconductor device including the memory transistors MT.

Then, heat treatment is performed. The heat treatment is preferably performed in an atmosphere containing nitrogen at higher than or equal to 200° C. and lower than or equal to 500° C., further preferably higher than or equal to 300° C. and lower than or equal to 400° C. The atmosphere in which the heat treatment is performed is not limited to the above atmosphere as long as at least one of nitrogen, oxygen, and argon is contained. The heat treatment may be performed in a reduced-pressure atmosphere or in an atmospheric pressure atmosphere.

Figure 30A:
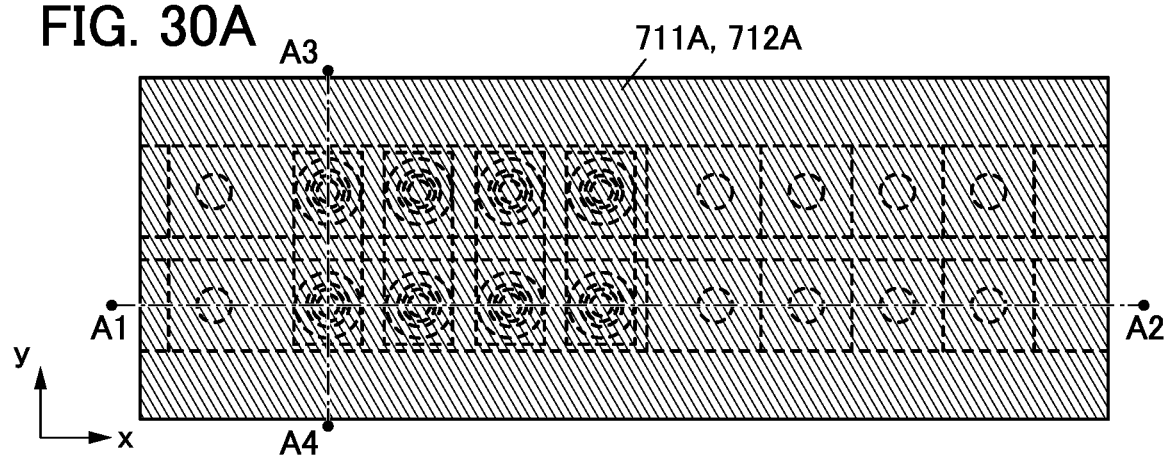
FIG. 30A is a top view illustrating a manufacturing process of a semiconductor device of one embodiment of the present invention.
Figure 30B:
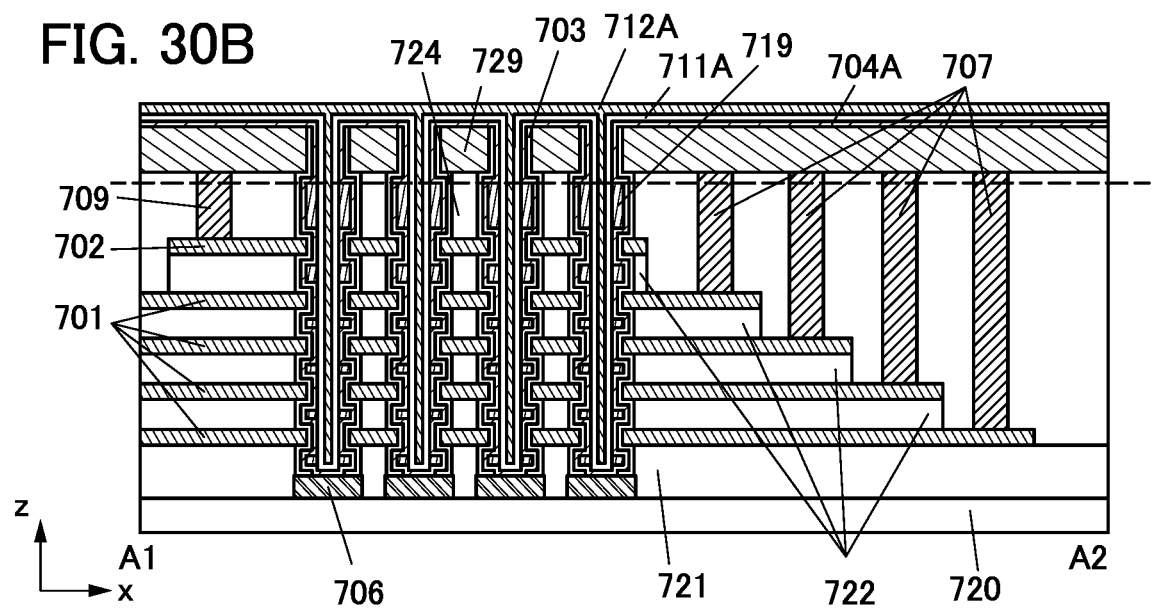
FIG. 30B and FIG. 30C are cross-sectional views illustrating the manufacturing process of the semiconductor device of one embodiment of the present invention.
Figure 30C:
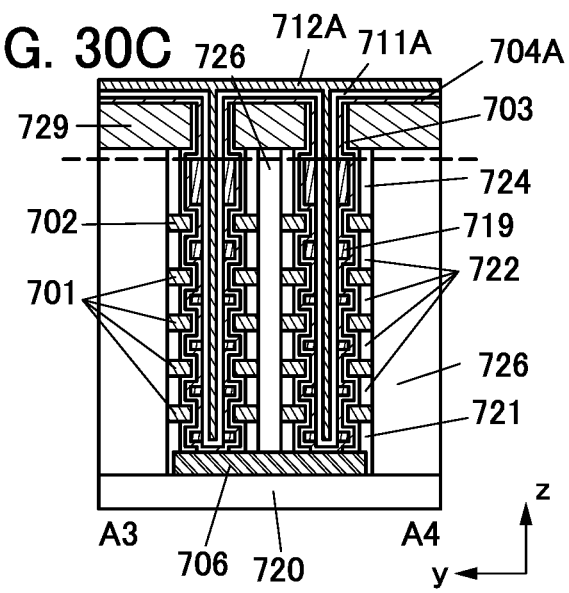
Figure 31A:
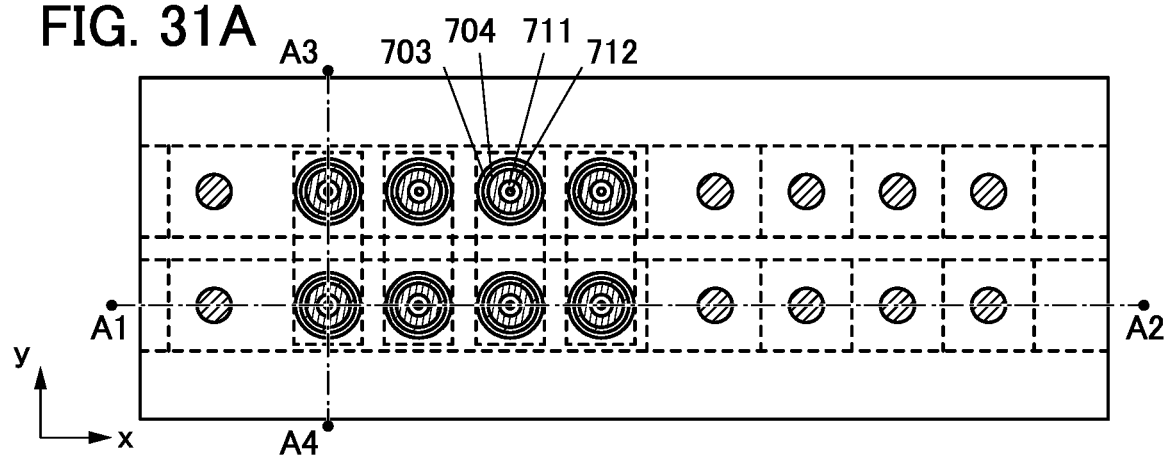
FIG. 31A is a top view illustrating a manufacturing process of a semiconductor device of one embodiment of the present invention.
Figure 31B:
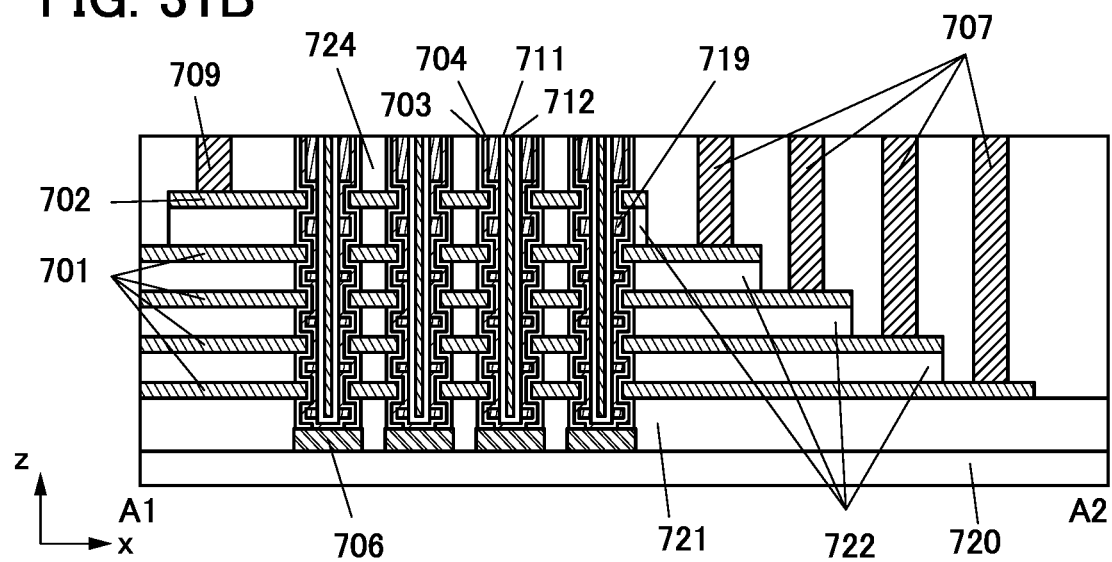
FIG. 31B and FIG. 31C are cross-sectional views illustrating the manufacturing process of the semiconductor device of one embodiment of the present invention.
Figure 31C:
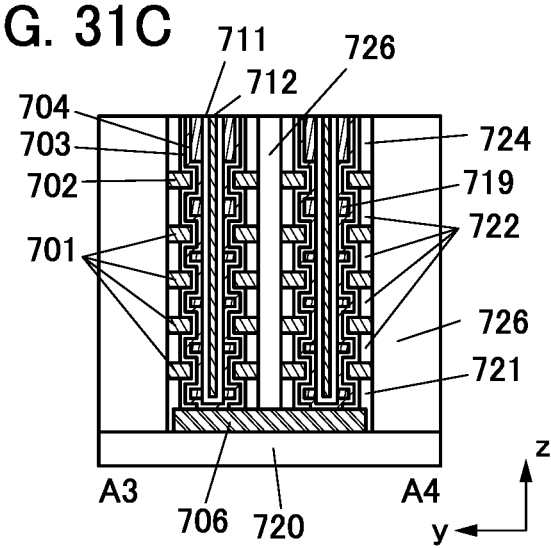

Next, the mask 729, and the conductive film 712A, the insulating film 711A, the oxide film 704A, the insulators 703, and the like positioned above the dotted lines shown in FIG. 30B and FIG. 30C are removed by a CMP method or the like to obtain the oxides 704, the insulators 711, and the conductors 712 (see FIG. 31A to FIG. 31C). Note that the above-described heat treatment may be performed after the removal of unnecessary portions of the conductive film 712A, the insulating film 711A, and the oxide film 704A. In the case where the mask 729 is removed after the formation of the first openings and before the formation of the insulating film 703A, the mask 729 does not need to be removed in this step.

Figure 32A:
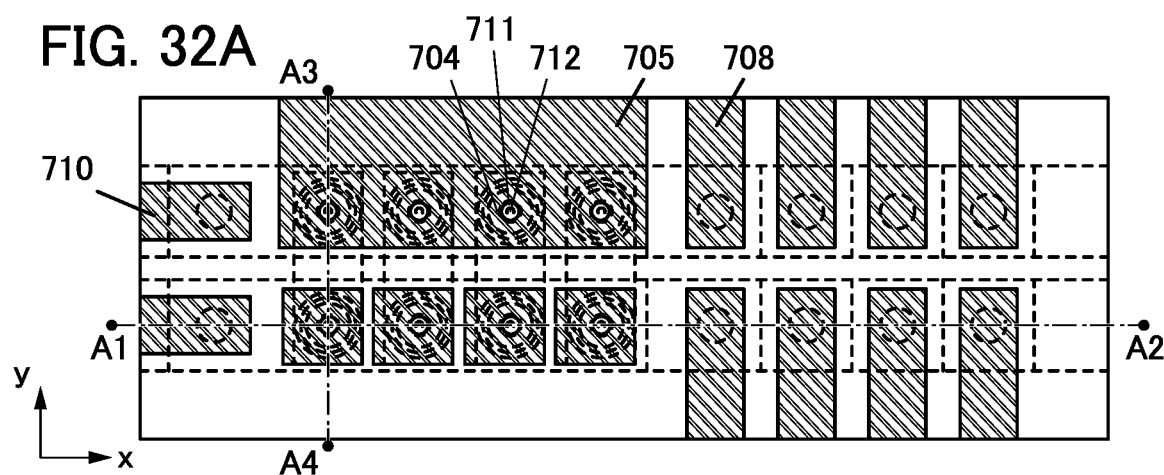
FIG. 32A is a top view illustrating a manufacturing process of a semiconductor device of one embodiment of the present invention.
Figure 32B:
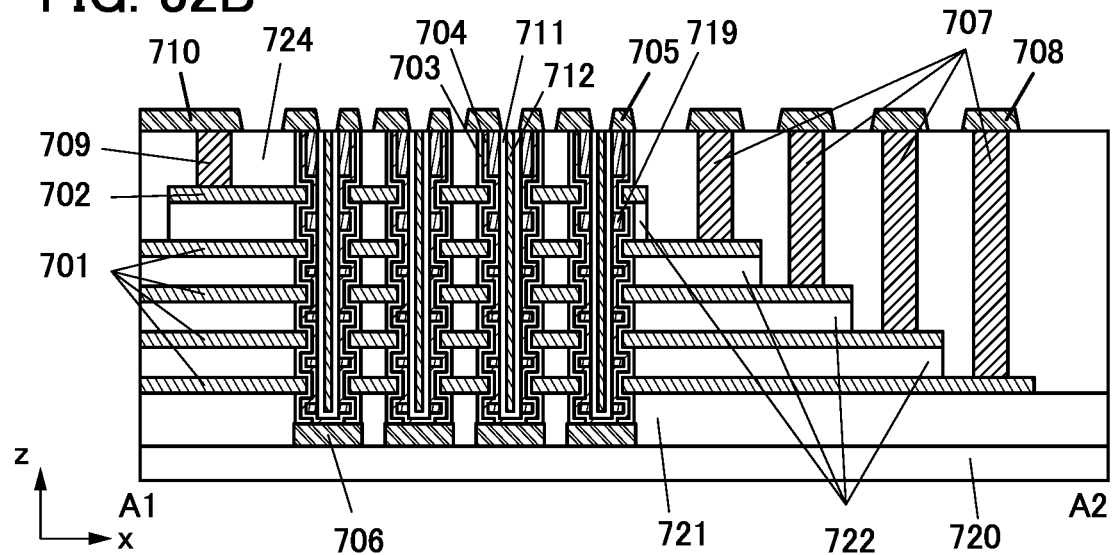
FIG. 32B and FIG. 32C are cross-sectional views illustrating the manufacturing process of the semiconductor device of one embodiment of the present invention.
Figure 32C:
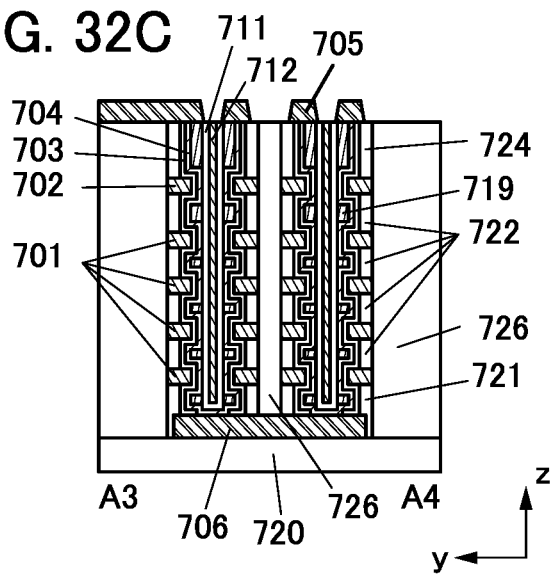

Then, as shown in FIG. 32A to FIG. 32C, the conductors 705 each serving as part of the bit line BL or the source line SL and the conductors 708 each serving as part of the word line WL, and the conductor 710 serving as part of the wiring DGL or the wiring SGL are formed. The conductors 705 are provided to be electrically connected to the oxides 704. The conductors 708 are provided to be electrically connected to the conductors 707. Furthermore, the conductor 710 is provided to be electrically connected to the conductor 709. In the case where the conductors 712 are provided inward from the oxides 704, it is preferable that openings that expose at least the conductors 712 be provided in the conductors 705 so that the conductors 705 and the conductors 712 are electrically separated from each other. In this case, the openings may be provided to expose the insulators 711. The oxides 704 may be partly exposed.

Then, as shown in FIG. 33A to FIG. 33C, the insulator 717 is formed to cover the conductors 705, the conductors 708, and the conductor 710. The insulator 717 is provided with openings that expose part of the conductors 705 (the conductors 705 electrically connected to the oxides 704 on the bit line side) and the conductors 712. In the case where the opening that exposes the conductor 712 is formed, the diameter of the opening may be larger than that of the opening provided in the conductor 705. Since the opening is provided in the conductor 705, the opening that exposes the conductor 712 can be formed in a self-aligned manner and thus a defect such as formation of the opening whose diameter at the bottom portion has an unexpected size and a defect such as displacement of the opening from the conductor 712 can be inhibited, which is preferable.

Figure 34A:
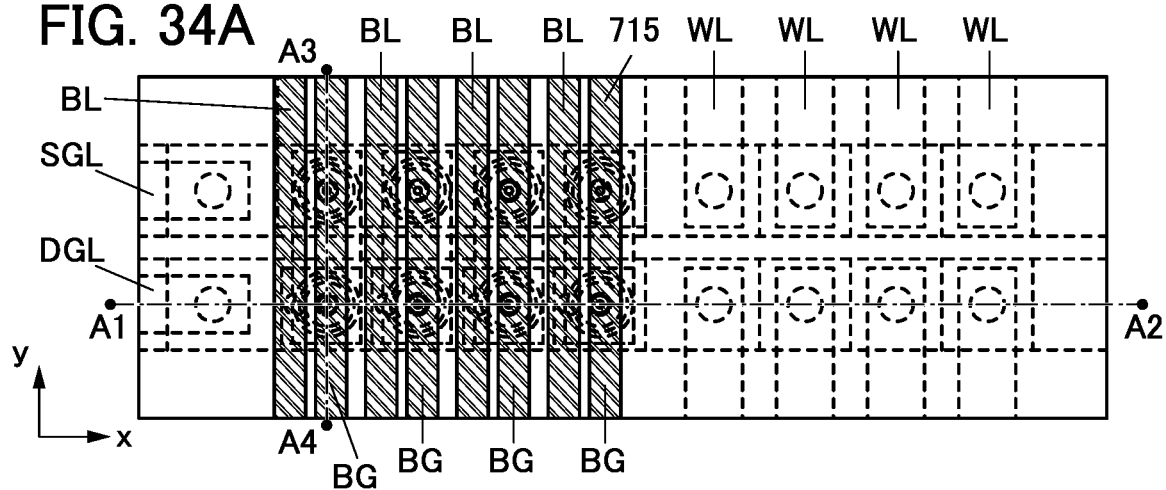
FIG. 34A is a top view illustrating a manufacturing process of a semiconductor device of one embodiment of the present invention.
Figure 34B:
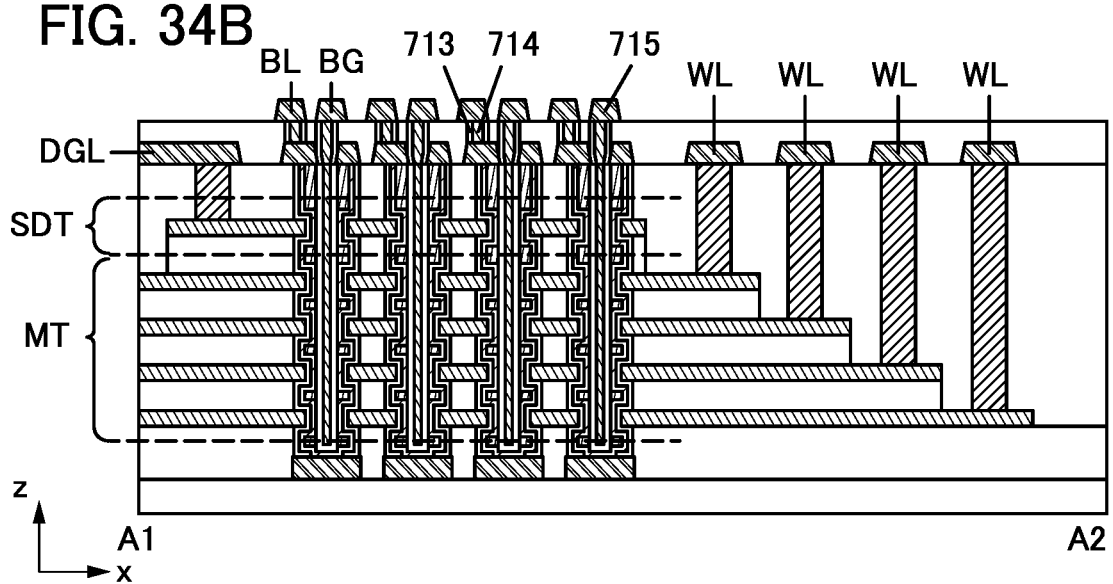
FIG. 34B and FIG. 34C are cross-sectional views illustrating the manufacturing process of the semiconductor device of one embodiment of the present invention.
Figure 34C:
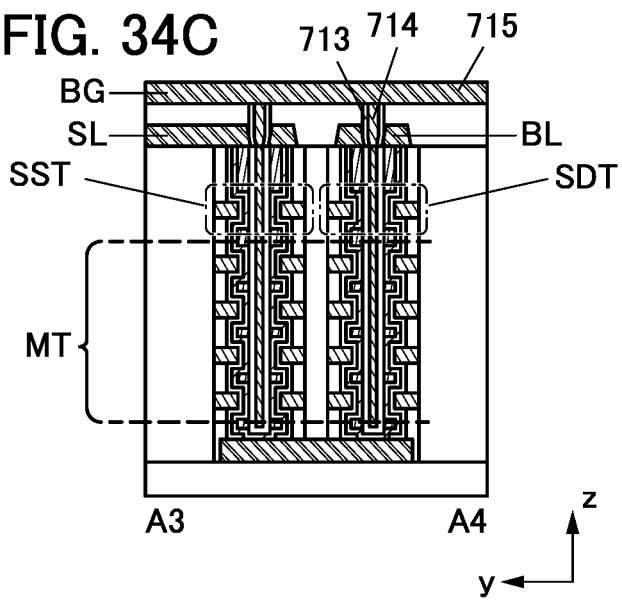

Next, as shown in FIG. 34A to FIG. 34C, the insulators 713 positioned at side surfaces of the openings that expose the conductors 712 and are provided in the insulator 717 are formed. An insulating film to be the insulators 713 is formed over the insulator 717 by a CVD method or an ALD method, and then anisotropic etching is performed to remove the insulating film formed at the bottom portions of the openings. At this time, the insulating film over the insulator 717 is also removed to form the insulators 713. The insulating film may be processed by a lithography method. At this time, the formed insulator 713 exists also over the insulator 717 in some cases.

Next, the conductors 714 and the conductors 715 that serve as the bit lines BL and the wirings BG are formed. Although the conductor 714 and the conductor 715 are shown as different layers in FIG. 34A to FIG. 34C, the present invention is not limited thereto. The conductor 714 and the conductor 715 may be formed as one conductor at a time. In the case where the conductor 714 and the conductor 715 are separately formed, a conductive film to be the conductors 714 is formed over the insulator 717 to be embedded in the openings formed in the insulator 717, and an unnecessary portion of the conductive film is removed by a CMP method or the like, whereby the conductors 714 can be formed. After that, the conductors 715 are formed. The conductors 715 may be formed by a lithography method or a damascene method. At this time, the insulators 713 are provided at the side surfaces of the openings formed in the insulator 717 and the conductors 705; thus, the conductors 715 electrically connected to the conductors 712 are not electrically connected to the conductors 705. In the case where the conductor 714 and the conductor 715 are formed at a time, a conductor to be the conductors 714 and the conductors 715 can be formed in such a manner that a conductive film is formed over the insulator 717 to be embedded in the openings formed in the insulator 717 and then processed by a lithography method.

Through the above steps, the memory cell array can be manufactured. In the description of this manufacturing process, the memory cell array includes four layers of the memory transistors MT and four memory strings; however, the present invention is not limited thereto. The memory cell array may include five or more layers of the memory transistors MT or five or more memory strings. For example, a memory cell array including 32 layers, 64 layers, or 128 layers of the memory transistors MT can be manufactured. A memory cell array including 200 or more layers of the memory transistors MT can be manufactured.

The memory cell array is manufactured in the above manner, whereby the memory transistors MT in a plurality of layers can be manufactured at a time without patterning for manufacturing the memory transistors MT for the plurality of layers. Furthermore, in the case where a memory cell array is manufactured by the above method, even when the number of layers of the memory transistors MT is increased, the number of steps of patterning and etching of the memory transistors MT is not increased. In this manner, the process of manufacturing the memory cell array can be shortened; thus, a semiconductor device with high productivity can be provided.

Manufacturing Method 2 of Memory Cell Array

Next, a manufacturing method of a memory cell array which is different from the above method is described with reference to FIG. 35A to FIG. 50C. In each diagram of FIG. 35A to FIG. 50C, A is a top view seen from the z-axis direction, and B is a cross-sectional view of a portion indicated by the dashed-dotted line A1-A2 in A. Furthermore, C is a cross-sectional view of a portion indicated by the dashed-dotted line A3-A4 in A. In addition, components similar to the components described in Manufacturing method 1 of memory cell, Manufacturing method 2 of memory cell, and Manufacturing method 1 of memory cell array are denoted by the same reference numerals, and the components and the manufacturing methods of the components are sometimes not described.

Figure 35A:
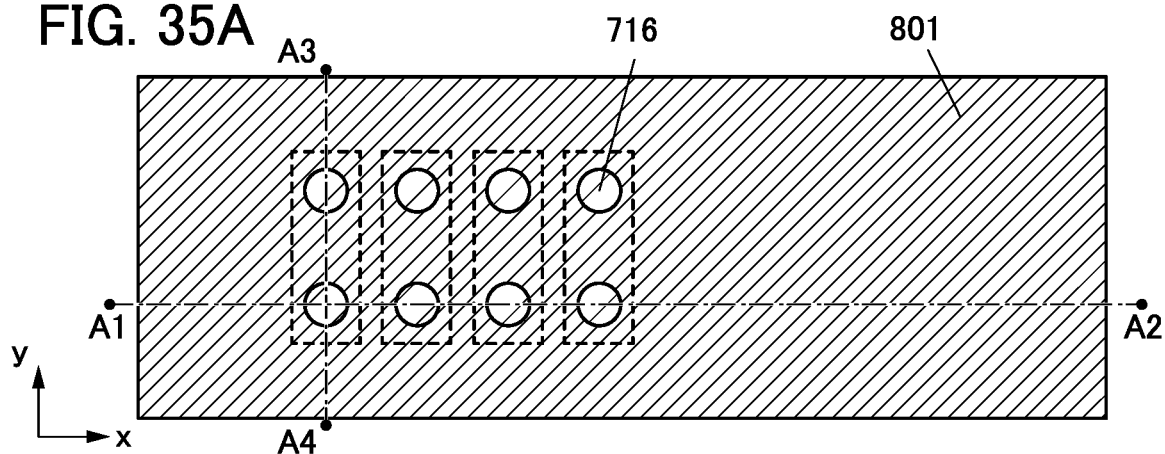
FIG. 35A is a top view illustrating a manufacturing process of a semiconductor device of one embodiment of the present invention.
Figure 35B:
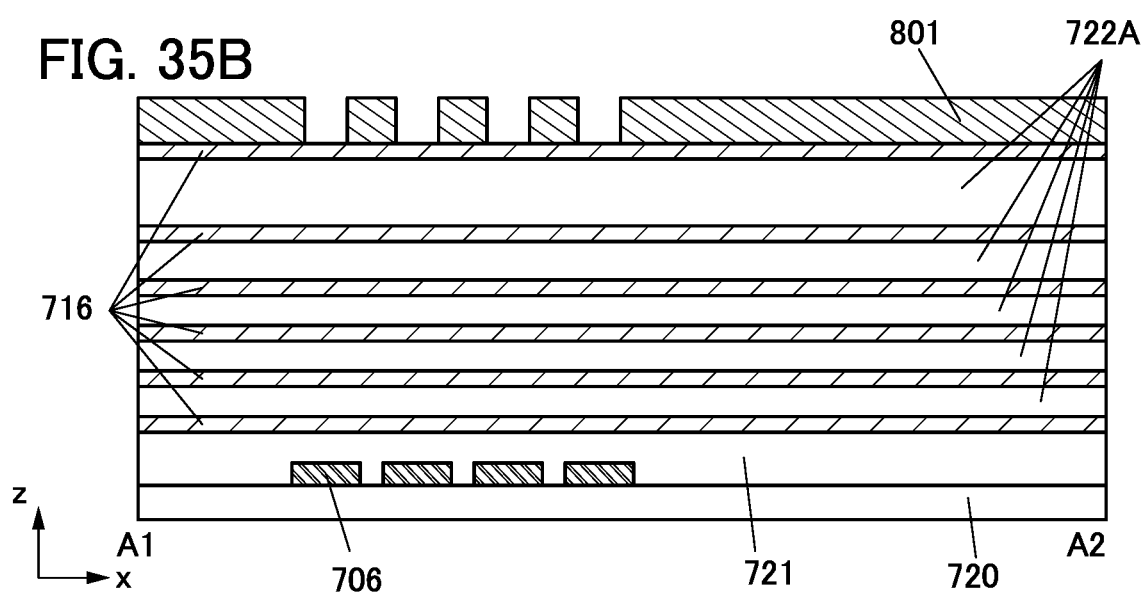
FIG. 35B and FIG. 35C are cross-sectional views illustrating the manufacturing process of the semiconductor device of one embodiment of the present invention.
Figure 35C:
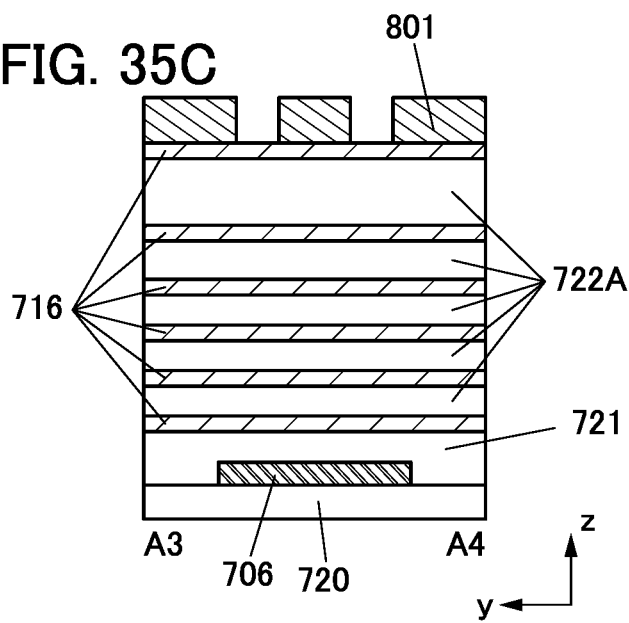

As in the method described in Manufacturing method 1 of memory cell array, the conductors 706 and the insulator 721 are formed over the base 720 (see FIG. 35A to FIG. 35C).

Next, the layers 716 and the insulating films 722A are alternately formed over the conductors 706 and the insulator 721 to form a stack. This embodiment shows an example in which the layer 716 is formed over the insulator 721 and the insulating film 722A is formed over the layer 716; however, the order of the formation is not limited thereto. The insulating film 722A may be formed over the insulator 721, and the layer 716 may be formed over the insulating film 722A. A CVD method can be used for the formation of the layers 716 and the insulating films 722A. Alternatively, a sputtering method may be used.

The number of layers stacked as the layers 716 and the insulating films 722A can be determined in accordance with required performance of the semiconductor device. For example, 32 layers, 64 layers, 128 layers, or 200 or more layers of the layers 716 and the insulating films 722A may be formed.

The uppermost layer 716 and the uppermost insulating film 722A serve as hard masks in a later step. A mask 801 is formed over the uppermost layer 716 (see FIG. 35A to FIG. 35C).

Figure 36A:
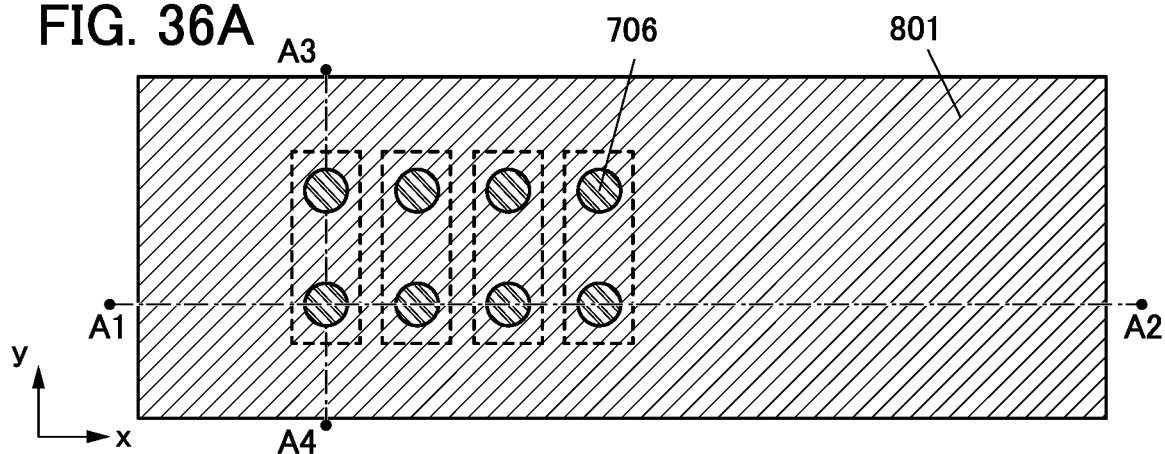
FIG. 36A is a top view illustrating a manufacturing process of a semiconductor device of one embodiment of the present invention.
Figure 36B:
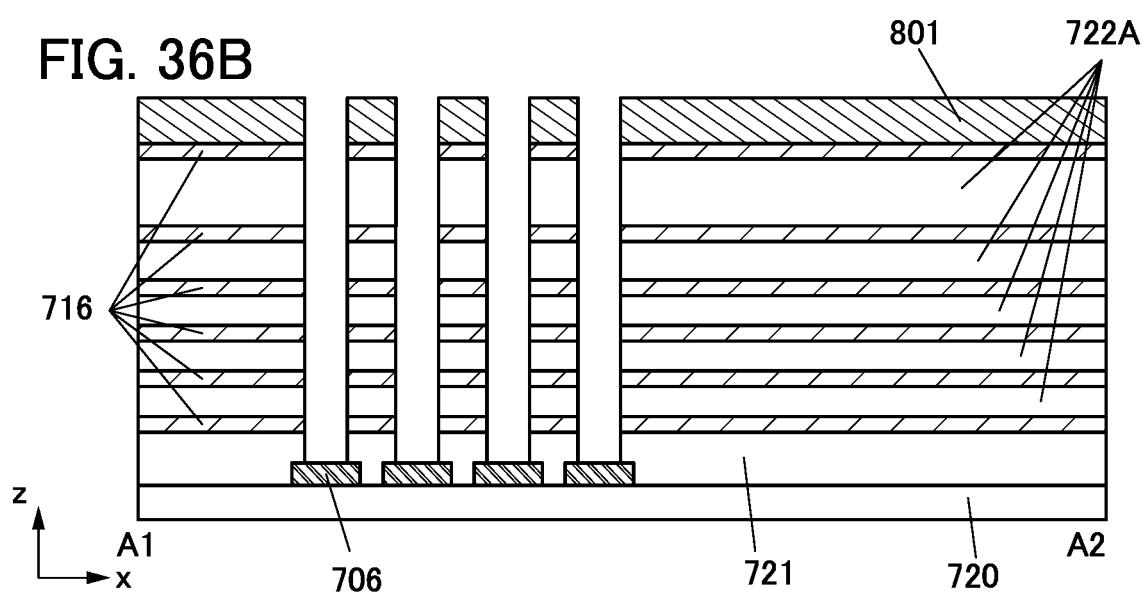
FIG. 36B and FIG. 36C are cross-sectional views illustrating the manufacturing process of the semiconductor device of one embodiment of the present invention.
Figure 36C:
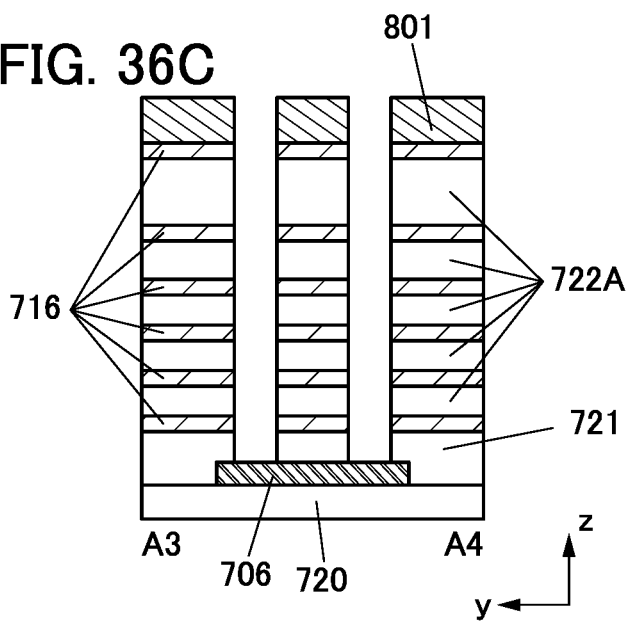

Then, the stack including the layers 716 and the insulating films 722A is processed with the use of the mask 801, whereby first openings are formed (see FIG. 36A to FIG. 36C). By this processing, the conductors 706 are partly exposed at the bottom portions of the first openings.

Figure 37A:
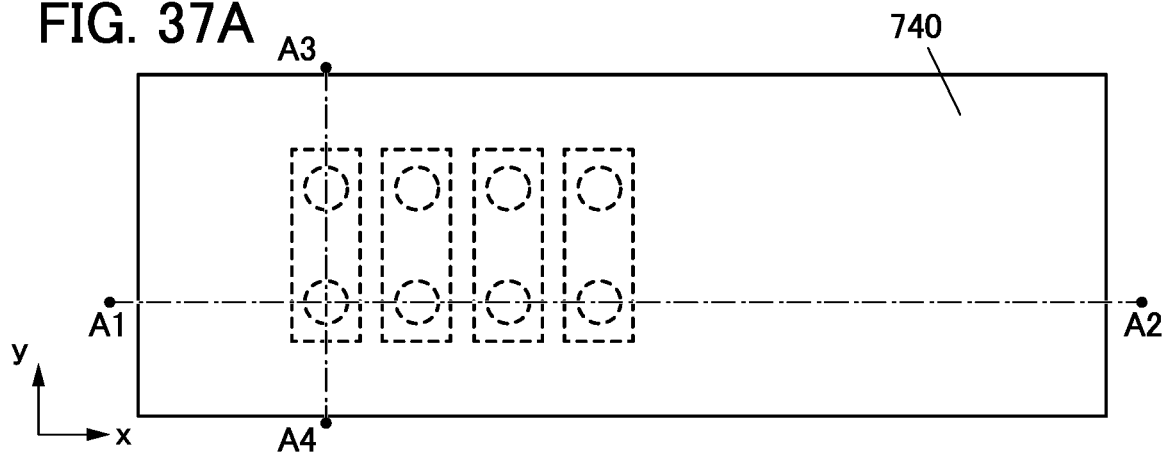
FIG. 37A is a top view illustrating a manufacturing process of a semiconductor device of one embodiment of the present invention.
Figure 37B:
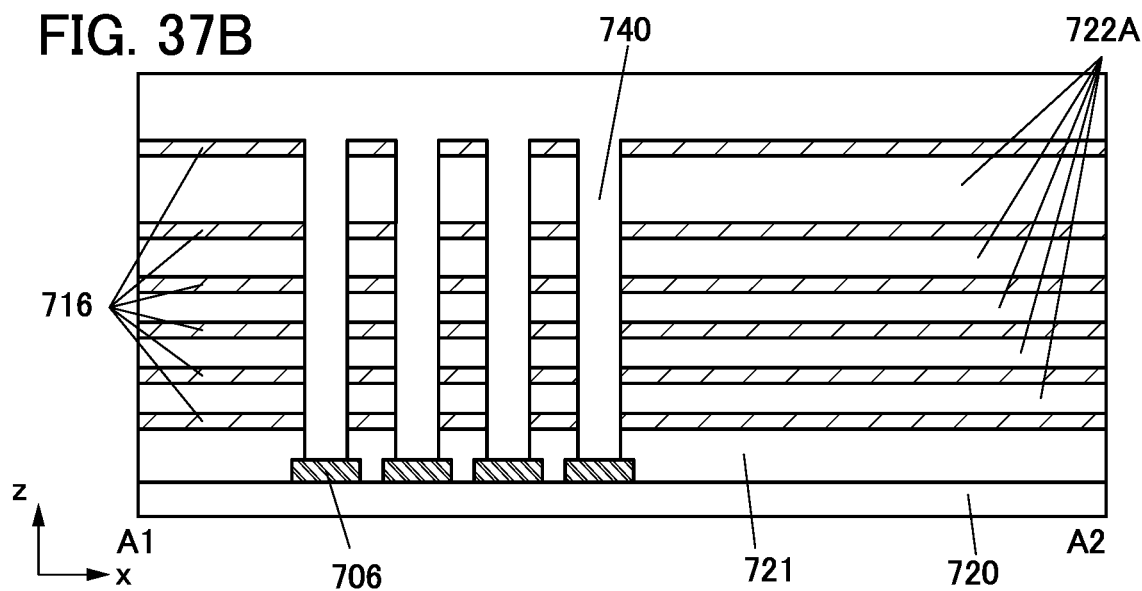
FIG. 37B and FIG. 37C are cross-sectional views illustrating the manufacturing process of the semiconductor device of one embodiment of the present invention.
Figure 37C:
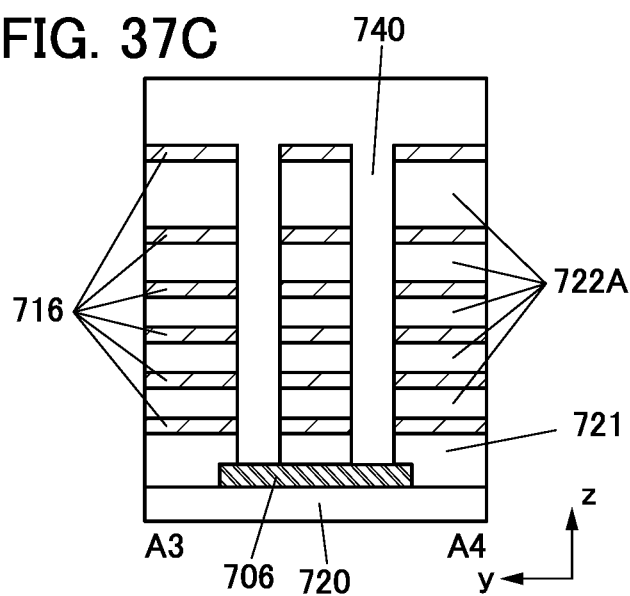

Subsequently, the layer 740 is formed over the uppermost layer 716 to fill the first openings (see FIG. 37A to FIG. 37C).

Then, a stack including the layer 740, the layers 716, and the insulating films 722A is processed to form second openings (see FIG. 38A to FIG. 38C). A plurality of the second openings, each of which has a slit shape, are formed to sandwich the first opening. In this embodiment, as shown in FIG. 38A, the second openings are formed such that their major axes extend in the x-axis direction. As shown in FIG. 38C, the first openings and the second openings are alternately placed in the y-axis direction. By the processing for the second openings, the base 720 is partly exposed at the bottom portions of the second openings.

Figure 39A:
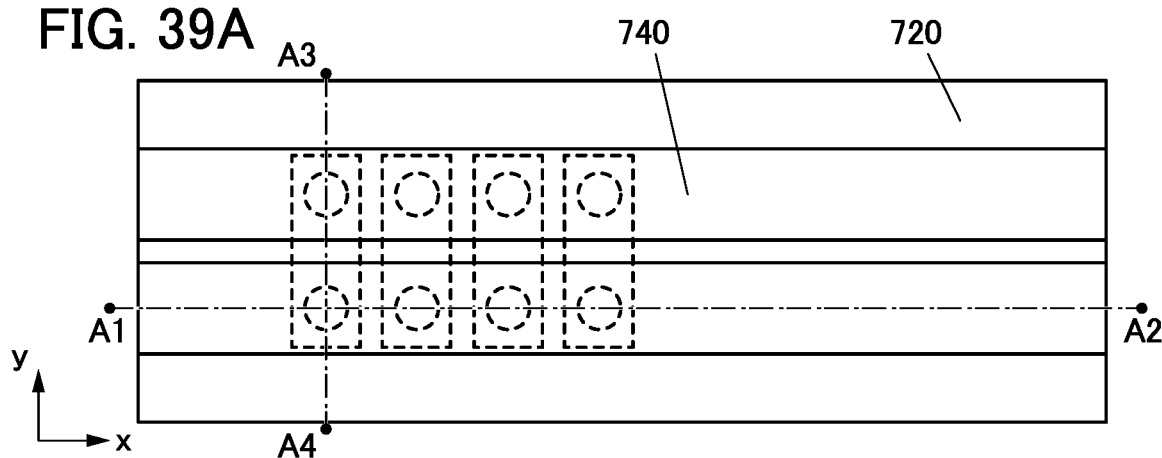
FIG. 39A is a top view illustrating a manufacturing process of a semiconductor device of one embodiment of the present invention.
Figure 39B:
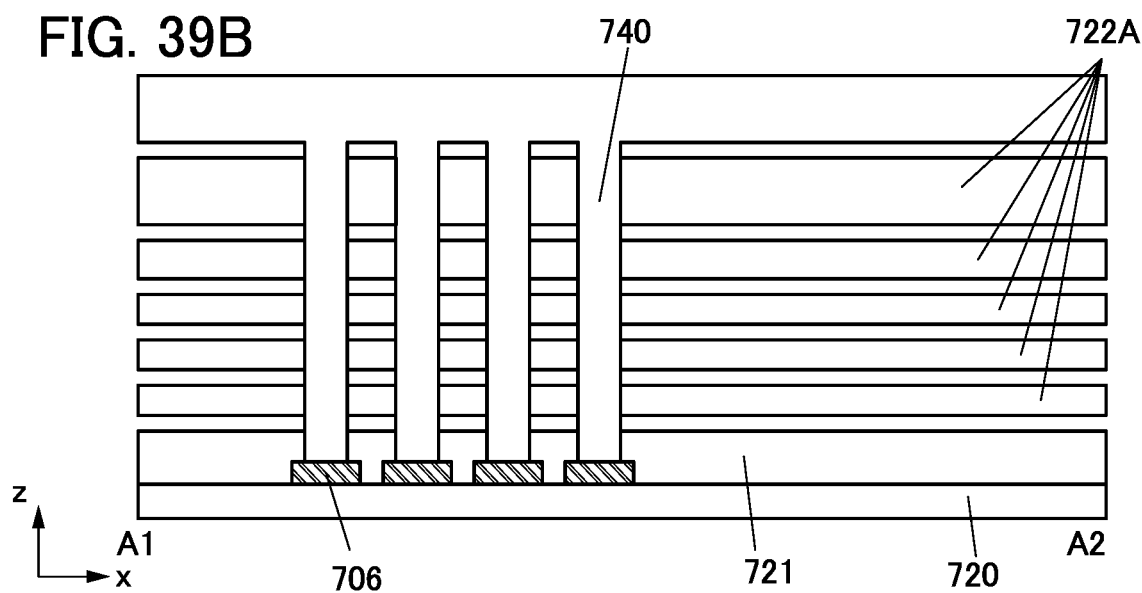
FIG. 39B and FIG. 39C are cross-sectional views illustrating the manufacturing process of the semiconductor device of one embodiment of the present invention.
Figure 39C:
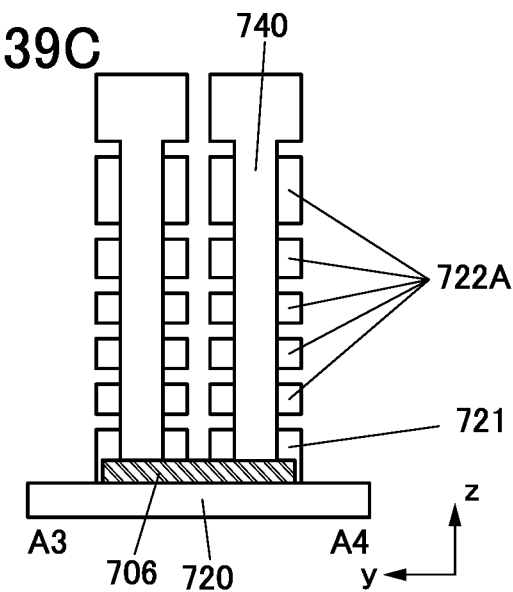

Subsequently, the layers 716 are etched to be removed (see FIG. 39A to FIG. 39C). For the etching of the layers 716, isotropic etching such as wet etching, plasma etching, or gas etching is preferably used. An etchant is introduced via the second openings to remove the layers 716. By the etching, side surfaces of the layer 740 that have been in contact with the layers 716 are exposed.

Figure 40A:
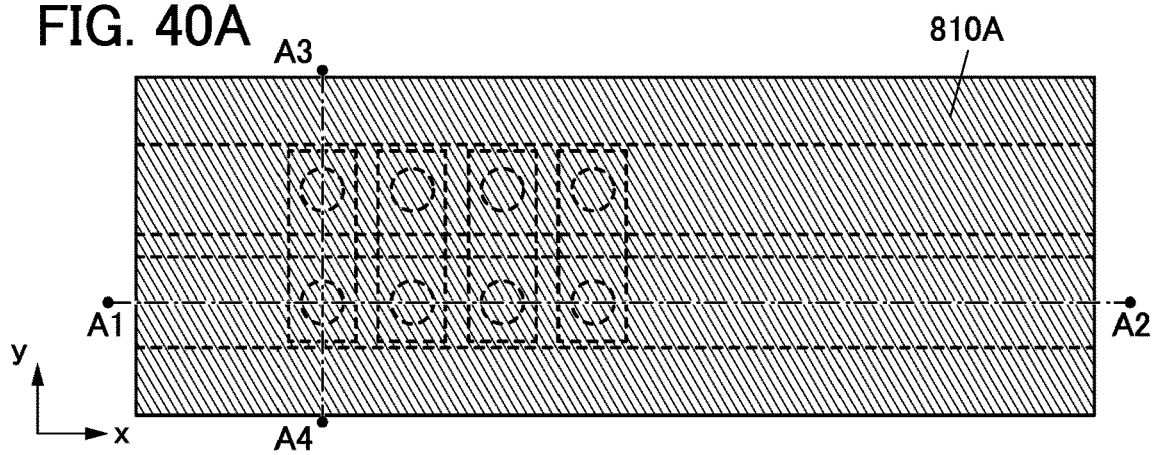
FIG. 40A is a top view illustrating a manufacturing process of a semiconductor device of one embodiment of the present invention.
Figure 40B:
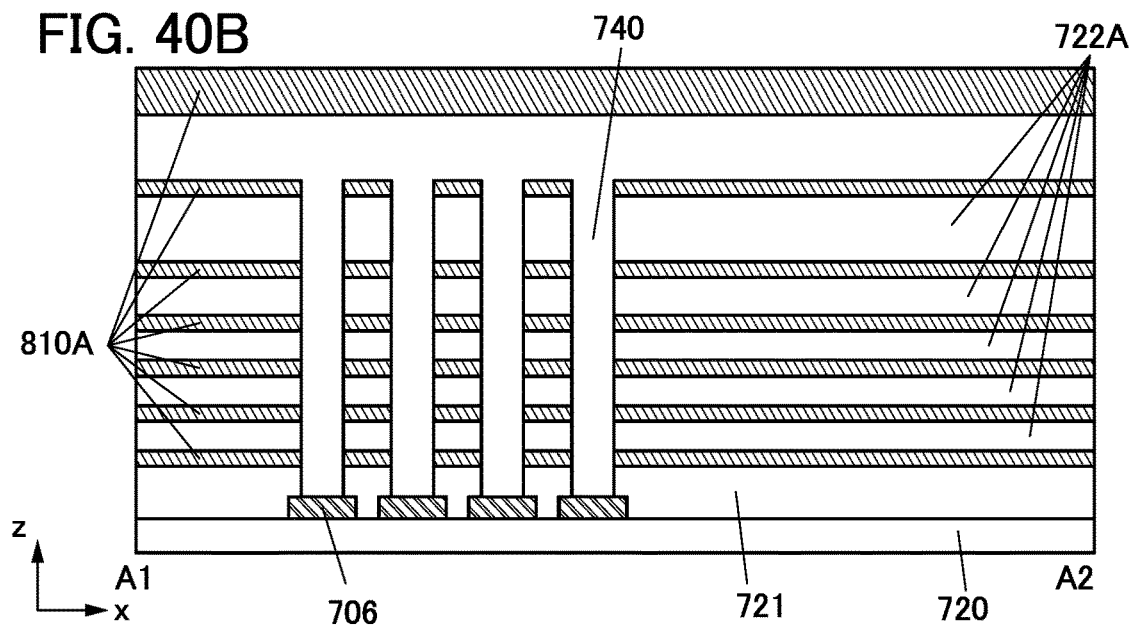
FIG. 40B and FIG. 40C are cross-sectional views illustrating the manufacturing process of the semiconductor device of one embodiment of the present invention.
Figure 40C:
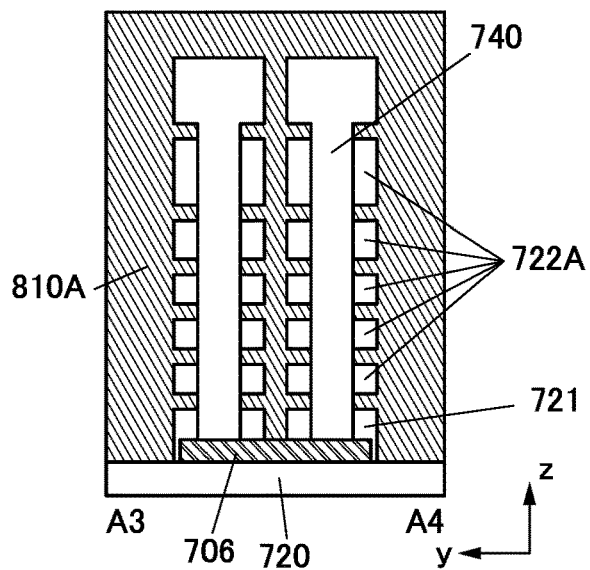

Next, the conductor 810A is formed over the layer 740 and the base 720 to fill the inner sides of the second openings and the regions from which the layers 716 have been removed (see FIG. 40A to FIG. 40C). The conductor 810A can be formed using a material that can be used for the conductive film 701A described in Manufacturing method 1 of memory cell array. The conductor 810A can be formed by an ALD method or a CVD method.

Figure 41A:
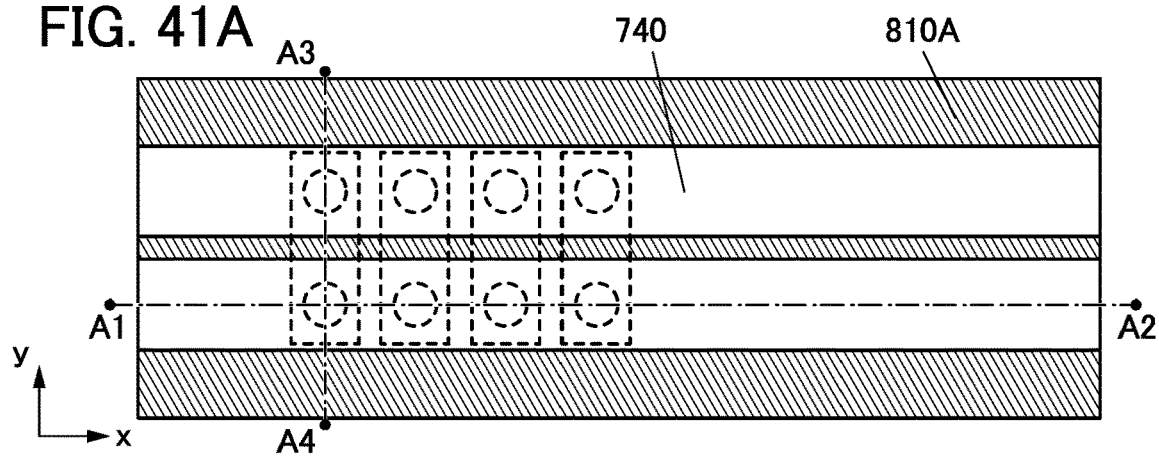
FIG. 41A is a top view illustrating a manufacturing process of a semiconductor device of one embodiment of the present invention.
Figure 41B:
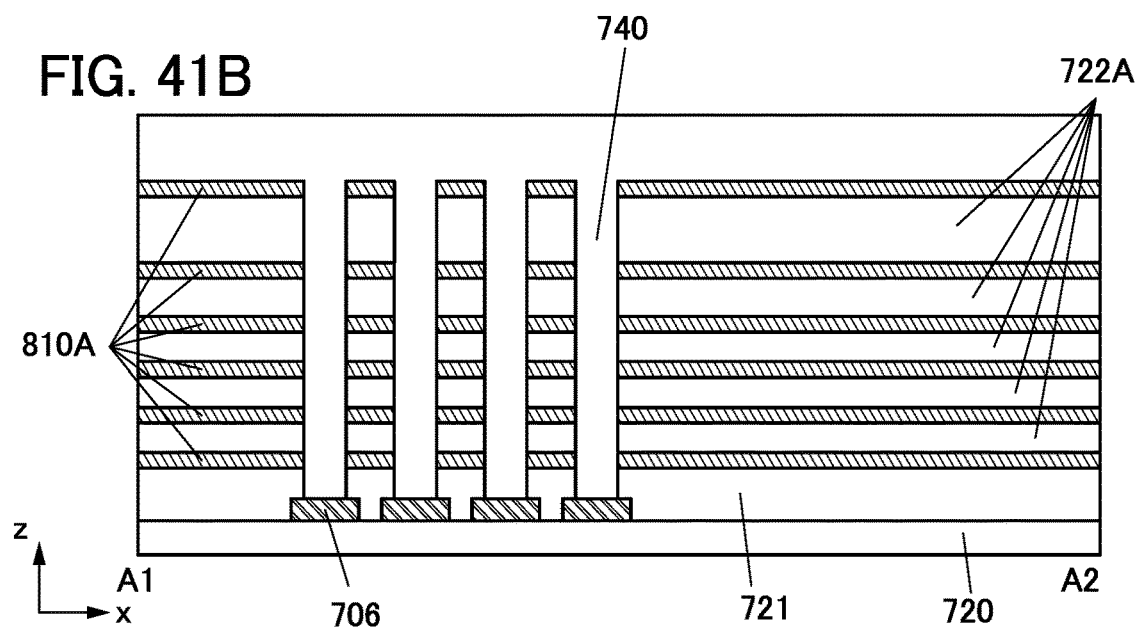
FIG. 41B and FIG. 41C are cross-sectional views illustrating the manufacturing process of the semiconductor device of one embodiment of the present invention.
Figure 41C:
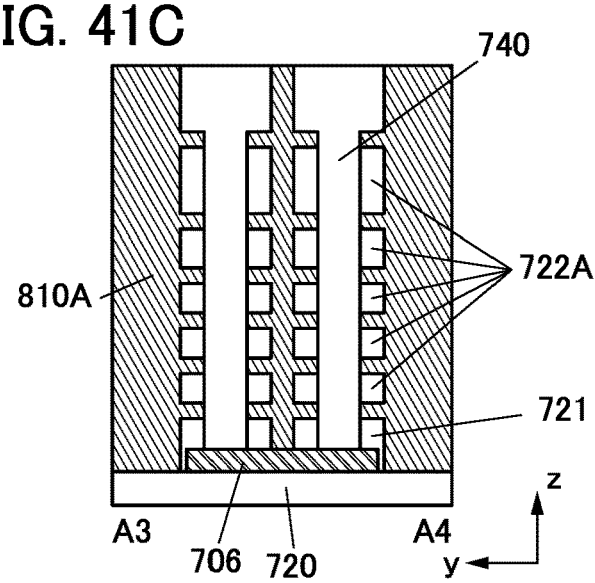

Then, the conductor 810A is partly removed to expose a surface of the layer 740 (see FIG. 41A to FIG. 41C). The conductor 810A is preferably removed by polishing. A CMP method or the like can be used for the polishing.

Figure 42A:
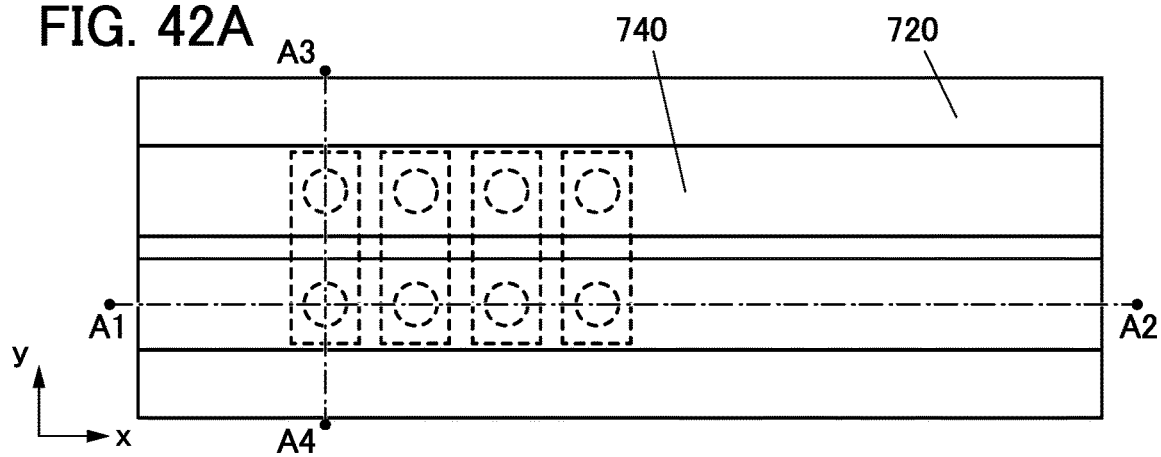
FIG. 42A is a top view illustrating a manufacturing process of a semiconductor device of one embodiment of the present invention.
Figure 42B:
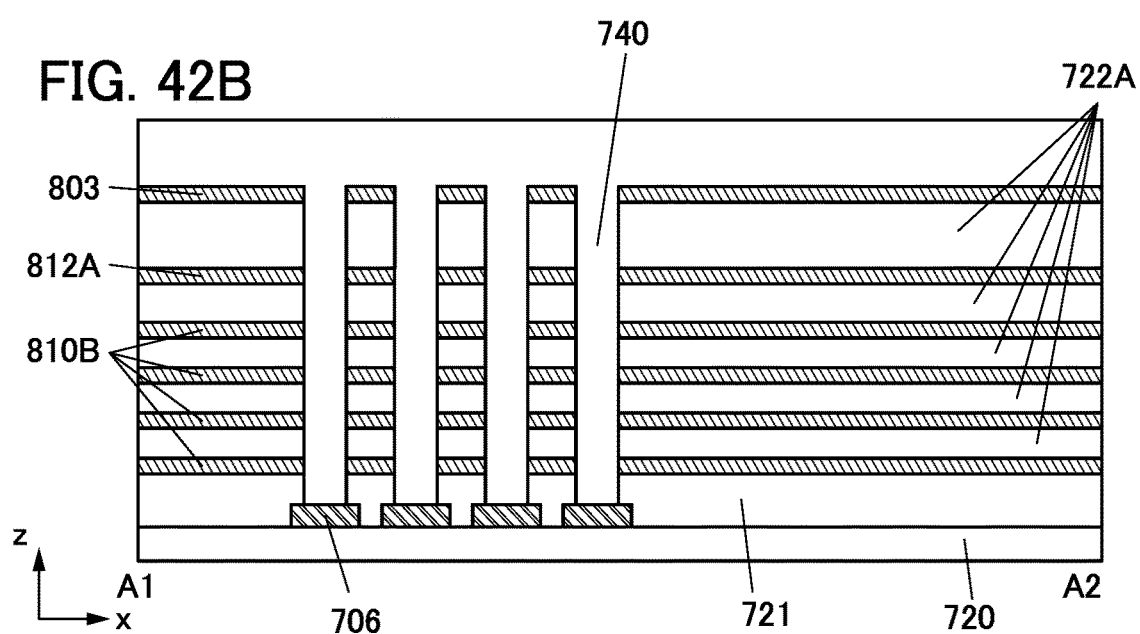
FIG. 42B and FIG. 42C are cross-sectional views illustrating the manufacturing process of the semiconductor device of one embodiment of the present invention.
Figure 42C:
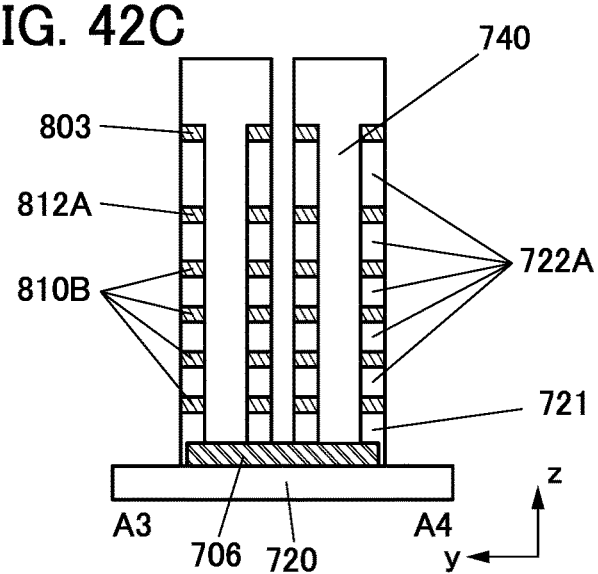

Then, with the use of the layer 740 as a mask, the conductor 810A is processed to be partly removed, so that conductors 810B, a conductor 812A, and a conductor 803 are formed (see FIG. 42A to FIG. 42C). By this processing, at least the conductor 810A in the second openings is removed. Anisotropic etching is preferably employed to remove the conductor 810A. The conductor 810A is preferably processed in a self-aligned manner with the use of the layer 740 as a mask. By this processing, the second openings are formed again. In addition, by this processing, the conductors 810B, the conductor 812A, and the conductor 803 which are electrically isolated from each other are formed. The conductors 810B are used as the gates of the memory transistors MT after undergoing later steps. The conductor 812A is used as the gate of the selection transistor after undergoing later steps. The conductor 803 is used as a hard mask in a later step.

Figure 43A:
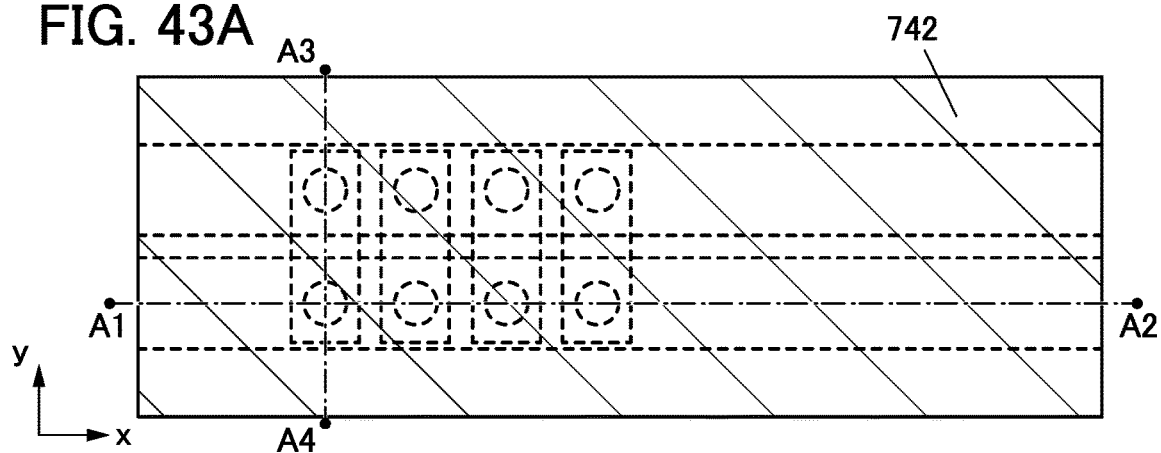
FIG. 43A is a top view illustrating a manufacturing process of a semiconductor device of one embodiment of the present invention.
Figure 43B:
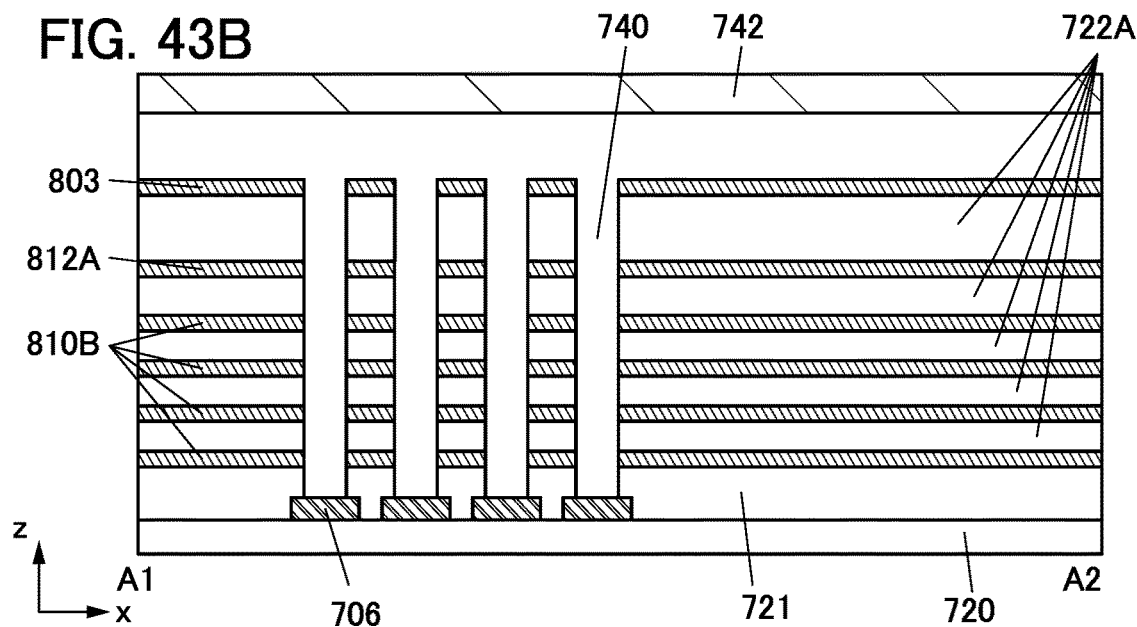
FIG. 43B and FIG. 43C are cross-sectional views illustrating the manufacturing process of the semiconductor device of one embodiment of the present invention.
Figure 43C:
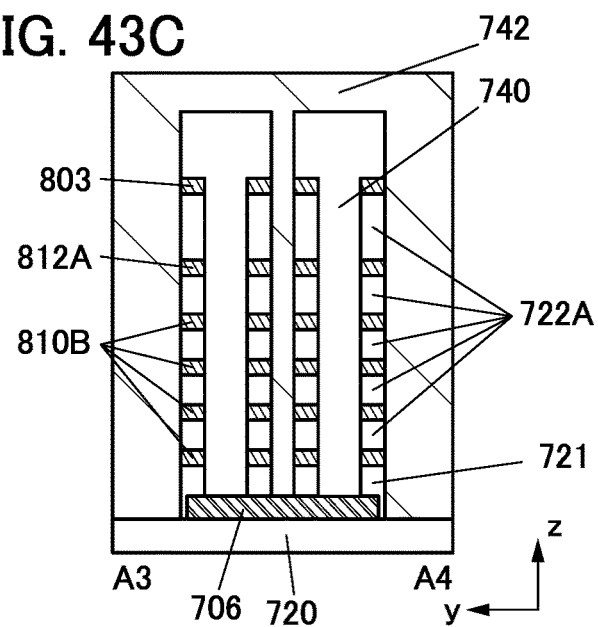

Subsequently, the insulator 742 is formed over the layer 740 and the base 720 to fill the second openings (see FIG. 43A to FIG. 43C).

Figure 44A:
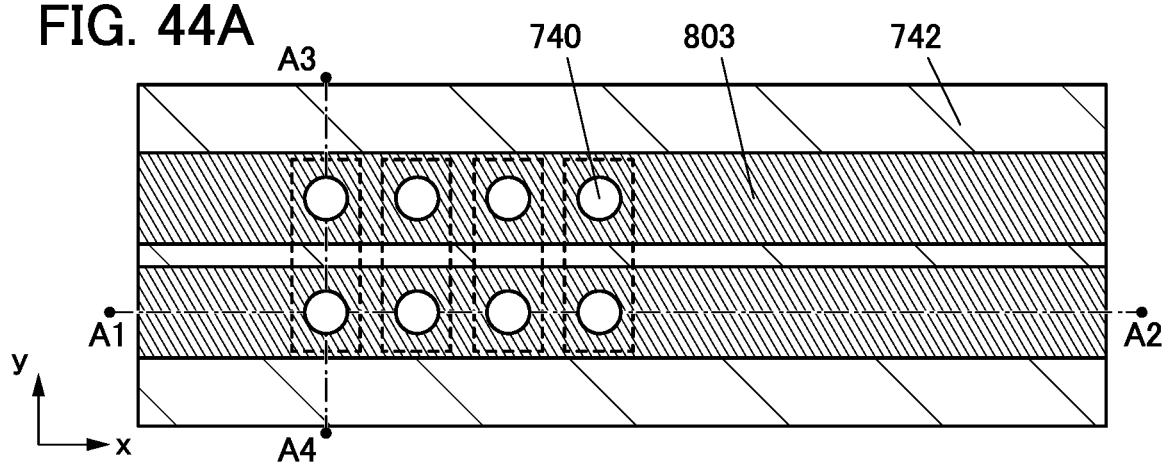
FIG. 44A is a top view illustrating a manufacturing process of a semiconductor device of one embodiment of the present invention.
Figure 44B:
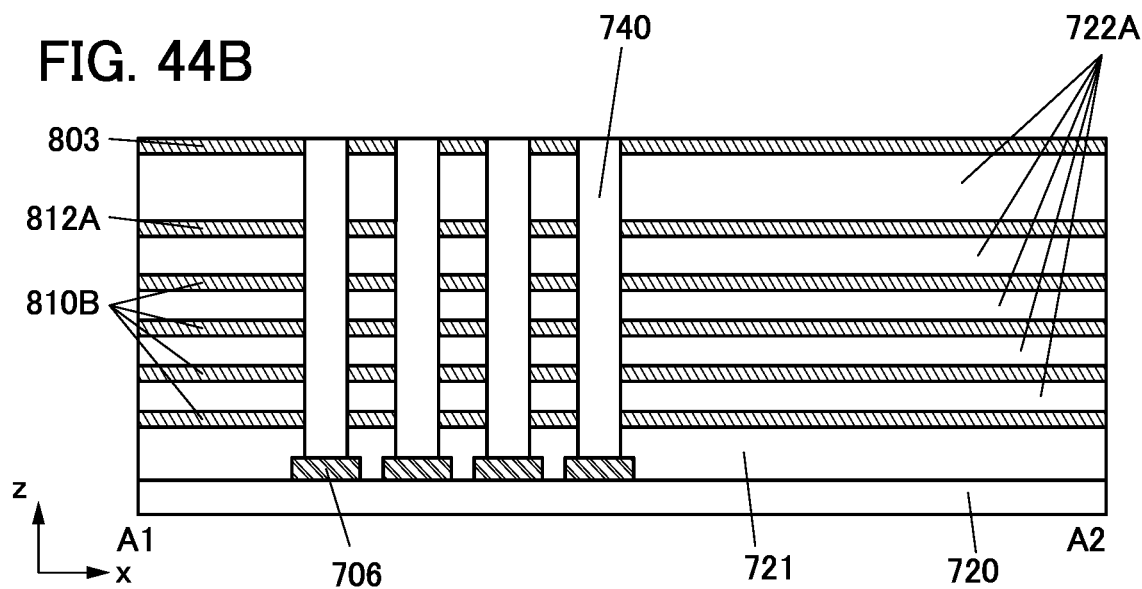
FIG. 44B and FIG. 44C are cross-sectional views illustrating the manufacturing process of the semiconductor device of one embodiment of the present invention.
Figure 44C:
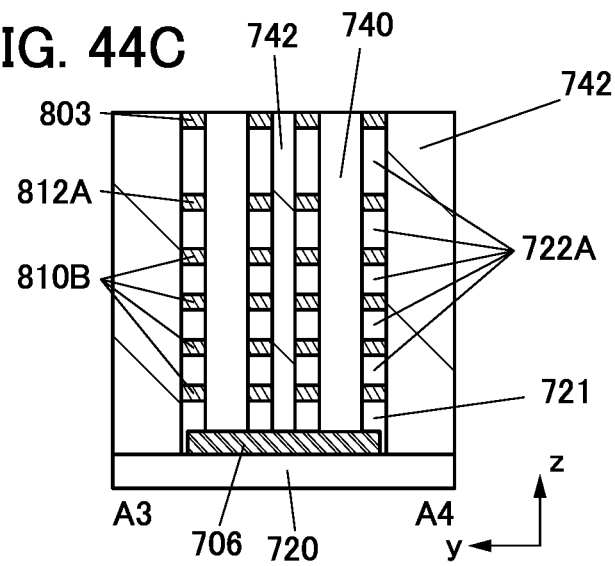

Then, part of the insulator 742 and part of the layer 740 are removed to expose a surface of the conductor 803 (see FIG. 44A to FIG. 44C). The insulator 742 and the layer 740 are preferably removed by polishing. A CMP method or the like can be used for the polishing.

Figure 45A:
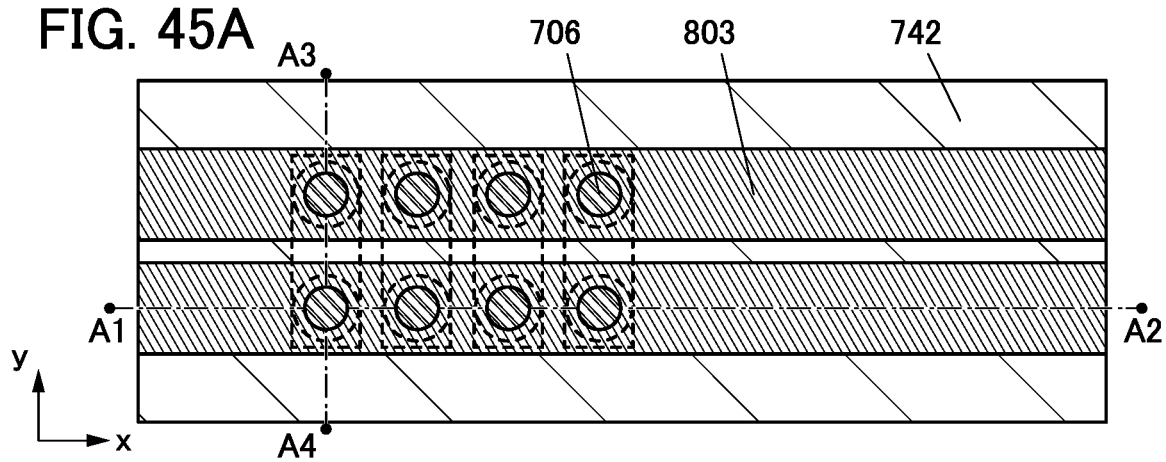
FIG. 45A is a top view illustrating a manufacturing process of a semiconductor device of one embodiment of the present invention.
Figure 45B:
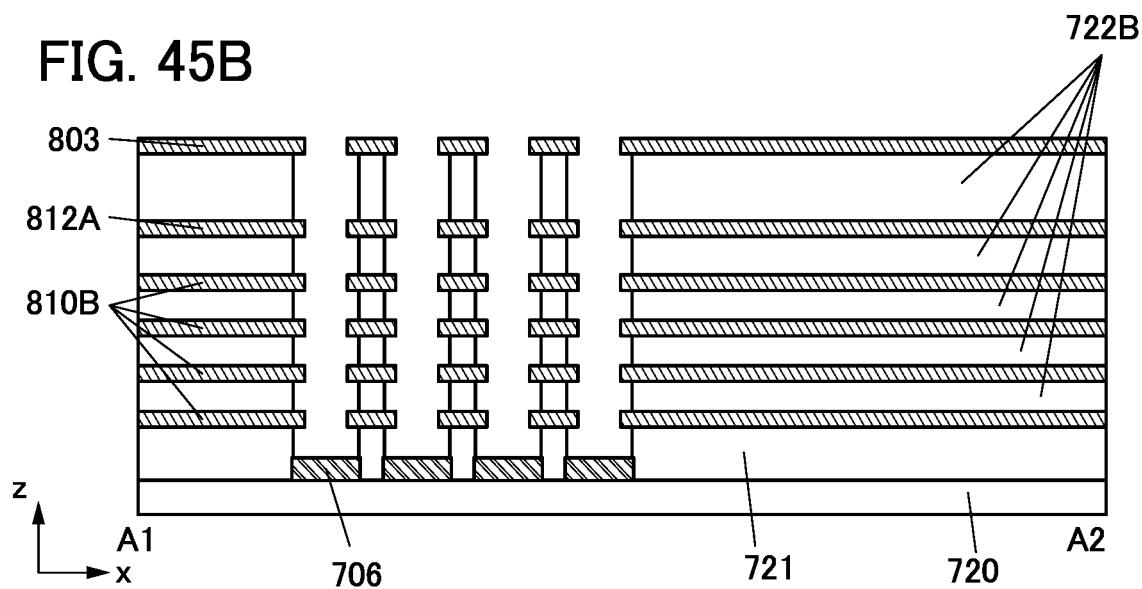
FIG. 45B and FIG. 45C are cross-sectional views illustrating the manufacturing process of the semiconductor device of one embodiment of the present invention.
Figure 45C:
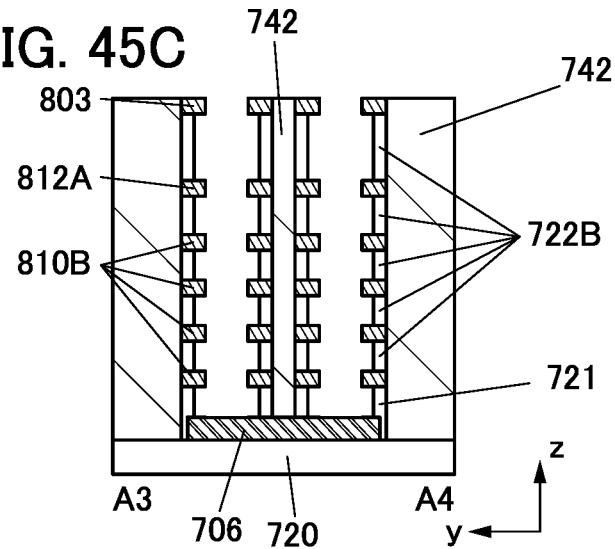

Subsequently, the layer 740 is removed with the use of the conductor 803 and the insulator 742 as masks (see FIG. 45A to FIG. 45C). Anisotropic etching is preferably used to remove the layer 740. By the anisotropic etching, the first openings are formed again. The insulating films 722A are subjected to isotropic etching to have an increased opening diameter, whereby the insulators 722B are formed. Here, it can be said that the insulators 722B each have a recession with respect to side surfaces of the conductors 810B between which the insulator 722B is vertically sandwiched. The processing of the insulating films 722A may be performed in the same step as the anisotropic etching of the layer 740. For example, the processing of the insulating films 722A may be performed during overetching by the anisotropic etching of the layer 740. Alternatively, the processing of the insulating films 722A may be performed by isotropic etching after removal of the layer 740.

Then, the insulators 703, the oxide film 704A, the conductors 719, the insulating film 711A, and the conductive film 712A are formed (see FIG. 46A to FIG. 46C). After the formation of the conductors 719 and before the formation of the insulating film 711A, the regions 734 of the oxide film 704A are subjected to microwave treatment to form the high-resistance regions. Furthermore, the regions 731 to be the low-resistance regions are formed in the oxide film 704A that is in contact with the conductors 719. For the formation of the low-resistance regions, heat treatment is preferably performed as appropriate. Incidentally, the above-described microwave treatment, i.e., the microwave annealing, may double as this heat treatment. In the case where the microwave annealing sufficiently heats the oxide 704 and the like, the heat treatment is not necessarily performed. These steps can be performed as in the method described in Manufacturing method 1 of memory cell array.

Figure 47A:
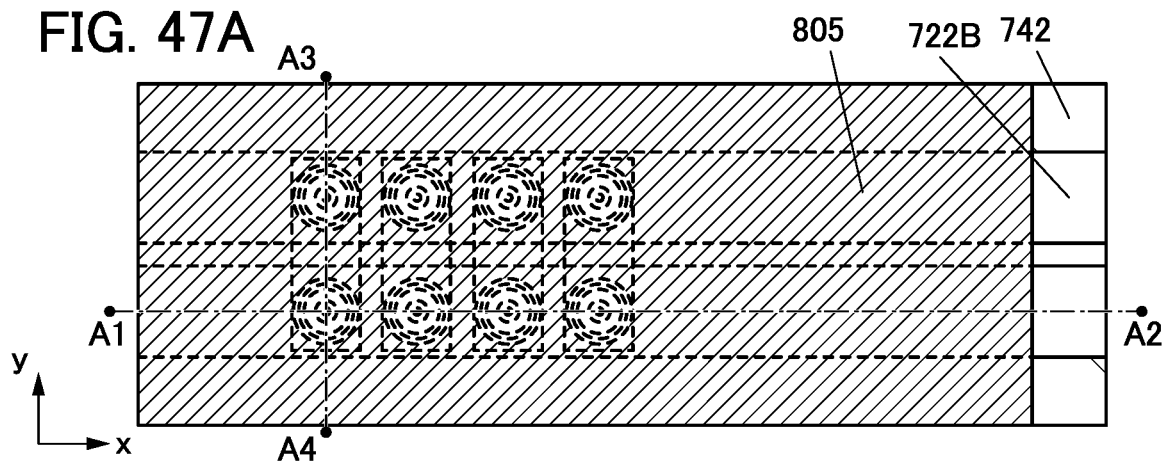
FIG. 47A is a top view illustrating a manufacturing process of a semiconductor device of one embodiment of the present invention.
Figure 47B:
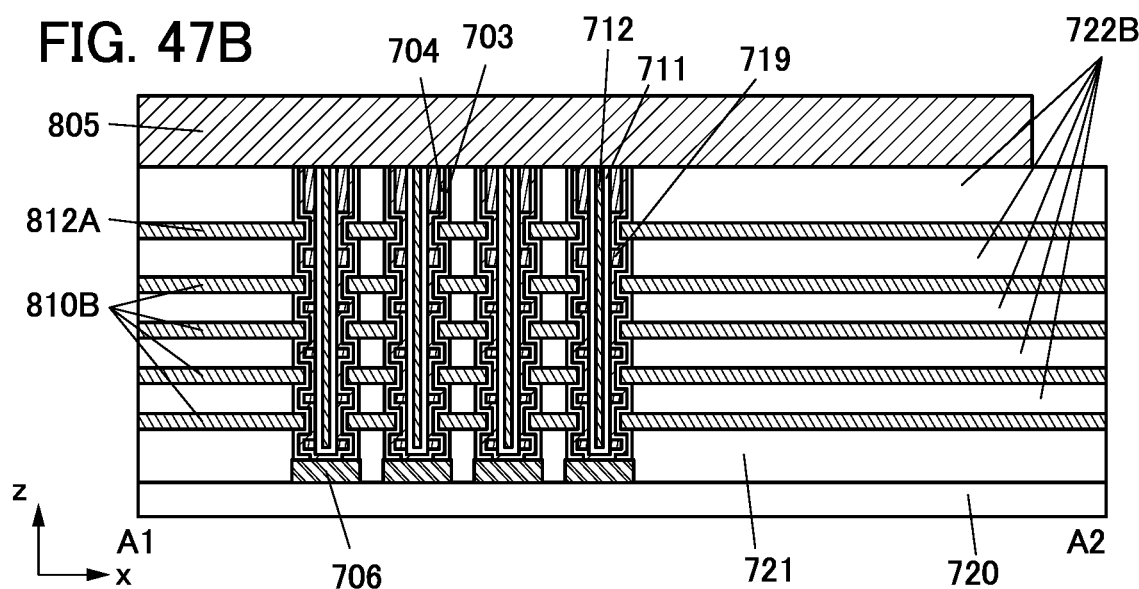
FIG. 47B and FIG. 47C are cross-sectional views illustrating the manufacturing process of the semiconductor device of one embodiment of the present invention.
Figure 47C:
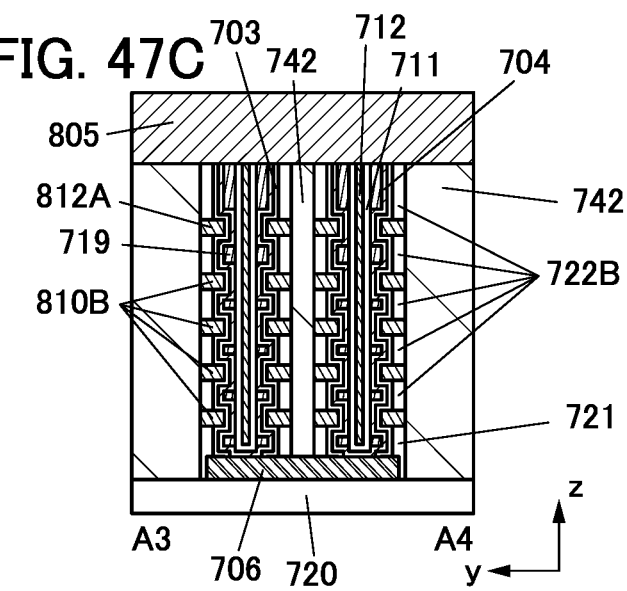

Next, the conductor 803, and the conductive film 712A, the insulating film 711A, the oxide film 704A, the insulators 703, and the like positioned above the dotted lines shown in FIG. 46B and FIG. 46C are removed by a CMP method or the like to obtain the oxides 704, the insulators 711, and the conductors 712 (see FIG. 47A to FIG. 47C). Note that the above-described heat treatment may be performed after the removal of unnecessary portions of the conductive film 712A, the insulating film 711A, and the oxide film 704A.

Then, a mask 805 is formed over the insulators 703, the oxides 704, the insulators 711, the conductors 712, the conductors 719, and the insulators 722B (see FIG. 47A to FIG. 47C).

Figure 48A:
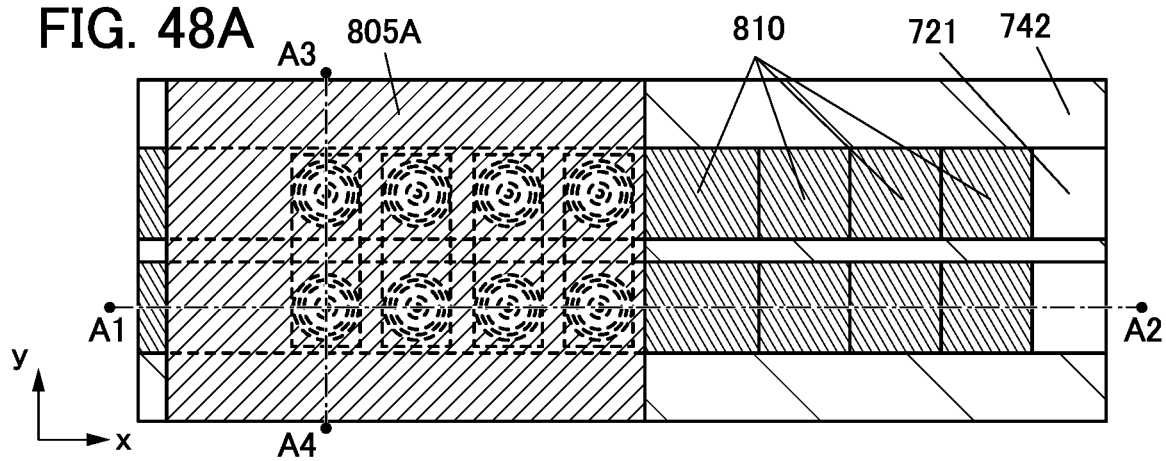
FIG. 48A is a top view illustrating a manufacturing process of a semiconductor device of one embodiment of the present invention.
Figure 48B:
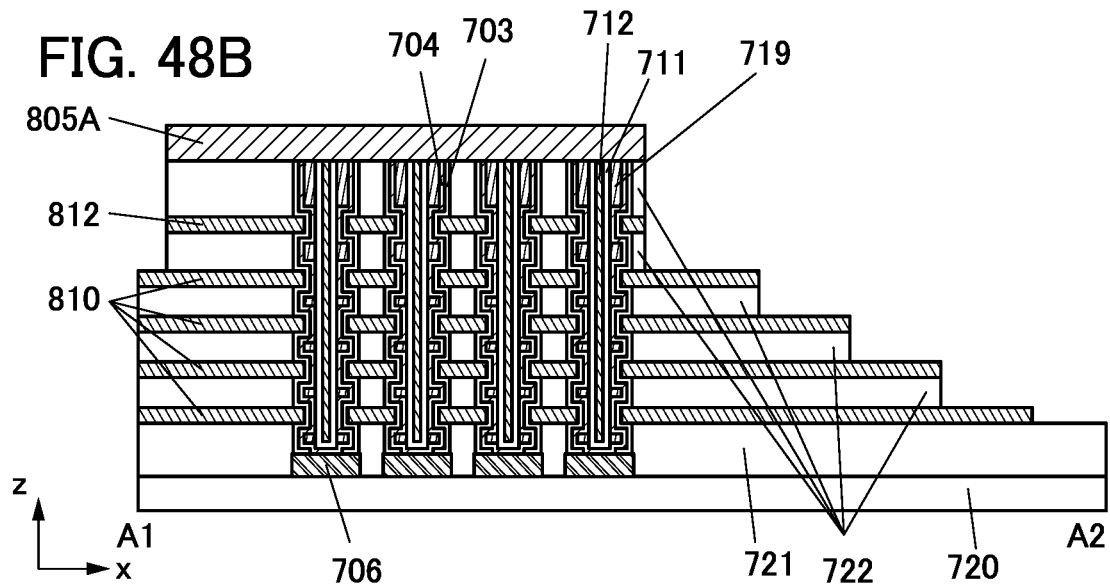
FIG. 48B and FIG. 48C are cross-sectional views illustrating the manufacturing process of the semiconductor device of one embodiment of the present invention.
Figure 48C:
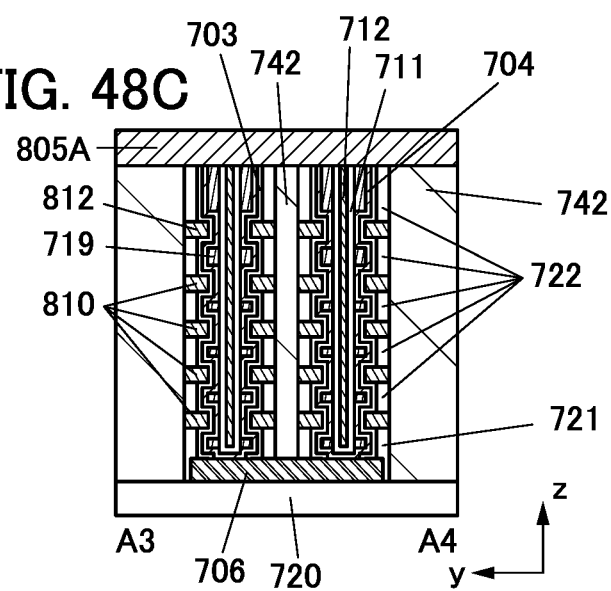

Subsequently, the conductor 812A, the conductors 810B, the insulators 722B, and the insulator 742 are processed to form the conductors 810, a conductor 812, and the insulators 722 which have a step-like shape as shown in FIG. 48B. In the processing of the conductor 812A, the conductors 810B, the insulators 722B, and the insulator 742, etching of the conductor 812A, the conductors 810B, the insulators 722B, and the insulator 742 and slimming of the mask 805 are alternately performed, whereby the conductors 810, the conductor 812, and the insulators 722 which have a step-like shape can be formed. By the processing of the conductor 812A, the conductors 810B, the insulators 722B, and the insulator 742, the mask 805 is reduced in width and thickness to be a mask 805A (see FIG. 48A to FIG. 48C).

Figure 49A:
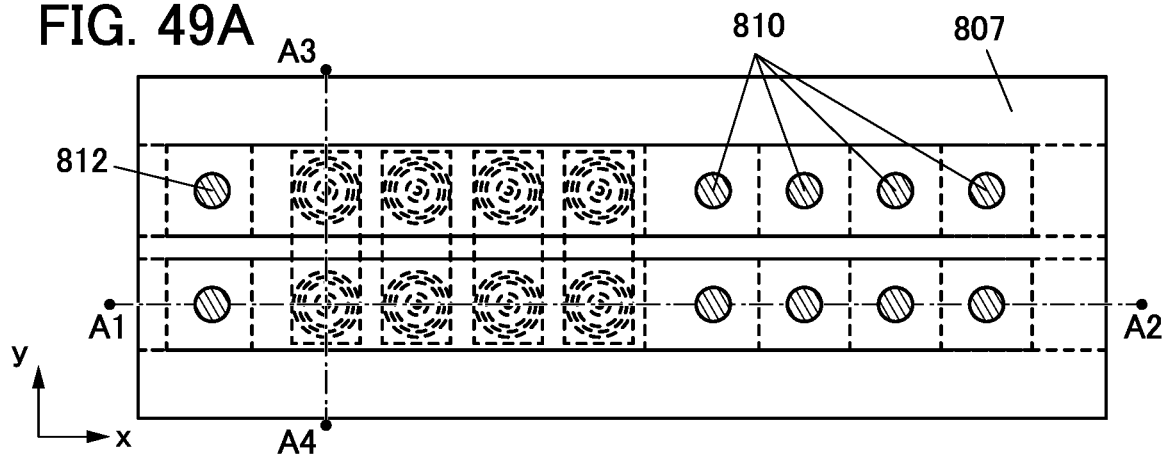
FIG. 49A is a top view illustrating a manufacturing process of a semiconductor device of one embodiment of the present invention.
Figure 49B:
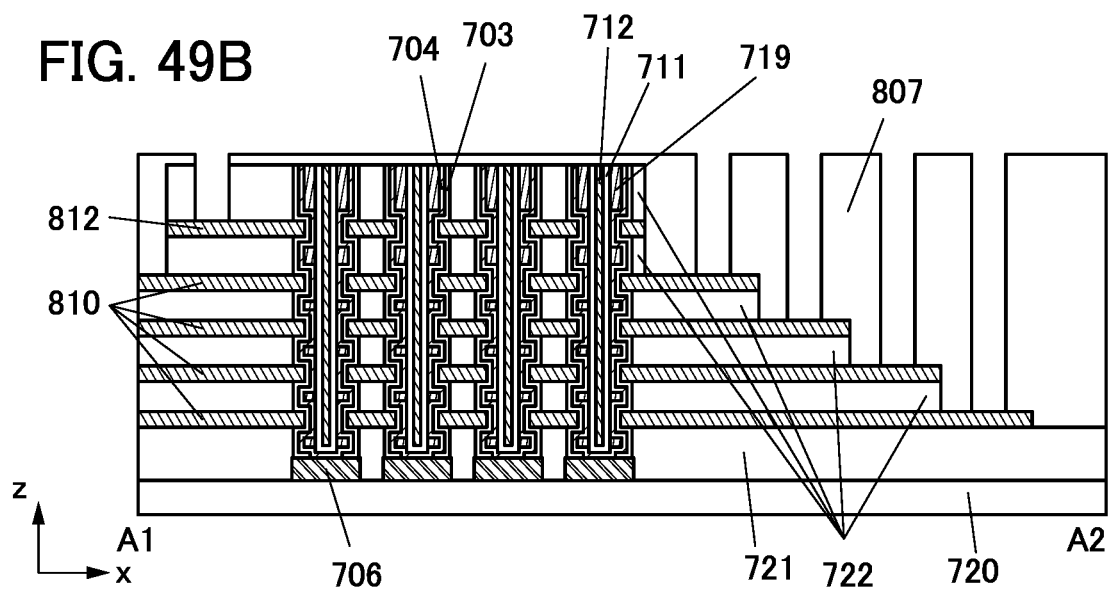
FIG. 49B and FIG. 49C are cross-sectional views illustrating the manufacturing process of the semiconductor device of one embodiment of the present invention.
Figure 49C:
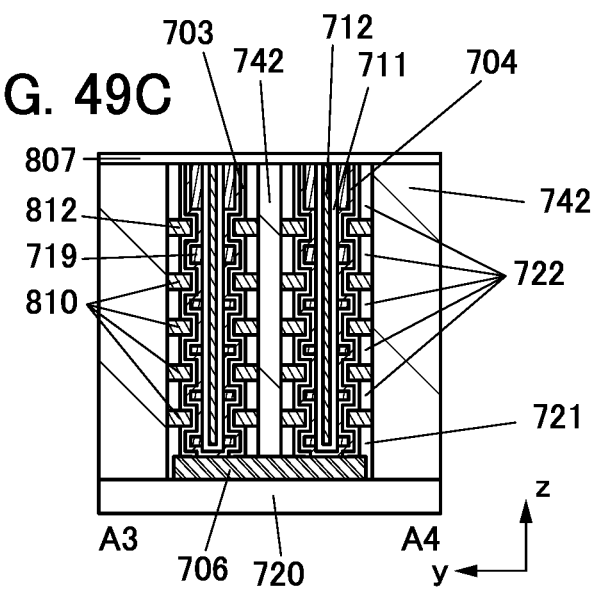

Then, the mask 805A is removed and an insulator 807 is formed to cover the conductors 810, the conductor 812, the insulators 722, and the like (see FIG. 49A to FIG. 49C). For the insulator 807, a material that can be used for the insulator 721 or the insulating film 722A can be used. The insulator 807 can be formed by a CVD method or an ALD method. In the insulator 807, openings reaching the conductors 810 are formed. An opening reaching the conductor 812 is formed in the insulator 722 and the insulator 807.

Figure 50A:
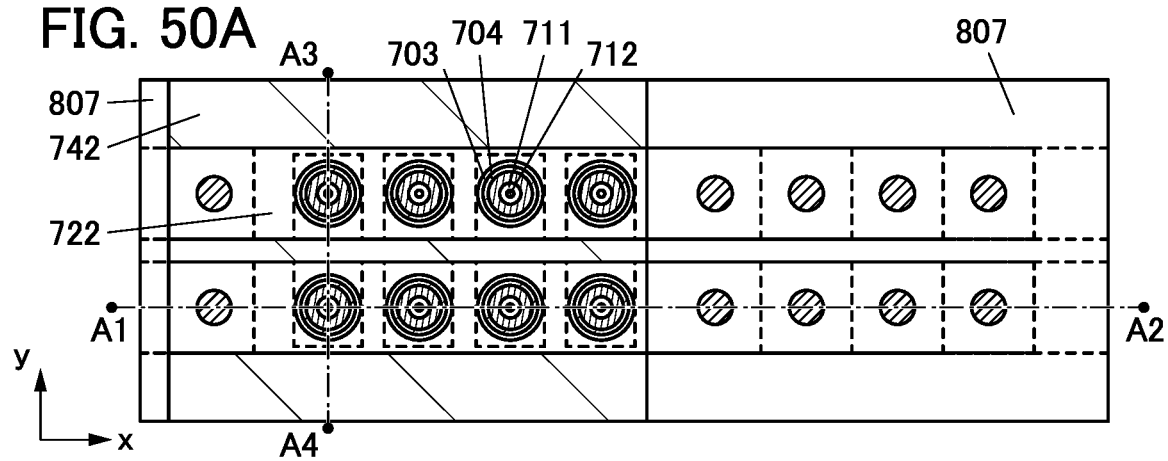
FIG. 50A is a top view illustrating a manufacturing process of a semiconductor device of one embodiment of the present invention.
Figure 50B:
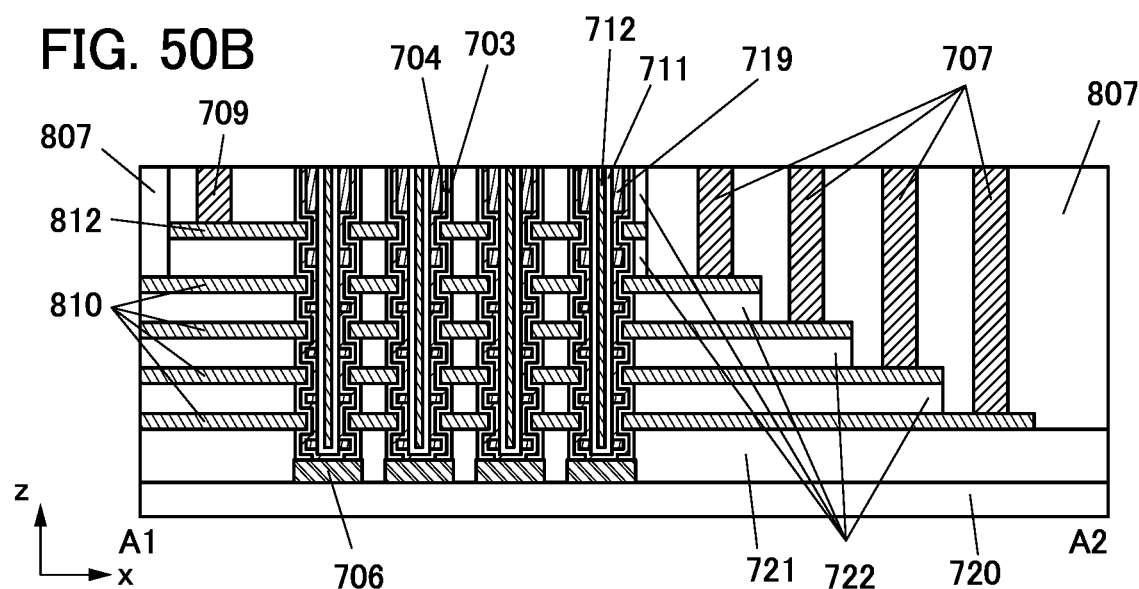
FIG. 50B and FIG. 50C are cross-sectional views illustrating the manufacturing process of the semiconductor device of one embodiment of the present invention.
Figure 50C:
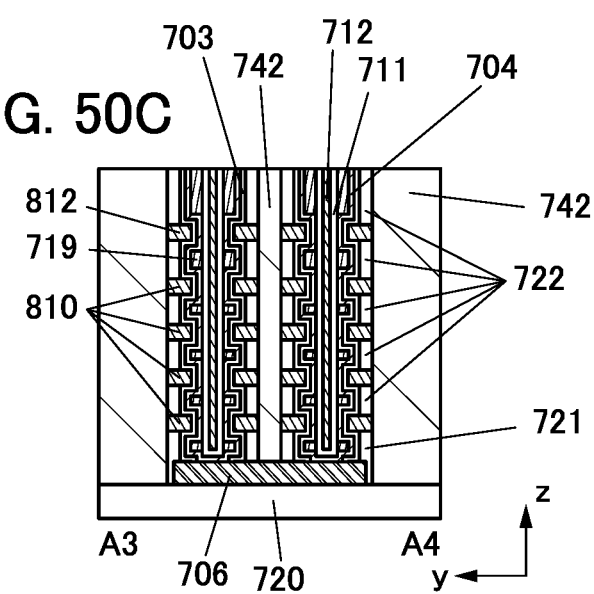

Then, in the openings formed in the insulator 722 and the insulator 807, the conductors 707 electrically connected to the conductors 810 and the conductor 709 electrically connected to the conductor 812 are formed (see FIG. 50A to FIG. 50C). A conductor is formed over the insulator 807 to fill the openings and the conductor positioned above the insulator 807 is removed by being polished by a CMP method or the like, so that the conductors 707 and the conductor 709 can be formed in the openings. For the conductors 707 and the conductor 709, a material that can be used for the conductor 810A can be used. For the formation of the conductor to be the conductors 707 and the conductor 709, a CVD method or an ALD method can be used.

Subsequently, with the use of the materials and the manufacturing method described in Manufacturing method 1 of memory cell array, the conductors 705 each serving as part of the bit line BL or the source line SL, the conductors 708 each serving as part of the word line WL, the conductor 710 serving as part of the wiring DGL or the wiring SGL, the insulator 717, the insulators 713, and the conductors 714 and the conductors 715 that serve as the bit lines BL and the wirings BG are formed.

Through the above steps, the memory cell array can be manufactured. In the description of this manufacturing process, the memory cell array includes four layers of the memory transistors MT and four memory strings; however, the present invention is not limited thereto. The memory cell array may include five or more layers of the memory transistors MT or five or more memory strings. For example, a memory cell array including 32 layers, 64 layers, or 128 layers of the memory transistors MT can be manufactured. A memory cell array including 200 or more layers of the memory transistors MT can be manufactured.

The memory cell array is manufactured in the above manner, whereby the memory transistors MT in a plurality of layers can be manufactured at a time without patterning for manufacturing the memory transistors MT for the plurality of layers. Furthermore, in the case where a memory cell array is manufactured by the above method, even when the number of layers of the memory transistors MT is increased, the number of steps of patterning and etching of the memory transistors MT is not increased. In this manner, the process of manufacturing the memory cell array can be shortened; thus, a semiconductor device with high productivity can be provided.

Microwave Treatment Apparatus

A microwave treatment apparatus that can be used for the above method for manufacturing the semiconductor device is described below.

Figure 52:
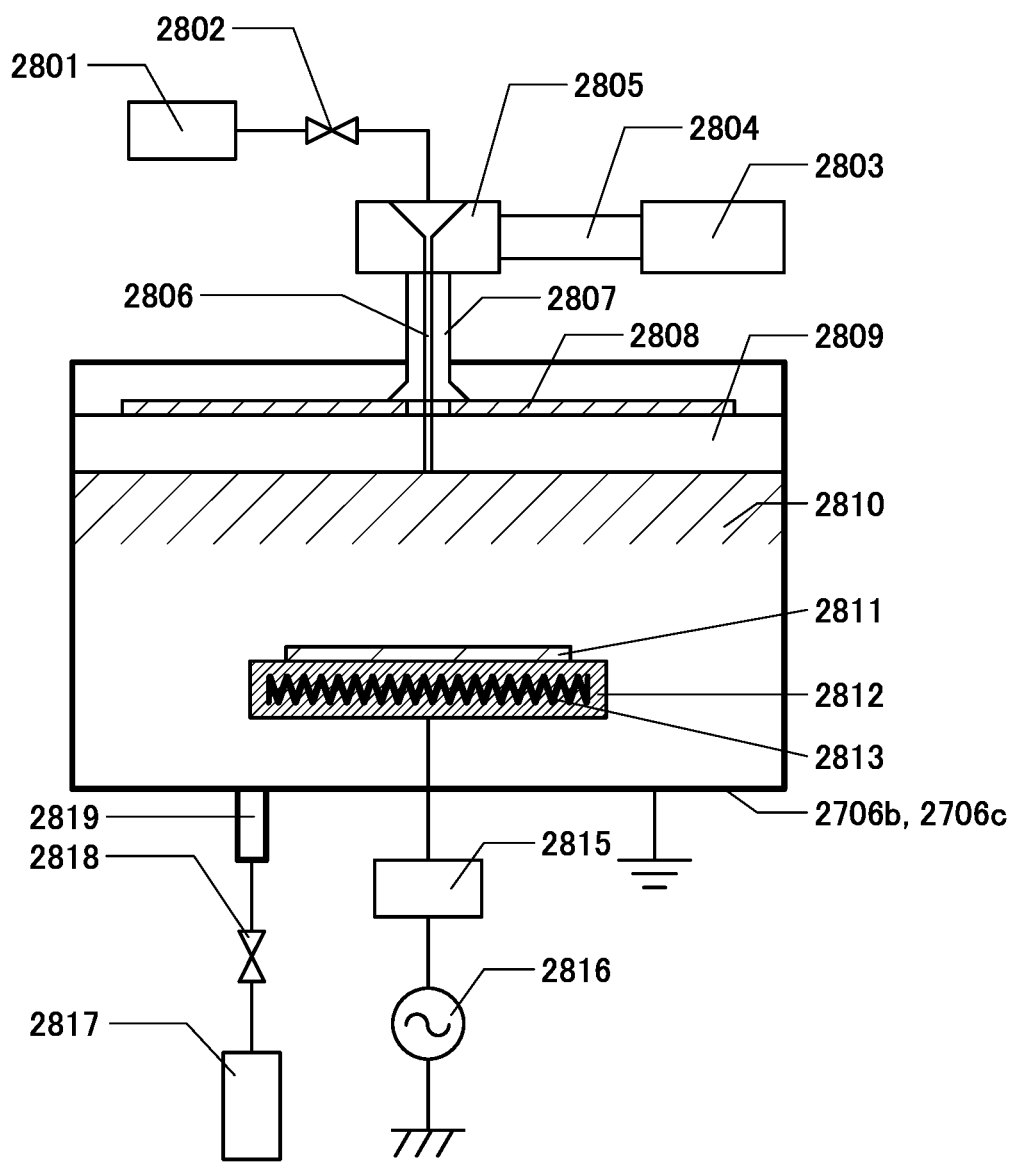
FIG. 52 is a cross-sectional view illustrating a microwave treatment apparatus of one embodiment of the present invention.
Figure 53:
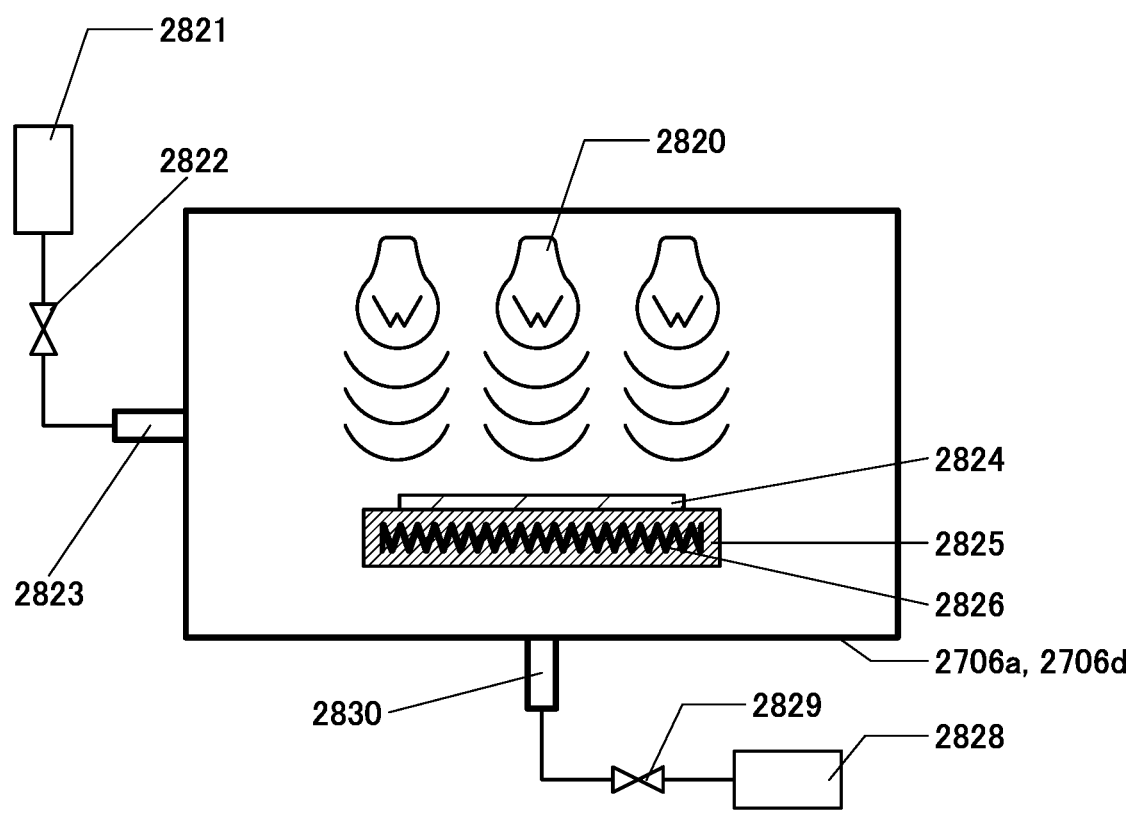
FIG. 53 is a cross-sectional view illustrating a microwave treatment apparatus of one embodiment of the present invention.

First, a structure of a manufacturing apparatus that allows entry of few impurities in manufacturing a semiconductor device or the like is described with reference to FIG. 51, FIG. 52, and FIG. 53.

Figure 51:
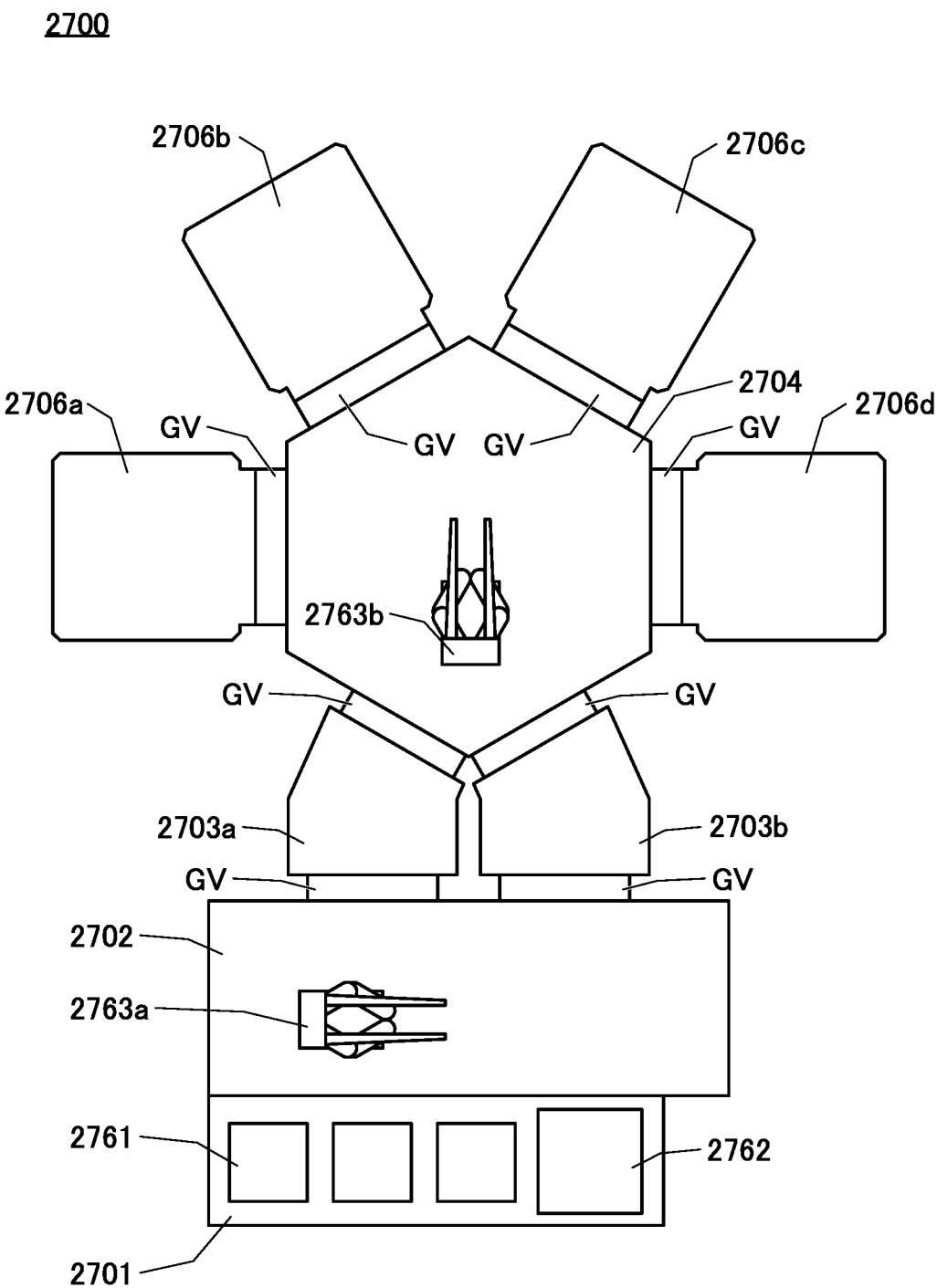
FIG. 51 is a top view illustrating a microwave treatment apparatus of one embodiment of the present invention.

FIG. 51 schematically shows a top view of a single wafer multi-chamber manufacturing apparatus 2700. The manufacturing apparatus 2700 includes an atmosphere-side substrate supply chamber 2701 including a cassette port 2761 for storing substrates and an alignment port 2762 for performing alignment of substrates; an atmosphere-side substrate transfer chamber 2702 through which a substrate is transferred from the atmosphere-side substrate supply chamber 2701; a load lock chamber 2703*a* where a substrate is carried in and the pressure inside the chamber is switched from atmospheric pressure to reduced pressure or from reduced pressure to atmospheric pressure; an unload lock chamber 2703*b* where a substrate is carried out and the pressure inside the chamber is switched from reduced pressure to atmospheric pressure or from atmospheric pressure to reduced pressure; a transfer chamber 2704 through which a substrate is transferred in a vacuum; a chamber 2706*a*; a chamber 2706*b*; a chamber 2706*c*; and a chamber 2706*d*.

Furthermore, the atmosphere-side substrate transfer chamber 2702 is connected to the load lock chamber 2703*a* and the unload lock chamber 2703*b*, the load lock chamber 2703*a* and the unload lock chamber 2703*b* are connected to the transfer chamber 2704, and the transfer chamber 2704 is connected to the chamber 2706*a*, the chamber 2706*b*, the chamber 2706*c*, and the chamber 2706*d*.

Note that gate valves GV are provided in connecting portions between the chambers so that each chamber excluding the atmosphere-side substrate supply chamber 2701 and the atmosphere-side substrate transfer chamber 2702 can be independently kept in a vacuum state. Furthermore, the atmosphere-side substrate transfer chamber 2702 is provided with a transfer robot 2763*a*, and the transfer chamber 2704 is provided with a transfer robot 2763*b*. With the transfer robot 2763*a* and the transfer robot 2763*b*, a substrate can be transferred inside the manufacturing apparatus 2700.

The back pressure (total pressure) in the transfer chamber 2704 and each of the chambers is, for example, lower than or equal to $1\times10^{-4}$ Pa, preferably lower than or equal to $3\times10^{-5}$ Pa, and further preferably lower than or equal to $1\times10^{-5}$ Pa. Furthermore, the partial pressure of a gas molecule (atom) having a mass-to-charge ratio (m/z) of 18 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa. Furthermore, the partial pressure of a gas molecule (atom) having m/z of 28 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa. Furthermore, the partial pressure of a gas molecule (atom) having m/z of 44 in the transfer chamber 2704 and each of the chambers is, for example, lower than or equal to $3\times10^{-5}$ Pa, preferably lower than or equal to $1\times10^{-5}$ Pa, and further preferably lower than or equal to $3\times10^{-6}$ Pa.

Note that the total pressure and the partial pressure inside the transfer chamber 2704 and each of the chambers can be measured using a mass analyzer. For example, Qulee CGM-051, a quadrupole mass analyzer (also referred to as Q-mass) produced by ULVAC, Inc. can be used.

Furthermore, the transfer chamber 2704 and the chambers each desirably have a structure in which the amount of external leakage or internal leakage is small. For example, the leakage rate in the transfer chamber 2704 and each of the chambers is lower than or equal to $3\times10^{-6}$ Pa·m³/s, and preferably lower than or equal to $1\times10^{-6}$ Pa·m³/s. Furthermore, for example, the leakage rate of a gas molecule (atom) having m/z of 18 is lower than or equal to $1\times10^{-6}$ Pa·m³/s, and preferably lower than or equal to $3\times10^{-8}$ Pa·m³/s. Furthermore, for example, the leakage rate of a gas molecule (atom) having m/z of 28 is lower than or equal to $1\times10^{-5}$ Pa·m³/s, and preferably lower than or equal to $1\times10^{-6}$ Pa·m³/s. Furthermore, for example, the leakage rate of a gas molecule (atom) having m/z of 44 is lower than or equal to $3\times10^{-6}$ Pa·m³/s, and preferably lower than or equal to $1\times10^{-6}$ Pa·m³/s.

Note that a leakage rate can be derived from the total pressure and partial pressure measured using the above-described mass analyzer. The leakage rate depends on external leakage and internal leakage. The external leakage refers to inflow of a gas from the outside of a vacuum system through a minute hole, a sealing defect, or the like. The internal leakage is due to leakage through a partition, such as a valve, in a vacuum system or a released gas from an internal member. Measures need to be taken from both aspects of external leakage and internal leakage in order that the leakage rate can be set to lower than or equal to the above-described value.

For example, open/close portions of the transfer chamber 2704 and each of the chambers are preferably sealed with a metal gasket. For the metal gasket, a metal covered with iron fluoride, aluminum oxide, or chromium oxide is preferably used. The metal gasket achieves higher adhesion than an O-ring and can reduce the external leakage. Furthermore, with the use of the metal covered with iron fluoride, aluminum oxide, chromium oxide, or the like, which is in the passive state, the release of a gas containing impurities released from the metal gasket is inhibited, so that the internal leakage can be reduced.

Furthermore, for a member of the manufacturing apparatus 2700, aluminum, chromium, titanium, zirconium, nickel, or vanadium, which releases a small amount of a gas containing impurities, is used. Furthermore, an alloy containing iron, chromium, nickel, and the like covered with the above-described material may be used. The alloy containing iron, chromium, nickel, and the like is rigid, resistant to heat, and suitable for processing. Here, when surface unevenness of the member is reduced by polishing or the like to reduce the surface area, the release of a gas can be reduced.

Alternatively, the above-described member of the manufacturing apparatus 2700 may be covered with iron fluoride, aluminum oxide, chromium oxide, or the like.

The member of the manufacturing apparatus 2700 is preferably formed using only metal when possible, and in the case where a viewing window formed of quartz or the like is provided, for example, the surface is preferably thinly covered with iron fluoride, aluminum oxide, chromium oxide, or the like to inhibit release of a gas.

An adsorbed substance present in the transfer chamber 2704 and each of the chambers does not affect the pressure in the transfer chamber 2704 and each of the chambers because it is adsorbed onto an inner wall or the like; however, it causes release of a gas when the transfer chamber 2704 and each of the chambers are evacuated. Thus, although there is no correlation between the leakage rate and the exhaust rate, it is important that the adsorbed substance present in the transfer chamber 2704 and each of the chambers be desorbed as much as possible and exhaust be performed in advance with the use of a pump with high exhaust capability. Note that the transfer chamber 2704 and each of the chambers may be subjected to baking to promote desorption of the adsorbed substance. By the baking, the desorption rate of the adsorbed substance can be increased about tenfold. The baking is performed at higher than or equal to 100° C. and lower than or equal to 450° C. At this time, when the adsorbed substance is removed while an inert gas is introduced into the transfer chamber 2704 and each of the chambers, the desorption rate of water or the like, which is difficult to desorb simply by exhaust, can be further increased. Note that when the inert gas to be introduced is heated to substantially the same temperature as the baking temperature, the desorption rate of the adsorbed substance can be further increased. Here, a rare gas is preferably used as the inert gas.

Alternatively, treatment for evacuating the transfer chamber 2704 and each of the chambers is preferably performed a certain period of time after a heated inert gas such as a rare gas, heated oxygen, or the like is introduced to increase the pressure inside the transfer chamber 2704 and each of the chambers. The introduction of the heated gas can desorb the adsorbed substance in the transfer chamber 2704 and each of the chambers, and impurities present in the transfer chamber 2704 and each of the chambers can be reduced. Note that this treatment is effective when repeated more than or equal to 2 times and less than or equal to 30 times, and preferably more than or equal to 5 times and less than or equal to 15 times. Specifically, an inert gas, oxygen, or the like with a temperature of higher than or equal to 40° C. and lower than or equal to 400° C., and preferably higher than or equal to 50° C. and lower than or equal to 200° C. is introduced, so that the pressure inside the transfer chamber 2704 and each of the chambers can be kept to be higher than or equal to 0.1 Pa and lower than or equal to 10 kPa, preferably higher than or equal to 1 Pa and lower than or equal to 1 kPa, and further preferably higher than or equal to 5 Pa and lower than or equal to 100 Pa in the time range of 1 minute to 300 minutes, and preferably 5 minutes to 120 minutes. After that, the transfer chamber 2704 and each of the chambers are evacuated in the time range of 5 minutes to 300 minutes, and preferably 10 minutes to 120 minutes.

Next, the chamber 2706b and the chamber 2706c are described with reference to a schematic cross-sectional view shown in FIG. 52.

The chamber 2706b and the chamber 2706c are chambers that can perform microwave treatment on an object, for example. Note that the chamber 2706b is different from the chamber 2706c only in the atmosphere in performing the microwave treatment. The other structures are common and thus collectively described below.

The chamber 2706b and the chamber 2706c each include a slot antenna plate 2808, a dielectric plate 2809, a substrate holder 2812, and an exhaust port 2819. Furthermore, a gas supply source 2801, a valve 2802, a high-frequency generator 2803, a waveguide 2804, a mode converter 2805, a gas pipe 2806, a waveguide 2807, a matching box 2815, a high-frequency power source 2816, a vacuum pump 2817, and a valve 2818 are provided outside the chamber 2706b and the chamber 2706c, for example.

The high-frequency generator 2803 is connected to the mode converter 2805 through the waveguide 2804. The mode converter 2805 is connected to the slot antenna plate 2808 through the waveguide 2807. The slot antenna plate 2808 is positioned in contact with the dielectric plate 2809. Furthermore, the gas supply source 2801 is connected to the mode converter 2805 through the valve 2802. Then, a gas is transferred to the chamber 2706b and the chamber 2706c through the gas pipe 2806 that runs through the mode converter 2805, the waveguide 2807, and the dielectric plate 2809. Furthermore, the vacuum pump 2817 has a function of an exhausting gas or the like from the chamber 2706b and the chamber 2706c through the valve 2818 and the exhaust port 2819. Furthermore, the high-frequency power source 2816 is connected to the substrate holder 2812 through the matching box 2815.

The substrate holder 2812 has a function of holding a substrate 2811. For example, the substrate holder 2812 has a function of an electrostatic chuck or a mechanical chuck for holding the substrate 2811. Furthermore, the substrate holder 2812 has a function of an electrode to which electric power is supplied from the high-frequency power source 2816. Furthermore, the substrate holder 2812 includes a heating mechanism 2813 therein and has a function of heating the substrate 2811.

As the vacuum pump 2817, a dry pump, a mechanical booster pump, an ion pump, a titanium sublimation pump, a cryopump, or a turbomolecular pump can be used, for example. Furthermore, in addition to the vacuum pump 2817, a cryotrap may be used. The use of the cryopump and the cryotrap is particularly preferable because water can be efficiently exhausted.

Furthermore, for example, the heating mechanism 2813 is a heating mechanism that uses a resistance heater or the like for heating. Alternatively, a heating mechanism that uses heat conduction or heat radiation from a medium such as a heated gas for heating may be used. For example, RTA (Rapid Thermal Annealing) such as GRTA (Gas Rapid Thermal Annealing) or LRTA (Lamp Rapid Thermal Annealing) can be used. In GRTA, heat treatment is performed using a high-temperature gas. An inert gas is used as the gas.

Furthermore, the gas supply source 2801 may be connected to a purifier through a mass flow controller. As the gas, a gas whose dew point is −80° C. or lower, and preferably −100° C. or lower is preferably used. For example, an oxygen gas, a nitrogen gas, or a rare gas (an argon gas or the like) is used.

For the dielectric plate 2809, silicon oxide (quartz), aluminum oxide (alumina), or yttrium oxide (yttria) is used, for example. Furthermore, another protective layer may be further formed on a surface of the dielectric plate 2809. For the protective layer, magnesium oxide, titanium oxide, chromium oxide, zirconium oxide, hafnium oxide, tantalum oxide, silicon oxide, aluminum oxide, yttrium oxide, or the like is used. The dielectric plate 2809 is exposed to an especially high density region of high-density plasma 2810 described later; thus, provision of the protective layer can reduce the damage. Consequently, an increase in the number of particles or the like during the treatment can be inhibited.

The high-frequency generator 2803 has a function of generating microwaves at, for example, higher than or equal to 0.3 GHz and lower than or equal to 6.0 GHz. For example, the high-frequency generator 2803 can generate microwaves at higher than or equal to 0.7 GHz and lower than or equal to 1.1 GHz, higher than or equal to 2.2 GHz and lower than or equal to 2.8 GHz, or higher than or equal to 5.0 GHz and lower than or equal to 6.0 GHz. The microwave generated by the high-frequency generator 2803 is propagated to the mode converter 2805 through the waveguide 2804. The mode converter 2805 converts the microwave propagated in the TE mode into a microwave in the TEM mode. Then, the microwave is propagated to the slot antenna plate 2808 through the waveguide 2807. The slot antenna plate 2808 is provided with a plurality of slot holes, and the microwave passes through the slot holes and the dielectric plate 2809. Then, an electric field is generated below the dielectric plate 2809, and the high-density plasma 2810 can be generated. In the high-density plasma 2810, ions and radicals based on the gas species supplied from the gas supply source 2801 are present. For example, oxygen radicals are present.

At this time, the quality of a film or the like over the substrate 2811 can be modified by the ions and radicals generated in the high-density plasma 2810. Note that it is preferable in some cases to apply a bias to the substrate 2811 side using the high-frequency power source 2816. As the high-frequency power source 2816, an RF (Radio Frequency) power source with a frequency of 13.56 MHz, 27.12 MHz, or the like is used, for example. The application of a bias to the substrate side allows ions in the high-density plasma 2810 to efficiently reach a deep portion of an opening portion of the film or the like over the substrate 2811.

For example, in the chamber 2706*b* or the chamber 2706*c*, oxygen radical treatment using the high-density plasma 2810 can be performed by introducing oxygen from the gas supply source 2801.

Next, the chamber 2706*a* and the chamber 2706*d* are described with reference to a schematic cross-sectional view shown in FIG. 53.

The chamber 2706*a* and the chamber 2706*d* are chambers that can irradiate an object with an electromagnetic wave, for example. Note that the chamber 2706*a* is different from the chamber 2706*d* only in the kind of the electromagnetic wave. The other structures have many common portions and thus are collectively described below.

The chamber 2706*a* and the chamber 2706*d* each include one or a plurality of lamps 2820, a substrate holder 2825, a gas inlet 2823, and an exhaust port 2830. Furthermore, a gas supply source 2821, a valve 2822, a vacuum pump 2828, and a valve 2829 are provided outside the chamber 2706*a* and the chamber 2706*d*, for example.

The gas supply source 2821 is connected to the gas inlet 2823 through the valve 2822. The vacuum pump 2828 is connected to the exhaust port 2830 through the valve 2829. The lamp 2820 is provided to face the substrate holder 2825. The substrate holder 2825 has a function of holding a substrate 2824. Furthermore, the substrate holder 2825 includes a heating mechanism 2826 therein and has a function of heating the substrate 2824.

As the lamp 2820, a light source having a function of radiating an electromagnetic wave such as visible light or ultraviolet light is used, for example. For example, a light source having a function of radiating an electromagnetic wave which has a peak at a wavelength of longer than or equal to 10 nm and shorter than or equal to 2500 nm, longer than or equal to 500 nm and shorter than or equal to 2000 nm, or longer than or equal to 40 nm and shorter than or equal to 340 nm is used.

As the lamp 2820, a light source such as a halogen lamp, a metal halide lamp, a xenon arc lamp, a carbon arc lamp, a high-pressure sodium lamp, or a high-pressure mercury lamp is used, for example.

For example, part or the whole of the electromagnetic wave radiated from the lamp 2820 is absorbed by the substrate 2824, so that the quality of a film or the like over the substrate 2824 can be modified. For example, generation or reduction of defects or removal of impurities can be performed. Note that when the radiation is performed while the substrate 2824 is heated, the generation or reduction of defects, removal of impurities, or the like can be efficient.

Alternatively, for example, the electromagnetic wave radiated from the lamp 2820 may generate heat in the substrate holder 2825 to heat the substrate 2824. In this case, the substrate holder 2825 does not need to include the heating mechanism 2826 therein.

For the vacuum pump 2828, refer to the description of the vacuum pump 2817. Furthermore, for the heating mechanism 2826, refer to the description of the heating mechanism 2813. Furthermore, for the gas supply source 2821, refer to the description of the gas supply source 2801.

Figure 54:
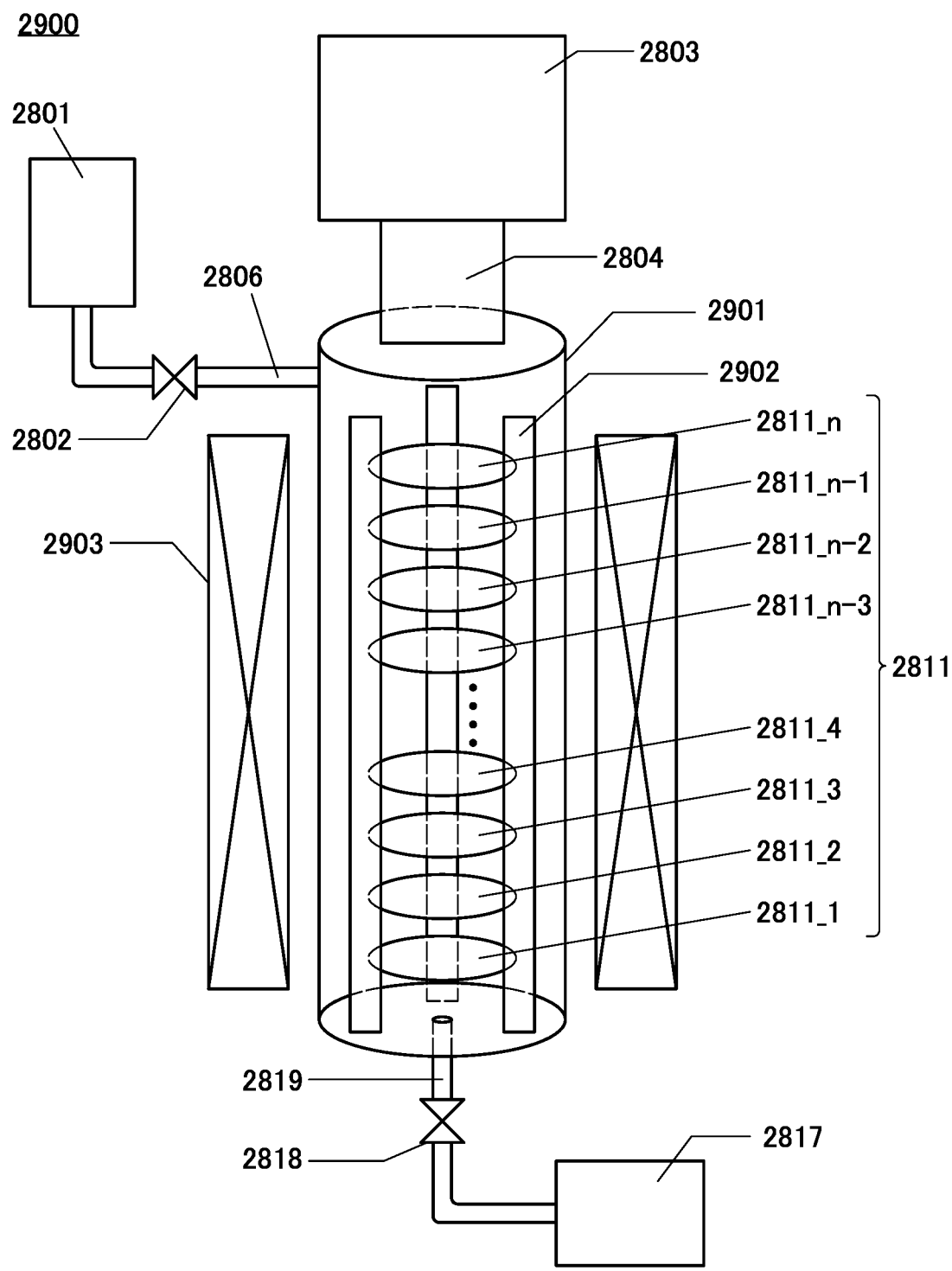
FIG. 54 is a cross-sectional view illustrating a microwave treatment apparatus of one embodiment of the present invention.

A microwave treatment apparatus that can be used in this embodiment is not limited to the above. It is possible to use a microwave treatment apparatus 2900 shown in FIG. 54. The microwave treatment apparatus 2900 includes a quartz tube 2901, the exhaust port 2819, the gas supply source 2801, the valve 2802, the high-frequency generator 2803, the waveguide 2804, the gas pipe 2806, the vacuum pump 2817, and the valve 2818. Furthermore, the microwave treatment apparatus 2900 includes, in the quartz tube 2901, a substrate holder 2902 for holding a plurality of the substrates 2811 (a substrate 2811_1 to a substrate 2811_*n*; n is an integer of greater than or equal to 2). The microwave treatment apparatus 2900 may further include a heating means 2903 outside the quartz tube 2901.

The substrate placed in the quartz tube 2901 is irradiated with the microwave generated by the high-frequency generator 2803 and passing through the waveguide 2804. The vacuum pump 2817 is connected to the exhaust port 2819 through the valve 2818 and can adjust the pressure inside the quartz tube 2901. The gas supply source 2801 is connected to the gas pipe 2806 through the valve 2802 and can introduce a desired gas into the quartz tube 2901. The heating means 2903 can heat the substrate 2811 in the quartz tube 2901 to a desired temperature. Alternatively, the heating means 2903 may heat the gas which is supplied from the gas supply source 2801. With the use of the microwave treatment apparatus 2900, the substrate 2811 can be subjected to heat treatment and microwave treatment at the same time. Alternatively, the substrate 2811 can be heated and then subjected to microwave treatment. Alternatively, the substrate 2811 can be subjected to microwave treatment and then heat treatment.

All of the substrate 2811_1 to the substrate 2811_*n* may be substrates to be treated where a semiconductor device or a memory device is to be formed, or some of the substrates may be dummy substrates. For example, the substrate 2811_1 and the substrate 2811_*n* may be dummy substrates and the substrate 2811_2 to the substrate 2811_*n*−1 may be substrates to be treated. Alternatively, the substrate 2811_1, the substrate 2811_2, the substrate 2811_*n*−1, and the substrate 2811_*n* may be dummy substrates and the substrate 2811_3 to the substrate 2811_*n*−2 may be substrates to be treated. A dummy substrate is preferably used, in which case a plurality of substrates to be treated can be uniformly treated at the time of microwave treatment or heat treatment and a variation between the substrates to be treated can be reduced. For example, a dummy substrate is preferably placed over the substrate to be treated which is the closest to the high-frequency generator 2803 and the waveguide 2804, in which case the substrate to be treated is inhibited from being directly exposed to a microwave.

With the use of the above manufacturing apparatus, the quality of a film or the like can be modified while the entry of impurities into an object is inhibited.

Configuration Example of 3D NAND

Figure 55A:
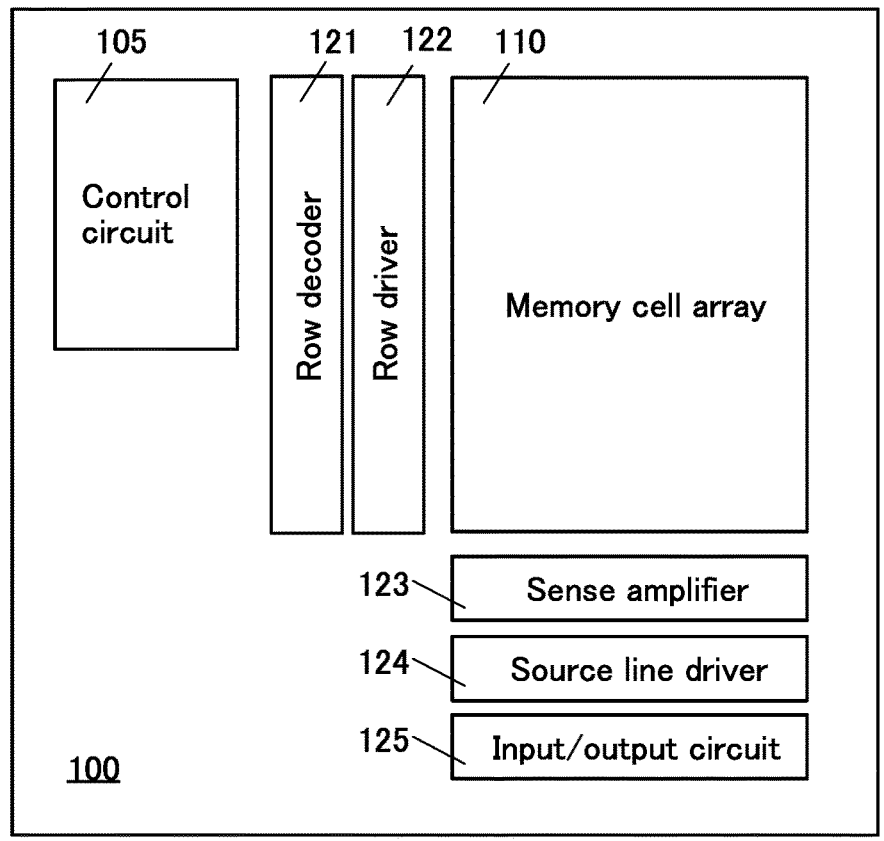
FIG. 55A is a functional block diagram showing a configuration example of a memory device of one embodiment of the present invention.

FIG. 55A shows a configuration example of a NAND-type nonvolatile memory device having a three-dimensional structure (3D NAND). A memory device 100 shown in FIG. 55A includes a control circuit 105, a memory cell array 110, and peripheral circuits.

The control circuit 105 controls the whole memory device 100 collectively and performs data writing and data reading. The control circuit 105 processes a command signal from the outside and generates a control signal for the peripheral circuits. As the peripheral circuits, a row decoder 121, a row driver 122, a sense amplifier 123, a source line driver 124, and an input/output circuit 125 are provided.

Figure 55B:
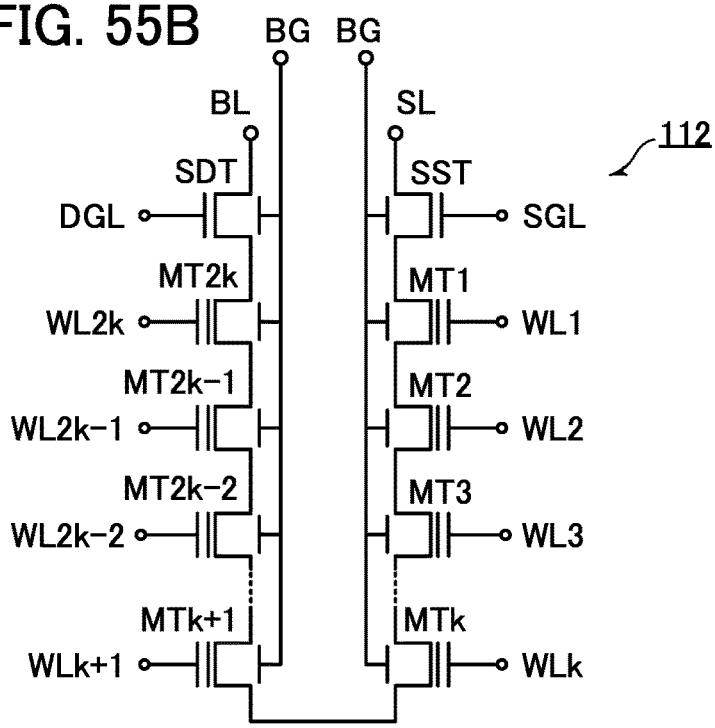
FIG. 55B is a circuit diagram showing a configuration example of a memory string of one embodiment of the present invention.

The memory cell array 110 includes a plurality of memory strings 112. FIG. 55B shows a circuit configuration example of the memory string 112. In the memory string 112, the selection transistor SST, memory transistors MT1 to MT2$k$ ($k$ is an integer of greater than or equal to 1), and the selection transistor SDT are electrically connected in series between the bit line BL and the source line SL.

Note that in the case where the memory transistors MT1 to MT2$k$ are not distinguished from each other, these memory transistors are referred to as memory transistors MT. The same applies to the other elements. For example, in the case where word lines WL1 to WL2$k$ are not distinguished from each other, these word lines are referred to as word lines WL.

As described above, the selection transistors SST and SDT, and the memory transistors MT1 to MT2$k$ are each a transistor in which the channel is formed of a metal oxide. The memory transistor MT includes a charge accumulation layer and forms a nonvolatile memory cell.

Gates of the selection transistors SST and SDT are electrically connected to the wirings SGL and DGL, respectively, serving as the selection gate lines. Gates of the memory transistors MT1 to MT2$k$ are electrically connected to the word lines WL1 to WL2$k$, respectively. The bit line BL extends in the column direction, and the wirings SGL and DGL and the word lines WL extend in the row direction.

The selection transistors SST and SDT and the memory transistors MT may each have a second gate as shown in FIG. 55B. The second gate is electrically connected to the wiring BG. FIG. 55B shows the wiring BG that is electrically connected to the second gates of the selection transistor SST and the memory transistors MT1 to MT$k$ and the wiring BG that is electrically connected to the second gates of the selection transistor SDT and the memory transistors MT$k$+1 to MT2$k$. Different potentials or the same potential may be applied to the wirings BG. Furthermore, the wirings BG may be electrically connected to each other.

The wiring BG preferably extends in the column direction parallel to the bit line BL but may extend in the row direction.

With the wiring BG, the threshold values of the selection transistors SST and SDT can be controlled. Furthermore, the potential of the wiring BG may be controlled in accordance with the circuit operation of the memory cell array.

The input/output circuit 125 temporarily holds data written to the memory cell array 110 and temporarily holds data read from the memory cell array 110, for example.

The source line driver 124 drives the source line SL.

The bit line BL is electrically connected to the sense amplifier 123. The sense amplifier 123 detects voltage that is read from the memory string 112 to the bit line BL at the time of data reading and amplifies it. In addition, the sense amplifier 123 inputs voltage corresponding to the written data to the bit line BL at the time of data writing.

The row decoder 121 decodes address data input from the outside and selects a row to be accessed. The row driver 122 inputs voltage needed for writing, reading, and erasing data to the wirings DGL and SGL and the word lines WL in accordance with the decoded results by the row decoder 121.

Figure 56:
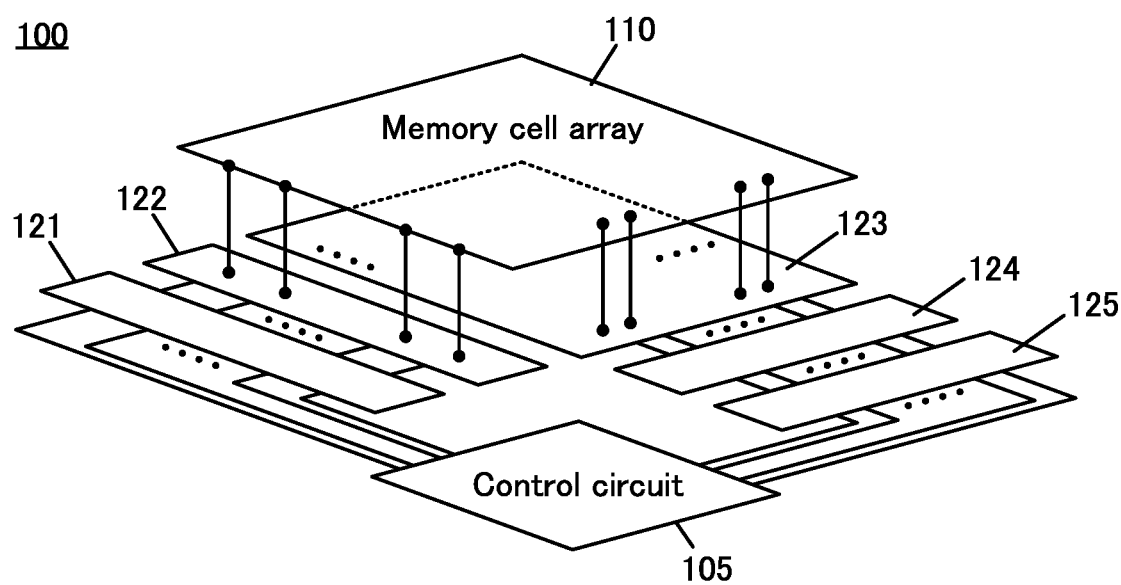
FIG. 56 is a functional block diagram showing a configuration example of a memory device of one embodiment of the present invention.

The memory cell array 110 may be provided in a layer different from the peripheral circuits such as the control circuit 105 and the sense amplifier 123. In particular, the memory cell array 110 is preferably stacked and overlapped with the sense amplifier 123, in which case the wiring led from the memory cell array 110 to the sense amplifier 123 can be more compact. FIG. 56 shows a block diagram of the memory device 100, shown in FIG. 55A, with a three-dimensional structure in which the memory cell array 110 is provided over the control circuit 105, the row decoder 121, the row driver 122, the sense amplifier 123, the source line driver 124, and the input/output circuit 125 to overlap with the sense amplifier 123.

Figure 57:
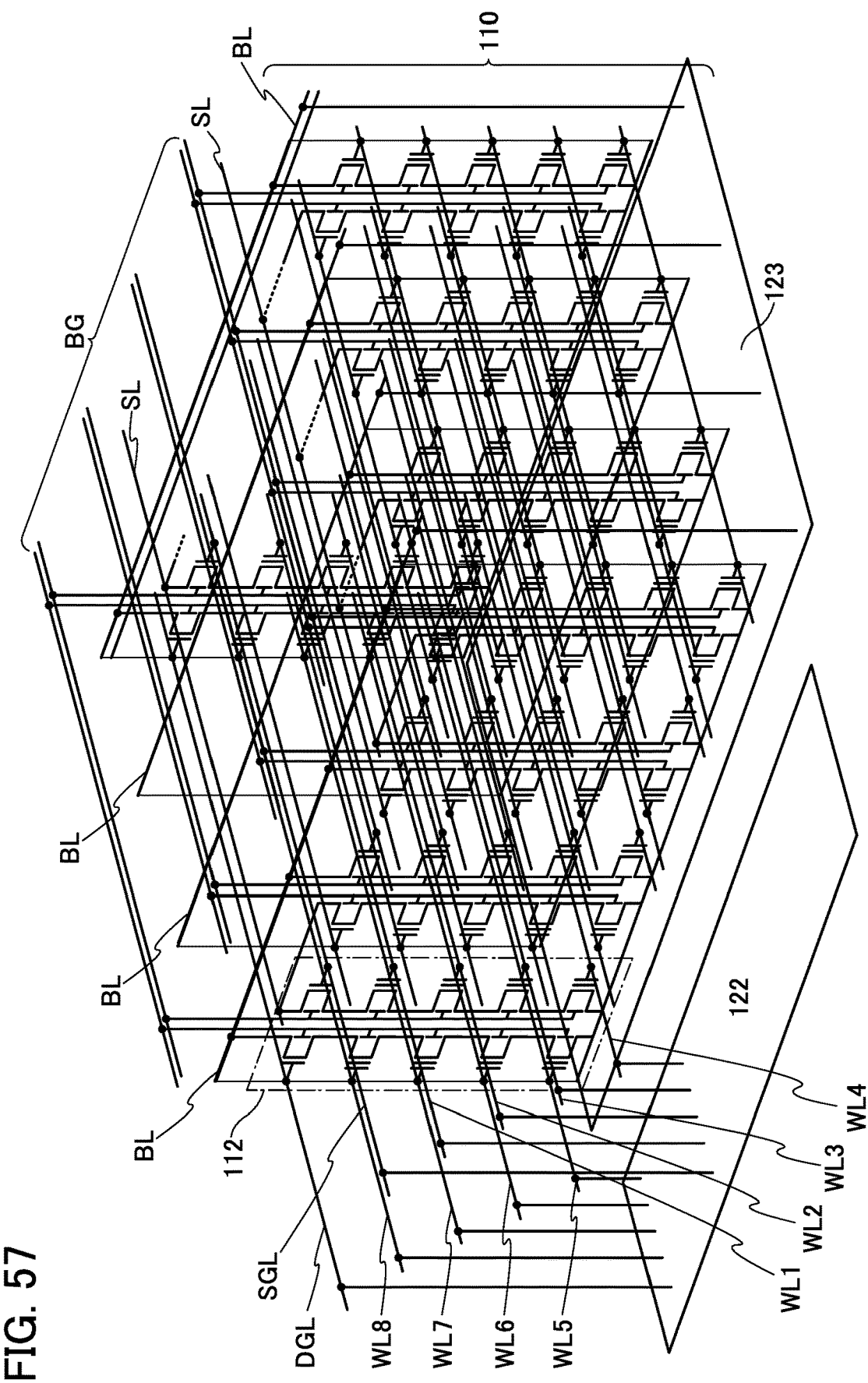
FIG. 57 is a diagram showing a three-dimensional structure example of a memory cell array of one embodiment of the present invention.
Figure 58:
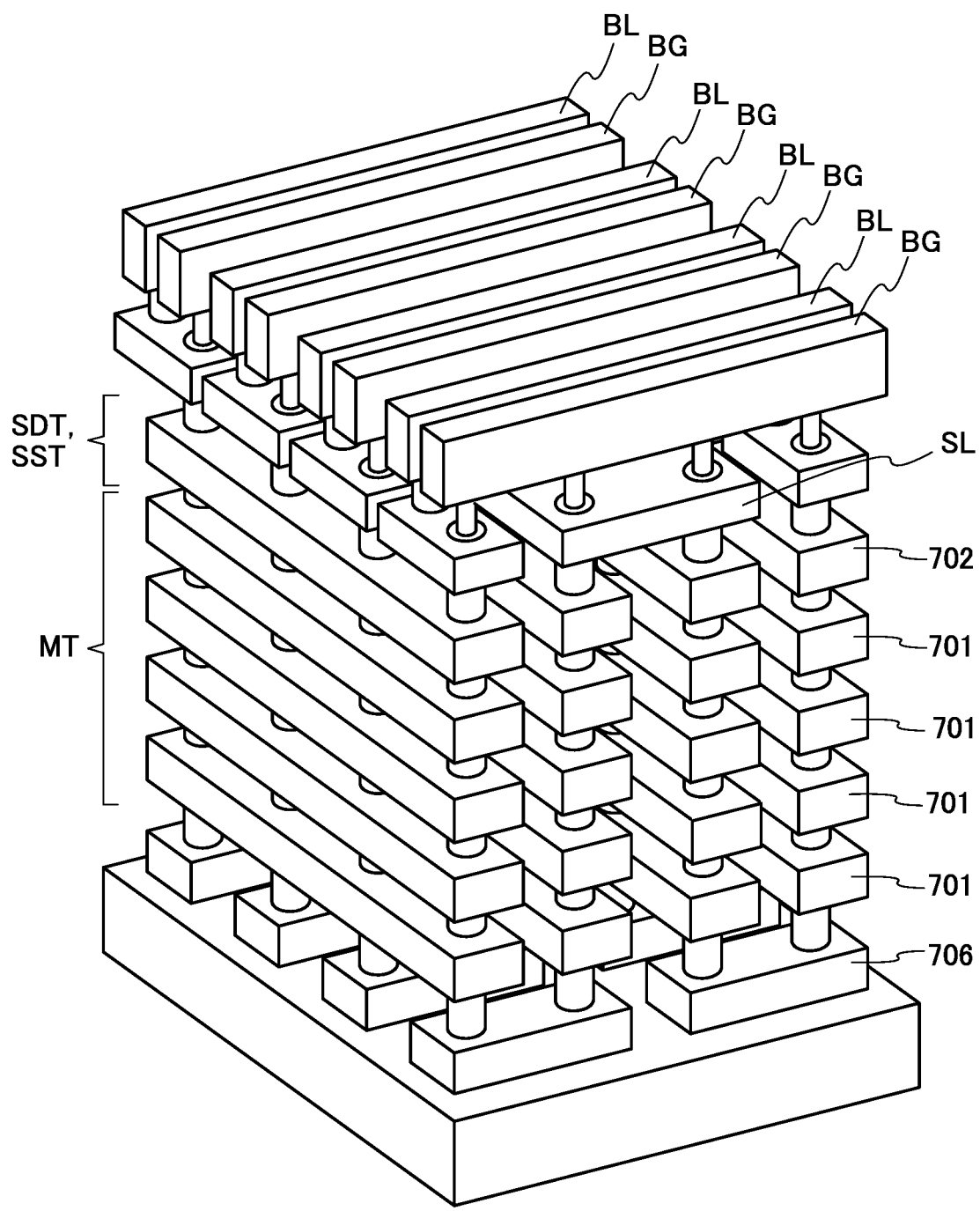
FIG. 58 is a diagram showing a three-dimensional structure example of a memory cell array of one embodiment of the present invention.
Figure 59:
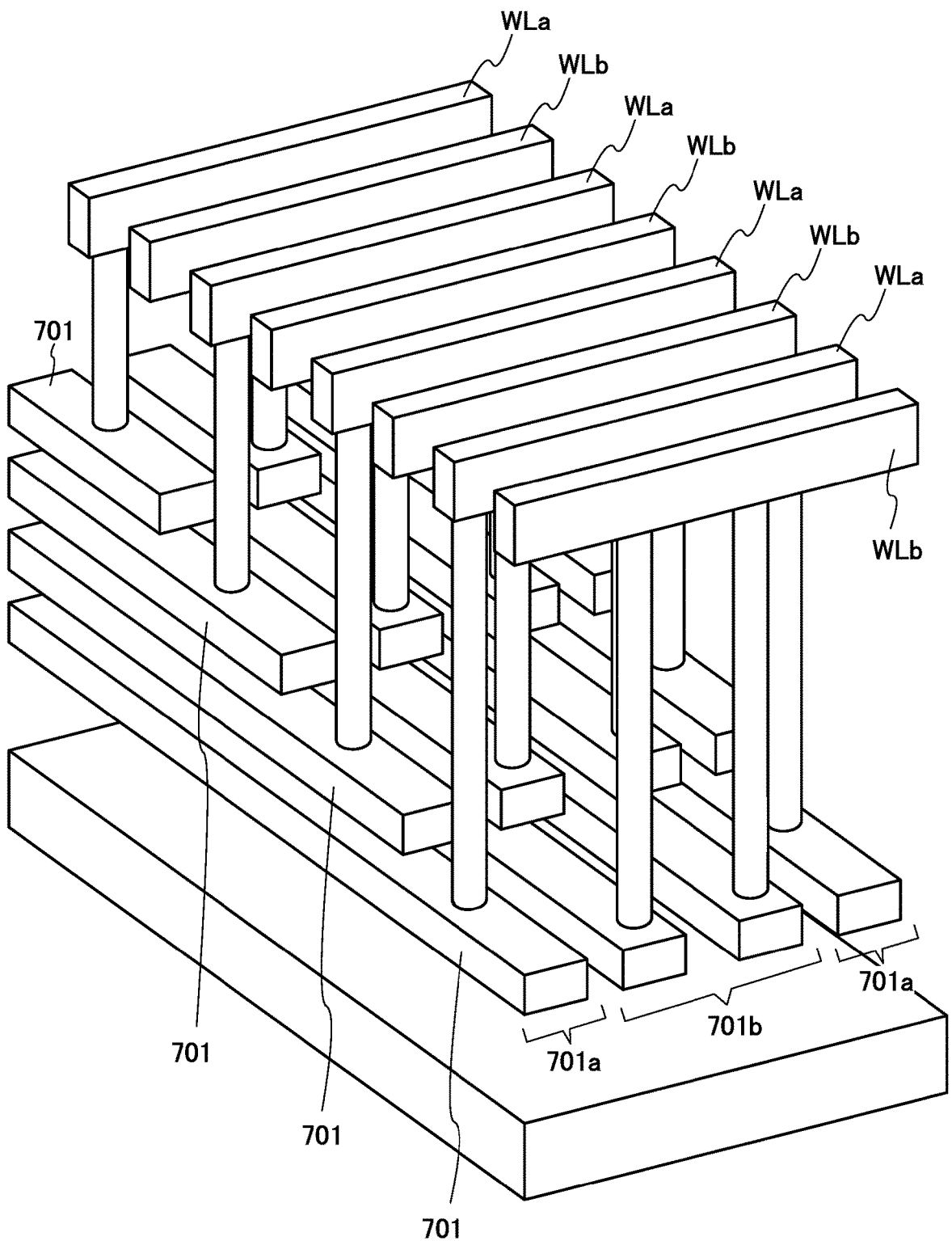
FIG. 59 is a diagram showing a three-dimensional structure example of a memory cell array of one embodiment of the present invention.

A three-dimensional stacked-layer structure example of the memory cell array 110 is shown in FIG. 57 to FIG. 59. FIG. 57 is a diagram schematically illustrating the example of the three-dimensional structure of the memory cell array 110 in the form of a circuit diagram. Some circuits (memory strings) are not shown for easy description. FIG. 58 is a perspective view showing the three-dimensional structure example of the memory cell array 110. FIG. 59 is a perspective view showing the three-dimensional structure example of the connection portion of the word lines WL and the conductors 701. As shown in FIG. 57, the memory cell array 110 is stacked over a region where the sense amplifier 123 is formed. Accordingly, the layout area of the memory device 100 can be reduced. As shown in FIG. 58 and FIG. 59, a conductor 701$a$ on the bit line BL side and a conductor 701$b$ on the source line SL side, which are the conductors 701 in the same stage, are connected to the word line WL$a$ and the word line WL$b$, respectively. The wiring BG electrically connected to the conductor 712 is provided in the same layer as the bit line BL and extends in the column direction like the bit line BL in this example; however, the present invention is not limited thereto. An insulator may be provided over the bit line BL, and the wiring BG may be provided over the insulator. The wiring BG does not necessarily extend in the column direction and may extend in the row direction. Note that FIG. 57 to FIG. 59 show an example in which eight memory transistors MT1 to MT8 are provided in one memory string 112.

Description of Circuit Operation of Memory Device

Next, operations of writing and reading out data to/from the memory string 112 are described with reference to FIG. 60A to FIG. 60C. The memory transistors MT sharing the word line WL1 to the word line WL2$k$ are collectively called a page below.

Figure 60A:
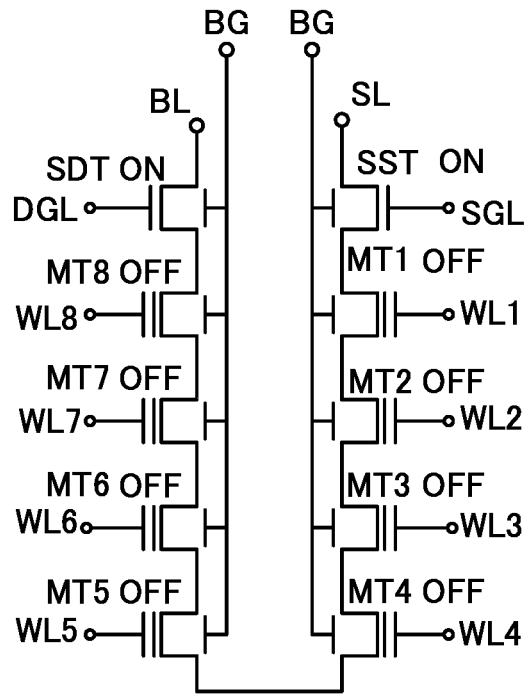
FIG. 60A to FIG. 60C are circuit diagrams for illustrating operations of a memory device of one embodiment of the present invention.
Figure 60B:
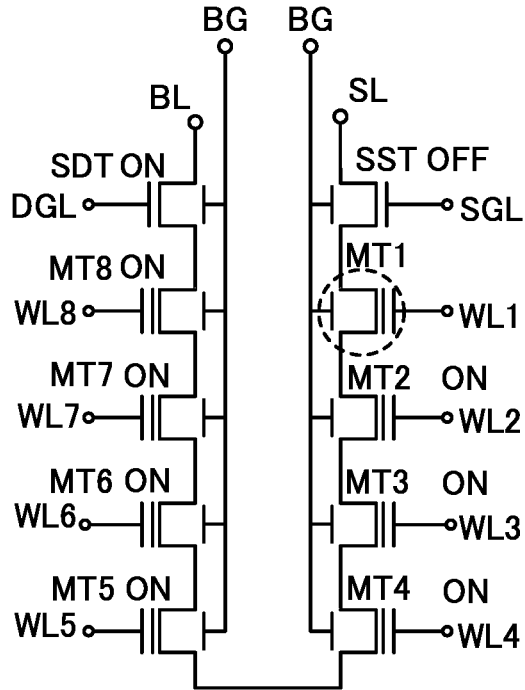
Figure 60C:
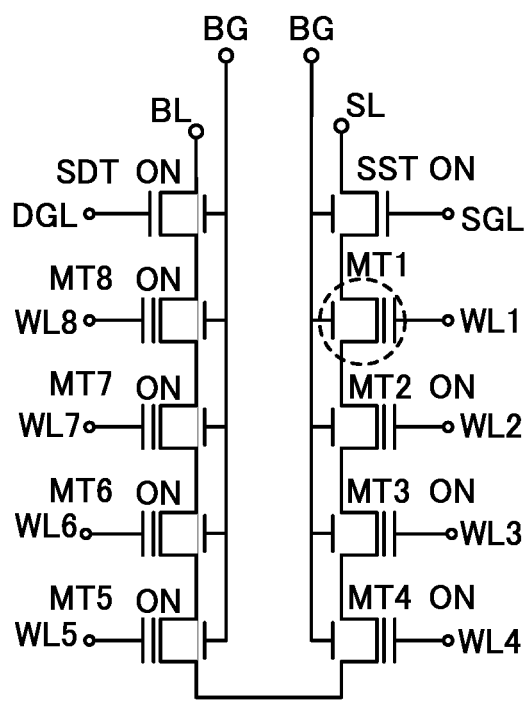

Although the memory string 112 includes the memory transistors MT1 to MT8 as an example in FIG. 60A to FIG. 60C, the number of memory transistors MT is not limited to this.

Erasing Operation

In the case where data is written to the memory transistor MT, data is preferably erased before the writing operation. The operation of erasing data is also referred to as a reset operation in some cases. An erasing operation is performed for each memory string 112 (also referred to as block). For example, an erasing operation can be performed in the following manner: a block storing data to be erased is selected, a low potential (a potential at which the memory transistors MT1 to MT8 are turned off, such as 0 V) is applied to the word lines WL1 to WL8, an erasing potential VE is applied to the source line SL and the bit line BL, and the selection transistor SDT and the selection transistor SST are turned on, as shown in FIG. 60A. Through the reset operation, electrons accumulated in the charge accumulation layer of each of the memory transistors MT1 to MT8 can be extracted. Accordingly, the memory transistors MT1 to MT8 hold data "1".

Alternatively, the erasing operation can be performed by application of an erasing potential to the wiring BG. The erasing operation can be performed in the following manner: an erasing potential, e.g., 15 V, is applied to the wiring BG, a low potential (a potential at which the memory transistors MT1 to MT8 are turned off, such as 0 V) is applied to the word line WL1 to the word line WL8, and the selection transistor SDT and the selection transistor SST are turned on.

Alternatively, data of the memory transistor MT can be erased in the following manner: the selection transistor SDT and the selection transistor SST are turned off to set an oxide including a channel formation region of the memory transistor MT in a floating state, and a positive charge (e.g., 15 V) is applied to the wiring BG as the erasing potential. At this time, the selection transistor SDT and the selection transistor SST are off, and thus the bit line BL and the source line SL are set at any potential. For example, to the word line WL1 to the word line WL8, a low potential (a potential at which the memory transistors MT1 to MT8 are turned off, such as 0 V) is applied. As a result, an oxide including a channel formation region is in a floating state; thus, the potential of the oxide increases with the increasing potential of the wiring BG, and electrons accumulated in the charge accumulation layer can be extracted to the oxide side.

In another erasing operation, to the word line WL1 to the word line WL8, a low potential (a potential at which the memory transistors MT1 to MT8 are turned off, such as 0 V) is applied, for example. Then, the selection transistor SDT and the selection transistor SST are turned on to increase the potentials of the bit line BL and the source line SL. At this time, the potentials of the bit line BL and the source line SL are set lower than that of the wiring BG. For example, the potentials of the bit line BL and the source line SL are set to 10 V and the potential of the wiring BG is set to 12 V. At this time, the memory transistor MT is turned on by the potential of the wiring BG, and the potential of an oxide included in the memory transistor MT also becomes 10 V. As a result, electrons accumulated in the charge accumulation layer can be extracted to the oxide side.

The erasing operation is not limited to the above-described method. The erasing operation may be performed by sequentially selecting the memory transistors MT with the data to be erased, for example. In that case, the erasing operation does not need to be performed on all the memory transistors MT, and only the memory transistors MT with the data that need to be erased may be selected and the data may be erased. For example, the erasing operation may be performed on only the memory transistor MT to which data "0" has been written.

Note that data in the memory transistor MT on which data rewriting is not performed is preferably stored in a different memory region in advance of the erasing operation of the block.

Writing Operation

Next, a data writing operation is described with reference to FIG. 60B.

The data writing operation can be performed for each of the above pages. First, a writing potential (e.g., 15 V) is applied to a word line of a page on which writing is performed, and then a positive potential (a potential at which a transistor is turned on, e.g., 3 V) is applied to a word line of a page on which writing is not performed. Here, as shown in FIG. 60B, a writing potential is applied to the word line WL1 first, and then positive potentials are applied to the word lines WL2 to WL8. Then, the selection transistor SST is turned off and a positive potential is applied to the selection transistor SDT to turn on the selection transistor SDT. Thus, data corresponding to the potential of the bit line BL is written to the memory transistor MT1. Specifically, when the potential of the bit line BL is a low potential (e.g., 0 V), as a potential difference from the writing potential applied to the word line WL1 increases, electrons are injected into the charge accumulation layer of the memory transistor MT1. In the case where the potentials of the selection transistor SDT and the bit line BL are both positive potentials, the selection transistor SDT is turned off. At this time, the memory transistor MT is brought into an electrically floating state, so that electrons are not injected into the charge accumulation layer of the memory transistor MT1. That is, when a low potential is applied to the bit line BL, data "0" is written to the memory transistor MT1, and when a positive potential is applied, the data in the memory transistor MT1 remains "1".

Here, data writing can be performed for each of the pages by making the potential applied to the bit line BL different between the memory strings 112.

Note that multilevel data can be written to the memory transistor MT. For example, the amount of charges injected into the charge accumulation layer of the memory transistor MT is controlled in accordance with the potential of the bit line BL or the like or a potential applying period.

Reading Operation

Then, a data reading operation is described with reference to FIG. 60C.

The data reading operation can also be performed for each of the pages. First, a low potential (e.g., 0 V) is applied to a word line of a page on which reading is performed, and then a positive potential (a potential at which a transistor is turned on, e.g., 3 V) is applied to a word line of a page on which reading is not performed. Here, as shown in FIG. 60C, a low potential is applied to the word line WL1 first, and then positive potentials are applied to the word lines WL2 to WL8. Then, the selection transistor SDT and the selection transistor SST are turned on. A reading potential (e.g., 1 V) is applied to the bit line BL, and a low potential (e.g., 0 V) is applied to the source line SL. At this time, when the data stored in the memory transistor MT is "1", current flows to the memory string 112, so that the potential of the bit line BL decreases. When the data stored in the memory transistor MT1 is "0", current does not flow to the memory string 112 and the potential of the bit line BL does not change. The sense amplifier 123 detects the potential of the bit line BL and amplifies it. Through the above steps, data in the memory string 112 can be read.

At this time, a positive potential may be applied to the wiring BG to shift the threshold voltage (Vth) of the memory transistor MT in the negative direction. The potential applied to the wiring BG is adjusted so that the memory transistor MT on which writing is not performed becomes normally on. Thus, wrong reading can be prevented. In addition, the potential applied to the word line WL can be reduced, and power consumption of the memory device can be reduced, which is preferable.

Data in each of the memory strings 112 is read to the bit line BL; thus, data per page can be read.

The structure described in this embodiment can be used in an appropriate combination with the structures described in the other embodiments.

Embodiment 2

In this embodiment, application examples of the memory device including the semiconductor device described in the above embodiment are described. The semiconductor device described in the above embodiment can be applied to, for example, memory devices of a variety of electronic devices (e.g., information terminals, computers, smartphones, e-book readers, digital cameras (including video cameras), video recording/reproducing devices, and navigation systems). Here, the computers refer not only to tablet computers, notebook computers, and desk-top computers, but also to large computers such as server systems. Alternatively, the semiconductor device described in the above embodiment is applied to a variety of removable memory devices such as memory cards (e.g., SD cards), USB memories, and SSDs (solid state drives). FIG. 61A to FIG. 61E schematically show some structure examples of removable memory devices. A packaged memory chip including the semiconductor device described in the above embodiment is used in a variety of storage devices and removable memories, for example.

FIG. 61A is a schematic view of a USB memory. A USB memory 1100 includes a housing 1101, a cap 1102, a USB connector 1103, and a substrate 1104. The substrate 1104 is stored in the housing 1101. The substrate 1104 is provided with a memory chip 1105 and a controller chip 1106, for example. The semiconductor device described in the above embodiment can be incorporated in the memory chip 1105 or the like on the substrate 1104.

FIG. 61B is a schematic external view of an SD card, and FIG. 61C is a schematic view of the internal structure of the SD card. An SD card 1110 includes a housing 1111, a connector 1112, and a substrate 1113. The substrate 1113 is stored in the housing 1111. The substrate 1113 is provided with a memory chip 1114 and a controller chip 1115, for example. When the memory chip 1114 is also provided on a back side of the substrate 1113, the capacity of the SD card 1110 can be increased. A wireless chip with a radio communication function may be provided on the substrate 1113. With this, data can be read from and written in the memory chip 1114 by radio communication between a host device and the SD card 1110. The semiconductor device described in the above embodiment can be incorporated in the memory chip 1114 or the like on the substrate 1113.

FIG. 61D is a schematic external view of an SSD, and FIG. 61E is a schematic view of the internal structure of the SSD. An SSD 1150 includes a housing 1151, a connector 1152, and a substrate 1153. The substrate 1153 is stored in the housing 1151. The substrate 1153 is provided with a memory chip 1154, a memory chip 1155, and a controller chip 1156, for example. The memory chip 1155 is a work memory of the controller chip 1156, and a DRAM chip is used, for example. When the memory chip 1154 is also provided on a back side of the substrate 1153, the capacity of the SSD 1150 can be increased. The semiconductor device described in the above embodiment can be incorporated in the memory chip 1154 or the like on the substrate 1153.

The structure described in this embodiment can be used in an appropriate combination with the structures described in the other embodiments.

Embodiment 3

In this embodiment, an AI system in which the semiconductor device described in the above embodiments is used is described with reference to FIG. 62.

Figure 62:
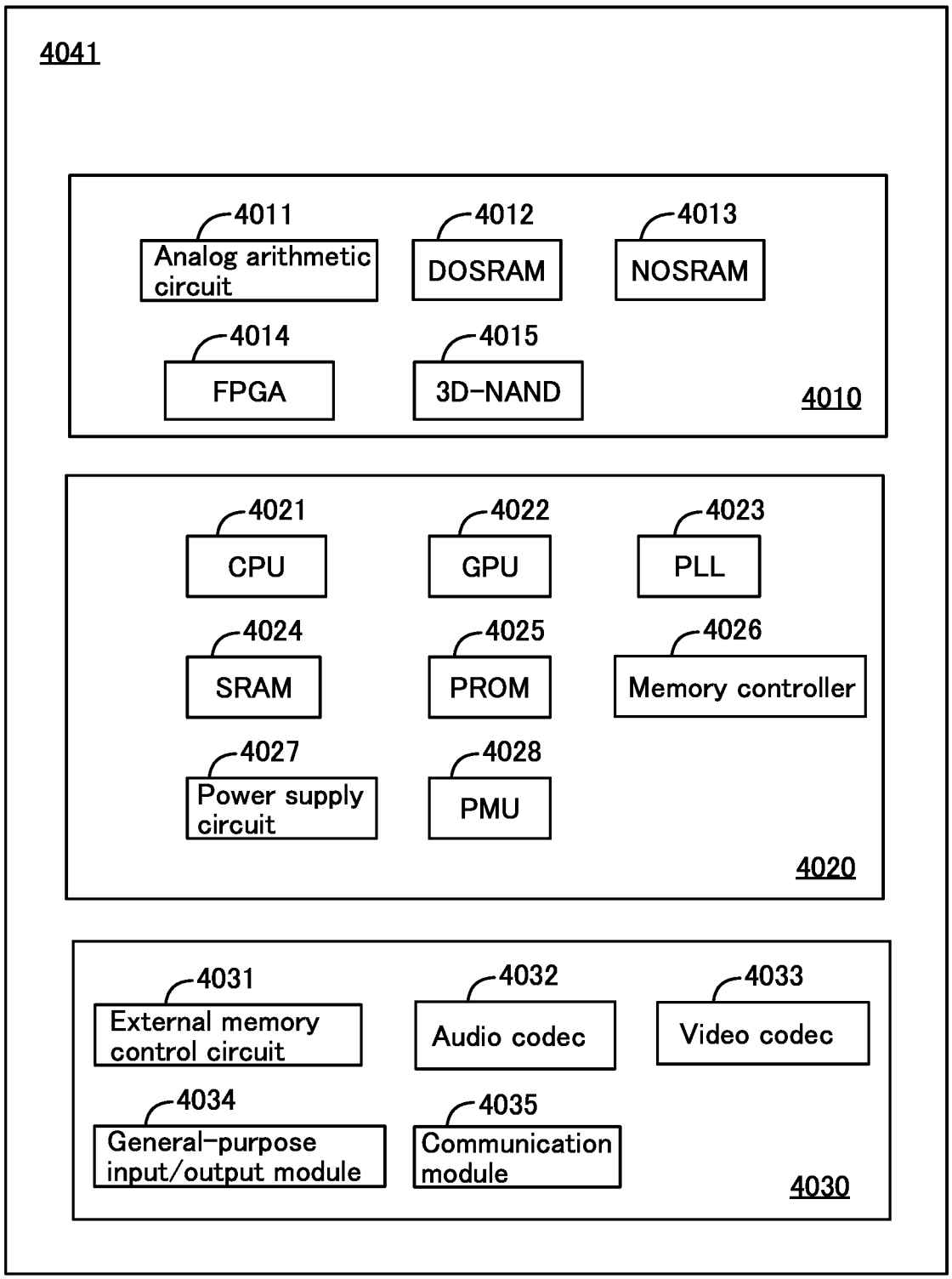
FIG. 62 is a block diagram showing a configuration example of an AI system of one embodiment of the present invention.

FIG. 62 is a block diagram showing a structure example of an AI system 4041. The AI system 4041 includes an arithmetic portion 4010, a control portion 4020, and an input/output portion 4030.

The arithmetic portion 4010 includes an analog arithmetic circuit 4011, a DOSRAM 4012, a NOSRAM 4013, an FPGA 4014, and a 3D-NAND 4015.

Here, DOSRAM (registered trademark) is an abbreviation of "Dynamic Oxide Semiconductor RAM", which indicates a RAM including a 1T (transistor) and 1C (capacitor) memory cell.

NOSRAM (registered trademark) is an abbreviation of "Nonvolatile Oxide Semiconductor RAM", which indicates a RAM including a gain cell (2T or 3T) memory cell. The DOSRAM and NOSRAM are memories utilizing a low off-state current of a transistor including an oxide in a semiconductor (hereinafter, referred to as an OS transistor). Note that hereinafter, a memory device including an OS transistor, such as the NOSRAM, is referred to as an OS memory in some cases.

The control portion 4020 includes a CPU (Central Processing Unit) 4021, a GPU (Graphics Processing Unit) 4022, a PLL (Phase Locked Loop) 4023, an SRAM (Static Random Access Memory) 4024, a PROM (Programmable Read Only Memory) 4025, a memory controller 4026, a power supply circuit 4027, and a PMU (Power Management Unit) 4028.

The input/output portion 4030 includes an external memory control circuit 4031, an audio codec 4032, a video codec 4033, a general-purpose input/output module 4034, and a communication module 4035.

The arithmetic portion 4010 can perform learning or inference by a neural network.

The analog arithmetic circuit 4011 includes an A/D (analog/digital) converter circuit, a D/A (digital/analog) converter circuit, and a product-sum operation circuit.

The analog arithmetic circuit 4011 is preferably formed using an OS transistor. The analog arithmetic circuit 4011 formed using an OS transistor includes an analog memory and can execute a product-sum operation necessary for the learning and the inference with low power consumption.

The DOSRAM 4012 is a DRAM formed using an OS transistor, and the DOSRAM 4012 is a memory that temporarily stores digital data sent from the CPU 4021. The DOSRAM 4012 includes a memory cell including an OS transistor and a read circuit portion including a Si transistor. Because the memory cell and the read circuit portion can be provided in different layers that are stacked, the entire circuit area of the DOSRAM 4012 can be small.

In the calculation with the neural network, more than 1000 data are input in some cases. In the case where the input data are stored in the SRAM, the input data has to be subdivided and stored because of the circuit area limitation and small storage capacity of the SRAM. The DOSRAM 4012 has a larger storage capacity than the SRAM because memory cells can be highly integrated even in a limited circuit area. Therefore, the DOSRAM 4012 can efficiently store the input data.

The NOSRAM 4013 is a nonvolatile memory including an OS transistor. The NOSRAM 4013 consumes less power in writing data than the other nonvolatile memories such as a flash memory, a ReRAM (Resistive Random Access Memory), and an MRAM (Magnetoresistive Random Access Memory). Furthermore, unlike in a flash memory and a ReRAM, elements do not deteriorate when data is written, and there is no limitation on the number of times of data writing.

Furthermore, the NOSRAM 4013 can store multilevel data of two or more bits as well as one-bit binary data. The multilevel data storage in the NOSRAM 4013 leads to a reduction of the memory cell area per bit.

Furthermore, the NOSRAM 4013 can store analog data as well as digital data. Thus, the analog arithmetic circuit 4011 can use the NOSRAM 4013 as an analog memory. The NOSRAM 4013 can store analog data as it is, and thus a D/A converter circuit and an A/D converter circuit are unnecessary. Therefore, the area of a peripheral circuit for the NOSRAM 4013 can be reduced. In this specification, analog data refers to data having a resolution of three bits (eight levels) or more. The above-described multilevel data might be included in the analog data.

Data and parameters used in the neural network calculation can be once stored in the NOSRAM 4013. Although the data and parameters may be stored in a memory provided outside the AI system 4041 via the CPU 4021, the NOSRAM 4013 provided inside the AI system 4041 can store the data and parameters more quickly with lower power consumption. Furthermore, the NOSRAM 4013 enables a longer bit line than the DOSRAM 4012 and thus can have an increased storage capacity.

The FPGA 4014 is an FPGA including an OS transistor. By including the FPGA 4014, the AI system 4041 can establish a connection of a neural network such as a deep neural network (DNN), a convolutional neural network (CNN), a recurrent neural network (RNN), an autoencoder, a deep Boltzmann machine (DBM), a deep belief network (DBN), or the like described later, with hardware. The connection of the neural network with hardware enables higher speed performance.

The FPGA 4014 is an FPGA including an OS transistor (OS-FPGA). An OS-FPGA can have a smaller memory area than an FPGA formed of an SRAM. Thus, adding a context switching function only causes a small increase in area. Moreover, an OS-FPGA can transmit data and parameters at high speed by boosting.

The 3D-NAND 4015 is a nonvolatile memory including an oxide semiconductor. The 3D-NAND 4015 is a highly integrated memory in which the storage capacity per unit area is large.

The 3D-NAND 4015 can store multilevel data of two or more bits as well as one-bit binary data. The multilevel data storage in the 3D-NAND 4015 can further reduce the memory cell area per bit.

As the 3D-NAND 4015, for example, the semiconductor device described in the above embodiment can be used. This can reduce the area occupied by the memory cell, and accordingly the 3D-NAND 4015 can be more highly integrated. Thus, the storage capacity per unit area of the 3D-NAND 4015 can be increased.

In the AI system 4041, the analog arithmetic circuit 4011, the DOSRAM 4012, the NOSRAM 4013, and the FPGA 4014 can be provided on one die (chip). Thus, the AI system 4041 can execute neural network calculation at high speed with low power consumption. The analog arithmetic circuit 4011, the DOSRAM 4012, the NOSRAM 4013, and the FPGA 4014 can be manufactured through the same manufacturing process. This enables the AI system 4041 to be manufactured at low cost.

Note that the arithmetic portion 4010 does not need to include all of the following: the DOSRAM 4012, the NOSRAM 4013, and the FPGA 4014. One or more memories are selected from the DOSRAM 4012, the NOSRAM 4013, and the FPGA 4014 in accordance with a problem that is desired to be solved in the AI system 4041.

The AI system 4041 can execute a method such as a deep neural network (DNN), a convolutional neural network (CNN), a recurrent neural network (RNN), an autoencoder, a deep Boltzmann machine (DBM), or a deep belief network (DBN) in accordance with the problem that is desired to be solved. The PROM 4025 can store a program for executing at least one of these methods. Furthermore, part or the whole of the program may be stored in the NOSRAM 4013 or the 3D-NAND 4015. The 3D-NAND 4015, which is a highly integrated memory in which the storage capacity per unit area is large, can store a high-capacity program.

Most of the existing programs that exist as libraries are premised on processing with a GPU. Therefore, the AI system 4041 preferably includes the GPU 4022. The AI system 4041 can execute the bottleneck product-sum operation among all the product-sum operations used for learning and inference in the arithmetic portion 4010, and execute the other product-sum operations in the GPU 4022. In this manner, the learning and inference can be performed at high speed.

The power supply circuit 4027 generates not only a low power supply potential for a logic circuit but also a potential for an analog operation. The power supply circuit 4027 may include an OS memory. Storing a reference potential in the OS memory can reduce the power consumption of the power supply circuit 4027.

The PMU 4028 has a function of temporarily stopping the power supply to the AI system 4041.

As a register in each of the CPU 4021 and the GPU 4022, an OS memory is preferably included. By including the OS memory, each of the CPU 4021 and the GPU 4022 can retain data (logic value) in the OS memory even when power supply is stopped. As a result, the AI system 4041 can save the electric power.

The PLL 4023 has a function of generating a clock. The AI system 4041 performs an operation on the basis of the clock generated by the PLL 4023. The PLL 4023 preferably includes an OS memory. When an OS memory is included in the PLL 4023, an analog potential with which the clock oscillation cycle is controlled can be held.

The AI system 4041 may store data in an external memory such as a DRAM. For this reason, the AI system 4041 preferably includes the memory controller 4026 functioning as an interface with the external DRAM. Furthermore, the memory controller 4026 is preferably provided near the CPU 4021 or the GPU 4022. Thus, data transmission can be performed at high speed.

Some or all of the circuits shown in the control portion 4020 can be formed on the same die as the arithmetic portion 4010. Thus, the AI system 4041 can execute neural network calculation at high speed with low power consumption.

Data used for neural network calculation is stored in an external memory device (an HDD (Hard Disk Drive), an SSD (Solid State Drive), or the like) in many cases. Therefore, the AI system 4041 preferably includes the external memory control circuit 4031 functioning as an interface with the external memory device.

Because the neural network often deal with audio and video for learning and inference, the AI system 4041 includes the audio codec 4032 and the video codec 4033. The audio codec 4032 encodes and decodes audio data, and the video codec 4033 encodes and decodes video data.

The AI system 4041 can perform learning or make an inference using data obtained from an external sensor. For this reason, the AI system 4041 includes the general-purpose input/output module 4034. The general-purpose input/output module 4034 includes a USB (Universal Serial Bus), an I2C (Inter-Integrated Circuit), or the like, for example.

The AI system 4041 can perform learning or make an inference using data obtained via the Internet. For this reason, the AI system 4041 preferably includes the communication module 4035.

The analog arithmetic circuit 4011 may include a multilevel flash memory as an analog memory. However, the flash memory has a limit on the number of times of rewriting. In addition, it is extremely difficult to embed the multilevel flash memory (to form the arithmetic circuit and the memory on the same die).

Alternatively, the analog arithmetic circuit 4011 may include a ReRAM as an analog memory. However, the ReRAM has a limit on the number of times of rewriting and also has a problem in storage accuracy. Moreover, the ReRAM is a two-terminal element, and thus has a complicated circuit design for separating data writing and data reading.

Further alternatively, the analog arithmetic circuit 4011 may include an MRAM as an analog memory. However, the MRAM has a problem in storage accuracy because of its low magnetoresistive ratio.

In consideration of the above, an OS memory is preferably used as an analog memory in the analog arithmetic circuit 4011.

The structure described in this embodiment can be used in an appropriate combination with the structures described in the other embodiments.

Embodiment 4

Application Examples of AI System

In this embodiment, application examples of the AI system described in the above embodiment are described with reference to FIG. 63A and FIG. 63B.

Figure 63A:
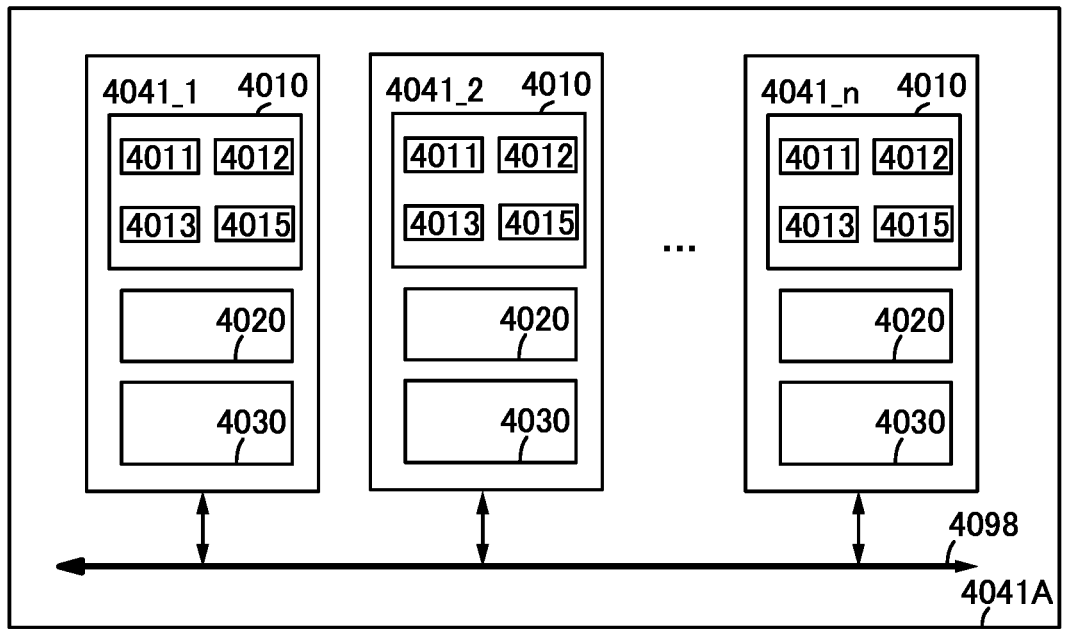
FIG. 63A and FIG. 63B are block diagrams illustrating application examples of an AI system of one embodiment of the present invention.

FIG. 63A is an AI system 4041A in which the AI systems 4041 illustrated in FIG. 62 are arranged in parallel and a signal can be transmitted between the systems via a bus line.

The AI system 4041A shown in FIG. 63A includes a plurality of AI systems 4041_1 to 4041_n (n is a natural number). The AI system 4041_1 to the AI system 4041_n are connected to each other via a bus line 4098.

Figure 63B:
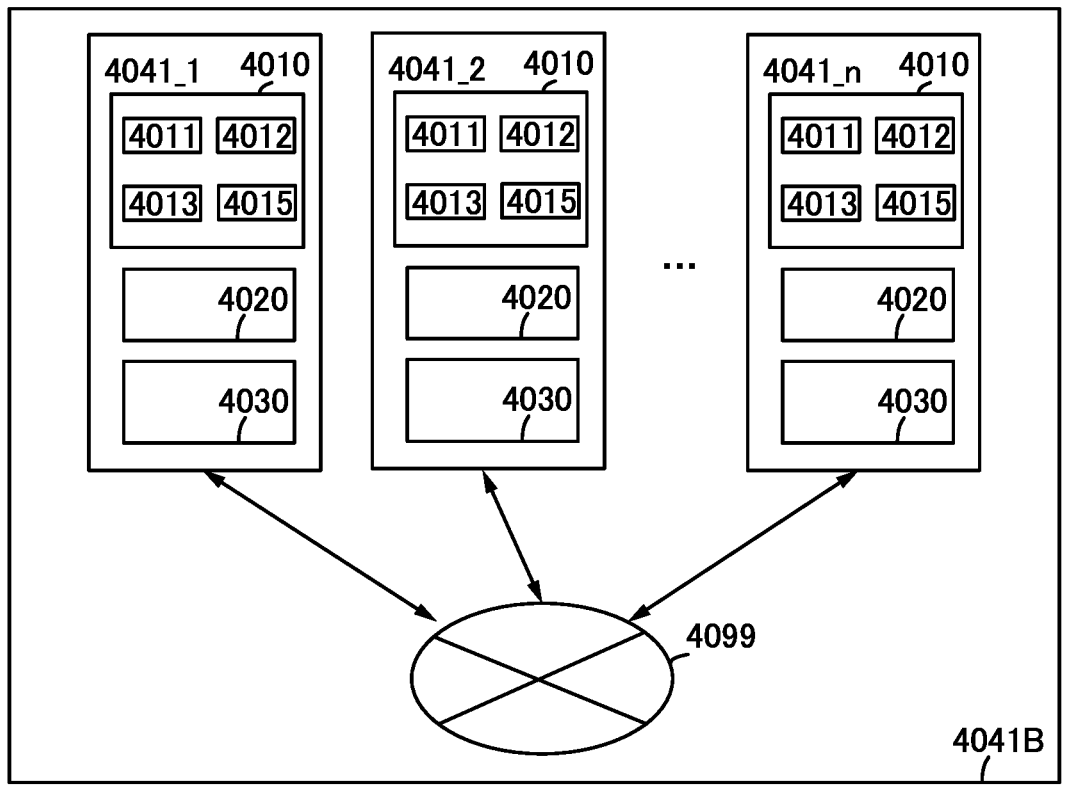

FIG. 63B is an AI system 4041B in which the AI systems 4041 illustrated in FIG. 62 are arranged in parallel as in FIG. 63A and a signal can be transmitted between the systems via a network.

The AI system 4041B shown in FIG. 63B includes the plurality of AI systems 4041_1 to 4041_n. The AI system 4041_1 to the AI system 4041_n are connected to each other via a network 4099.

A structure may be employed in which a communication module is provided in each of the AI system 4041_1 to the AI system 4041_n so that the network 4099 can perform wireless or wired communication. The communication module can perform communication via an antenna. For example, the communication can be performed in such a manner that each electronic device is connected to a computer network such as the Internet, which is the infrastructure of the World Wide Web (WWW), an intranet, an extranet, a PAN (Personal Area Network), a LAN (Local Area Network), a CAN (Campus Area Network), a MAN (Metropolitan Area Network), a WAN (Wide Area Network), or a GAN (Global Area Network). In the case of performing wireless communication, it is possible to use, as a communication protocol or a communication technology, a communications standard such as LTE (Long Term Evolution), GSM (Global System for Mobile Communication: registered trademark), EDGE (Enhanced Data Rates for GSM Evolution), CDMA 2000 (Code Division Multiple Access 2000), or W-CDMA (registered trademark), or a specification that is communication standardized by IEEE such as Wi-Fi (registered trademark), Bluetooth (registered trademark), or ZigBee (registered trademark).

With the structure in FIG. 63A and FIG. 63B, analog signals obtained with external sensors or the like can be processed by different AI systems. For example, analog signals containing biological information such as brain waves, a pulse, blood pressure, and body temperature obtained with a variety of sensors such as a brain wave sensor, a pulse wave sensor, a blood pressure sensor, and a temperature sensor can be processed by different AI systems. When the signal processing or learning is performed by different AI systems, the amount of information processed by each AI system can be reduced. Accordingly, the signal processing or learning can be performed with a smaller amount of arithmetic processing. As a result, recognition accuracy can be increased. The information obtained with each AI system is expected to enable instant and unified understanding of biological information that changes in a complex way.

The structure described in this embodiment can be used in an appropriate combination with the structures described in the other embodiments.

Embodiment 5

In this embodiment, an example of an IC into which the AI system described in the above embodiment is incorporated will be described.

In the AI system described in the above embodiment, a digital processing circuit such as a CPU that includes a Si transistor, an analog arithmetic circuit that includes an OS transistor, a 3D-NAND, an OS-FPGA, and an OS memory such as a DOSRAM or a NOSRAM can be integrated into one die.

Figure 64:
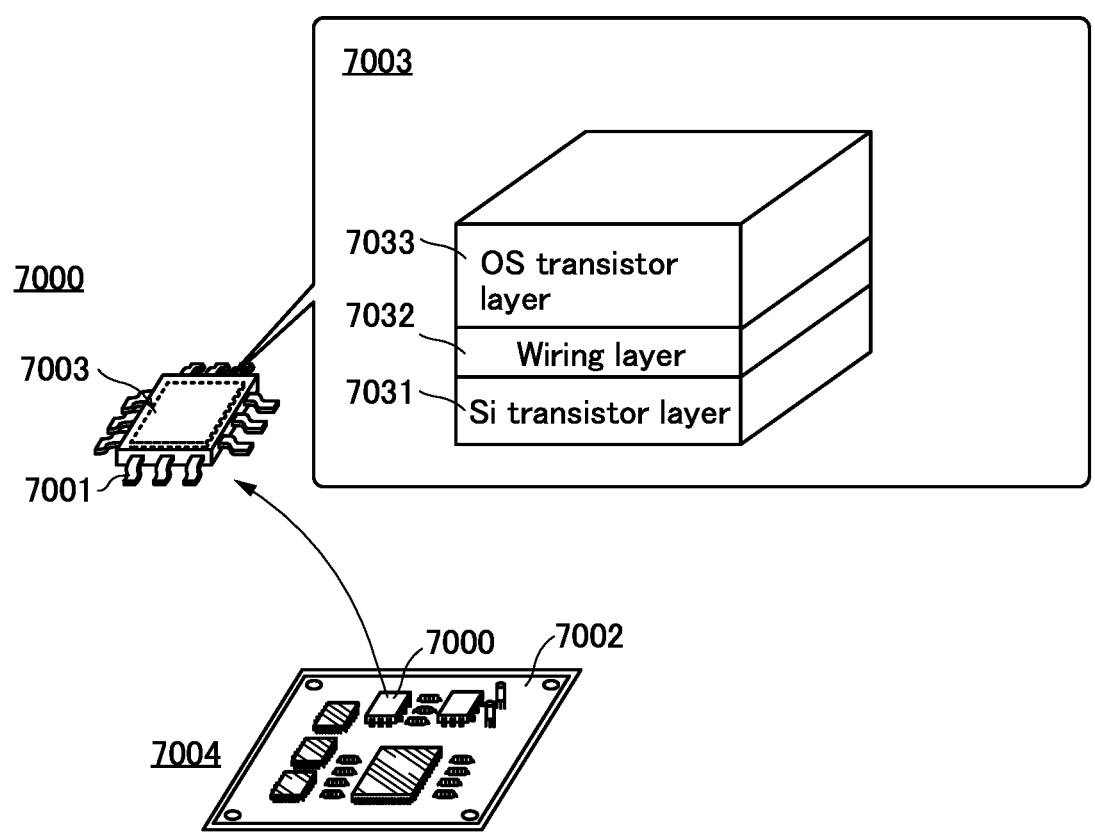
FIG. 64 is a schematic perspective view showing a structure example of an IC into which an AI system of one embodiment of the present invention is incorporated.

FIG. 64 shows the example of the IC into which the AI system is incorporated. An AI system IC 7000 shown in FIG. 64 includes a lead 7001 and a circuit portion 7003. The AI system IC 7000 is mounted on a printed circuit board 7002, for example. A plurality of such IC chips are combined and electrically connected to each other on the printed circuit board 7002; thus, a board on which electronic components are mounted (a circuit board 7004) is completed. In the circuit portion 7003, the circuits described in the above embodiment are provided on one die. The circuit portion 7003 has a stacked-layer structure as described in the above embodiment, and is broadly divided into a Si transistor layer 7031, a wiring layer 7032, and an OS transistor layer 7033.

Since the OS transistor layer 7033 can be stacked over the Si transistor layer 7031, the size of the AI system IC 7000 can be easily reduced.

Although a QFP (Quad Flat Package) is used as a package of the AI system IC 7000 in FIG. 64, the embodiment of the package is not limited thereto.

The digital processing circuit such as a CPU, the analog arithmetic circuit that includes an OS transistor, the 3D-NAND, the OS-FPGA, and the OS memory such as a DOSRAM or a NOSRAM can all be formed in the Si transistor layer 7031, the wiring layer 7032, and the OS transistor layer 7033. In other words, elements included in the AI system can be formed through the same manufacturing process. Thus, the number of steps in the manufacturing process of the IC described in this embodiment does not need to be increased even when the number of elements is increased, and accordingly the AI system can be incorporated into the IC at low cost.

The structure described in this embodiment can be used in an appropriate combination with the structures described in the other embodiments.

Embodiment 6

Electronic Device

The semiconductor device according to one embodiment of the present invention can be used for a variety of electronic devices. FIG. 65A to FIG. 66F show specific examples of electronic devices including the semiconductor device according to one embodiment of the present invention.

Figure 65A:
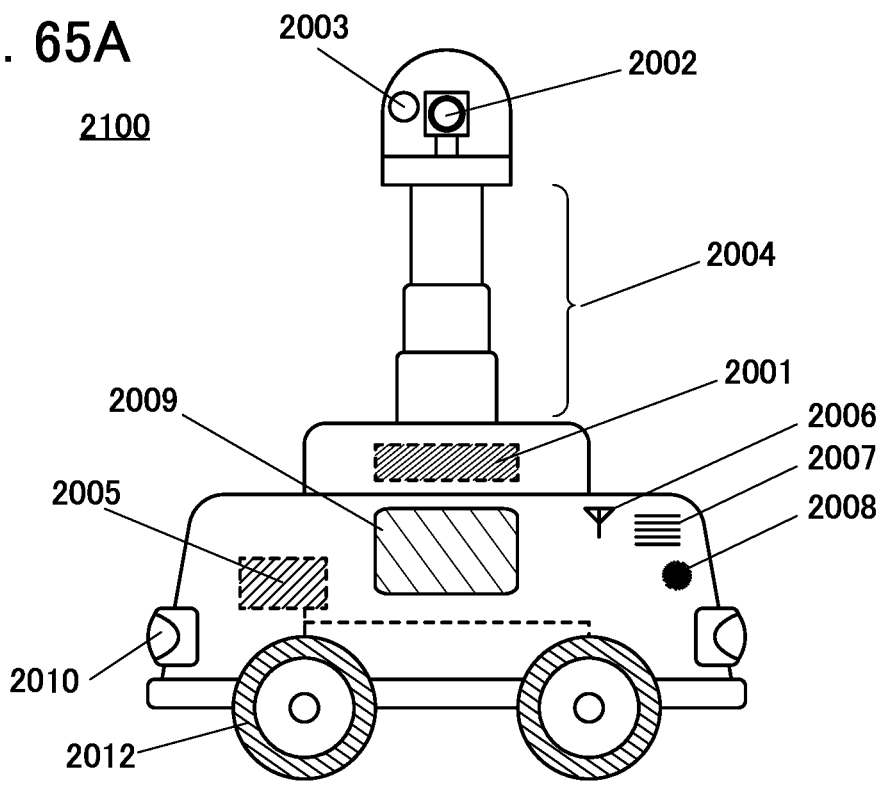
FIG. 65A is a diagram showing an electronic device of one embodiment of the present invention.

A robot 2100 shown in FIG. 65A includes an arithmetic device 2001, a sensor 2002, a light 2003, a lift 2004, a driver portion 2005, and a moving mechanism 2012, and can take a still image and a moving image while being moved. Such a robot can be used for a security system or a monitoring system.

The robot 2100 may further include a communication means 2006, a speaker 2007, a microphone 2008, a display portion 2009, a light-emitting portion 2010, and the like.

For the arithmetic device 2001, the semiconductor device according to one embodiment of the present invention can be used. In the arithmetic device 2001, an IC in which the AI system according to one embodiment of the present invention is incorporated can be used. The sensor 2002 has a function of a camera which takes images of surroundings of the robot 2100. The light 2003 can be used as a light when the images of the surroundings of the robot 2100 are taken by the sensor 2002. When a still image is taken by the sensor 2002, the light 2003 preferably functions as a flashlight. The sensor 2002 is connected to a main body of the robot via the lift 2004. The height of the sensor 2002 can be adjusted by the lift 2004. The lift 2004 is preferably telescopic. Alternatively, the lift 2004 may be a foldable lift composed of a plurality of booms. The robot 2100 is provided with the driver portion 2005 and the moving mechanism 2011 connected to the driver portion 2005 and thus an imaging range of the sensor 2002, that is, a monitoring range, is expanded, which is preferred.

The communication means 2006 can send information whose image is taken by the sensor 2002 to a manager or the server owned by the manager. When the arithmetic device 2001 analyzes the information whose image is taken by the sensor 2002 and judges that there is an emergency such as such as a crime, an accident, or a fire, the communication means 2006 can report to a security company, the police, fire fighting, a medical institution, or the owner of the land or the building. The speaker 2007 can transmit information such as an alert to a criminal, a call to an injured person or an emergency patient, and evacuation guidance, to the surroundings of the robot 2100. The microphone 2008 can be used to obtain sounds around the robot 2100. When used together with the communication means 2006 and the speaker 2007, the robot 2100 can have a function of a telephone. A person around the robot 2100 can have a conversation with the manager or a given person. The display portion 2009 can display given information. In emergency, the disaster information and the evacuation route can be displayed. When used together with the communication means 2006, the speaker 2007, and the microphone 2008, the robot 2100 can have a function of a videophone. A person around the robot 2100 can have a conversation with the manager or a given person while seeing the display portion 2009.

The light-emitting portion 2010 can show the direction of movement and the stopped state of the robot 2100 with characters or light. In addition, emergency may also be shown.

Figure 65B:
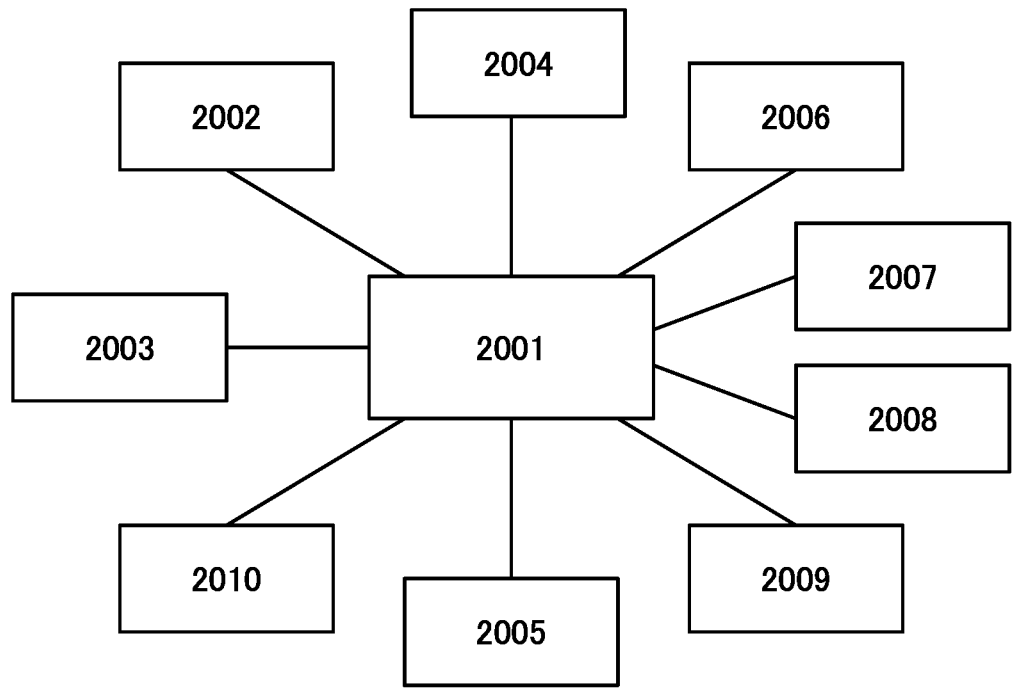
FIG. 65B is a block diagram showing a configuration example of the electronic device of one embodiment of the present invention.

FIG. 65B is a block diagram showing a configuration of the robot 2100. The arithmetic device 2001 adjusts turning on or off and the brightness of the light 2003 from information such as an image obtained by the sensor 2002. In addition, the height of the lift 2004 is adjusted or the driver portion 2005 is controlled to align the positions of the robot 2100 and the sensor 2002. The operating condition of the driver portion 2005 can be shown by using the light-emitting portion 2010. With the communication means 2006, information around the robot 2100 obtained from the sensor 2002 and the microphone 2008 can be transmitted to the manager or the server owned by the manager. Depending on the judgement of the arithmetic device 2001 or the manager, information can be sent to the surroundings of the robot 2100 with the speaker 2007 and the display portion 2009.

In the case where a sensor that can take an image even in dark surroundings is used as the sensor 2002, the light 2003 is not necessarily provided. As such a sensor, an image sensor including selenium (Se) in the light receiving portion can be used.

The robot 2100 as described above can be used in commercial facilities and for security of offices. Information obtained from the sensor 2002 and the microphone 2008 is stored in the arithmetic device 2001 or the server. The stored information is analyzed by the AI system to confirm whether there is an abnormality such as a loss or a damage of an object, entry of a suspicious individual, or a disaster such as a fire. For the information analysis, deep learning may be used. When the occurrence of an abnormality is confirmed, the robot 2100 performs report to the manager and transmits information to the surroundings, and records the conditions of the surroundings.

The robot 2100 may be used to monitor the growing conditions of crops. The robot 2100 placed in a rice field or a field monitors the shapes, the sizes, or the colors of leaves or fruit with the sensor 2002 to check whether the crops are damaged by disease or not or whether the crops are harmed by pests or not. Since the moving mechanism 2012 is provided for the robot 2100, the growing conditions of the crops can be monitored in a wide range. Since the robot 2100 is provided with the lift 2004, the leaves and fruit at any height can be monitored regardless of the kind of crops and the growing conditions. The monitoring results are sent to a producer using the communication means 2006, and the producer can determine the kind, the amount, and the spraying timing of fertilizer and agricultural chemicals necessary for the crops. The monitoring results may be analyzed with the AI system using the arithmetic device 2001, and the kind, the amount, and the spraying timing of fertilizer and agricultural chemicals necessary for the crops may be determined and reported to the producer. Deep learning may be used for analysis of the monitoring results.

Figure 66A:
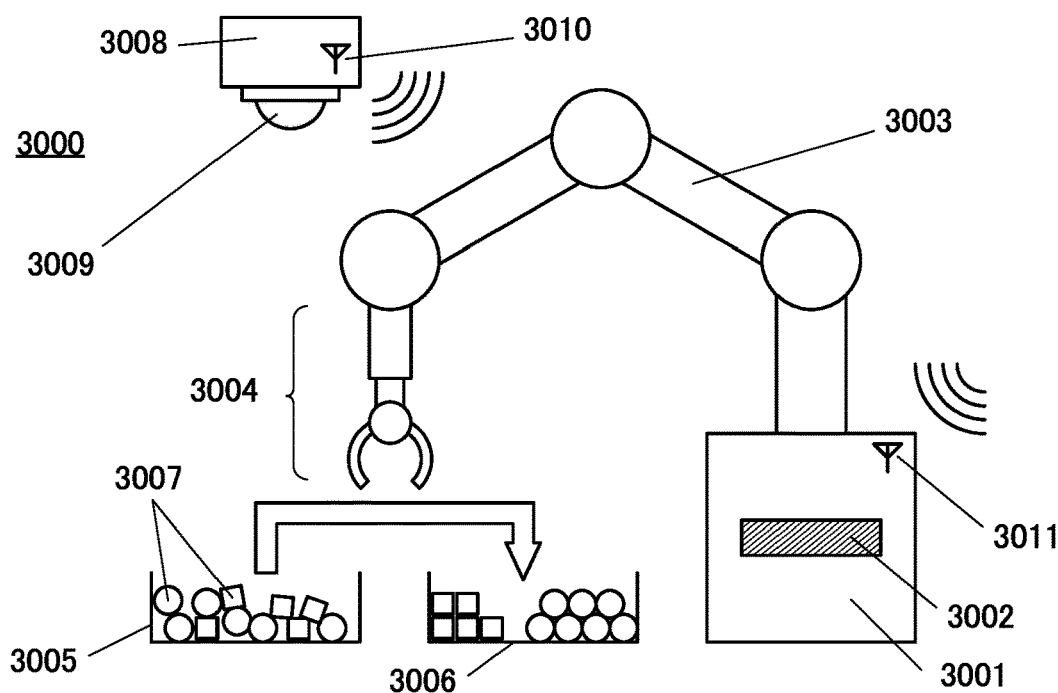
FIG. 66A to FIG. 66F are diagrams showing an electronic device of one embodiment of the present invention.

FIG. 66A shows a sorting system 3000 including a robot 3001. The robot 3001 includes an arithmetic device 3002, a boom 3003, and an arm 3004. The robot 3001 may further include a wired or wireless communication means 3011. In addition, the sorting system 3000 includes a housing 3008 including a sensor 3009. The housing 3008 includes a communication means 3010. The housing 3008 is provided for the sorting system 3000 or a ceiling, a wall, or a beam (not shown) of a sorting operation area. The housing 3008 may be provided in the robot 3001. For example, the housing 3008 may be provided for the boom 3003 or the arm 3004. In the case where the housing 3008 is provided in the robot 3001, information obtained by the sensor 3009 may be sent to the arithmetic device 3002 without passing through the communication means 3010 and the communication means 3011, and processed.

The boom 3003 is movable, whereby the arm 3004 can be placed at a desired position. The arm 3004 may be telescopic. The arm 3004 placed over a desired object 3007 may be stretched to grab the desired object 3007, shortened, and then moved by the boom 3003.

The sorting system 3000 can transfer the object 3007 in a receptacle 3005 to a receptacle 3006. The receptacle 3005 and the receptacle 3006 may have the same shape or different shapes. Furthermore, a plurality of objects 3007 put in one receptacle 3005 may be moved separately to a plurality of receptacles 3006.

As the receptacle 3005 and the receptacle 3006, a container, a cardboard box, a box for packing a product, a case, a film, a bag, a tray for storing foods, a lunch box, or the like is used. At least one of the receptacle 3005 and the receptacle 3006 may be cooking utensils such as a pot or a frying pan.

For the arithmetic device 3002, the semiconductor device according to one embodiment of the present invention can be used. In the arithmetic device 3002, an IC in which the AI system according to one embodiment of the present invention is incorporated can be used.

The sensor 3009 reads out the position and the number of the receptacle 3005, the position and the number of the receptacle 3006, the state of the inside of the receptacle 3005, and the state of the object 3007 in the receptacle 3005 and transmits the information to the arithmetic device 3002 using the communication means 3010. The information is transmitted with or without a wire. The information may be transmitted through a wire without the communication means 3010. The arithmetic device 3002 analyzes the transmitted information. Here, the state of the object 3007 indicates the shape or the number of the objects 3007, the overlap between the objects 3007, or the like. The arithmetic device 3002 conducts analysis on the basis of information from the sensor 3009 and derives detailed information on the object 3007. The three-dimensional shape and hardness (or softness) of the object 3007 are derived by comparison with the data stored in the arithmetic device 3002 or the server that can communicate with the robot 3001. Depending on the three-dimensional shape and hardness (or softness) of the object 3007, the shape of the arm 3004 can be changed. Furthermore, depending on the shape or the size of the object 3007, the position in the receptacle 3006 may be changed or a plurality of receptacles 3006 may be provided to sort the objects 3007.

To derive the detailed information on the object 3007, analysis using the AI system can be utilized. For the information analysis, deep learning may be used.

Figure 66B:
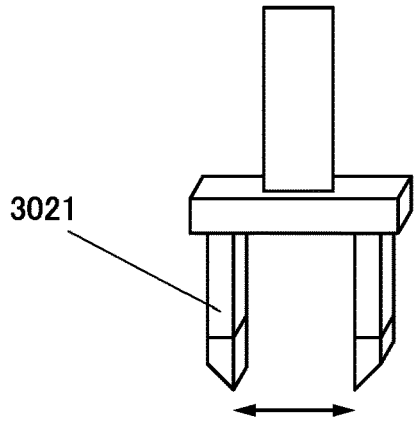
Figure 66C:
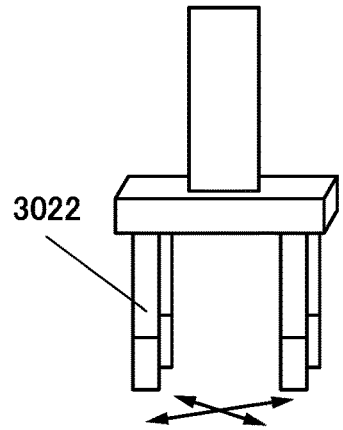
Figure 66D:
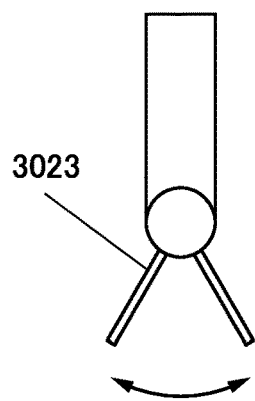
Figure 66E:
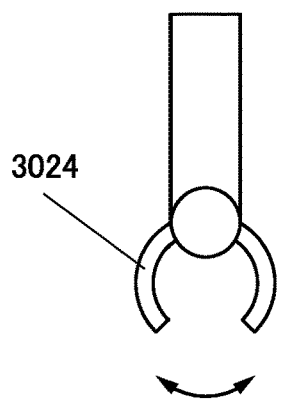
Figure 66F:
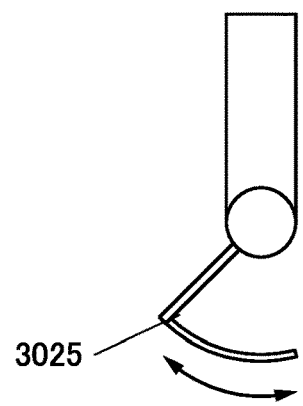

FIG. 66B is an arm in which a pair of plates 3021 can move in the horizontal direction to pinch the object 3007. The pair of plates 3021 moves toward the center horizontally, whereby the object 3007 can be pinched. Such an arm can hold the object 3007 by the surfaces, and is suitable for picking up the object 3007 with a columnar shape, such as a cube or a rectangular solid. FIG. 66C is an arm in which a plurality of bars 3022 can move in the horizontal direction to pinch the object 3007. The plurality of bars 3022 move toward the center horizontally, whereby the object 3007 can be pinched. Such an arm can pinch the object 3007 by the points, and is suitable for picking up the object 3007 in a spherical shape or in a non-fixed shape, that is, the object 3007 in an irregular shape. Although the number of the bars 3022 is four in FIG. 66C, this embodiment is not limited to this. The number of the bars 3022 may be three or five or more. FIG. 66D is an arm in which a pair of plates 3023 rotates around the common axis to be closer to each other to pinch the object 3007. Such an arm can hold the object 3007 by the surfaces, and is suitable for picking up the object 3007 with a thin-film shape, such as paper or films. FIG. 66E is an arm in which a pair of crook-shaped plates 3024 rotates around the common axis such that the ends of them are closer to each other to pick up the object 3007. Such an arm can pinch the object 3007 by the points or the sides, and is suitable for picking up the object 3007 with a thin-film shape, such as paper or films, or the object 3007 with a finer-grained shape. As shown in FIG. 66F, a spatula 3025 may be attached to the tip of the arm, and the object 3007 with a smaller particulate shape may be scooped.

The arms shown in FIG. 66A to FIG. 66F are just examples and one embodiment of the present invention is not limited to these shapes. In addition, the application of the arms is just an example and one embodiment of the present invention is not limited thereto.

The robot 3001 moves the boom 3003 to move the arm 3004 to a position over the desired object 3007 in the receptacle 3005 on the basis of signals from the arithmetic device 3002. In the case of the telescopic arm 3004, the arm 3004 is stretched, and the tip of the arm 3004 is brought down to a position on the same level as the object 3007. The tip of the arm is moved to catch the desired object 3007. The arm is shortened while catching the object 3007. The boom 3003 is moved again to transfer the arm 3004 to the desired position in the receptacle 3006. At this time, the arm 3004 may be rotated to adjust the angle of the object 3007 to the receptacle 3006. The arm 3004 is stretched to place the object 3007 in the receptacle 3006, and the arm 3004 releases the object 3007. The above operation is repeated, so that the robot 3001 can move the objects 3007 from the receptacle 3005 to the receptacle 3006.

Since the positional information on the receptacle 3005 and the receptacle 3006 and the state of the object 3007 are analyzed using the AI system, the object 3007 can be moved surely regardless of the shape or hardness of the object 3007. Examples of the object 3007 include not only an object packed in a box with a shape of a cube or a rectangular solid or a box or a case with a given shape but also eggs, shaped processed foods such as a hamburger steak and a croquette, foods such as vegetables with an irregular shape such as a potato and a tomato, machine parts such as a screw and a nut, a thin film of a paper or a film, and the like. Since in the sorting system 3000 described in this embodiment, the shape of the arm can be changed in consideration of the shape and the hardness of the object 3007, the objects 3007 given above as examples can be transferred from the receptacle 3005 to the receptacle 3006 regardless of the shape and the hardness.

For example, a memory device including the semiconductor device of one embodiment of the present invention can retain control data, a control program, or the like of the above-described electronic device for a long time. With the use of the semiconductor device according to one embodiment of the present invention, a highly reliable electronic device can be achieved.

An IC in which the above AI system is incorporated can be used for the arithmetic device or the like of the above-described electronic device, for example. Accordingly, the electronic device described in this embodiment can perform optimal operations depending on circumstances with low power consumption by utilizing the AI system.

This embodiment can be implemented in an appropriate combination with the configurations described in the other embodiments.

REFERENCE NUMERALS

700: memory cell array, 700A: memory cell array, 701: conductor, 702: conductor, 702A: conductive film, 703: insulator, 704: oxide, 705: conductor, 706: conductor, 707: conductor, 708: conductor, 709: conductor, 710: conductor, 711: insulator, 712: conductor, 713: insulator, 714: conductor, 715: conductor, 716: layer, 717: insulator, 719: conductor, 720: base, 721: insulator, 722: insulator, 723: mask, 724: insulator, 725: mask, 726: insulator, 727: material, 729: mask, 731: region, 734: region, 740: layer, 742: insulator, 744: microwave, 750: memory device, 752: conductor, 801: mask, 803: conductor, 805: mask, 807: insulator, 810: conductor, 812: conductor

The invention claimed is:

1. A semiconductor device comprising:
   a first insulator comprising a first opening;
   a first conductor comprising a second opening over the first insulator;
   a second insulator comprising a third opening over the first conductor;
   a third insulator provided along a first side surface of the first opening, a second side surface of the second opening, and a third side surface of the third opening;
   an oxide provided along the first side surface, the second side surface, and the third side surface with the third insulator therebetween;
   a second conductor provided at the first side surface with the third insulator and the oxide therebetween; and
   a third conductor provided at the third side surface with the third insulator and the oxide therebetween,
   wherein the oxide comprises a first region in the first opening, a second region in the second opening, and a third region in the third opening, and
   wherein the second region has higher resistance than the first region and the third region.

2. The semiconductor device according to claim 1, wherein the oxide comprises indium, an element M, and zinc, and
   wherein M is one or more selected from aluminum, gallium, yttrium, and tin.

3. The semiconductor device according to claim 1, wherein the oxide comprises:
   a first layer;
   a second layer provided in contact with an inner side of the first layer; and
   a third layer provided in contact with an inner side of the second layer,
   wherein an energy gap of the second layer is narrower than an energy gap of the first layer, and
   wherein the energy gap of the second layer is narrower than an energy gap of the third layer.

4. The semiconductor device according to claim 1, wherein the second conductor and the third conductor are each configured to block a microwave.

5. The semiconductor device according to claim 1, wherein the second region comprises more oxygen than the first region and the third region.

6. The semiconductor device according to claim 1, wherein the second region comprises less hydrogen than the first region and the third region.

7. The semiconductor device according to claim 1, wherein the second region has a lower carrier concentration than the first region and the third region.

8. The semiconductor device according to claim 1, wherein the third insulator comprises a gate insulating layer, a charge accumulation layer, and a tunnel insulating layer.

9. The semiconductor device according to claim 1, wherein a diameter of the first opening and a diameter of the third opening are larger than a diameter of the second opening.

10. A semiconductor device comprising:
    a first insulator comprising a first opening;
    a first conductor comprising a second opening over the first insulator;
    a second insulator comprising a third opening over the first conductor;
    a third insulator provided along a first side surface of the first opening, a second side surface of the second opening, and a third side surface of the third opening;
    an oxide provided along the first side surface, the second side surface, and the third side surface with the third insulator therebetween;
    a second conductor provided at the first side surface with the third insulator and the oxide therebetween;
    a third conductor provided at the third side surface with the third insulator and the oxide therebetween;
    a fourth insulator in contact with the oxide, the second conductor, and the third conductor; and
    a fourth conductor in contact with the fourth insulator,
    wherein the oxide is provided between the first conductor and the fourth insulator,
    wherein the fourth insulator is provided between the oxide and the fourth conductor,
    wherein the oxide comprises a first region in the first opening, a second region in the second opening, and a third region in the third opening, and
    wherein the second region has higher resistance than the first region and the third region.

11. The semiconductor device according to claim 10, wherein the first conductor serves as a first gate, and wherein the fourth conductor serves as a second gate.

12. The semiconductor device according to claim 10, wherein the oxide comprises indium, an element M, and zinc, and
    wherein M is one or more selected from aluminum, gallium, yttrium, and tin.

13. The semiconductor device according to claim 10, wherein the oxide comprises:

a first layer;

a second layer provided in contact with an inner side of the first layer; and a third layer provided in contact with an inner side of the second layer, wherein an energy gap of the second layer is narrower than an energy gap of the first layer, and wherein the energy gap of the second layer is narrower than an energy gap of the third layer.

14. The semiconductor device according to claim 10, wherein the second conductor and the third conductor are each configured to block a microwave.

15. The semiconductor device according to claim 10, wherein the second region comprises more oxygen than the first region and the third region, and wherein the second region comprises less hydrogen than the first region and the third region.

16. The semiconductor device according to claim 10, wherein the second region has a lower carrier concentration than the first region and the third region.

* * * * *